US012685011B2

(12) United States Patent
Uno et al.

(10) Patent No.: US 12,685,011 B2
(45) Date of Patent: Jul. 14, 2026

(54) ORGANIC ELECTROLUMINESCENCE DEVICE AND AMINE COMPOUND FOR ORGANIC ELECTROLUMINESCENCE DEVICE

(71) Applicant: Samsung Display Co., Ltd., Yongin-si (KR)

(72) Inventors: Takuya Uno, Yokohama (JP); Naoya Sakamoto, Yokohama (JP); Taku Imaizumi, Yokohama (JP); XiuLan Jin, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 1097 days.

(21) Appl. No.: 17/086,130

(22) Filed: Oct. 30, 2020

(65) Prior Publication Data

US 2021/0305509 A1 Sep. 30, 2021

(30) Foreign Application Priority Data

Mar. 23, 2020 (KR) ........................ 10-2020-0035165

(51) Int. Cl.
*H01L 51/50* (2006.01)
*H10K 85/10* (2023.01)
(Continued)

(52) U.S. Cl.
CPC ......... *H10K 85/633* (2023.02); *H10K 85/111* (2023.02); *H10K 85/6574* (2023.02);
(Continued)

(58) Field of Classification Search
None
See application file for complete search history.

(56) References Cited

U.S. PATENT DOCUMENTS 8,614,010 B2 12/2013 Yabunouchi et al.
8,652,653 B2 2/2014 Lin et al.
(Continued)

FOREIGN PATENT DOCUMENTS

CN 103553936 A 2/2014
CN 106467458 A 3/2017
(Continued)

OTHER PUBLICATIONS

WO-2020096326-A1—translation (Year: 2020).
(Continued)

*Primary Examiner* — Gregory D Clark
(74) *Attorney, Agent, or Firm* — Womble Bond Dickinson (US) LLP

(57) ABSTRACT

An organic electroluminescence device of an embodiment includes a first electrode, a second electrode, and a plurality of organic layers disposed between the first electrode and the
(Continued)

second electrode, wherein at least one among the plurality of organic layers includes an amine compound represented by Formula 1*a*, thereby showing excellent emission efficiency and/or improved life characteristics:

Formula 1a

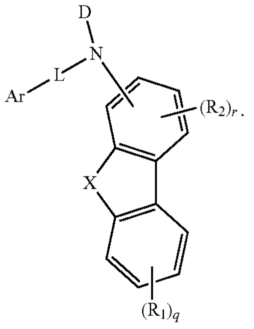

4 Claims, 2 Drawing Sheets

(51) Int. Cl.
*H10K 85/60* (2023.01)
*H10K 50/15* (2023.01)
*H10K 50/16* (2023.01)

(52) U.S. Cl.
CPC ......... *H10K 85/6576* (2023.02); *H10K 50/15* (2023.02); *H10K 50/16* (2023.02)

(56) References Cited

U.S. PATENT DOCUMENTS

| | | | |
|---|---|---|---|
| 8,703,304 B2 | 4/2014 | Yabunouchi | |
| 8,890,126 B2 | 11/2014 | Ryu et al. | |
| 9,065,060 B2 | 6/2015 | Hong et al. | |
| 9,087,997 B2 | 7/2015 | Yabunouchi | |
| 9,799,833 B2 | 10/2017 | Mujica-Fernaud et al. | |
| 9,847,491 B2 | 12/2017 | Hwang et al. | |
| 10,056,560 B2 | 8/2018 | Lee et al. | |
| 10,079,348 B2 | 9/2018 | Jin et al. | |
| 10,333,075 B2 | 6/2019 | Miyake et al. | |
| 10,333,076 B2 | 6/2019 | Miyake et al. | |
| 10,550,134 B2 | 2/2020 | Sakamoto et al. | |
| 11,121,329 B2 | 9/2021 | Uno | |
| 11,600,781 B2 | 3/2023 | Kim et al. | |
| 2009/0230852 A1 | 9/2009 | Lee et al. | |
| 2013/0105771 A1 | 5/2013 | Ryu et al. | |
| 2013/0153865 A1 | 6/2013 | Kho et al. | |
| 2013/0334517 A1 | 12/2013 | Hong et al. | |
| 2014/0374722 A1 | 12/2014 | Kim et al. | |
| 2015/0280133 A1 | 10/2015 | Parham et al. | |
| 2016/0093810 A1 | 3/2016 | Miyake et al. | |
| 2016/0111653 A1 | 4/2016 | Itoi | |
| 2016/0126465 A1 | 5/2016 | Kim et al. | |
| 2016/0172593 A1 | 6/2016 | Takada et al. | |
| 2017/0213980 A1 | 7/2017 | Nakano | |
| 2017/0317289 A1 | 11/2017 | Lee et al. | |
| 2017/0373256 A1 | 12/2017 | Ko et al. | |
| 2018/0105741 A1 | 4/2018 | Ko et al. | |
| 2018/0114907 A1 | 4/2018 | Takada et al. | |
| 2018/0123042 A1 | 5/2018 | Cha et al. | |
| 2018/0222844 A1 | 8/2018 | Kato et al. | |
| 2018/0226585 A1 | 8/2018 | Park et al. | |
| 2018/0287069 A1 | 10/2018 | Cha et al. | |
| 2018/0331290 A1 | 11/2018 | Miyake et al. | |
| 2019/0006591 A1 | 1/2019 | Yamaki et al. | |
| 2019/0039996 A1 | 2/2019 | Takada et al. | |
| 2019/0088878 A1 | 3/2019 | Parham et al. | |
| 2019/0119260 A1 | 4/2019 | Parham et al. | |
| 2019/0140177 A1 | 5/2019 | Lee et al. | |
| 2019/0165285 A1* | 5/2019 | Uno | C07F 7/0812 |
| 2019/0169176 A1 | 6/2019 | Cha et al. | |
| 2019/0185460 A1 | 6/2019 | Kim et al. | |
| 2019/0189927 A1 | 6/2019 | Lee et al. | |
| 2019/0189950 A1 | 6/2019 | Miyake et al. | |
| 2019/0198763 A1 | 6/2019 | Lee et al. | |
| 2019/0207117 A1 | 7/2019 | Miyake et al. | |
| 2019/0229271 A1 | 7/2019 | Lee et al. | |
| 2019/0237668 A1 | 8/2019 | Miyake et al. | |
| 2019/0237676 A1 | 8/2019 | Miyake et al. | |
| 2019/0296244 A1 | 9/2019 | Mun et al. | |
| 2019/0300535 A1 | 10/2019 | Mun et al. | |
| 2019/0378981 A1 | 12/2019 | Yoo et al. | |
| 2020/0052224 A1 | 2/2020 | Uno | |
| 2020/0055822 A1 | 2/2020 | Wirges et al. | |
| 2020/0058877 A1 | 2/2020 | Cha et al. | |
| 2020/0106017 A1 | 4/2020 | Ha et al. | |
| 2020/0119282 A1 | 4/2020 | Sakuma | |
| 2020/0119283 A1 | 4/2020 | Uno | |
| 2020/0131112 A1 | 4/2020 | Cha et al. | |
| 2020/0168804 A1 | 5/2020 | Song et al. | |
| 2020/0194673 A1 | 6/2020 | Ha et al. | |
| 2020/0203619 A1 | 6/2020 | Park et al. | |
| 2020/0227644 A1 | 7/2020 | Lee et al. | |
| 2020/0235297 A1 | 7/2020 | Miyake et al. | |
| 2020/0259104 A1 | 8/2020 | Sakuma | |
| 2020/0287140 A1 | 9/2020 | Chae et al. | |
| 2020/0317653 A1 | 10/2020 | Ito et al. | |
| 2020/0365814 A1 | 11/2020 | Ha et al. | |
| 2021/0028370 A1 | 1/2021 | Mun et al. | |
| 2021/0119135 A1 | 4/2021 | Uno | |
| 2021/0126197 A1 | 4/2021 | Uno | |
| 2021/0376241 A1 | 12/2021 | Lee et al. | |
| 2022/0048899 A1 | 2/2022 | Kim et al. | |
| 2022/0093870 A1 | 3/2022 | Mun et al. | |
| 2022/0158095 A1 | 5/2022 | Huang et al. | |
| 2022/0238811 A1 | 7/2022 | Park et al. | |
| 2022/0263027 A1 | 8/2022 | Kim et al. | |
| 2022/0298130 A1 | 9/2022 | Mun et al. | |
| 2022/0367818 A1 | 11/2022 | Mun et al. | |
| 2022/0376189 A1 | 11/2022 | Mun et al. | |
| 2023/0013038 A1 | 1/2023 | Sakamoto et al. | |
| 2023/0013956 A1 | 1/2023 | Lee et al. | |
| 2023/0016632 A1 | 1/2023 | Kim et al. | |
| 2023/0024273 A1 | 1/2023 | Takahashi et al. | |
| 2023/0048456 A1 | 2/2023 | Kwon et al. | |
| 2023/0055036 A1 | 2/2023 | Miyake et al. | |
| 2023/0100154 A1 | 3/2023 | Park et al. | |
| 2023/0106317 A1 | 4/2023 | Kim et al. | |
| 2023/0111469 A1 | 4/2023 | Park et al. | |
| 2023/0111751 A1 | 4/2023 | Lee et al. | |
| 2024/0147844 A1 | 5/2024 | Miyake et al. | |
| 2024/0164207 A1 | 5/2024 | Lee et al. | |
| 2024/0357933 A1 | 10/2024 | Lee et al. | |
| 2024/0389451 A1 | 11/2024 | Miyake et al. | |
| 2025/0048920 A1 | 2/2025 | Song et al. | |

FOREIGN PATENT DOCUMENTS

| | | |
|---|---|---|
| CN | 106661445 A | 5/2017 |
| CN | 107109211 A | 8/2017 |
| CN | 107216261 A | 9/2017 |
| CN | 107445884 A | 12/2017 |
| CN | 107459466 A | 12/2017 |
| CN | 107602397 A | 1/2018 |
| CN | 107667099 A | 2/2018 |
| CN | 107936957 A | 4/2018 |
| CN | 108342191 A | 7/2018 |
| CN | 108623545 A | 10/2018 |
| CN | 108863813 A | 11/2018 |
| CN | 109053698 A | 12/2018 |
| CN | 109232492 A | 1/2019 |
| CN | 109574926 A | 4/2019 |
| CN | 109761967 A | 5/2019 |
| CN | 109896965 A | 6/2019 |

(56) References Cited

FOREIGN PATENT DOCUMENTS

| | | | | |
|---|---|---|---|---|
| CN | 109942526 A | | 6/2019 | |
| CN | 110078705 A | | 8/2019 | |
| CN | 110105225 A | | 8/2019 | |
| CN | 110218175 A | | 9/2019 | |
| CN | 110511151 A | | 11/2019 | |
| CN | 111995532 A | | 11/2019 | |
| CN | 110577509 A | | 12/2019 | |
| CN | 110590568 A | | 12/2019 | |
| CN | 110799486 A | | 2/2020 | |
| CN | 110845394 A | | 2/2020 | |
| CN | 110950762 A | | 4/2020 | |
| CN | 111362812 A | | 7/2020 | |
| CN | 111518017 A | | 8/2020 | |
| CN | 111518064 A | | 8/2020 | |
| CN | 111606813 A | | 9/2020 | |
| CN | 111718357 A | | 9/2020 | |
| CN | 111732578 A | | 10/2020 | |
| CN | 111848415 A | | 10/2020 | |
| CN | 112028864 A | | 12/2020 | |
| CN | 112679531 A | | 4/2021 | |
| CN | 113004153 A | | 6/2021 | |
| CN | 113121363 A | | 7/2021 | |
| CN | 113135903 A | | 7/2021 | |
| CN | 114728891 A | | 7/2022 | |
| EP | 2100941 A2 | | 9/2009 | |
| EP | 3508472 A1 | | 7/2019 | |
| EP | 3909946 A2 | | 11/2021 | |
| EP | 4043430 A1 | | 8/2022 | |
| JP | 3915256 B2 | | 5/2007 | |
| JP | 2009-215333 A | | 9/2009 | |
| JP | WO2010/061824 A1 | | 6/2010 | |
| JP | 5193295 B2 | | 5/2013 | |
| JP | 2015-529632 A | | 10/2015 | |
| JP | 2018-188433 A | | 11/2018 | |
| JP | 2019-512476 A | | 5/2019 | |
| JP | 6584058 B2 | | 10/2019 | |
| JP | 2020-125287 A | | 8/2020 | |
| KR | 10-1181261 B1 | | 9/2012 | |
| KR | 10-1251451 B1 | | 4/2013 | |
| KR | 10-2013-0084960 A | | 7/2013 | |
| KR | 10-1292554 B1 | | 8/2013 | |
| KR | 10-2013-0106255 A | | 9/2013 | |
| KR | 10-1379133 B1 | | 3/2014 | |
| KR | 2015/102734 | * | 2/2015 | ............. H01L 51/50 |
| KR | 10-2015-0038811 A | | 4/2015 | |
| KR | 10-2015-0102734 A | | 9/2015 | |
| KR | 10-2015-0102735 A | | 9/2015 | |
| KR | 10-2015-0107442 A | | 9/2015 | |
| KR | 2016-024625 | * | 3/2016 | ............. H01L 51/50 |
| KR | 10-2016-0037059 A | | 4/2016 | |
| KR | 10-2016-0044299 A | | 4/2016 | |
| KR | 10-2016-0052136 A | | 5/2016 | |
| KR | 10-2016-0053561 A | | 5/2016 | |
| KR | 10-2016-0054855 A | | 5/2016 | |
| KR | 10-2016-0059602 A | | 5/2016 | |
| KR | 10-2016-0059609 A | | 5/2016 | |
| KR | 2016052136 | * | 5/2016 | ............. H10K 50/00 |
| KR | 10-2016-0066308 A | | 6/2016 | |
| KR | 10-2016-0127429 A | | 11/2016 | |
| KR | 10-2016-0130145 A | | 11/2016 | |
| KR | 10-2017-0001830 A | | 1/2017 | |
| KR | 10-2017-0022438 A | | 3/2017 | |
| KR | 2017022438 | * | 3/2017 | ............. C09K 11/06 |
| KR | 10-2017-0082459 A | | 7/2017 | |
| KR | 10-1764908 B1 | | 8/2017 | |
| KR | 10-2017-0134163 A | | 12/2017 | |
| KR | 10-2018-0013713 A | | 2/2018 | |
| KR | 10-2018-0027195 A | | 3/2018 | |
| KR | 10-2018-0030560 A | | 3/2018 | |
| KR | 10-2018-0031385 A | | 3/2018 | |
| KR | 10-2018-0044799 A | | 5/2018 | |
| KR | 10-1854886 B1 | | 5/2018 | |
| KR | 10-2018-0061077 A | | 6/2018 | |
| KR | 10-2018-0063707 A | | 6/2018 | |
| KR | 10-2018-0066855 A | | 6/2018 | |
| KR | 10-2018-0078177 A | | 7/2018 | |
| KR | 10-2018-0084423 A | | 7/2018 | |
| KR | 10-2018-0096458 A | | 8/2018 | |
| KR | 10-2018-0112962 A | | 10/2018 | |
| KR | 10-2018-0118744 A | | 10/2018 | |
| KR | 10-1897632 B1 | | 10/2018 | |
| KR | 10-1907292 B1 | | 10/2018 | |
| KR | 10-2018-0127906 A | | 11/2018 | |
| KR | 10-2018-0134453 A | | 12/2018 | |
| KR | 10-2019-0005522 A | | 1/2019 | |
| KR | 10-2019-0014299 A | | 2/2019 | |
| KR | 10-2019-0031117 A | | 3/2019 | |
| KR | 10-1959512 B1 | | 3/2019 | |
| KR | 10-2019-0042989 A | | 4/2019 | |
| KR | 10-2019-0069224 A | | 6/2019 | |
| KR | 10-2019-0073009 A | | 6/2019 | |
| KR | 10-2019-0074329 A | | 6/2019 | |
| KR | 2019-0084880 | * | 6/2019 | ............. H01L 51/50 |
| KR | 10-2019-0077158 A | | 7/2019 | |
| KR | 10-2019-0079181 A | | 7/2019 | |
| KR | 10-2019-0082699 A | | 7/2019 | |
| KR | 10-2019-0084880 A | | 7/2019 | |
| KR | 10-2019-0103788 A | | 9/2019 | |
| KR | 10-2022391 B1 | | 9/2019 | |
| KR | 10-2019-0114635 A | | 10/2019 | |
| KR | 10-2019-0125993 A | | 11/2019 | |
| KR | 10-2020-0017692 A | | 2/2020 | |
| KR | 10-2020-0017703 A | | 2/2020 | |
| KR | 10-2073257 B1 | | 2/2020 | |
| KR | 10-2020-0031936 A | | 3/2020 | |
| KR | 10-2020-0077860 A | | 7/2020 | |
| KR | 10-2020-0081771 A | | 7/2020 | |
| KR | 10-2020-0084172 A | | 7/2020 | |
| KR | 10-2148056 B1 | | 8/2020 | |
| KR | 10-2020-0110508 A | | 9/2020 | |
| KR | 10-2020-0129992 A | | 11/2020 | |
| KR | 10-2020-0131929 A | | 11/2020 | |
| KR | 10-2020-0136116 A | | 12/2020 | |
| KR | 10-2020-0139398 A | | 12/2020 | |
| KR | 10-2021-0015615 A | | 2/2021 | |
| KR | 10-2021-0015616 A | | 2/2021 | |
| KR | 10-2021-0030522 A | | 3/2021 | |
| KR | 10-2021-0040774 A | | 4/2021 | |
| KR | 10-2021-0053209 A | | 5/2021 | |
| KR | 10-2021-0068935 A | | 6/2021 | |
| KR | 10-2021-0072883 A | | 6/2021 | |
| KR | 10-2021-0086738 A | | 7/2021 | |
| KR | 10-2021-0090782 A | | 7/2021 | |
| WO | WO 2012/099376 A2 | | 7/2012 | |
| WO | WO 2013/109027 A1 | | 7/2013 | |
| WO | WO 2016/032137 A1 | | 3/2016 | |
| WO | WO 2016032066 | * | 3/2016 | ............. H01L 51/50 |
| WO | WO 2016/064110 A1 | | 4/2016 | |
| WO | WO 2016/072690 | * | 5/2016 | ............. H01L 51/50 |
| WO | WO 2016/072690 A1 | | 5/2016 | |
| WO | WO 2016/072691 A1 | | 5/2016 | |
| WO | WO 2016/122150 A2 | | 8/2016 | |
| WO | WO 2016/178544 A2 | | 11/2016 | |
| WO | WO 2017/022730 A1 | | 2/2017 | |
| WO | WO 2017/099471 A1 | | 6/2017 | |
| WO | WO 2017/119792 A1 | | 7/2017 | |
| WO | WO 2017/148564 A1 | | 9/2017 | |
| WO | WO 2018/033087 A1 | | 2/2018 | |
| WO | WO 2018/033088 A1 | | 2/2018 | |
| WO | WO 2018/139767 A1 | | 8/2018 | |
| WO | WO 2018/216903 A1 | | 11/2018 | |
| WO | WO 2019/013441 A1 | | 1/2019 | |
| WO | WO 2019/054599 A1 | | 3/2019 | |
| WO | WO 2019/066250 A1 | | 4/2019 | |
| WO | WO 2019/083122 A1 | | 5/2019 | |
| WO | WO 2019/093649 A1 | | 5/2019 | |
| WO | WO 2019/132246 A1 | | 7/2019 | |
| WO | WO 2019/135665 A1 | | 7/2019 | |
| WO | WO 2019/164327 A1 | | 8/2019 | |
| WO | WO 2019/168367 A1 | | 9/2019 | |
| WO | WO 2019/190101 A1 | | 10/2019 | |
| WO | 2020/096326 A1 | | 5/2020 | |
| WO | WO 2020/111251 A1 | | 6/2020 | |
| WO | WO 2020/130511 A1 | | 6/2020 | |

(56) References Cited

FOREIGN PATENT DOCUMENTS

| | | | |
|---|---|---|---|
| WO | 2021/070965 | A1 | 4/2021 |
| WO | WO 2021/066319 | A2 | 4/2021 |
| WO | WO 2021/073385 | A1 | 4/2021 |
| WO | WO 2021/141356 | A1 | 7/2021 |

OTHER PUBLICATIONS

Extended European Search Report dated Apr. 20, 2022, issued in European Patent Application No. 21212225.3-1211 (11 pages).
European Examination report dated Apr. 16, 2024, from the European Patent Office in corresponding European Patent Application No. 21212225.3-1211 (10 pages).
US Office Action dated Jul. 15, 2024, issued in U.S. Appl. No. 17/444,895 (16 pages).
US Office Action dated Sep. 9, 2024, issued in U.S. Appl. No. 17/449,885 (31 pages).
US Office Action dated Mar. 31, 2025, issued in U.S. Appl. No. 17/444,895 (21 pages).
US Office Action dated Apr. 8, 2025, issued in U.S. Appl. No. 17/449,885 (28 pages).
US Office action dated Feb. 28, 2025, issued in U.S. Appl. No. 18/523,729, 17 pages.
US Office Action dated Apr. 22, 2025, issued in U.S. Appl. No. 17/649,024, 34 pages.
Chinese Office Action for CN Application No. 202110270138.3 dated Dec. 12, 2024, 10 pages.
Final Office Action for U.S. Appl. No. 17/444,895 dated Jan. 15, 2025, 16 pages.
Final Office Action for U.S. Appl. No. 17/449,885 dated Jan. 15, 2025, 28 pages.
US Final Office Action dated Aug. 29, 2025, issued in U.S. Appl. No. 17/449,885 (21 pages).
US Final Office Action dated Aug. 29, 2025, issued in U.S. Appl. No. 17/649,024 (23 pages).
US Office Action dated Nov. 14, 2025, issued in U.S. Appl. No. 17/649,024 (24 pages).
US Office Action dated Nov. 14, 2025, issued in U.S. Appl. No. 17/449,885 (25 pages).
US Office Action dated Dec. 10, 2025, issued in U.S. Appl. No. 17/444,895 (14 pages).
Chinese Office Action and Search Report corresponding to CN Application No. 202110270138.3, dated Jun. 27, 2025 (599 pages).
US Final Office Action dated Aug. 11, 2025, issued in U.S. Appl. No. 17/444,895 (19 pages).
US Final Office Action dated Mar. 26, 2026, issued in US Appl. No. 17/444,895 (16 pages).
US Final Office Action dated Apr. 28, 2026, issued in U.S. Appl. No. 17/449,885 (22 pages).
US Final Office Action dated May 7, 2026, 2025, issued in U.S. Appl. No. 17/649,024 (26 pages).

* cited by examiner

ORGANIC ELECTROLUMINESCENCE DEVICE AND AMINE COMPOUND FOR ORGANIC ELECTROLUMINESCENCE DEVICE

CROSS-REFERENCE TO RELATED APPLICATION

This application claims priority to and the benefit of Korean Patent Application No. 10-2020-0035165, filed on Mar. 23, 2020, the entire content of which is hereby incorporated by reference.

BACKGROUND

One or more aspects of embodiments of the present disclosure relate to an organic electroluminescence device and an amine compound used therein.

Organic electroluminescence displays are being active developed as image displays. An organic electroluminescence display is a so-called self-luminescent display, in which holes and electrons respectively injected from a first electrode and a second electrode recombine in an emission layer to produce excitons, and the excitons thus produced fall to the ground state to generate light and attain display.

In the application of an organic electroluminescence device to a display, decreased in driving voltages and increased emission efficiency and life span of the organic electroluminescence device are desired, and materials capable of stably attaining such requirements are being continuously developed.

Amine compounds continue to be developed as hole transport region materials, but improved amine compounds providing high efficiency and long life span to an organic electroluminescence device are desired.

SUMMARY

One or more aspects of embodiments of the present disclosure are directed toward an organic electroluminescence device having excellent emission efficiency and/or improved life span.

One or more aspects of embodiments of the present disclosure are directed toward an amine compound as a material for an organic electroluminescence device having excellent emission efficiency and/or improved life span.

One or more example embodiments of the present disclosure provide an organic electroluminescence device including a first electrode, a second electrode opposite the first electrode, and a plurality of organic layers disposed between the first electrode and the second electrode, wherein at least one organic layer among the plurality of organic layers includes an amine compound represented by Formula 1a:

Formula 1a

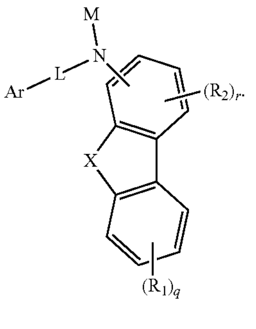

In Formula 1a, X is O or S, $R_1$ is a hydrogen atom, a deuterium atom, a halogen atom, a substituted or unsubstituted alkyl group of 1 to 20 carbon atoms, or a substituted or unsubstituted aryl group of 6 to 40 carbon atoms for forming a ring; $R_2$ is a hydrogen atom or a deuterium atom; L is a direct linkage, or a substituted or unsubstituted arylene group of 6 to 30 carbon atoms for forming a ring, where a case where L is a substituted or unsubstituted divalent fluorenyl group is excluded; "q" is an integer of 0 to 4; "r" is an integer of 0 to 3; and M is represented by Formula 1b:

Formula 1b

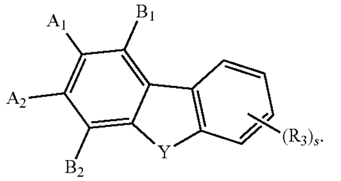

In Formula 1b, Y is O or S; X and Y are different from each other; $R_3$ is a hydrogen atom, a deuterium atom, a halogen atom, a substituted or unsubstituted alkyl group of 1 to 20 carbon atoms, or a substituted or unsubstituted aryl group of 6 to 40 carbon atoms for forming a ring; "s" is an integer of 0 to 4; $A_1$ and $A_2$ are each independently a hydrogen atom or a deuterium atom; $B_1$ and $B_2$ are each independently a hydrogen atom or a deuterium atom, where the nitrogen atom in Formula 1a (e.g., in the amine group) is bonded to any one of $B_1$ and $B_2$; in Formula 1a, Ar is a substituted or unsubstituted alkyl group of 1 to 20 carbon atoms, or a substituted or unsubstituted aryl group of 6 to 40 carbon atoms for forming a ring, where a case where Ar is a substituted or unsubstituted fluorenyl group or represented by Formula 2 is excluded:

Formula 2

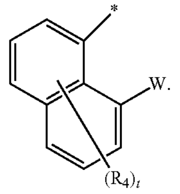

In Formula 2, W is a substituted or unsubstituted aryl group of 6 to 20 carbon atoms for forming a ring, $R_4$ is a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring, "t" is an integer of 0 to 6, and "——∗" is a position connected to L in Formula 1a.

In an embodiment, Ar may be a substituted or unsubstituted phenyl group, a substituted or unsubstituted biphenyl group, a substituted or unsubstituted terphenyl group, a substituted or unsubstituted quaterphenyl group, a substituted or unsubstituted naphthyl group, a substituted or unsubstituted phenanthryl group, or a substituted or unsubstituted triphenylene group.

In an embodiment, L may be a direct linkage, an unsubstituted phenylene group, an unsubstituted divalent biphenyl group, an unsubstituted divalent terphenyl group, an unsubstituted naphthylene group, or an unsubstituted divalent phenanthryl group.

In an embodiment, $R_1$ and $R_2$ may each independently be a hydrogen atom, a deuterium atom, an unsubstituted t-butyl group, or an unsubstituted phenyl group.

In an embodiment, in a case where Ar is the substituted or unsubstituted alkyl group, Ar may be a substituted or unsubstituted cycloalkyl group.

In an embodiment, the amine compound represented by Formula 1a may be a monoamine compound.

In an embodiment, the amine compound represented by Formula 1a may be represented by Formula 3-1 or Formula 3-2:

Formula 3-1

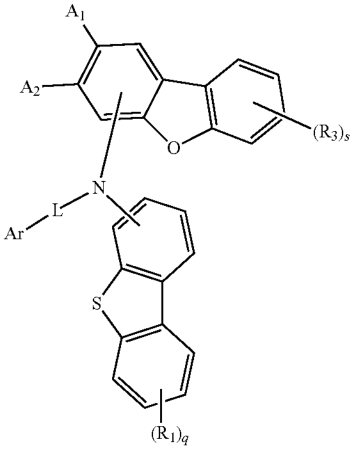

Formula 3-2

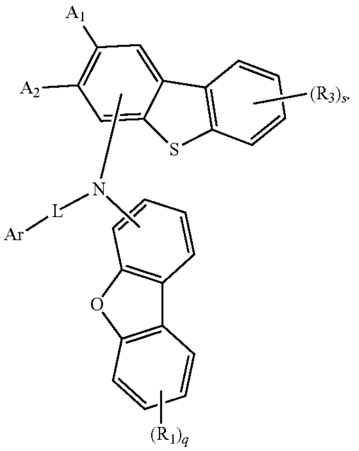

In Formula 3-1 and Formula 3-2, $A_1$, $A_2$, $R_1$, $R_3$, L, "q", "s", and Ar may each independently be the same as defined in Formula 1a and Formula 1b.

In an embodiment, the amine compound represented by Formula 1a may be represented by Formula 4-1 or Formula 4-2:

Formula 4-1

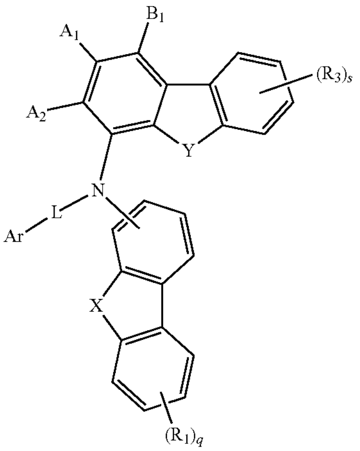

Formula 4-2

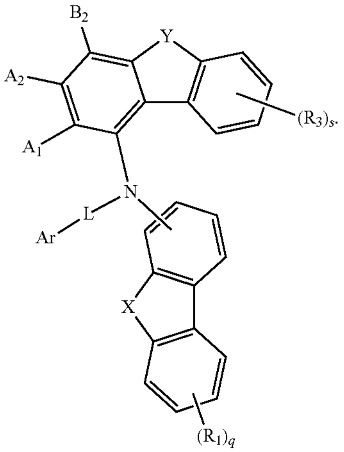

In Formula 4-1 and Formula 4-2, $A_1$, $A_2$, $B_1$, $B_2$, X, Y, $R_1$, $R_3$, L, "q", "s", and Ar may each independently be the same as defined in Formula 1a and Formula 1b.

In an embodiment, the amine compound represented by Formula 1a may be represented by any one among Formula 5-1 to Formula 5-4:

Formula 5-1

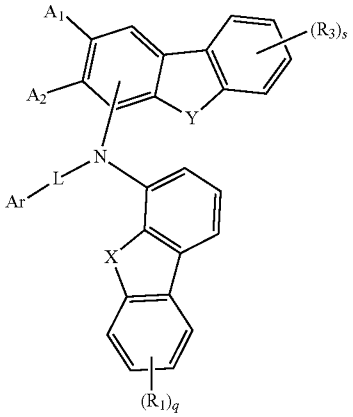

-continued

Formula 5-2

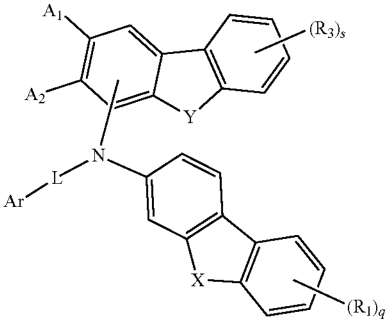

Formula 5-3

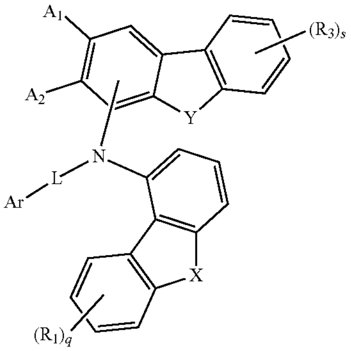

Formula 5-4

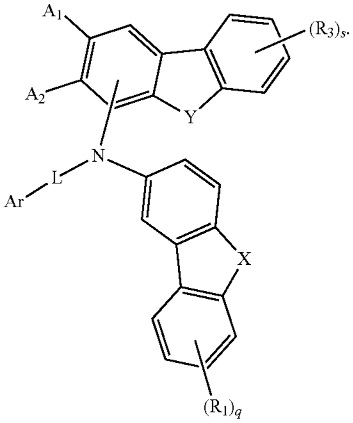

In Formula 5-1 to Formula 5-4, $A_1$, $A_2$, X, Y, $R_1$, $R_3$, L, "q", "s", and Ar may each independently be the same as defined in Formula 1a and Formula 1b.

In an embodiment, the plurality of the organic layers may include a hole transport region, an emission layer, and an electron transport region, and the hole transport region may include the amine compound represented by Formula 1a.

In an embodiment, the organic electroluminescence device may further include a capping layer disposed on the second electrode and having a refractive index of about 1.6 or more.

In an embodiment, the amine compound represented by Formula 1a may be any one among compounds represented in Compound Group A and Compound Group B:

Compound Group A

A1

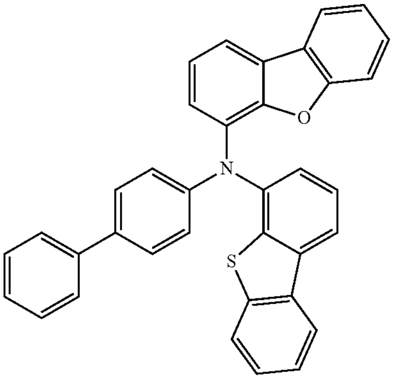

A2

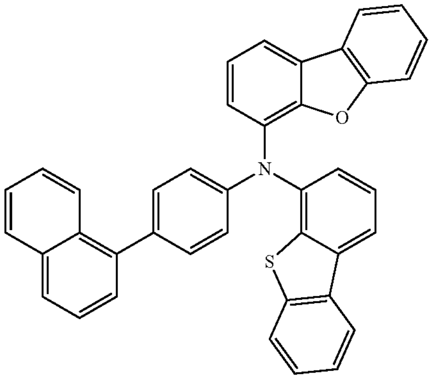

A3

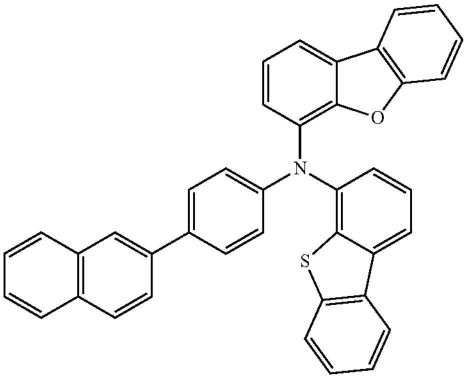

A4

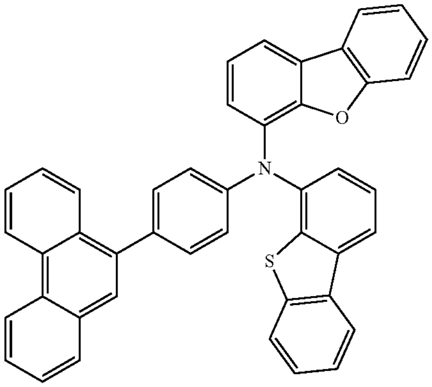

-continued
A5
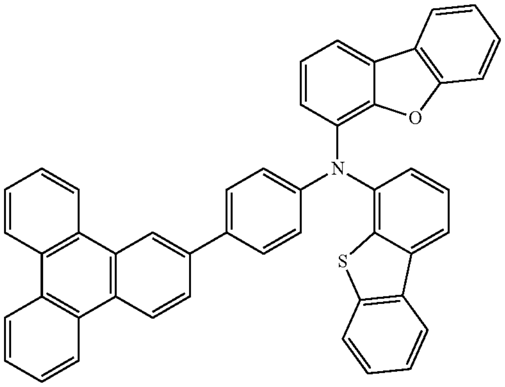
A6
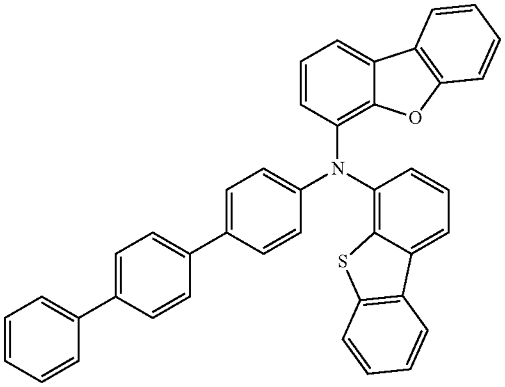
A7
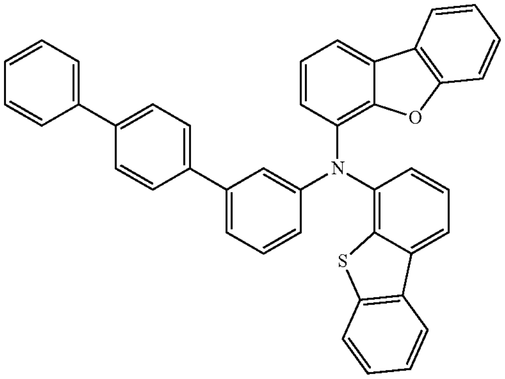
A8
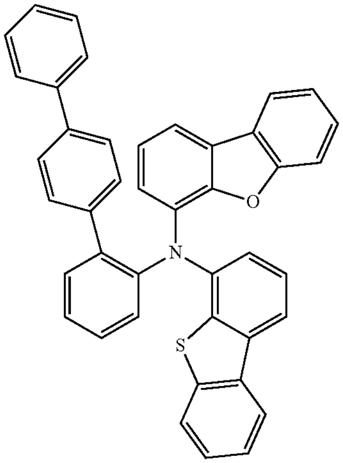
-continued
A9
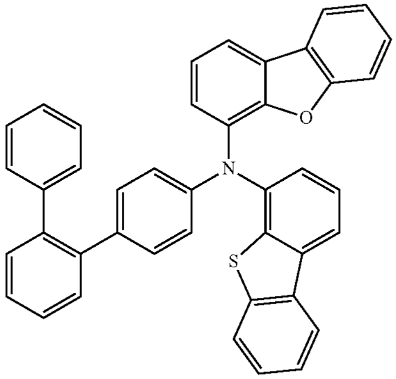
A10
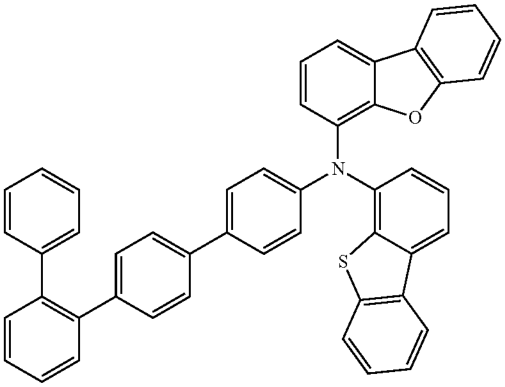
A11
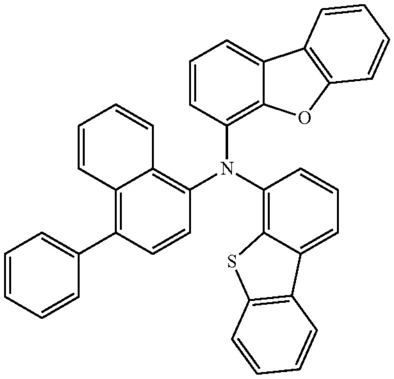
A12
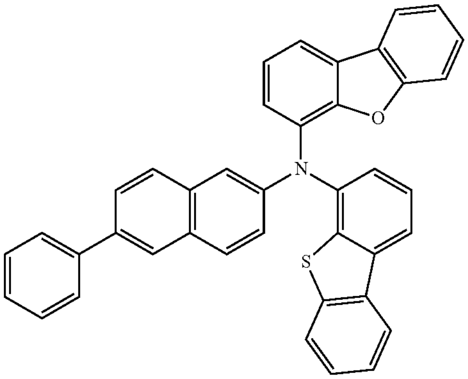

-continued
A13
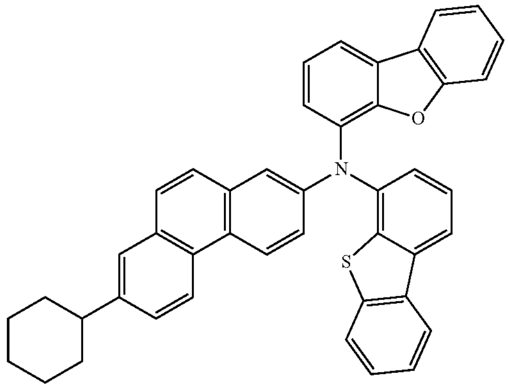
A14
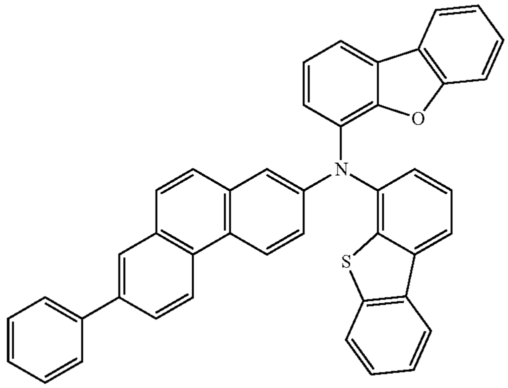
A15
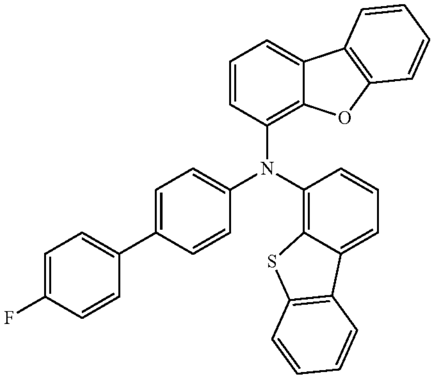
A16
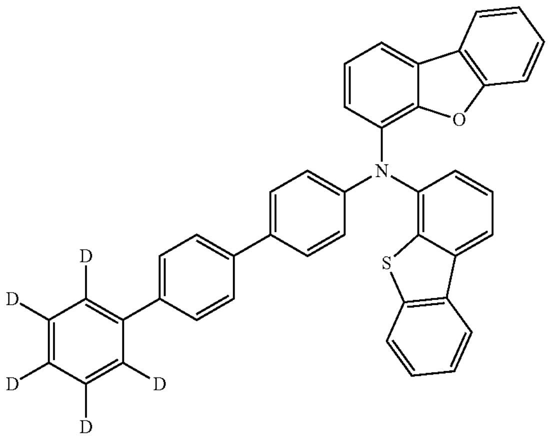
-continued
A17
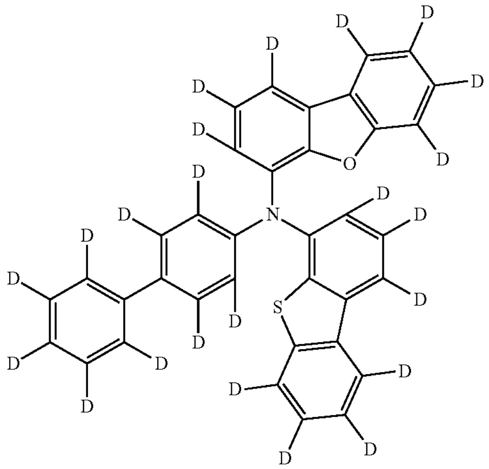
A18
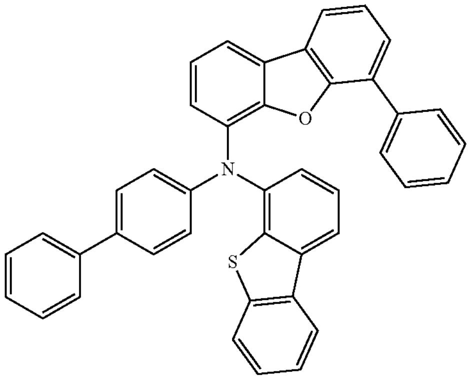
A19
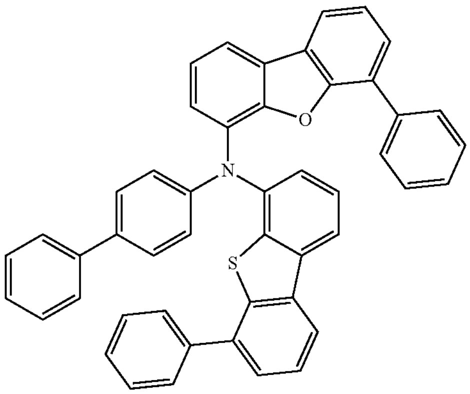
A20
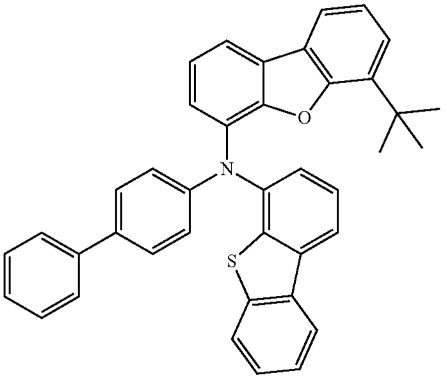

-continued
A21
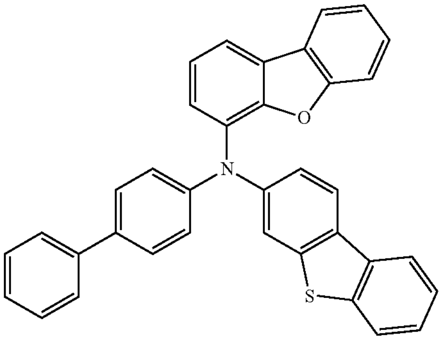
A22
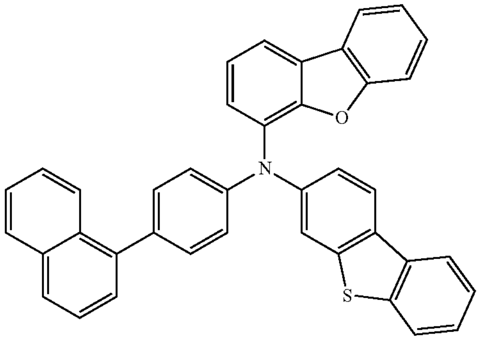
A23
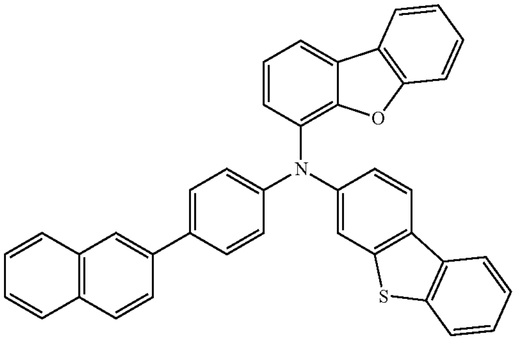
A24
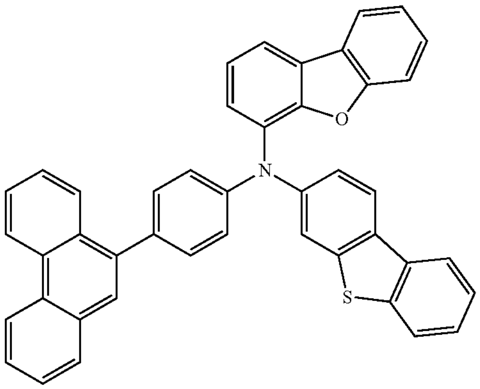
-continued
A25
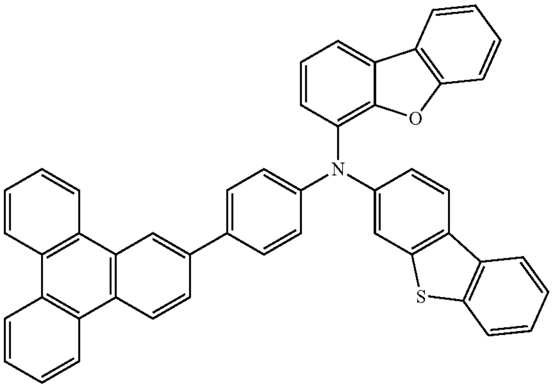
A26
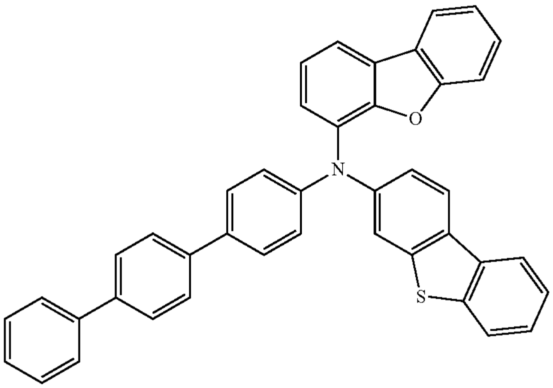
A27
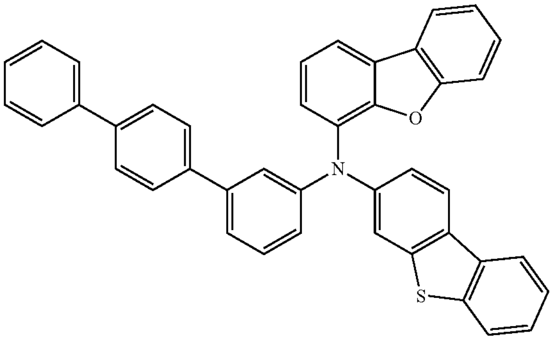
A28
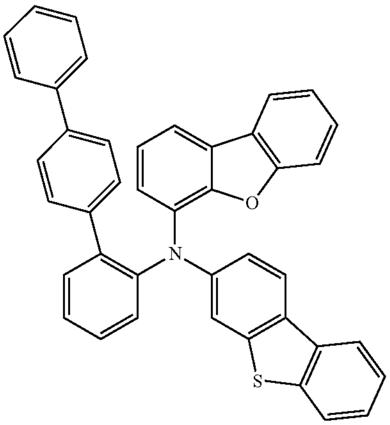

-continued
A29
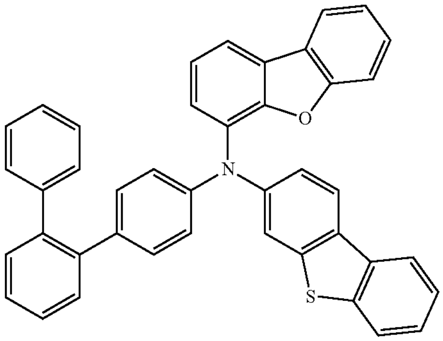
A30
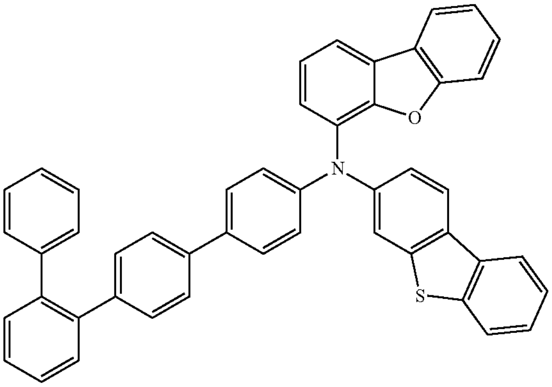
A31
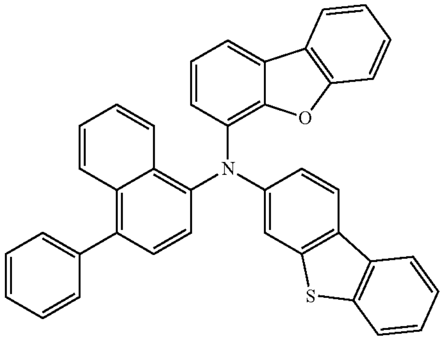
A32
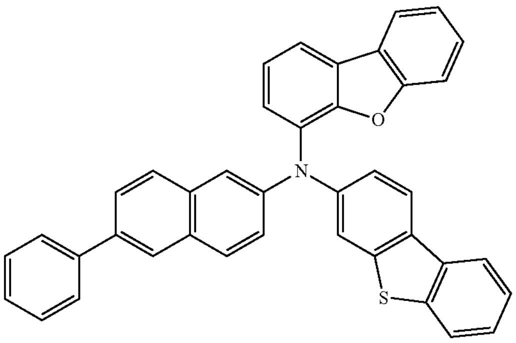
-continued
A33
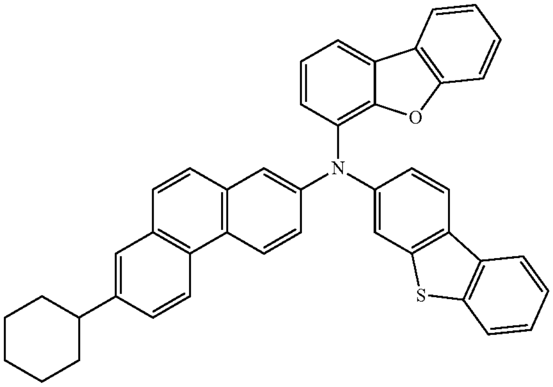
A34
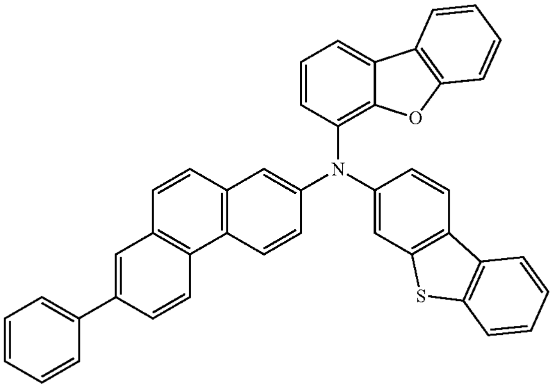
A35
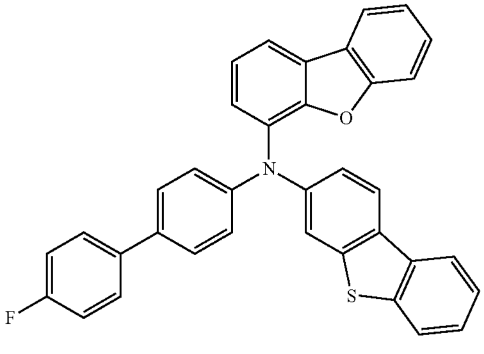
A36
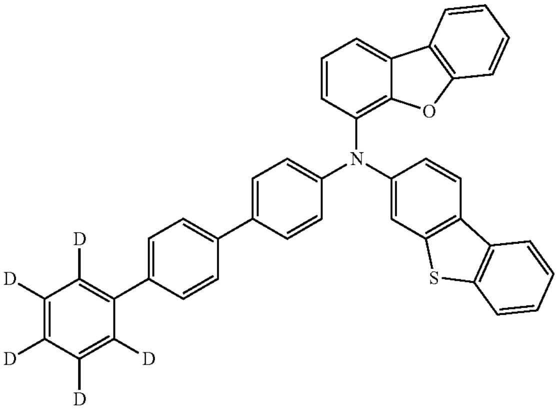

-continued
A37
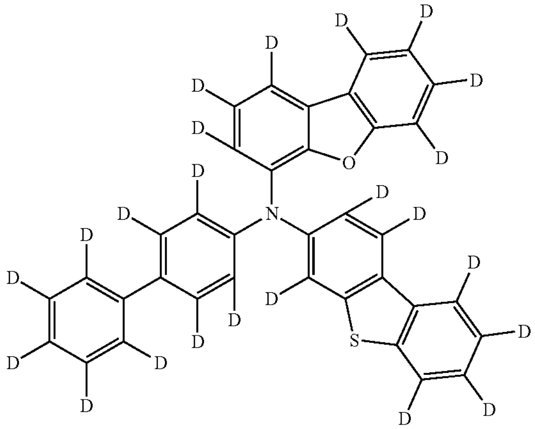
A38
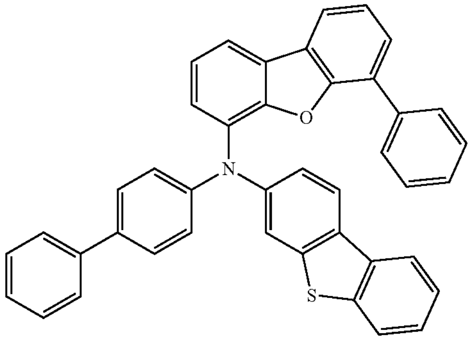
A39
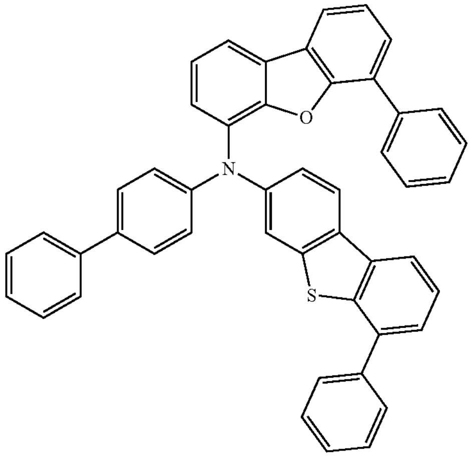
A40
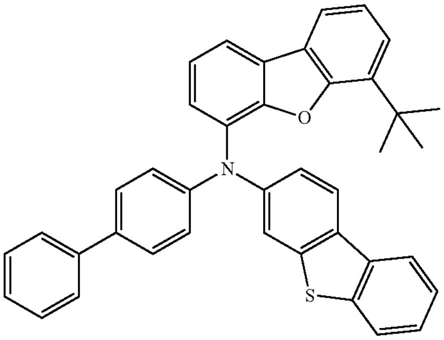
-continued
A41
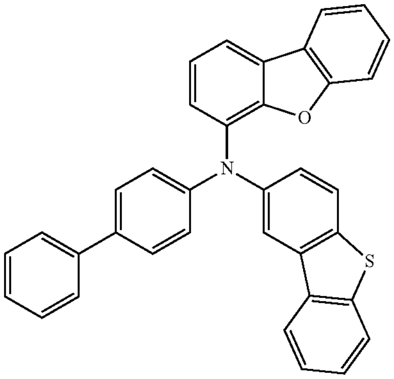
A42
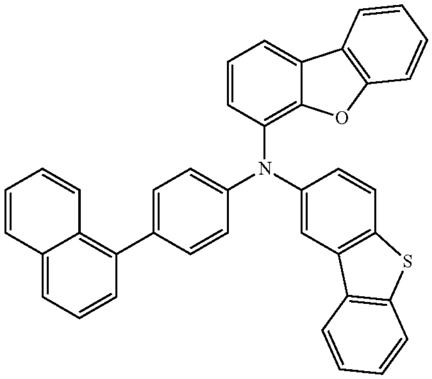
A43
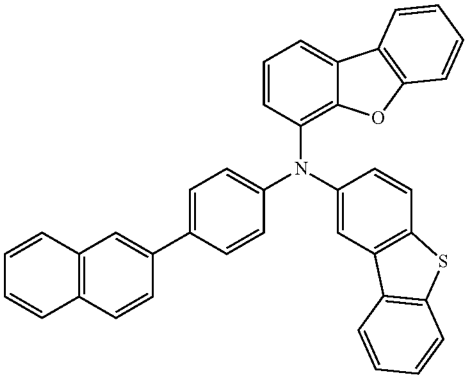
A44
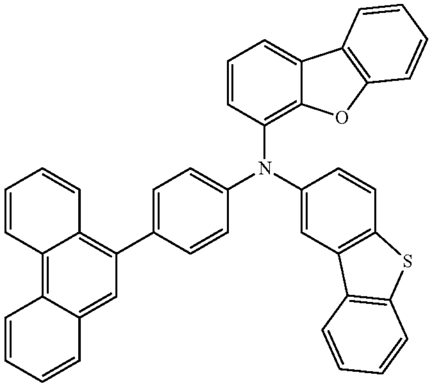

-continued
A45
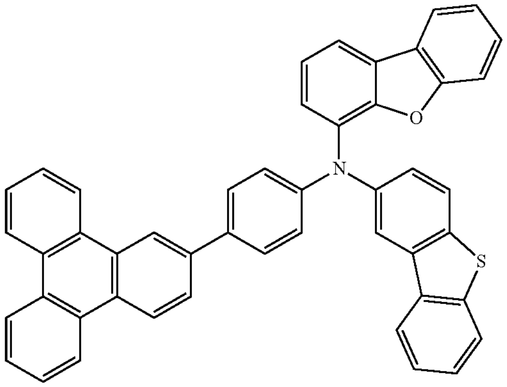
A46
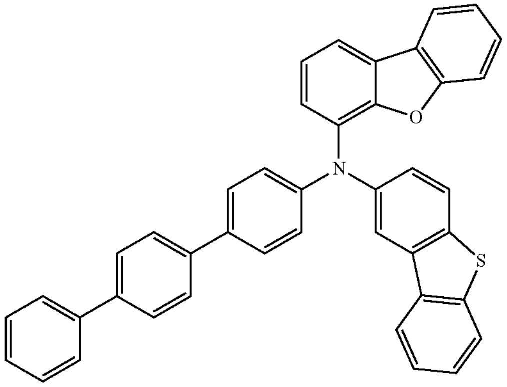
A47
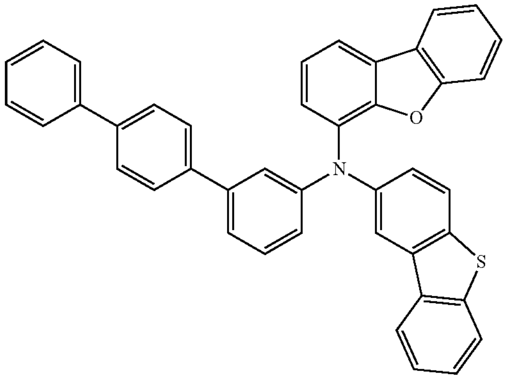
A48
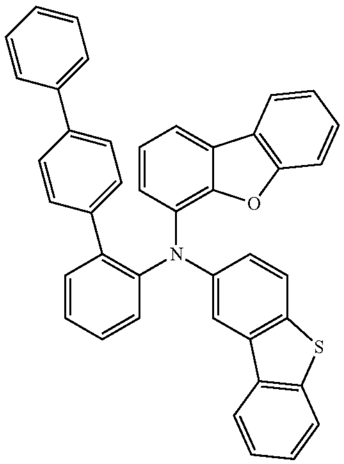
-continued
A49
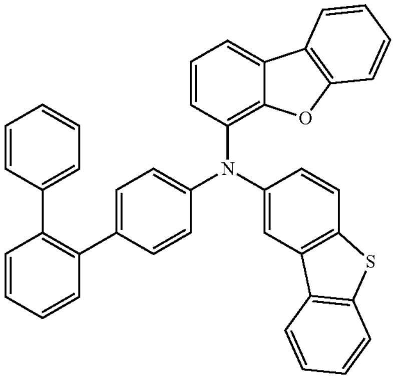
A50
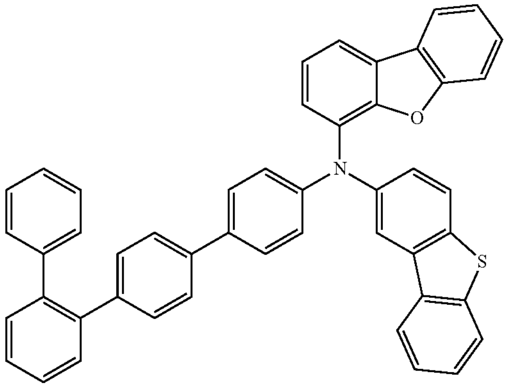
A51
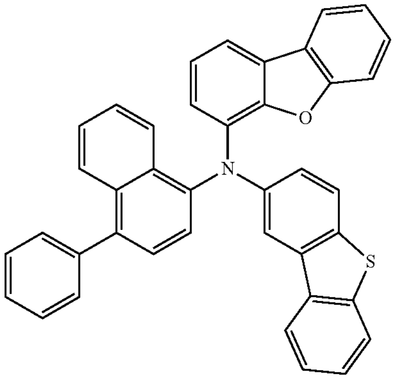
A52
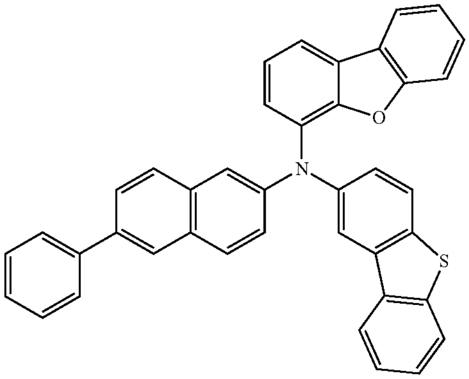

-continued
A53
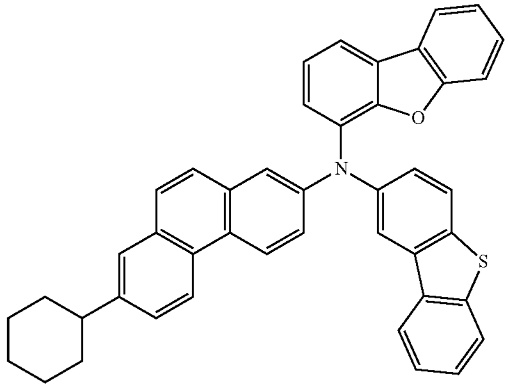
A54
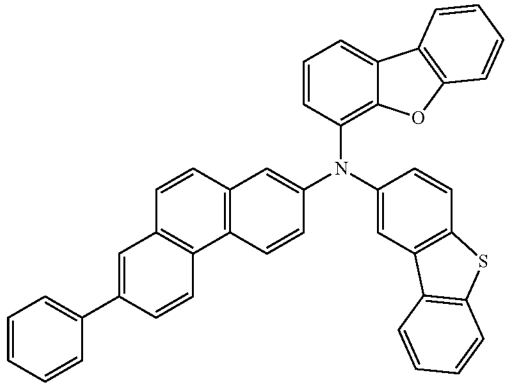
A55
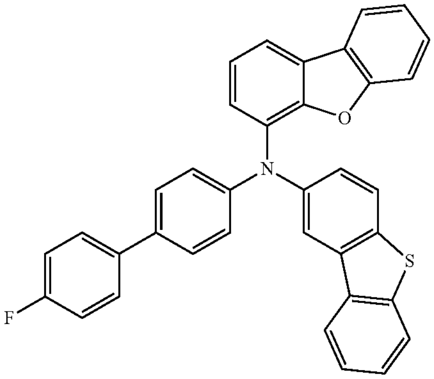
A56
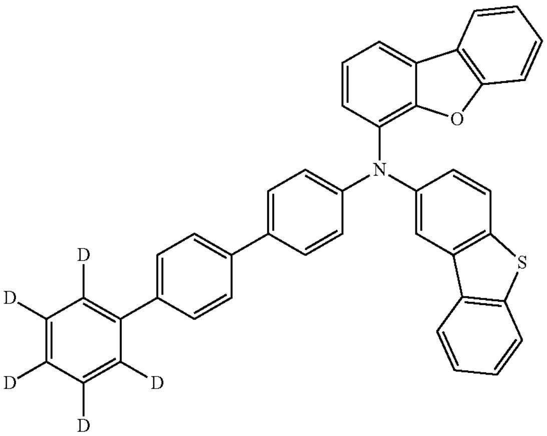
-continued
A57
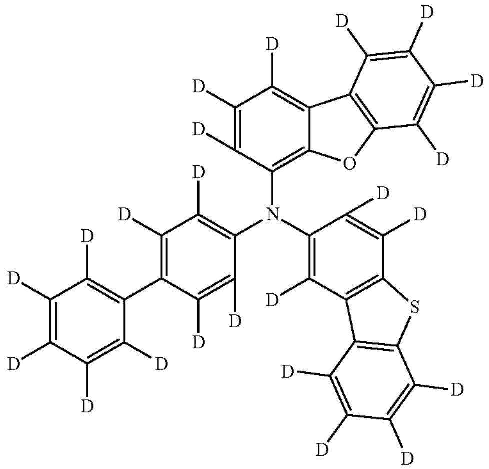
A58
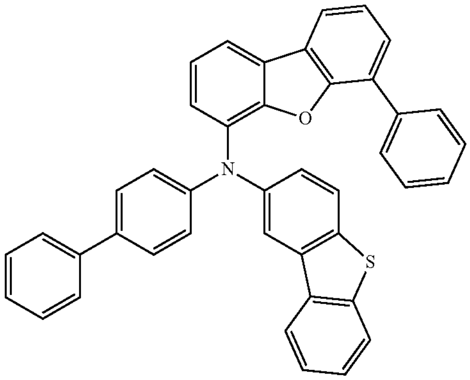
A59
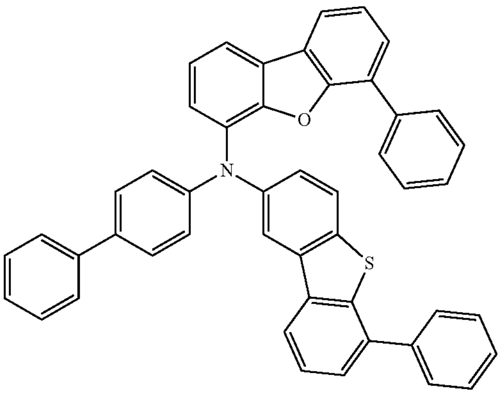
A60
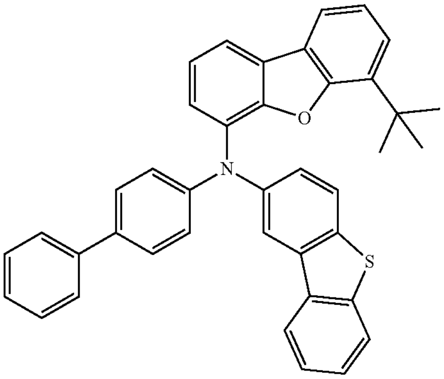

-continued
A61
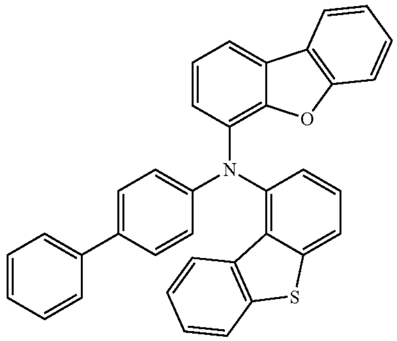
A62
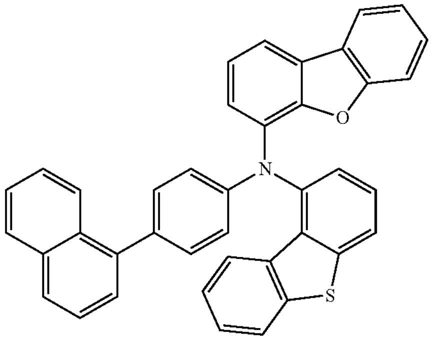
A63
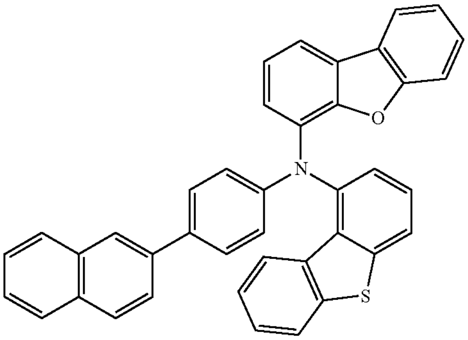
A64
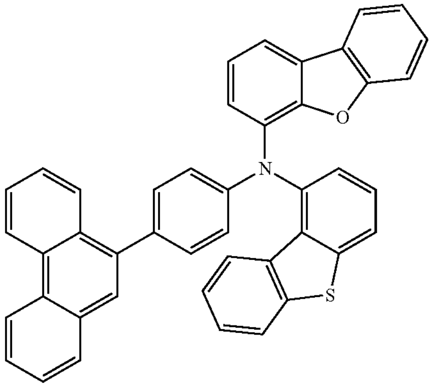
-continued
A65
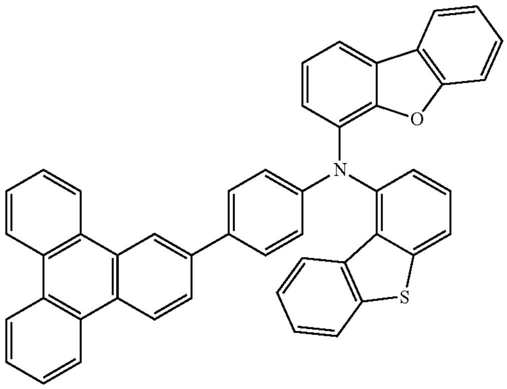
A66
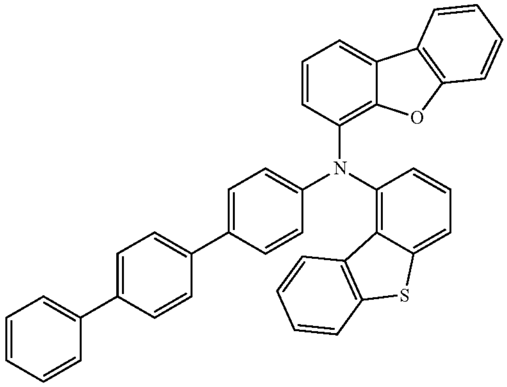
A67
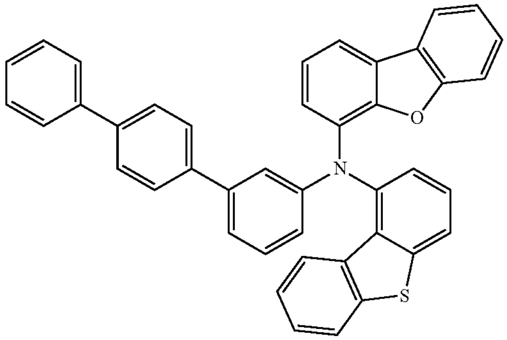
A68
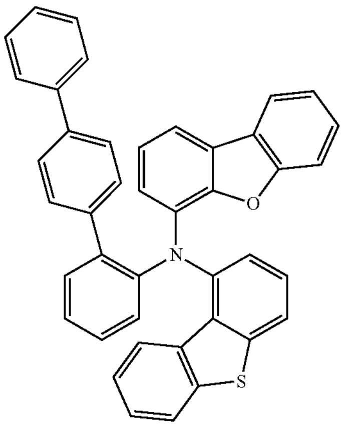

-continued
A69
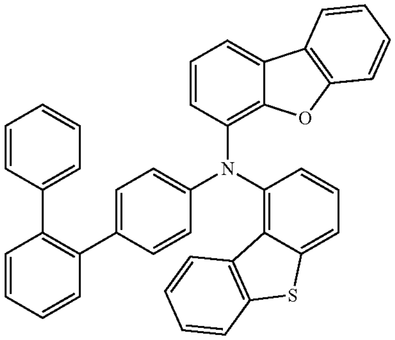
A70
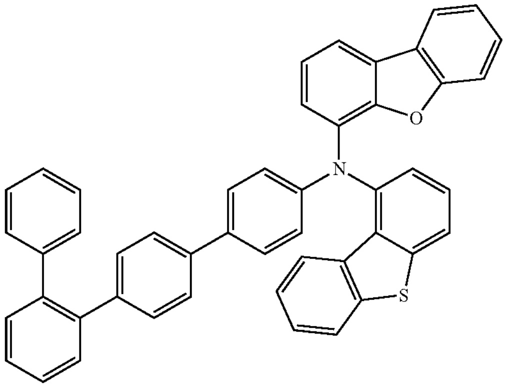
A71
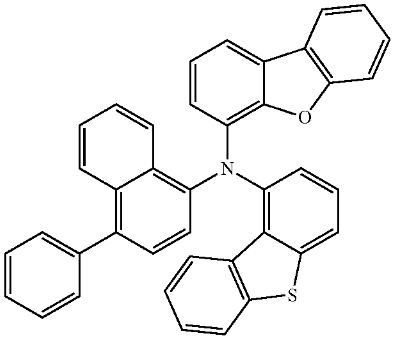
A72
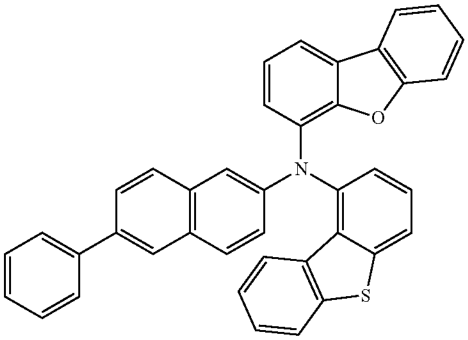
-continued
A73
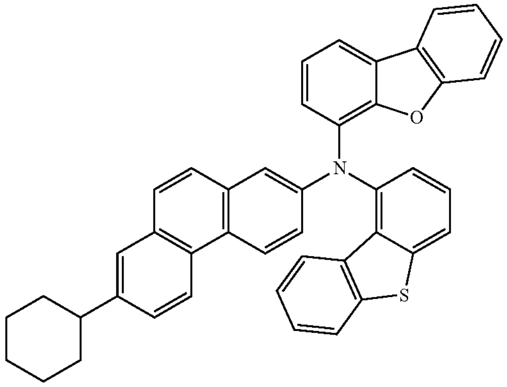
A74
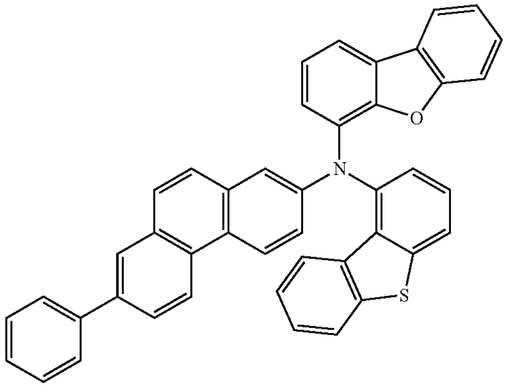
A75
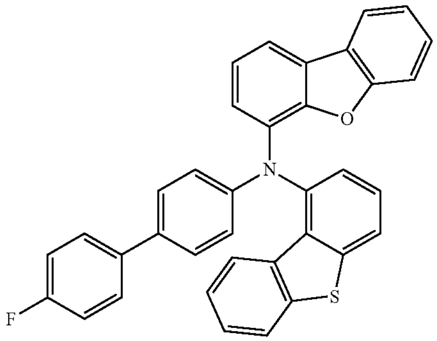
A76
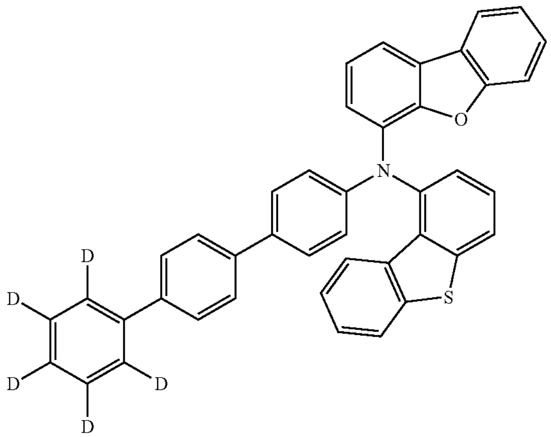

-continued
A77
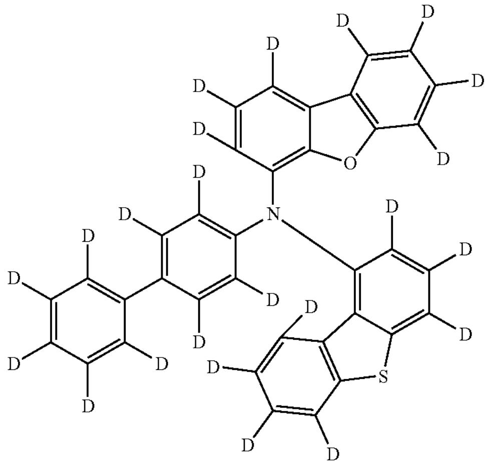
A78
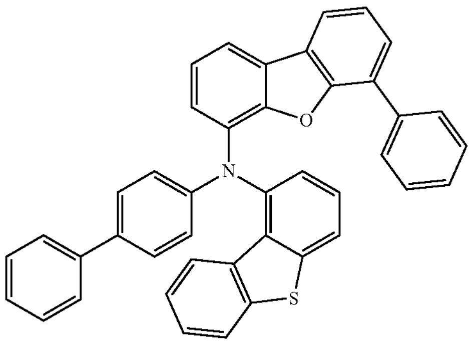
A79
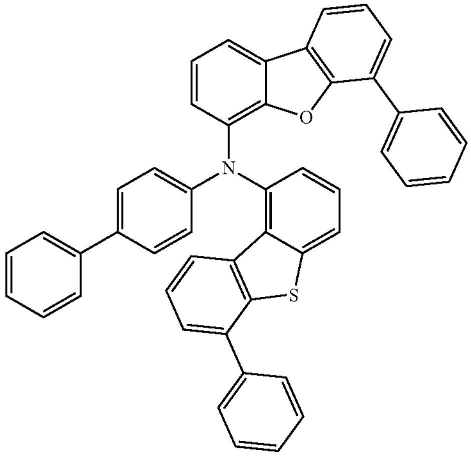
A80
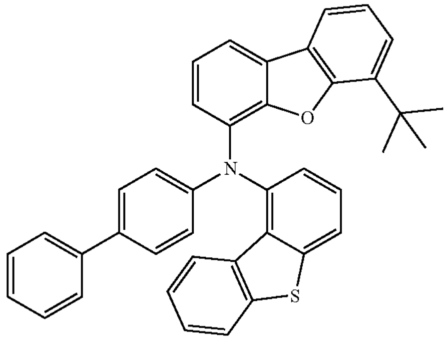
-continued
A81
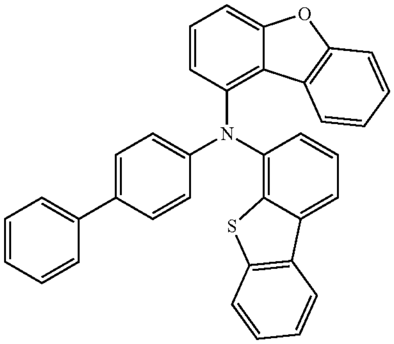
A82
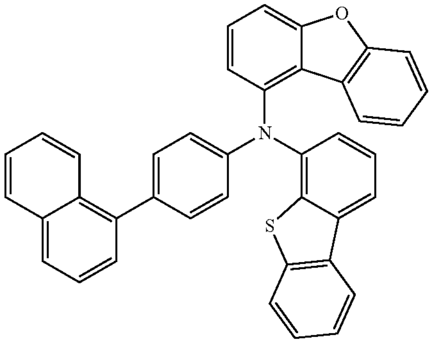
A83
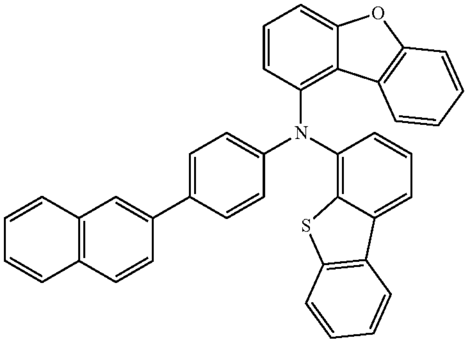
A84
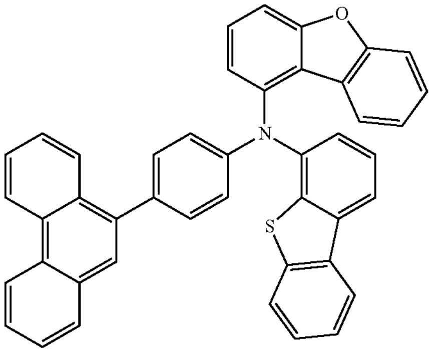

-continued
A85
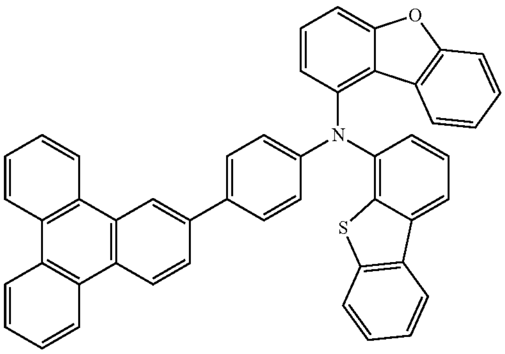
A86
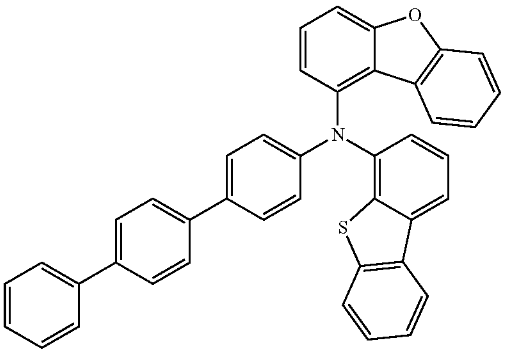
A87
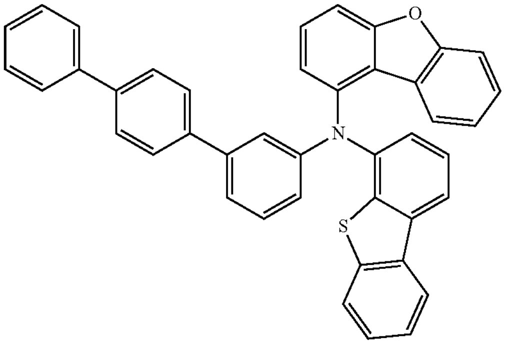
A88
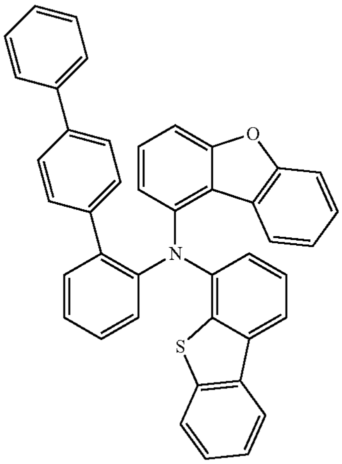
-continued
A89
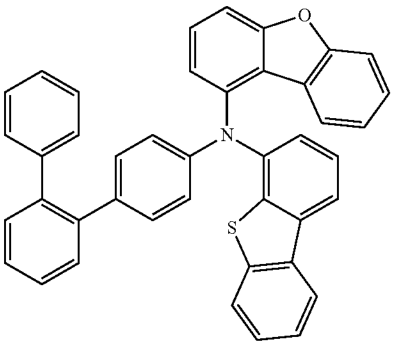
A90
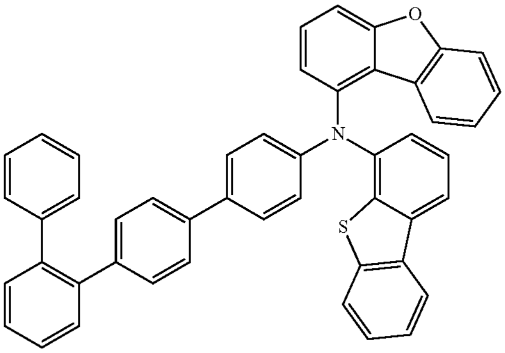
A91
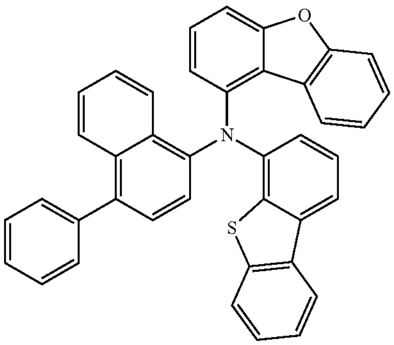
A92
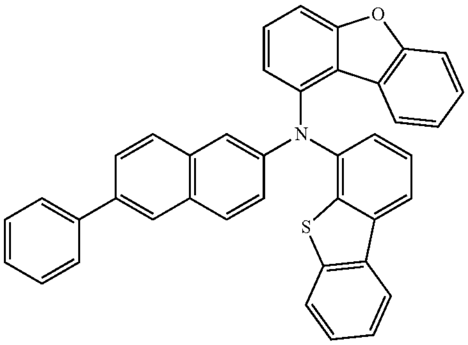

-continued
A93
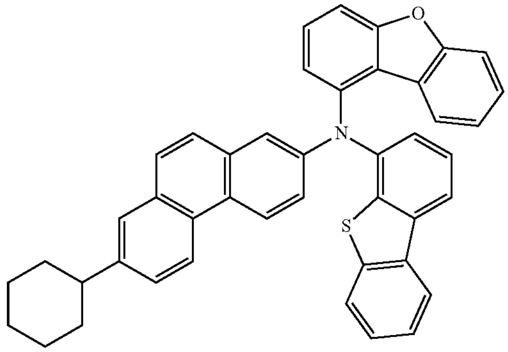
A94
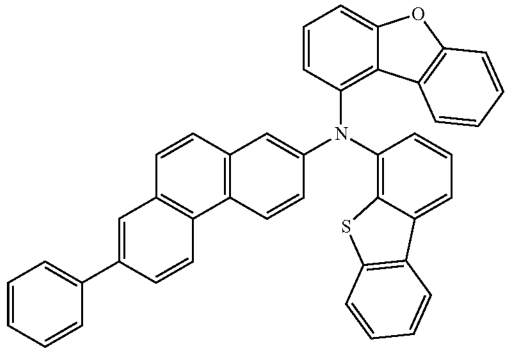
A95
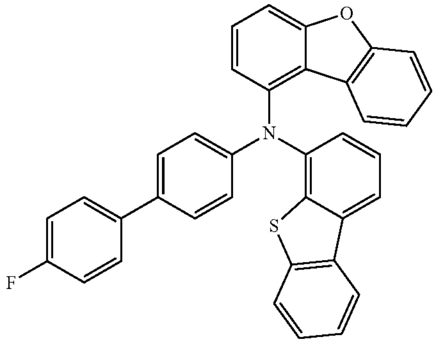
A96
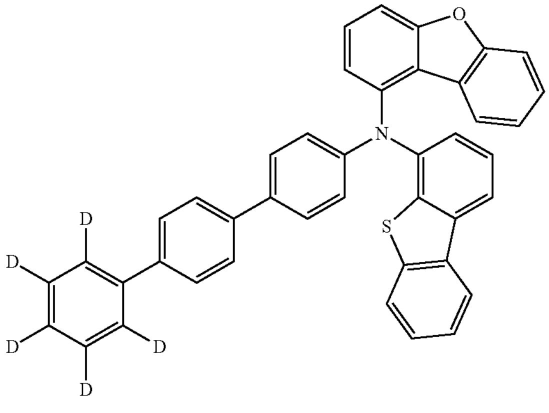
-continued
A97
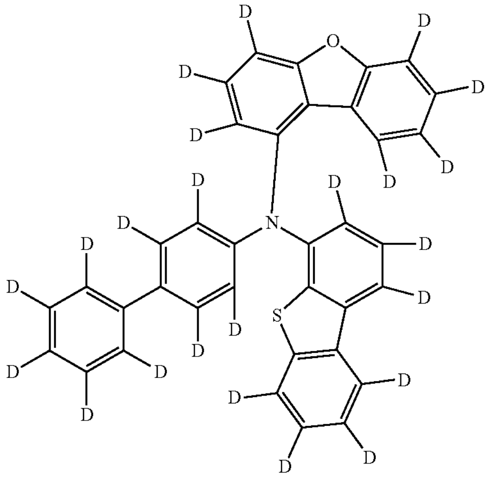
A98
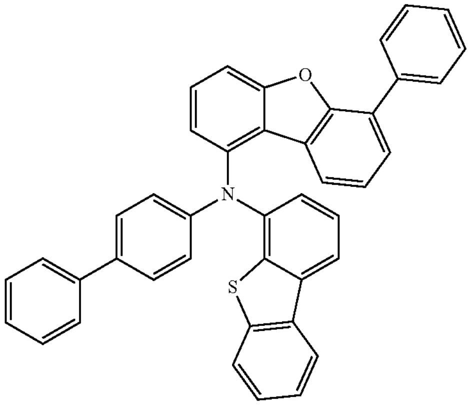
A99
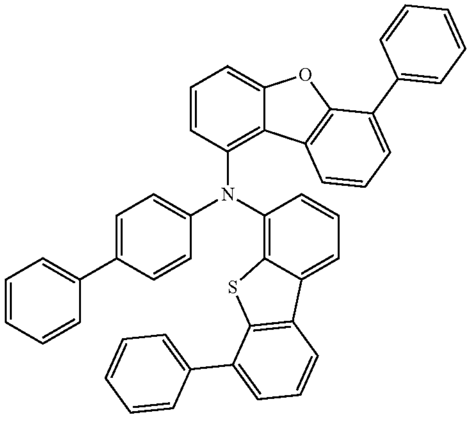

-continued
A100
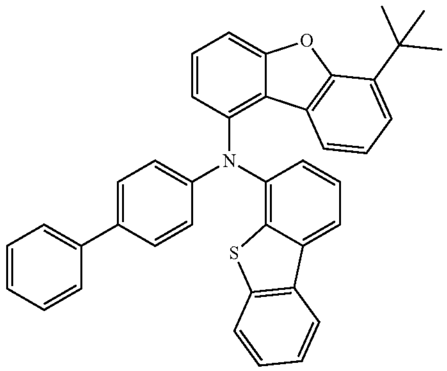
A101
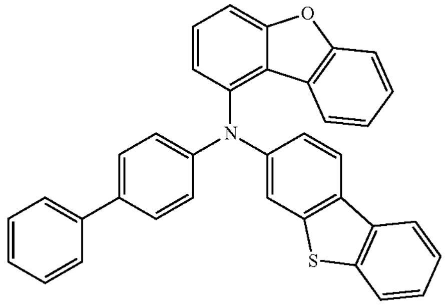
A102
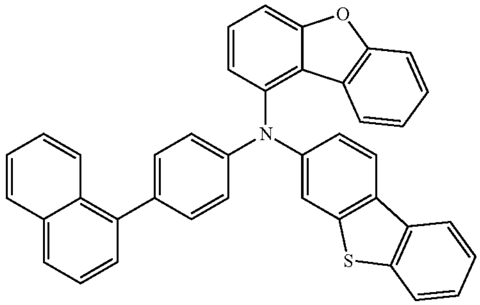
A103
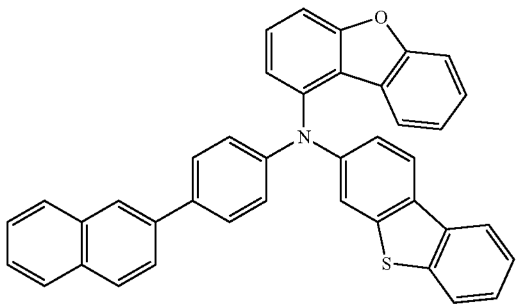
-continued
A104
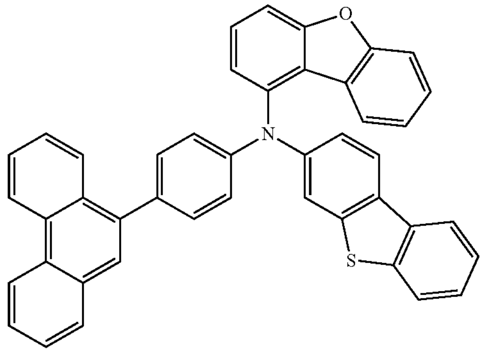
A105
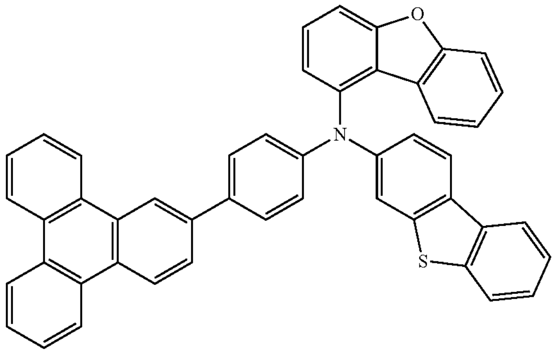
A106
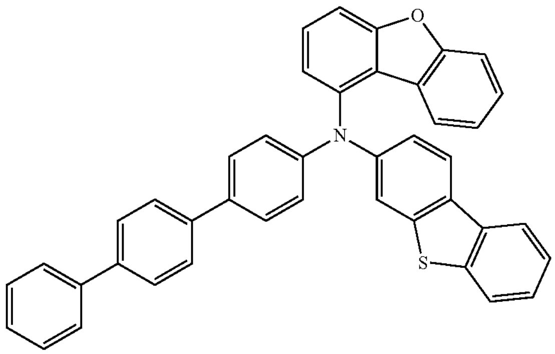
A107
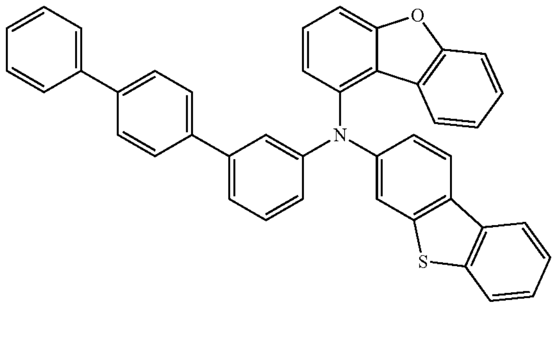

-continued
A108
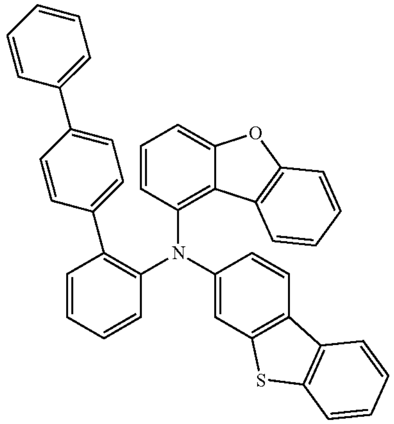
A109
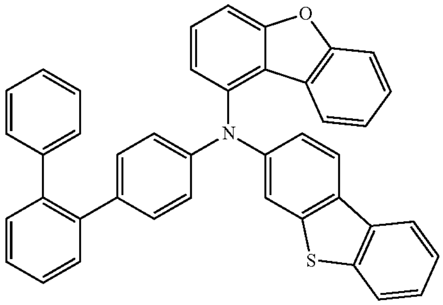
A110
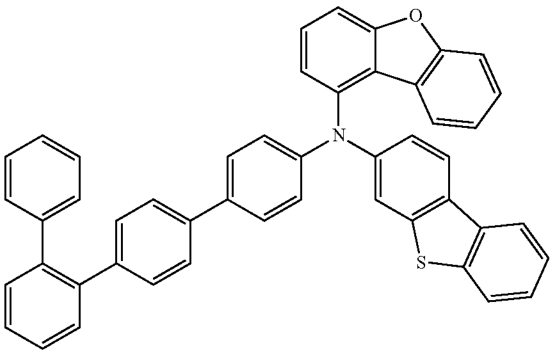
A111
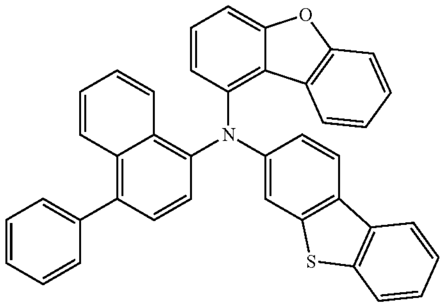
-continued
A112
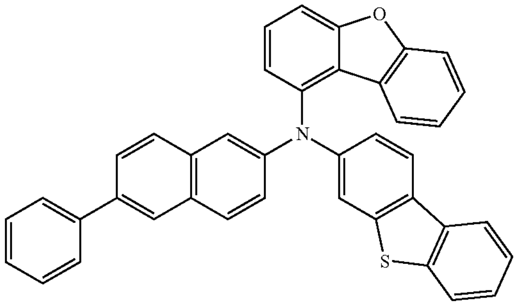
A113
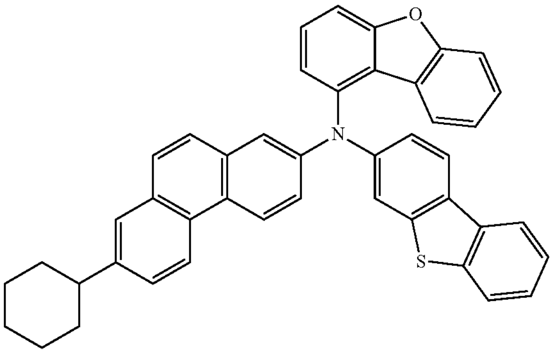
A114
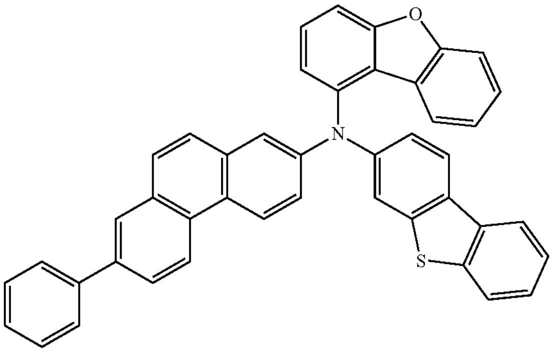
A115
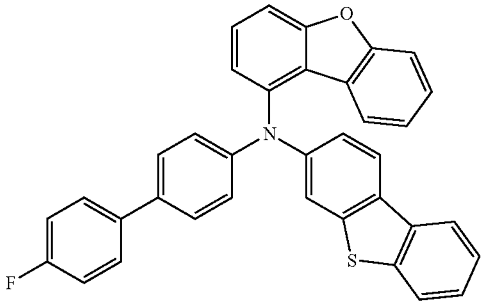

-continued
A116
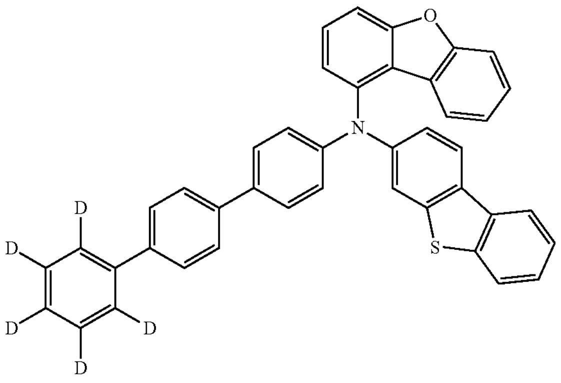
A117
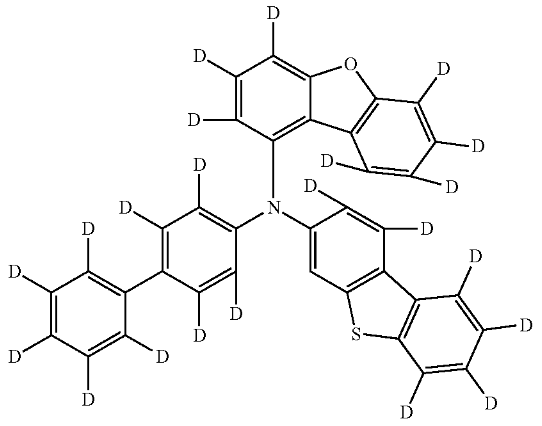
A118
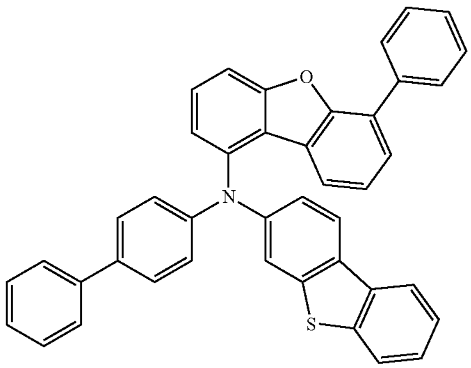
-continued
A119
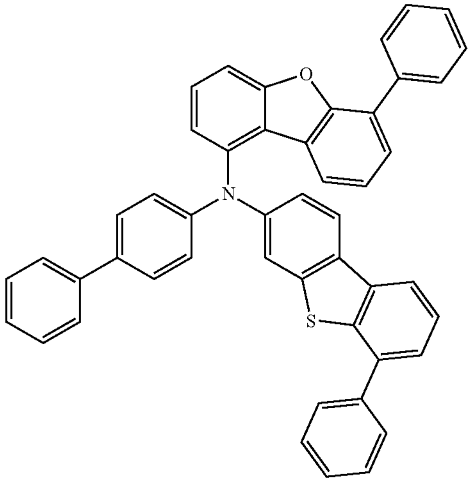
A120
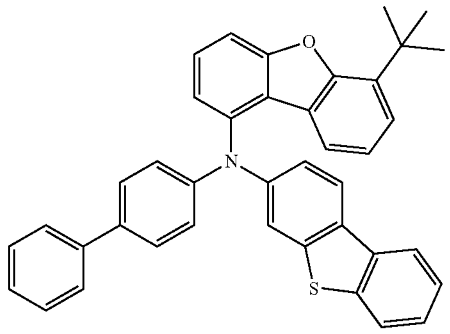
A121
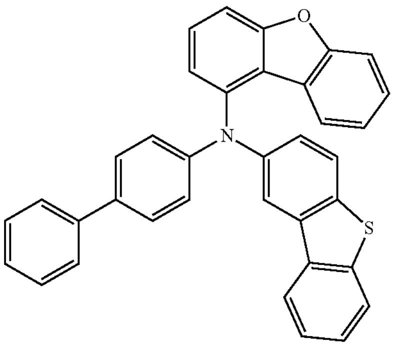
A122
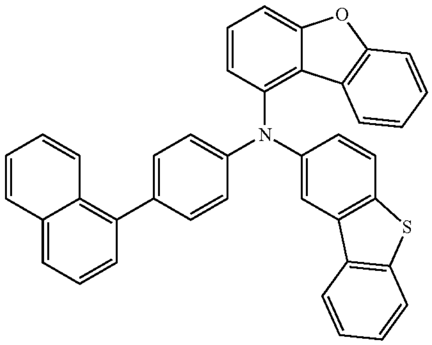

-continued
A123
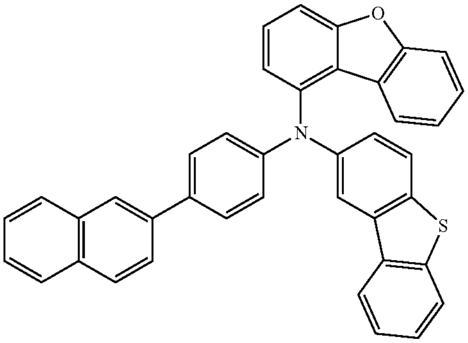
A124
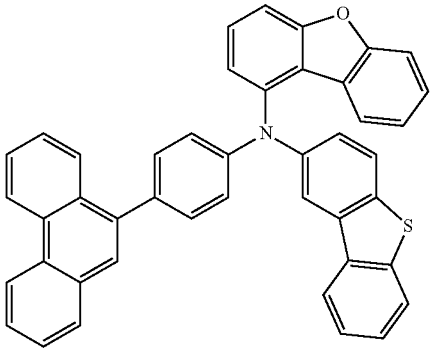
A125
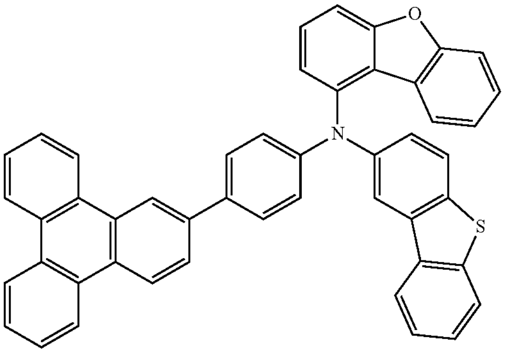
A126
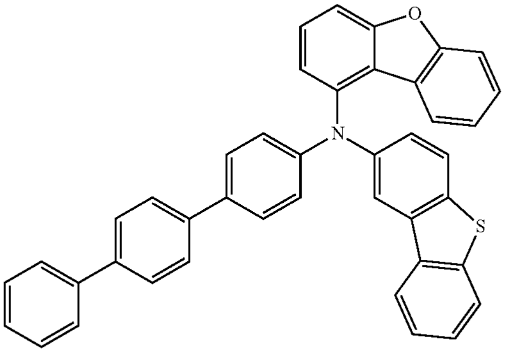
-continued
A127
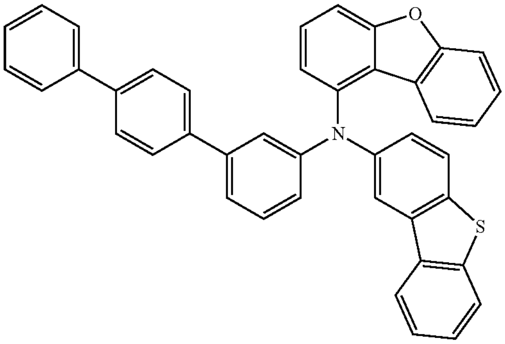
A128
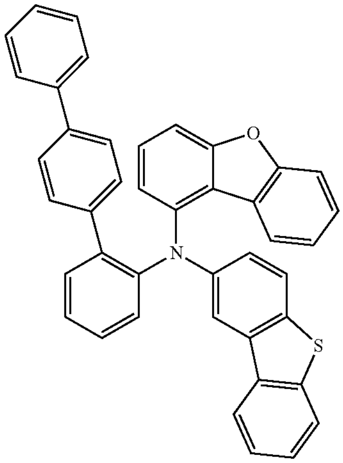
A129
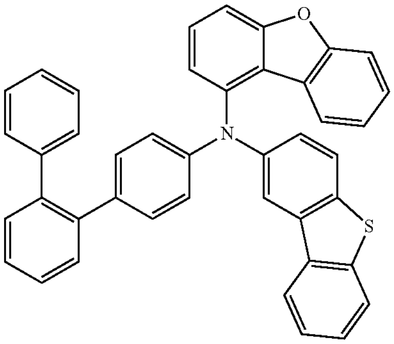
A130
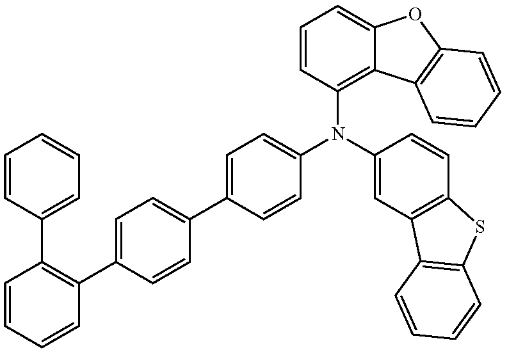

-continued
A131
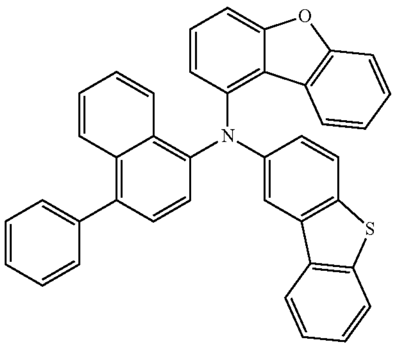
A132
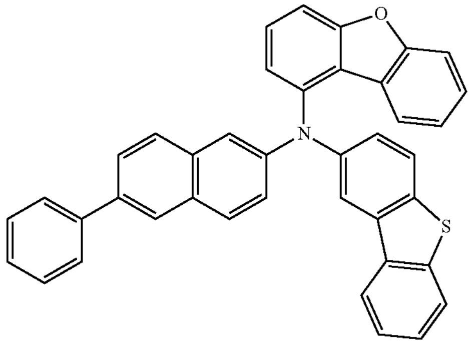
A133
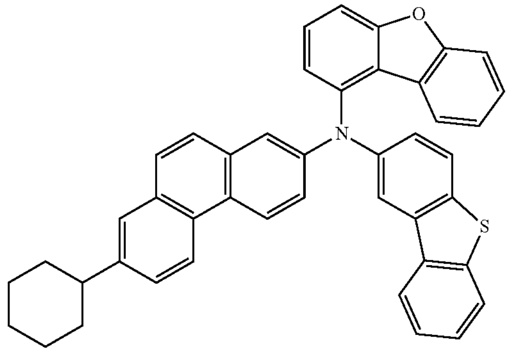
A134
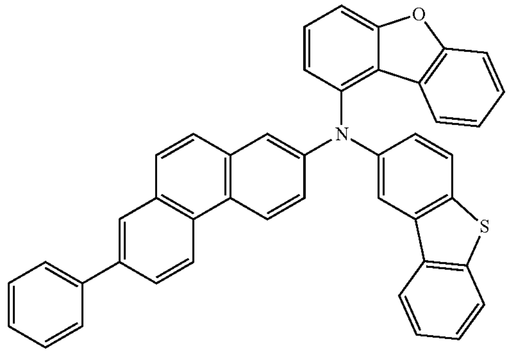
-continued
A135
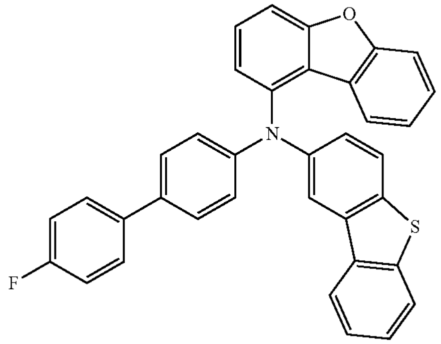
A136
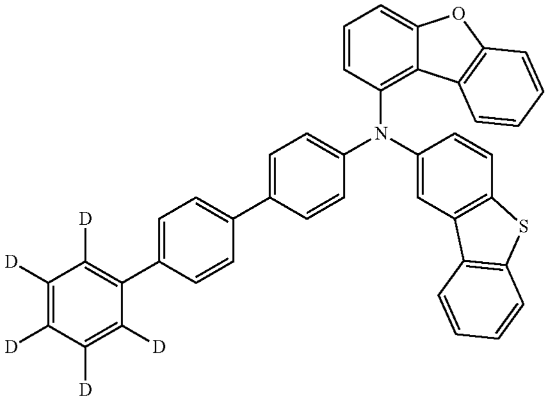
A137
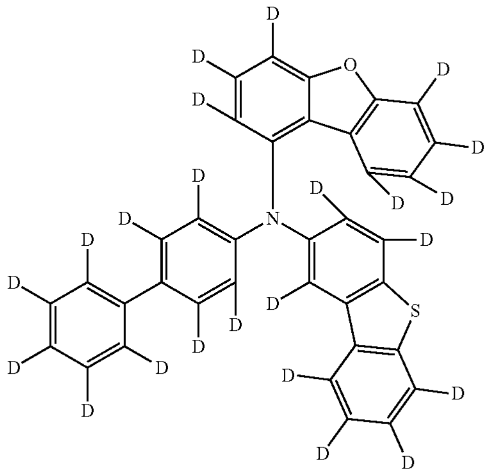
A138
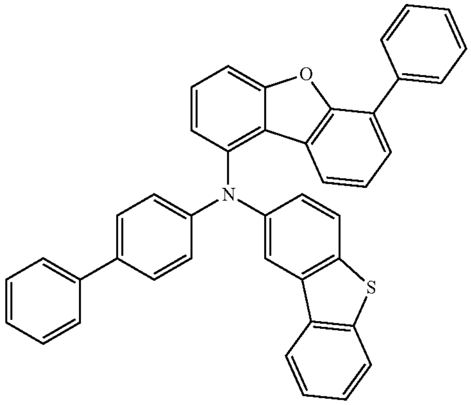

-continued
A139
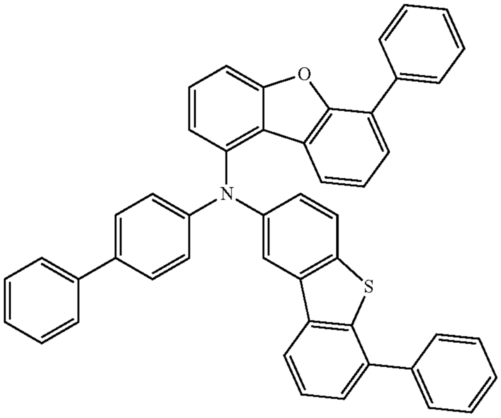
A140
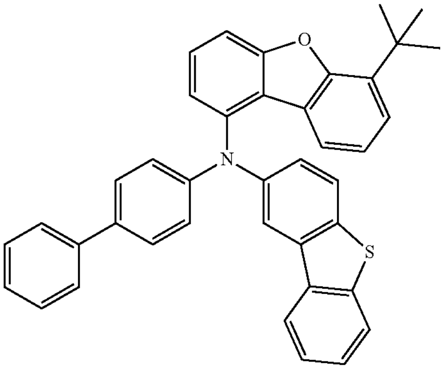
A141
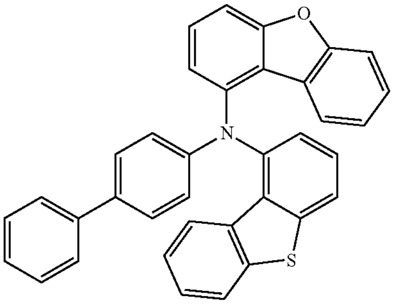
A142
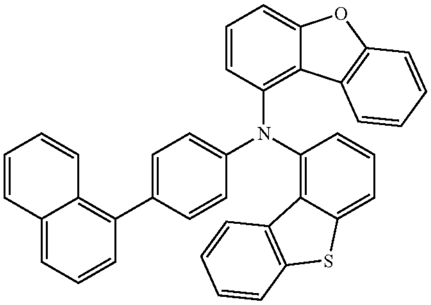
-continued
A143
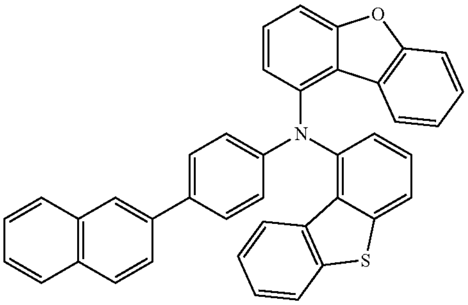
A144
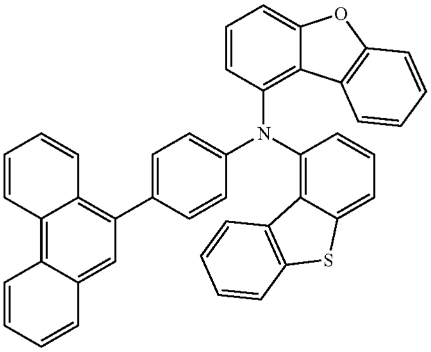
A145
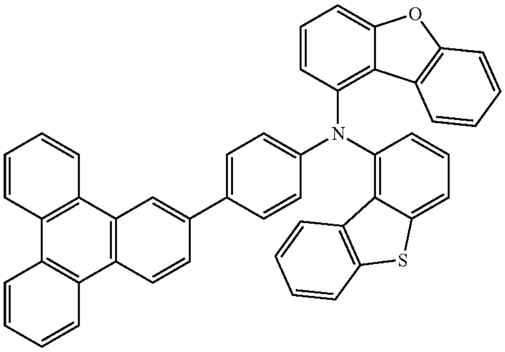
A146
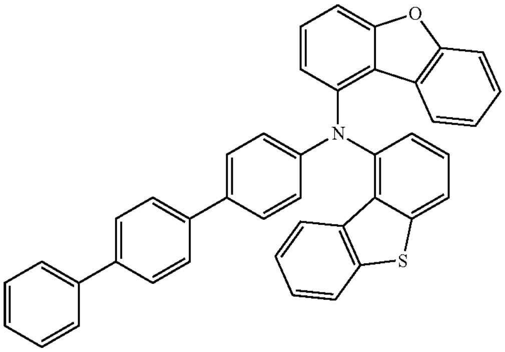

-continued
A147
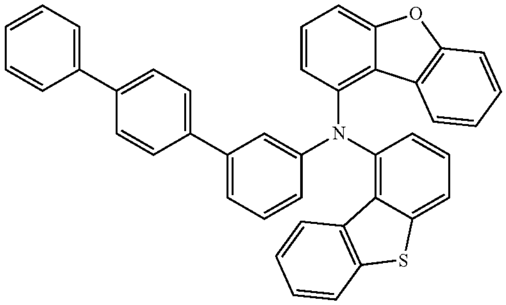
A148
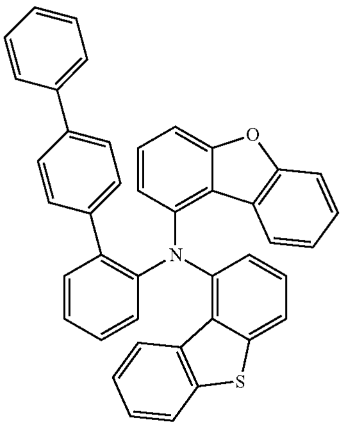
A149
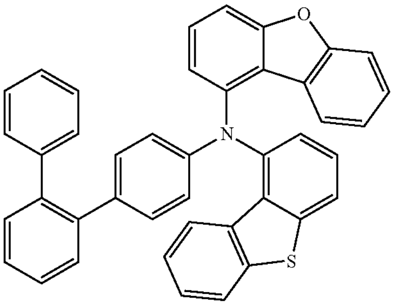
A150
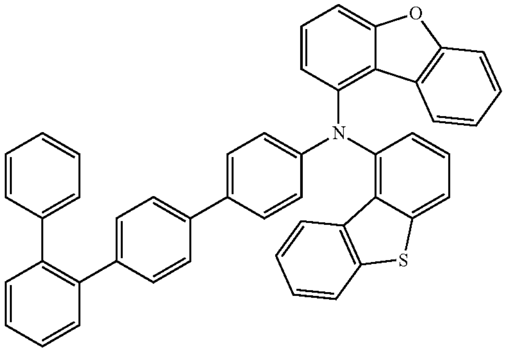
-continued
A151
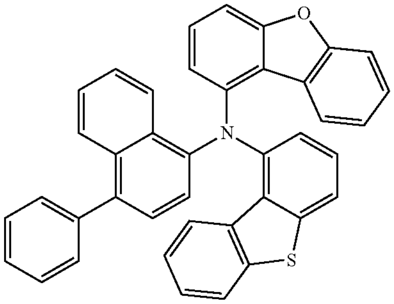
A152
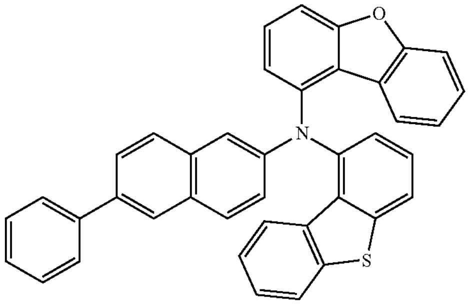
A153
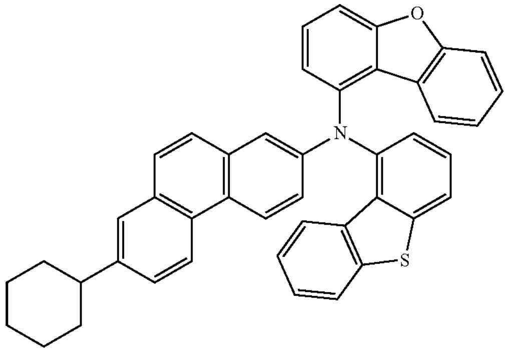
A154
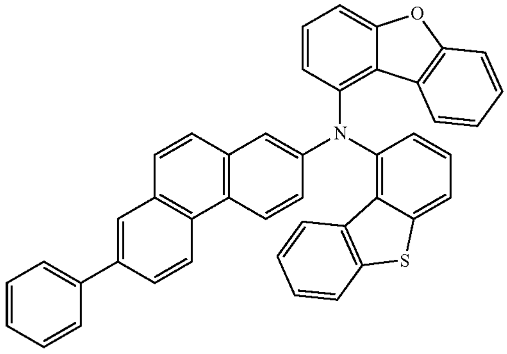

-continued
A155
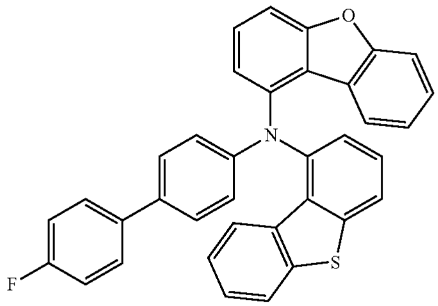
A156
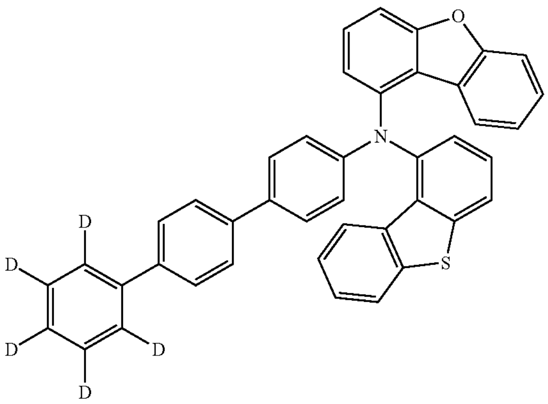
A157
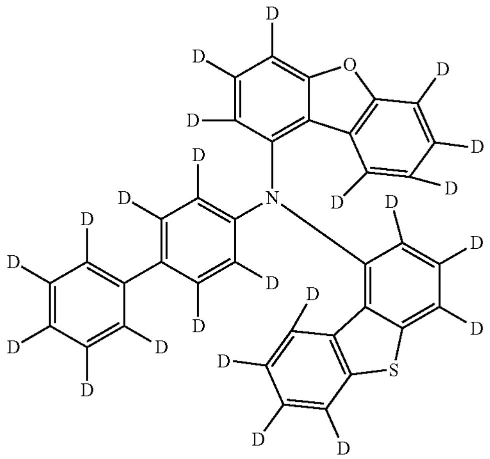
A158
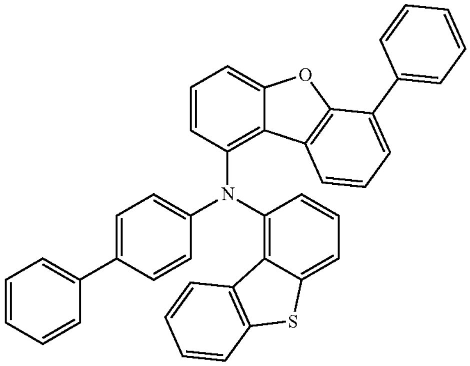
-continued
A159
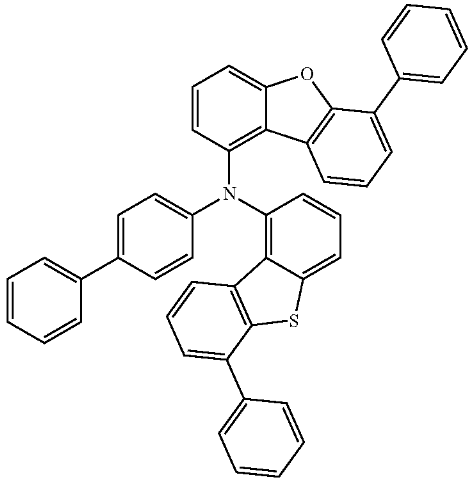
A160
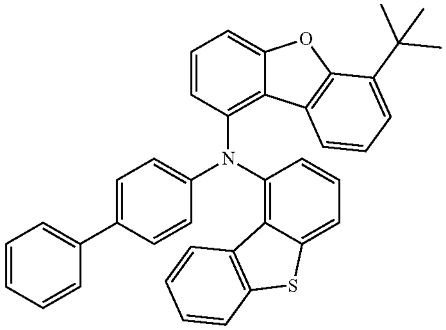
Compound Group B
B1
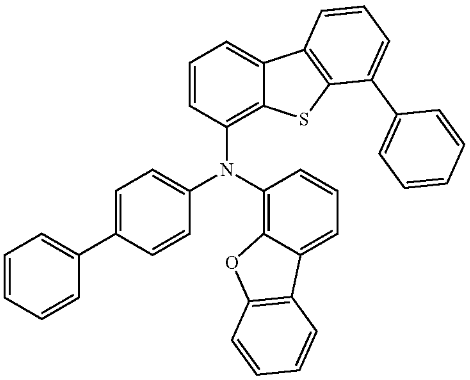
B2
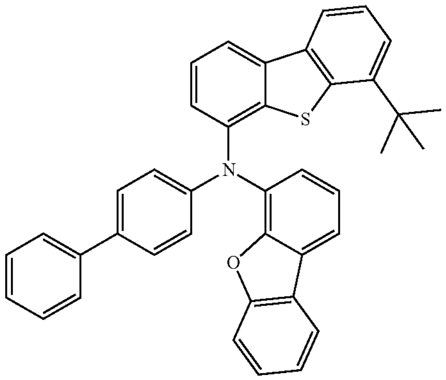

-continued
B3
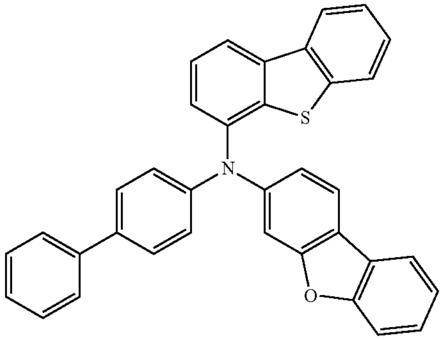
B4
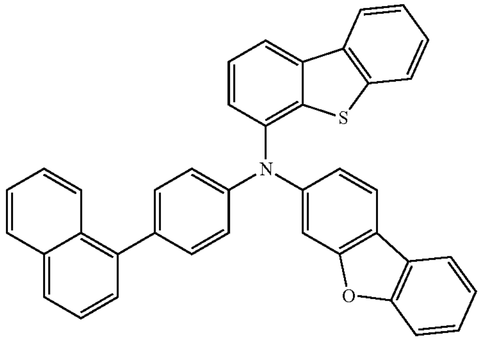
B5
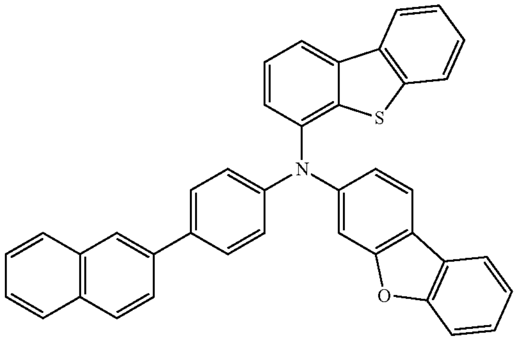
B6
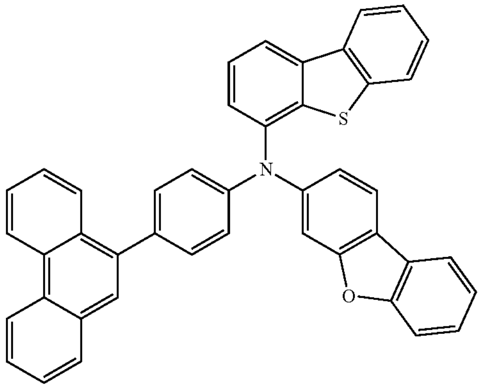
-continued
B7
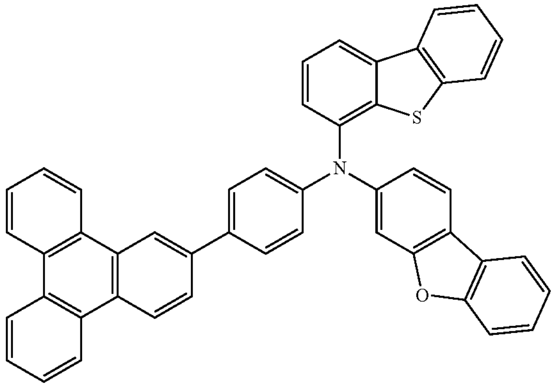
B8
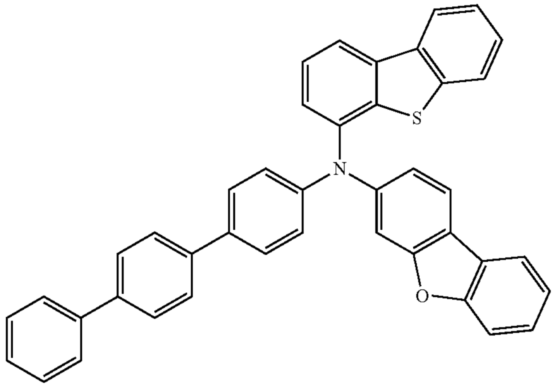
B9
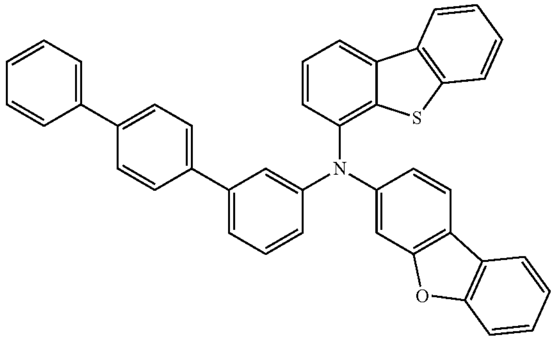
B10
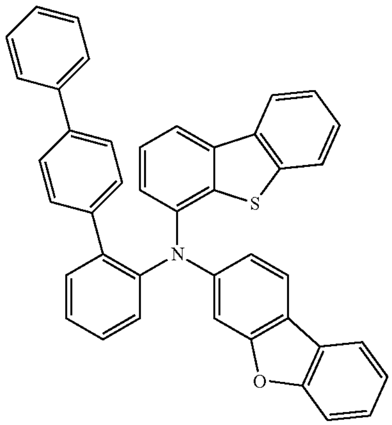

-continued
B11
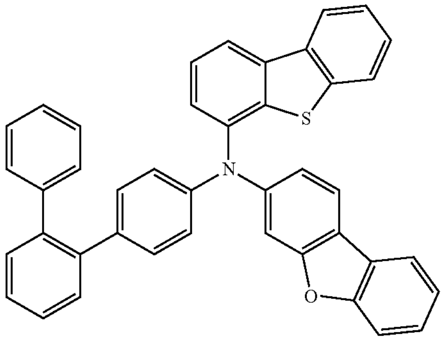
B12
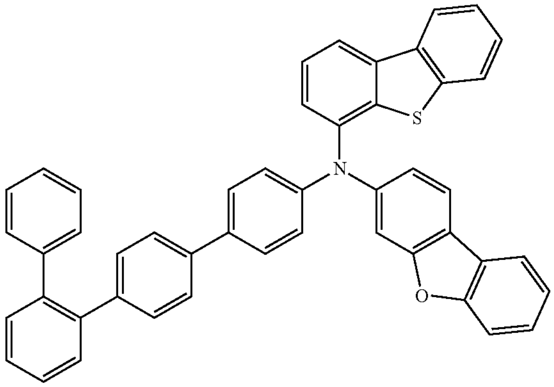
B13
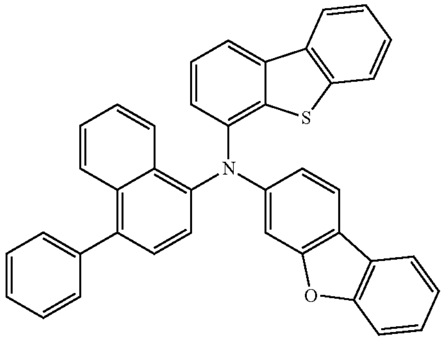
B14
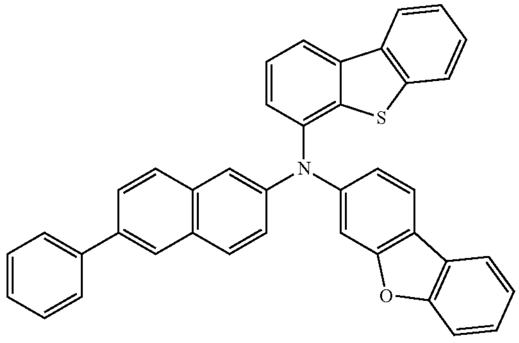
-continued
B15
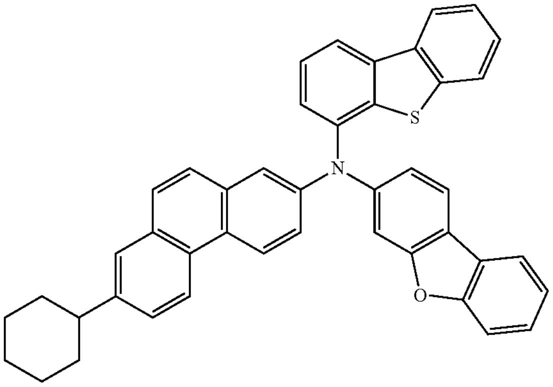
B16
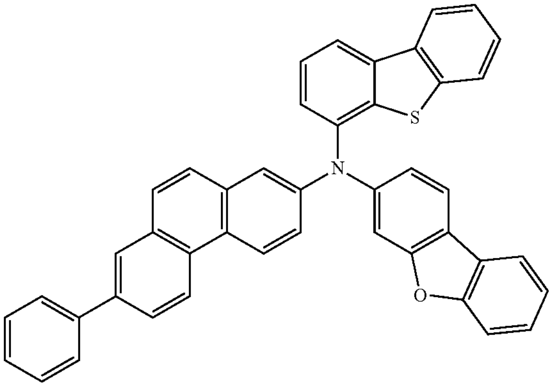
B17
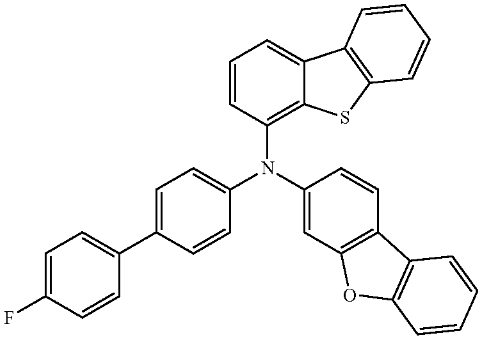
B18
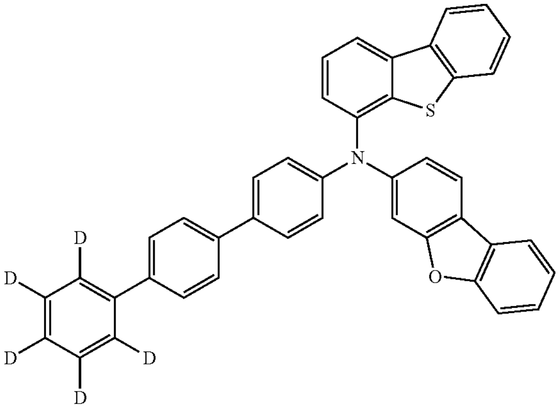

-continued
B19
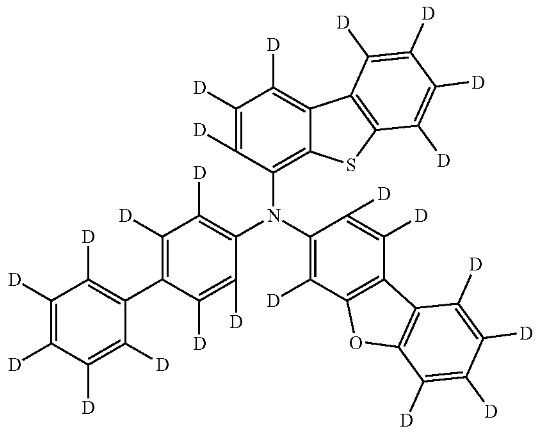
B20
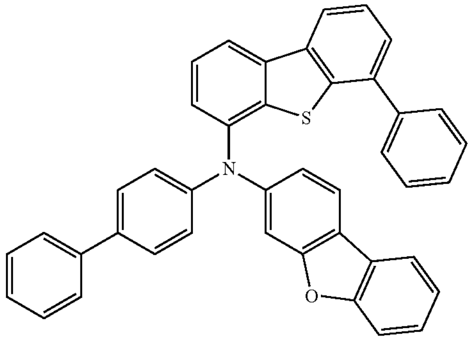
B21
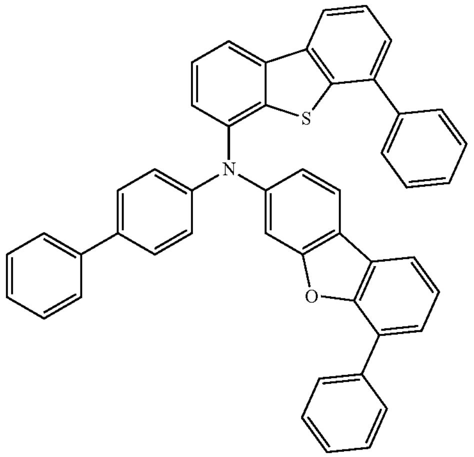
B22
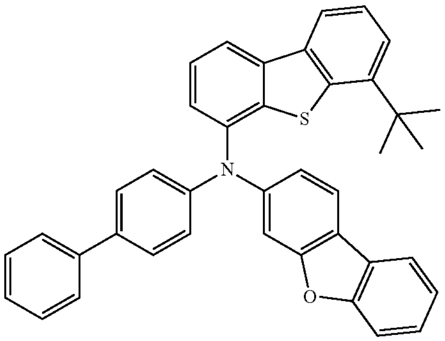
-continued
B23
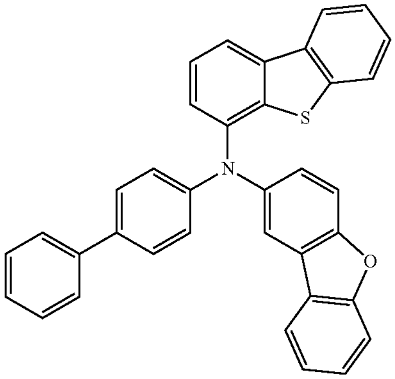
B24
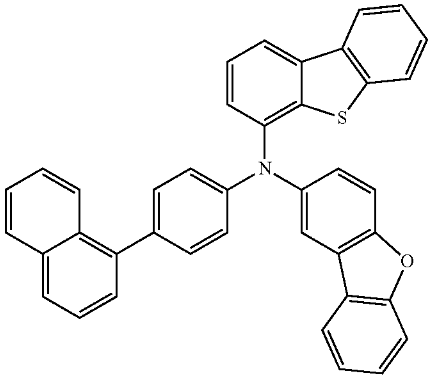
B25
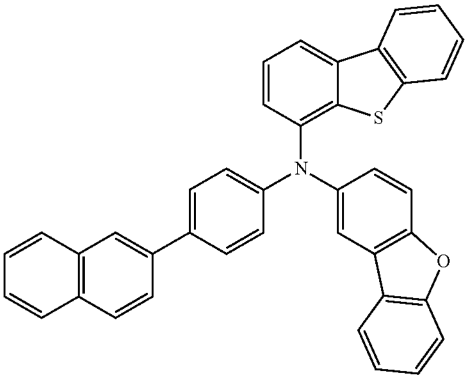
B26
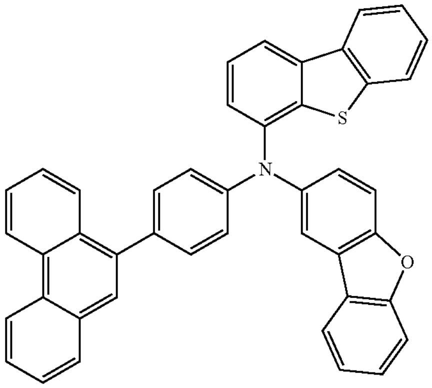

-continued
B27
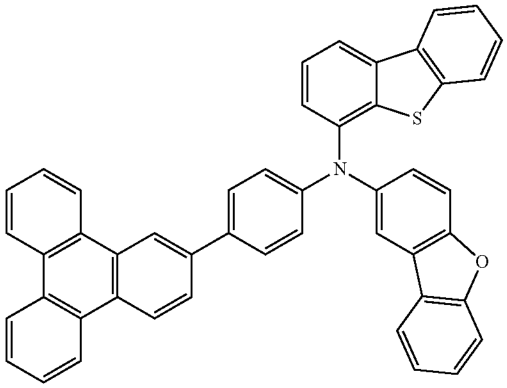
B28
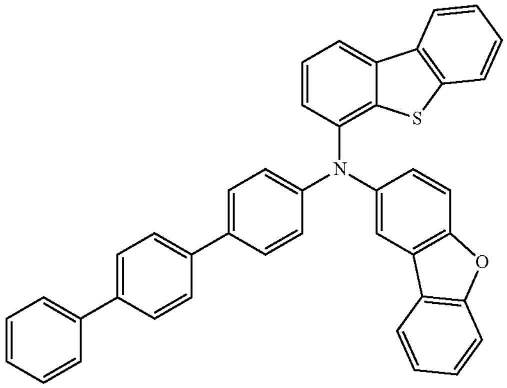
B29
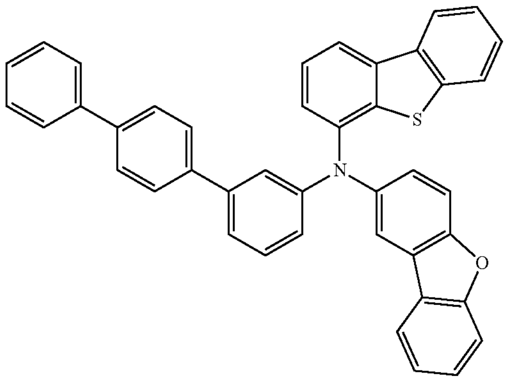
B30
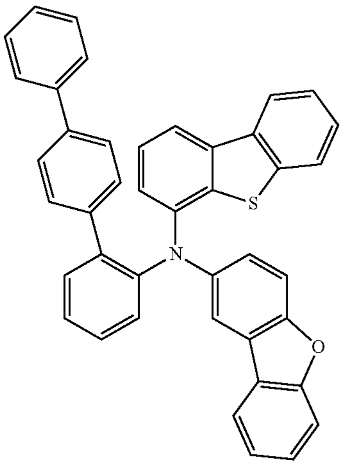
-continued
B31
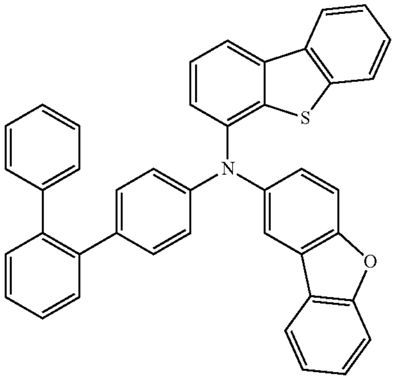
B32
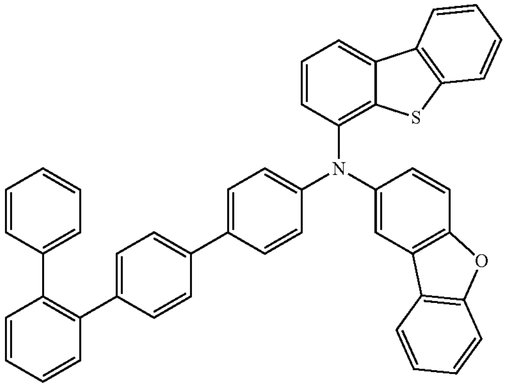
B33
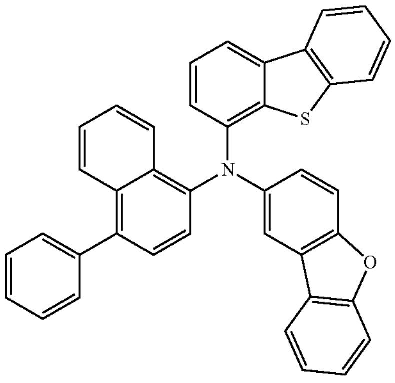
B34
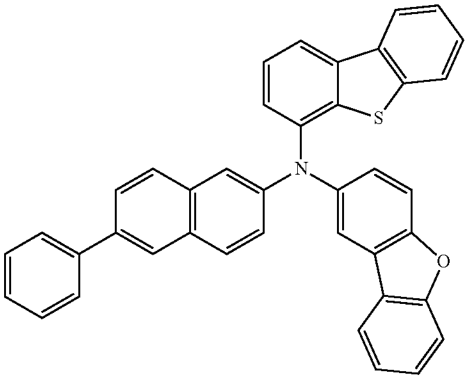

-continued
B35
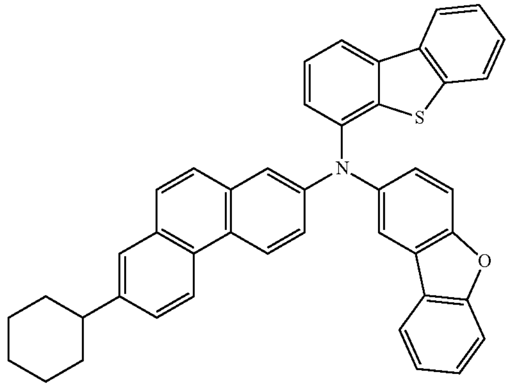
B36
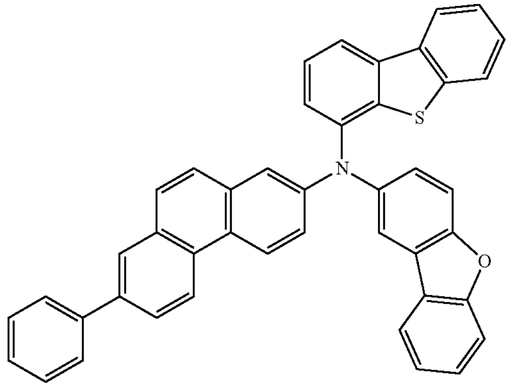
B37
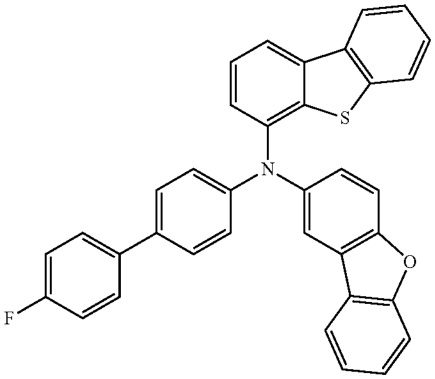
B38
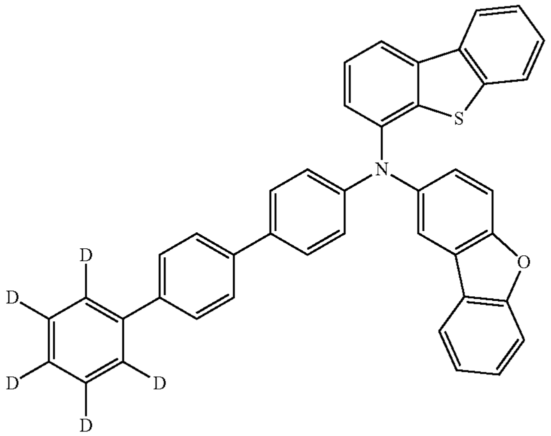
-continued
B39
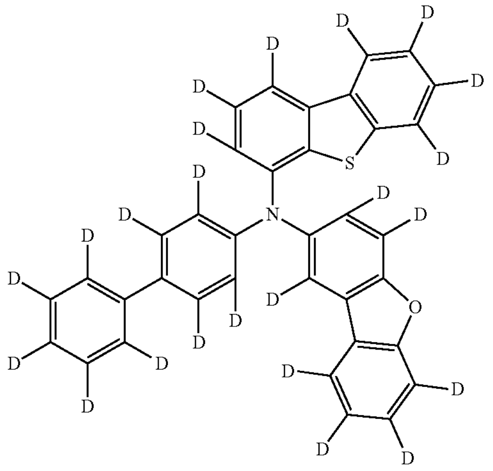
B40
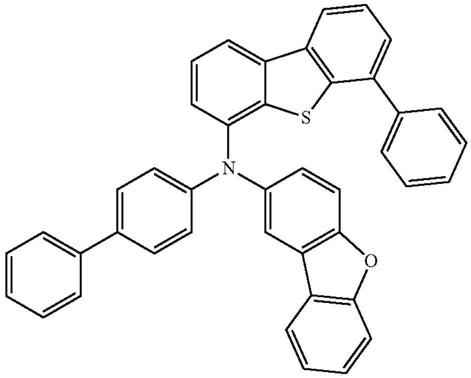
B41
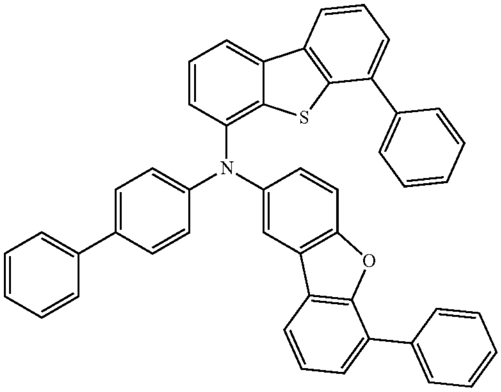
B42
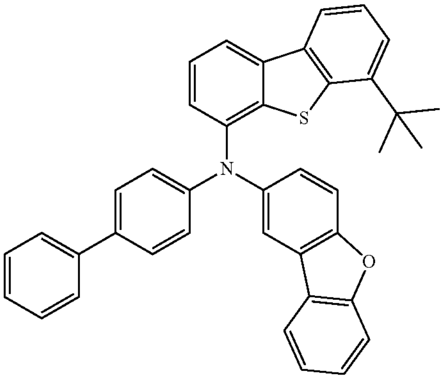

-continued
B43
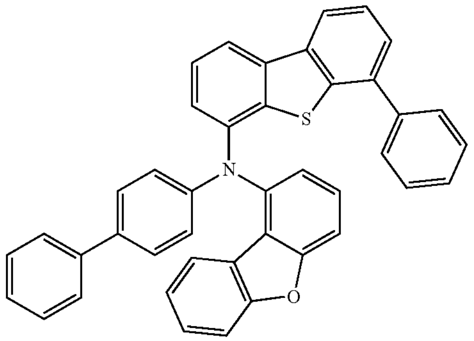
B44
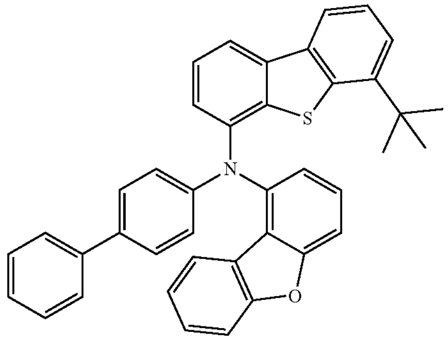
B45
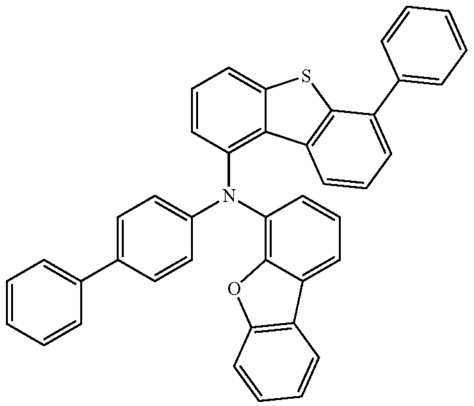
B46
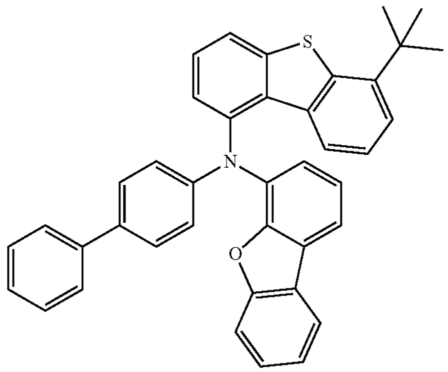
-continued
B47
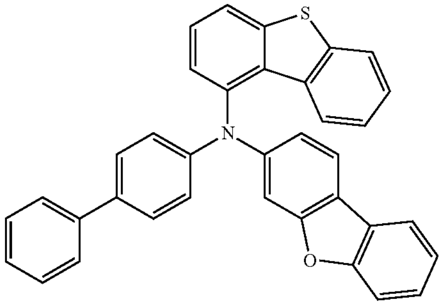
B48
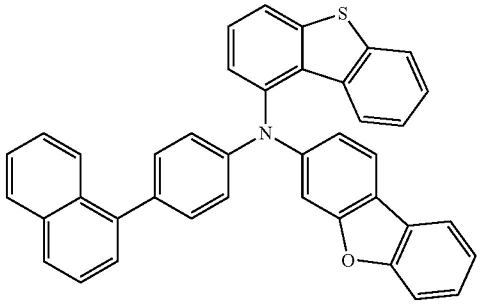
B49
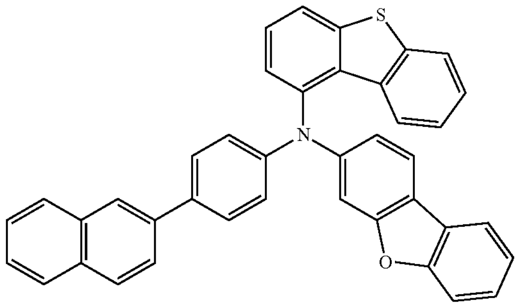
B50
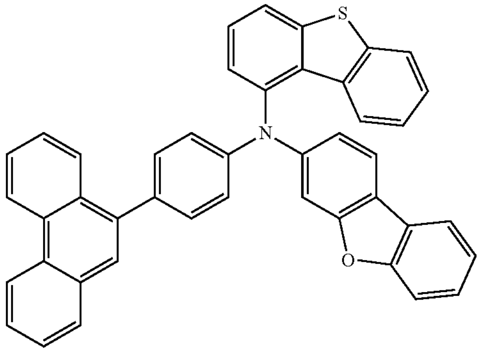

-continued
B51
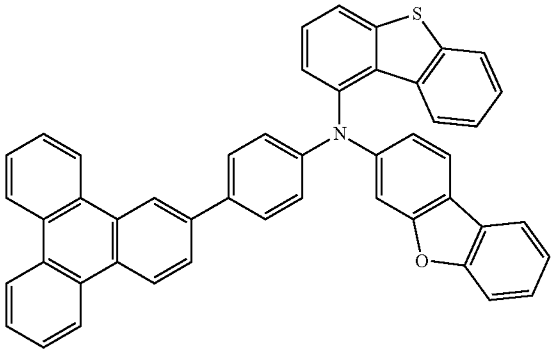
B52
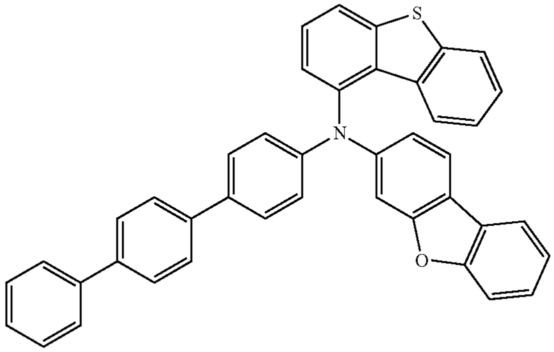
B53
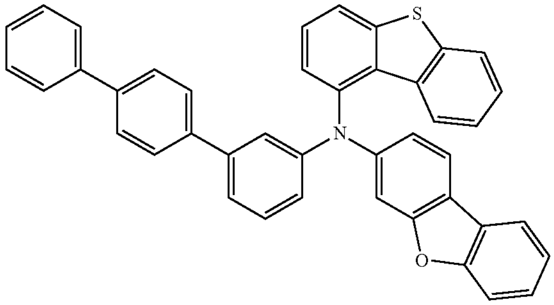
B54
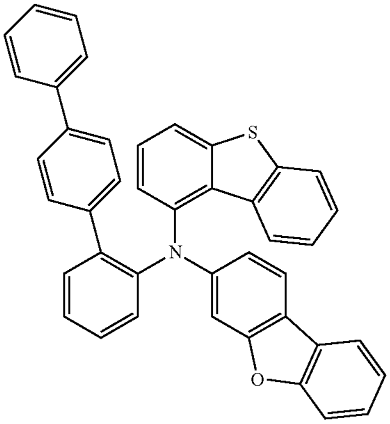
-continued
B55
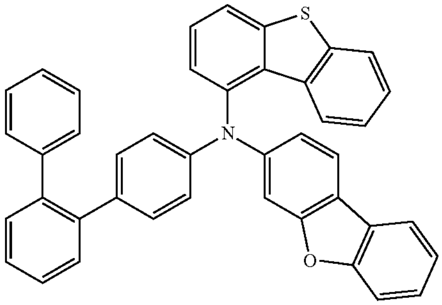
B56
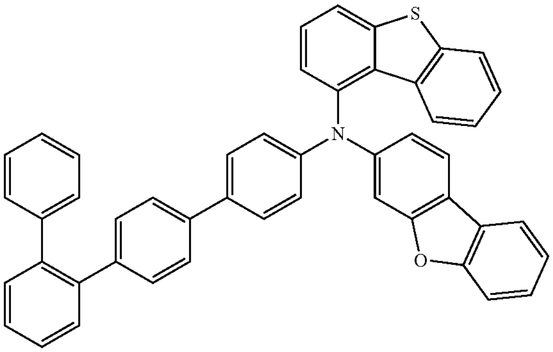
B57
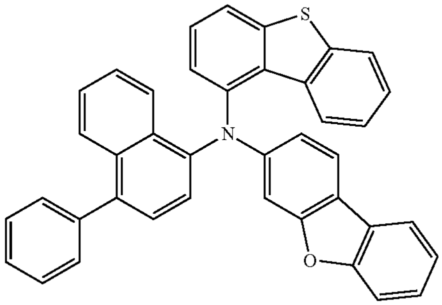
B58
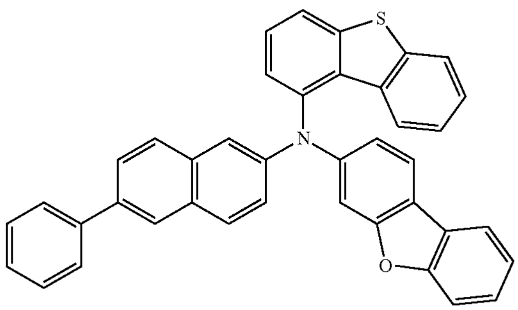

-continued
B59
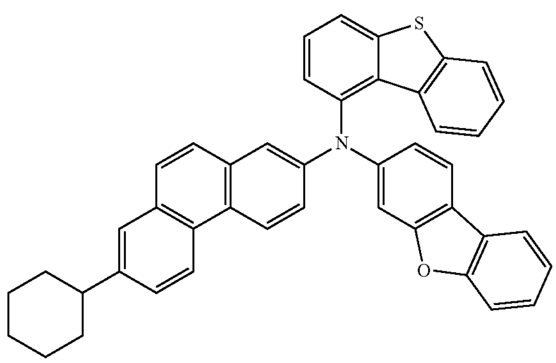
B60
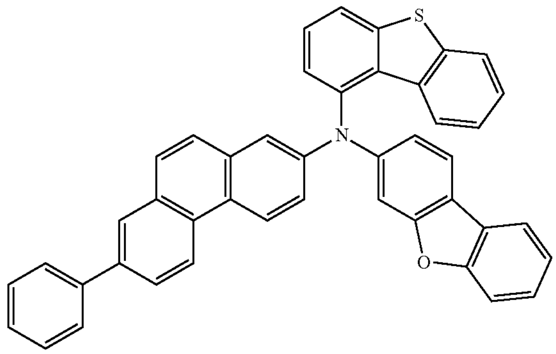
B61
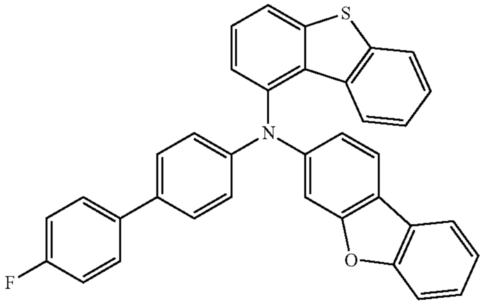
B62
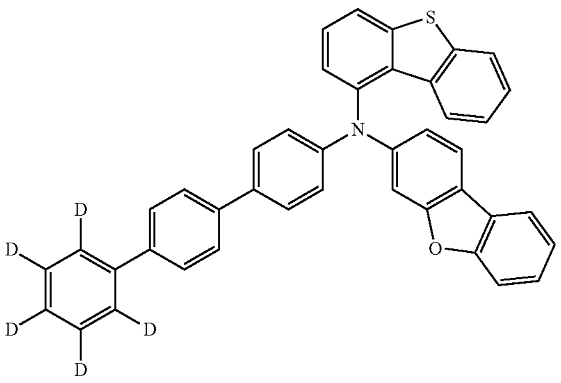
-continued
B63
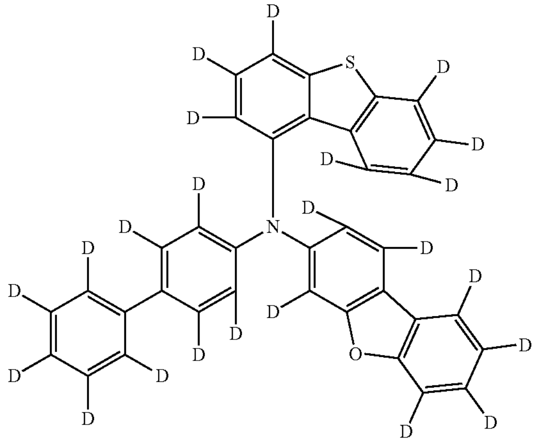
B64
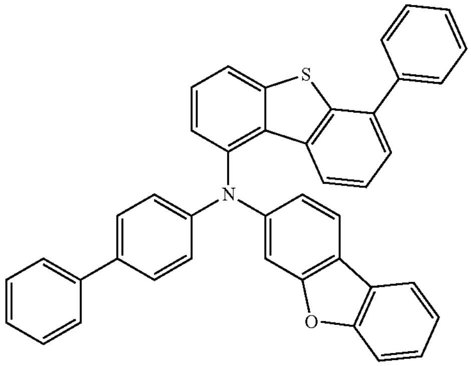
B65
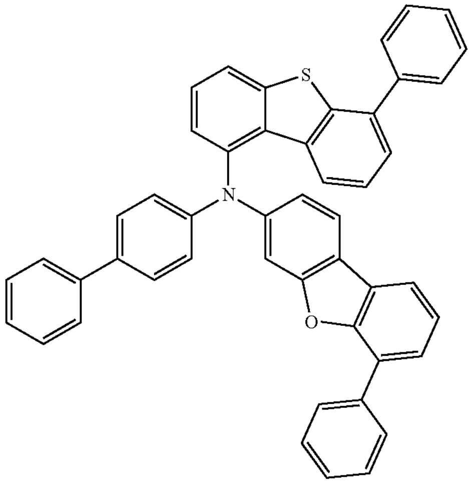
B66
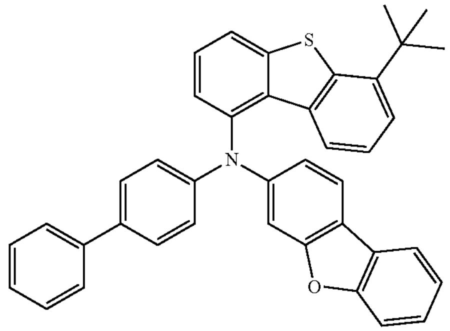

B67
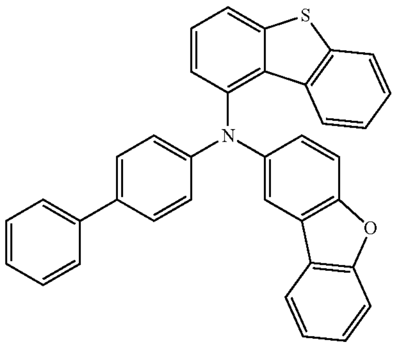
B68
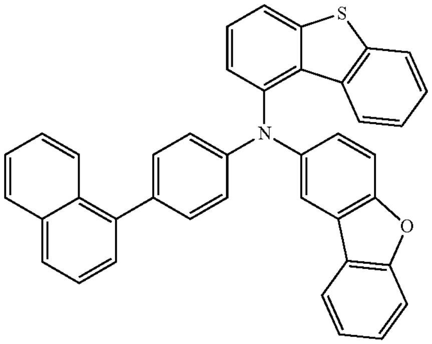
B69
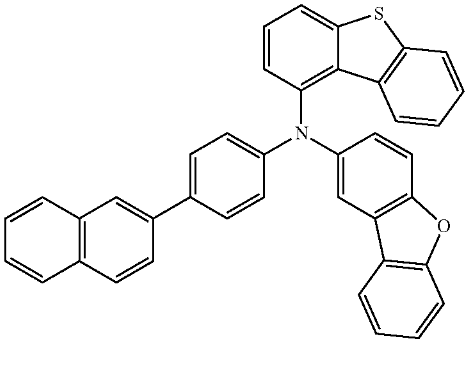
B70
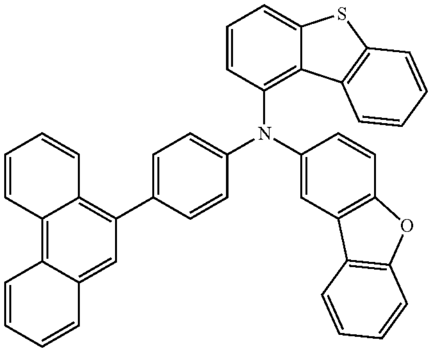
B71
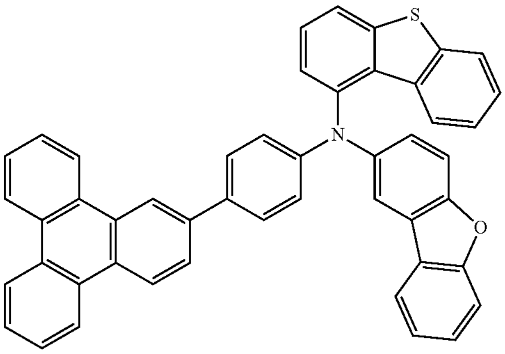
B72
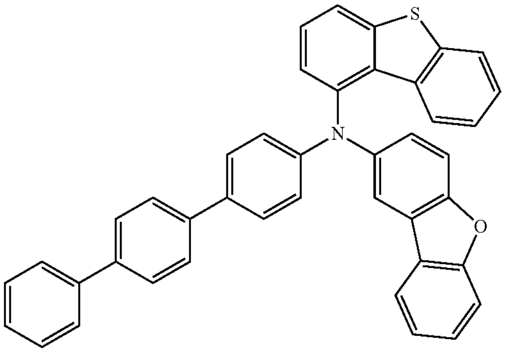
B73
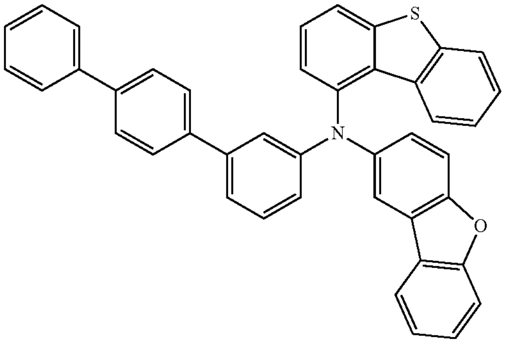
B74
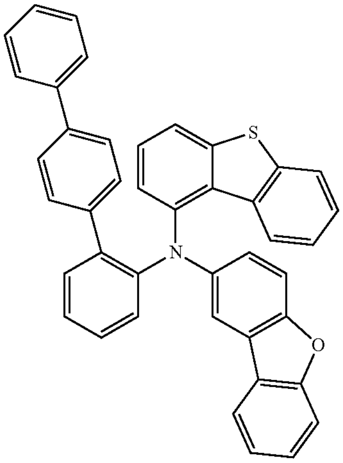

-continued
B75
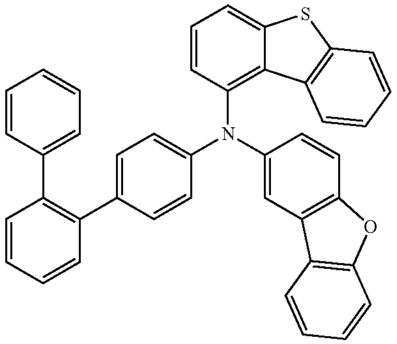
B76
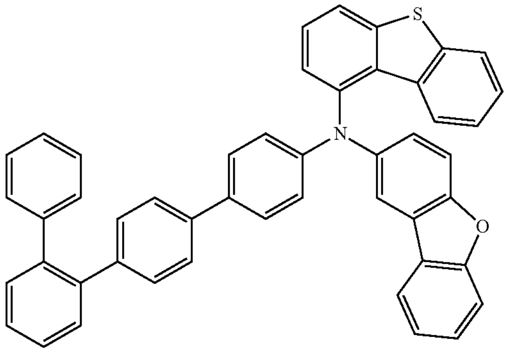
B77
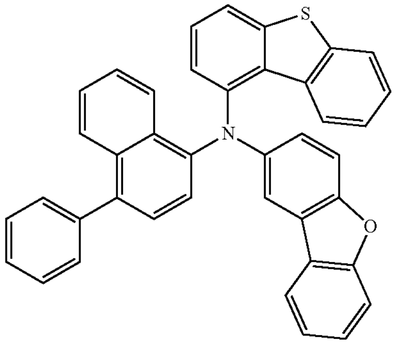
B78
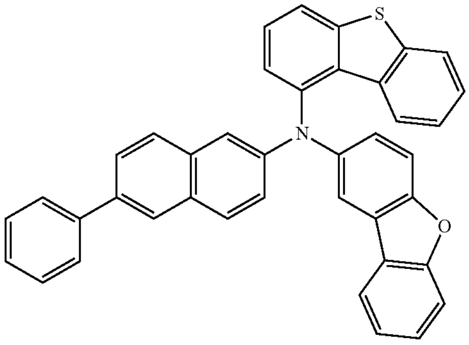
-continued
B79
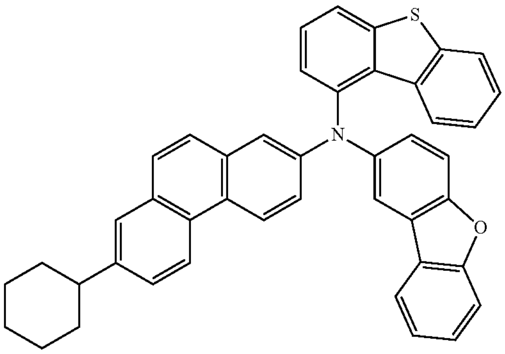
B80
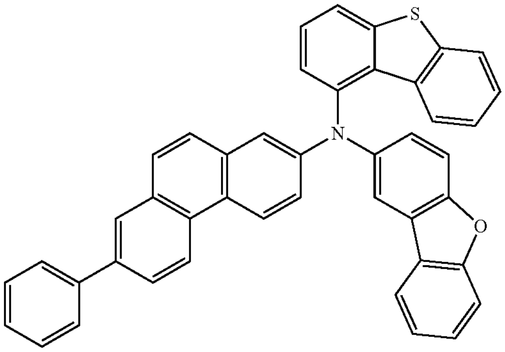
B81
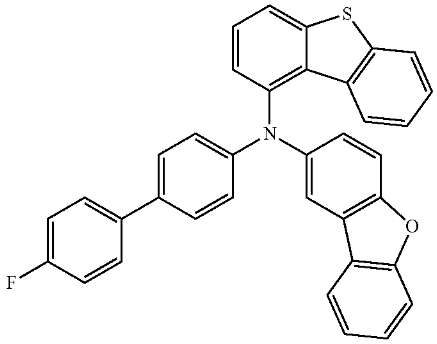
B82
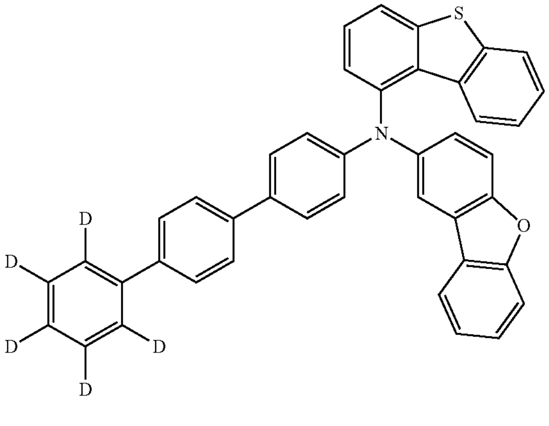

-continued

B83

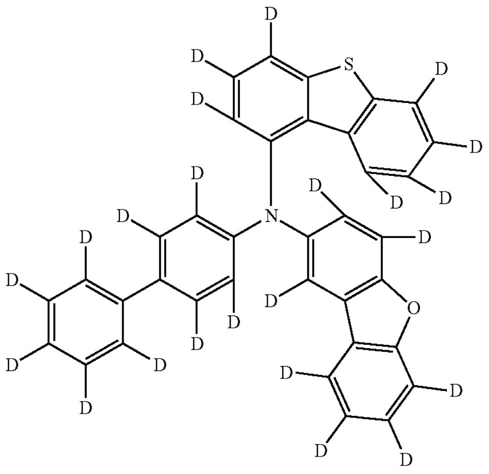

B84

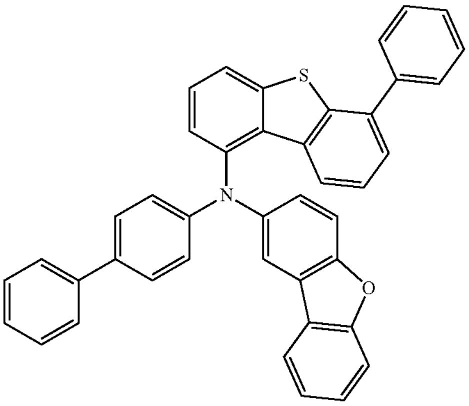

B85

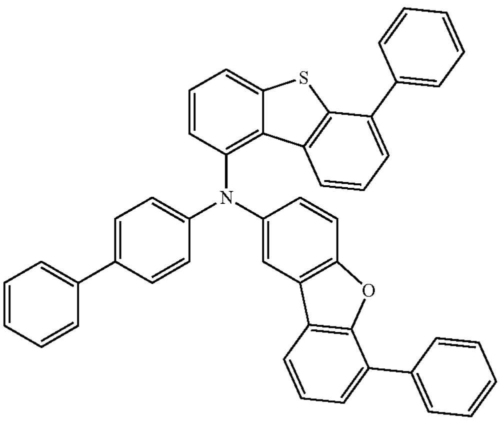

-continued

B86

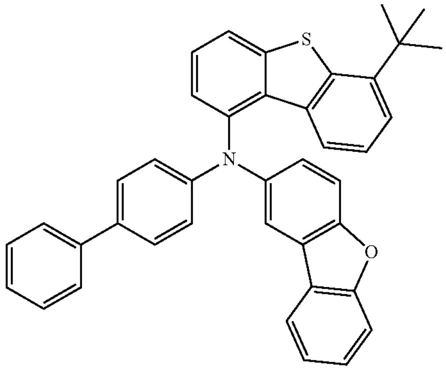

B87

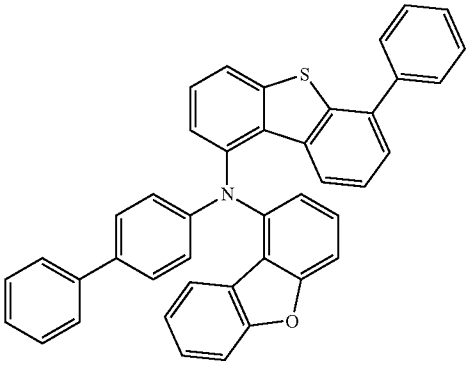

B88

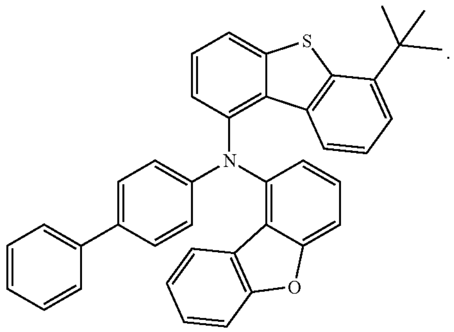

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
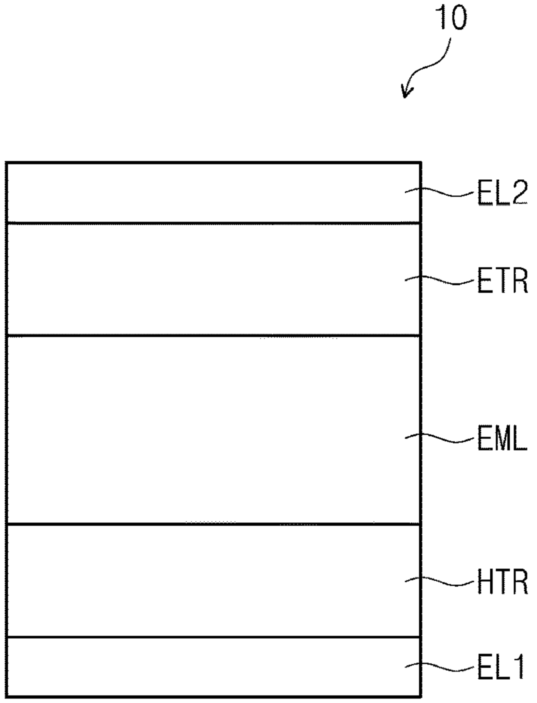
FIG. 1 is a cross-sectional view schematically illustrating an organic electroluminescence device according to an embodiment of the present disclosure.

The present disclosure may have various modifications and may be embodied in different forms, and example embodiments will be explained in more detail with reference to the accompany drawings. The present disclosure may, however, be embodied in different forms and should not be construed as being limited to the embodiments set forth herein. Rather, all modifications, equivalents, and substitutents in the spirit and technical scope of the present disclosure should be understood as being included in the present disclosure.

It will be understood that when an element is referred to as being "on", "connected to" or "coupled to" another element, it can be directly on, connected or coupled to the other element, or intervening elements may be present. When an element is referred to as being "directly" on, connected or coupled to the other element, no intervening elements are present.

Like reference numerals refer to like elements throughout, and duplicative descriptions thereof may not be provided. In addition, in the drawings, the thickness, the ratio, and the dimensions of constituent elements may be exaggerated for effective explanation of technical contents.

As used herein, the singular forms "a," "an," and "the" are intended to include the plural forms as well, unless the context clearly indicates otherwise. The term "and/or" includes any and all combinations of one or more of the associated listed items.

As used herein, expressions such as "at least one of," "one of," and "selected from," when preceding a list of elements, modify the entire list of elements and do not modify the individual elements of the list.

Further, the use of "may" when describing embodiments of the present disclosure refers to "one or more embodiments of the present disclosure".

It will be understood that, although the terms first, second, etc. may be used herein to describe various elements, these elements should not be limited by these terms. These terms are only used to distinguish one element from another element.

Thus, a first element could be termed a second element without departing from the teachings of the present disclosure. Similarly, a second element could be termed a first element. As used herein, the singular forms are intended to include the plural forms as well, unless the context clearly indicates otherwise.

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present.

In addition, the terms "below", "beneath", "on", and "above" are used for explaining the relation of elements shown in the drawings. The terms are relative concept and are explained on the basis of the direction shown in the drawing.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes," "including," "comprises," and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

Hereinafter, the organic electroluminescence device according to an embodiment of the present disclosure and a compound of an embodiment included therein will be explained with reference to the attached drawings.

FIG. 1 to FIG. 4 are cross-sectional views schematically showing organic electroluminescence devices according to example embodiments of the present disclosure. Referring to FIGS. 1 to 4, in an organic electroluminescence device 10 according to an embodiment, a first electrode EL1 and a second electrode EL2 are oppositely disposed, and between the first electrode EL1 and the second electrode EL2, an emission layer EML may be disposed.

In addition, the organic electroluminescence device 10 of an embodiment may further include a plurality of organic layers between the first electrode EL1 and the second electrode EL2 in addition to the emission layer EML. The plurality of the organic layers may include a hole transport region HTR and an electron transport region ETR. For example, the organic electroluminescence device 10 of an embodiment may include a first electrode EL1, a hole transport region HTR, an emission layer EML, an electron transport region ETR, and a second electrode EL2, stacked one by one. In addition, the organic electroluminescence device 10 of an embodiment may include a capping layer CPL disposed on the second electrode EL2.

The organic electroluminescence device 10 of an embodiment may include an amine compound of an embodiment, which will be explained later in the plurality of organic layers disposed between the first electrode EL1 and the second electrode EL2. For example, the hole transport region HTR may include an amine compound of an embodiment, which will be explained later. However, an embodiment of the present disclosure is not limited thereto.

Figure 2:
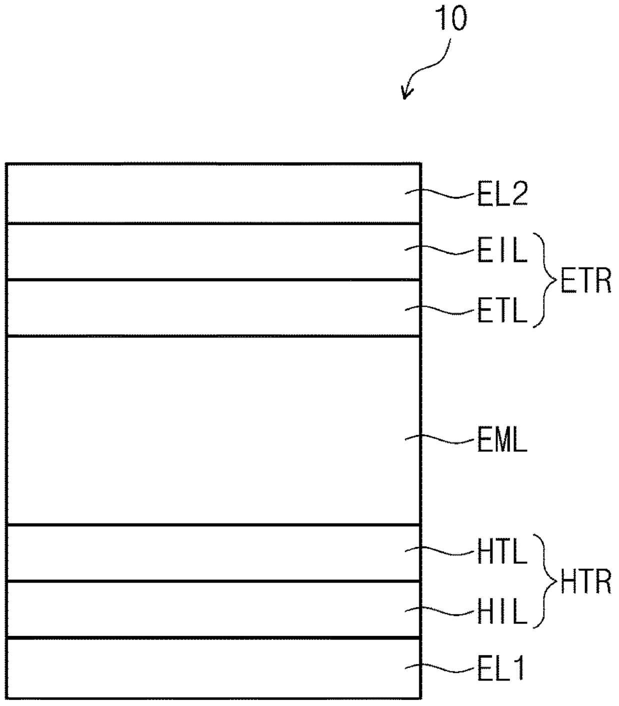
FIG. 2 is a cross-sectional view schematically illustrating an organic electroluminescence device according to an embodiment of the present disclosure.
Figure 3:
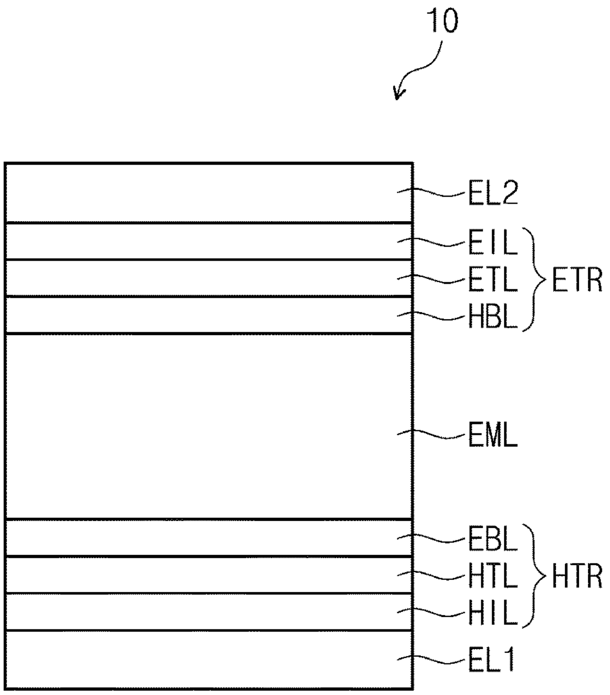
FIG. 3 is a cross-sectional view schematically illustrating an organic electroluminescence device according to an embodiment of the present disclosure.
Figure 4:
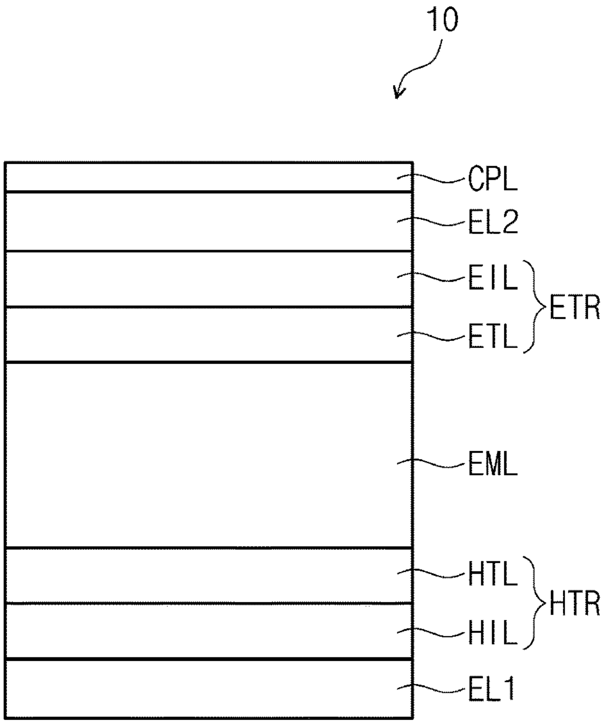
FIG. 4 is a cross-sectional view schematically illustrating an organic electroluminescence device according to an embodiment of the present disclosure.

Compared with FIG. 1, FIG. 2 shows the cross-sectional view of an organic electroluminescence device 10 of an embodiment, wherein a hole transport region HTR includes a hole injection layer HIL and a hole transport layer HTL, and an electron transport region ETR includes an electron injection layer EIL and an electron transport layer ETL. Compared with FIG. 1, FIG. 3 shows the cross-sectional view of an organic electroluminescence device 10 of an embodiment, wherein the hole transport region HTR includes the hole injection layer HIL, the hole transport layer HTL, and an electron blocking layer EBL, and the electron transport region ETR includes the electron injection layer EIL, the electron transport layer ETL, and a hole blocking layer HBL. Compared with FIG. 2, FIG. 4 shows the cross-sectional view of an organic electroluminescence device 10 of an embodiment including a capping layer CPL disposed on the second electrode EL2.

The first electrode EL1 has conductivity. The first electrode EL1 may be formed using a metal alloy and/or a conductive compound. The first electrode EL1 may be an anode. In addition, the first electrode EL1 may be a pixel electrode. The first electrode EL1 may be a transmissive electrode, a transflective electrode, or a reflective electrode. When the first electrode EL1 is a transmissive electrode, the first electrode EL1 may be formed using a transparent metal oxide (such as indium tin oxide (ITO), indium zinc oxide (IZO), zinc oxide (ZnO), and/or indium tin zinc oxide (ITZO)). When the first electrode EL1 is a transflective electrode or a reflective electrode, the first electrode EL1 may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), a compound thereof, or a mixture thereof (for example, a mixture of Ag and Mg). In some embodiments, the first electrode EL1 may have a structure including a plurality of layers including a reflective layer or a transflective layer formed using the above materials, and a transmissive conductive layer formed using ITO, IZO, ZnO, or ITZO. For example, the first electrode EL1 may include a three-layer structure of ITO/Ag/ITO. However, an embodiment of the present disclosure is not limited thereto. The thickness of the first electrode EL1 may be about 1,000 Å to about 10,000 Å, for example, about 1,000 Å to about 3,000 Å.

The hole transport region HTR is provided on the first electrode EL1. The hole transport region HTR may include at least one of a hole injection layer HIL, a hole transport layer HTL, a hole buffer layer, or an electron blocking layer EBL. The thickness of the hole transport region HTR may be about 50 Å to about 15,000 Å.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer of a hole injection layer HIL, or a hole transport layer HTL, or may have a structure of a single layer formed using a hole injection material and a hole transport material. In some embodiments, the hole transport region HTR may have a structure of a single layer formed using a plurality of different materials, or a structure stacked from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may be formed using any suitable method (such as a vacuum deposition method, a spin coating method, a cast method, a Langmuir-Blodgett (LB) method, an inkjet printing method, a laser printing method, and/or a laser induced thermal imaging (LITI) method).

The hole transport region HTR of an embodiment may include an amine compound of an embodiment, which will be explained later. For example, a hole transport layer HTL may include the amine compound of an embodiment.

In the description, the term "substituted or unsubstituted" refers to a state of being unsubstituted, or substituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the substituents may be further substituted or unsubstituted. For example, a biphenyl group may be interpreted as an aryl group or a phenyl group substituted with a phenyl group.

In the description, the term "forming a ring via the combination with an adjacent group" may refer to forming a substituted or unsubstituted hydrocarbon ring, or a substituted or unsubstituted heterocycle via combination with an adjacent group. The hydrocarbon ring may be an aliphatic hydrocarbon ring or an aromatic hydrocarbon ring. The heterocycle may be an aliphatic heterocycle or an aromatic heterocycle. The ring formed via combination with an adjacent group may be a monocyclic ring or a polycyclic ring. In addition, the ring formed via combination with an adjacent group may be further combined with another ring to form a spiro structure.

In the description, the term "adjacent group" may refer to a substituent on the same atom or point, a substituent on an atom that is directly connected to the base atom or point, or a substituent sterically positioned (e.g., within intramolecular bonding distance) to the corresponding substituent. For example, in 1,2-dimethylbenzene, the two methyl groups may be interpreted as being "adjacent groups" to each other, and in 1,1-diethylcyclopentane, the two ethyl groups may be interpreted as being "adjacent groups" to each other.

In the description, the halogen atom may be a fluorine atom, a chlorine atom, a bromine atom, or an iodine atom.

In the description, the alkyl group may be a linear chain, a branched chain, or a cyclic alkyl group. The alkyl group may be or include a cycloalkyl group. The cycloalkyl group may be or include a monocycloalkyl group, a bicycloalkyl group, and/or a polycycloalkyl group (such as a tricycloalkyl group). For example, the tricycloalkyl group may be or include adamantane.

The carbon number of the alkyl may be 1 to 50, 1 to 30, 1 to 20, 1 to 10, or 1 to 6. Non-limiting examples of the alkyl include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc.

In the description, the term "hydrocarbon ring group" may refer to an optional functional group or substituent derived from an aliphatic hydrocarbon ring. The hydrocarbon ring group may be a saturated hydrocarbon ring group of 5 to 20 carbon atoms for forming a ring.

In the description, the term "aryl group" may refer to an optional functional group or substituent derived from an aromatic hydrocarbon ring. The aryl group may be a monocyclic aryl group or a polycyclic aryl group. The carbon number for forming a ring of the aryl group may be 6 to 40, 6 to 30, 6 to 20, or 6 to 15. Non-limiting examples of the aryl group include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc.

In the description, the fluorenyl group may be substituted, and the two substituents may be combined with each other to form a spiro structure. Examples of a substituted fluorenyl group are as follows. However, an embodiment of the present disclosure is not limited thereto:

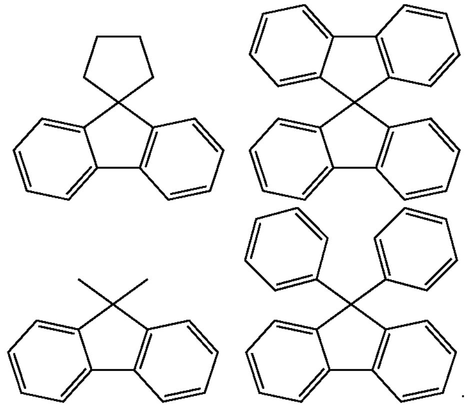

In the description, the term "heterocyclic group" may refer to an optional functional group or substituent derived from a ring including one or more among boron (B), oxygen (O), nitrogen (N), phosphorus (P), silicon (Si) and sulfur(S) as heteroatoms. The heterocyclic group may include an aliphatic heterocyclic group and an aromatic heterocyclic group. The aromatic heterocyclic group may be a heteroaryl group. The aliphatic heterocyclic group and the aromatic heterocyclic group may each independently be monocycles or polycycles.

When the heterocyclic group includes two or more heteroatoms, the two or more heteroatoms may be the same or different. The heterocyclic group may be a monocyclic heterocyclic group or a polycyclic heterocyclic group, and in some embodiments may be a heteroaryl group. The carbon number for forming a ring of the heterocyclic group may be 2 to 30, 2 to 20, or 2 to 10.

The carbon number for forming a ring of the aliphatic heterocyclic group may be 2 to 30, 2 to 20, or 2 to 10. Non-limiting examples of the aliphatic heterocyclic group include an oxirane group, a thiirane group, a pyrrolidine group, a piperidine group, a tetrahydrofuran group, a tetrahydrothiophene group, a thiane group, a tetrahydropyran group, a 1,4-dioxane group, etc.

When the heteroaryl group includes two or more heteroatoms, the two or more heteroatoms may be the same or different. The heteroaryl group may be a monocyclic heterocyclic group or a polycyclic heterocyclic group. The carbon number for forming a ring of the heteroaryl group may be 2 to 30, 2 to 20, or 2 to 10. Non-limiting examples of the heteroaryl group include thiophene, furan, pyrrole, imidazole, triazole, pyridine, bipyridine, pyrimidine, triazine, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzimidazole, benzothiazole, benzocarbazole, benzothiophene, dibenzothiophene, thienothiophene, benzofuran, phenanthroline, thiazole, isooxazole, oxadiazole, thiadiazole, phenothiazine, dibenzosilole, dibenzofuran, etc.

In the description, the carbon number of the amine group is not specifically limited, but may be 1 to 30. The amine group may be or include an alkyl amine group and/or an aryl amine group. Non-limiting examples of the amine group include a methylamine group, a dimethylamine group, a phenylamine group, a naphthylamine group, a 9-methyl-anthracenylamine group, a triphenylamine group, etc.

In the description, the alkyl group in the alkyl amine group may be the above-illustrated alkyl group.

In the description, the aryl group in the aryl amine group may be the above-illustrated aryl group.

In the description, the term "direct linkage" may refer to a single bond.

In the description, " —* " means a connected position.

The amine compound according to an embodiment may be represented by Formula 1a:

Formula 1a

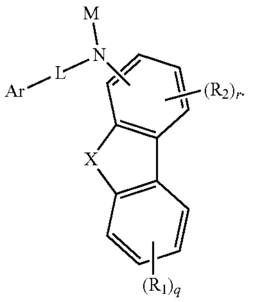

In Formula 1a, X may be O or S.

In Formula 1a, $R_1$ may be a hydrogen atom, a deuterium atom, a halogen atom, a substituted or unsubstituted alkyl group of 1 to 20 carbon atoms, or a substituted or unsubstituted aryl group of 6 to 40 carbon atoms for forming a ring. For example, $R_1$ may be a hydrogen atom, a deuterium atom, an unsubstituted t-butyl group, or un unsubstituted phenyl group. However, embodiments of the present disclosure are not limited thereto.

In Formula 1a, $R_2$ may be a hydrogen atom or a deuterium atom.

In Formula 1a, L may be a direct linkage, or a substituted or unsubstituted arylene group of 6 to 30 carbon atoms for forming a ring. A case where L is a substituted or unsubstituted divalent fluorenyl group is excluded (e.g., L is not a substituted or unsubstituted divalent fluorenyl group). For example, L may be a direct linkage, an unsubstituted phenylene group, an unsubstituted divalent biphenyl group, an unsubstituted divalent terphenyl group, an unsubstituted naphthylene group, or an unsubstituted divalent phenanthryl group.

In Formula 1a, "q" may be an integer of 0 to 4. For example, "q" may be 0 or 1. A case where "q" is 0 may be the same as a case where "q" is 1 and $R_1$ is a hydrogen atom.

In Formula 1a, "r" may be an integer of 0 to 3. For example, "r" may be 0 or 1. A case where "r" is 0 may be the same as a case where "r" is 1 and $R_2$ is a hydrogen atom.

In Formula 1a, M may be represented by Formula 1b:

Formula 1b

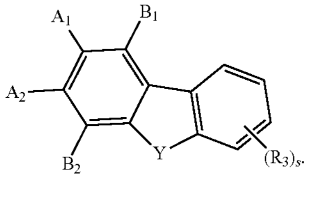

In Formula 1b, Y may be O or S, where X and Y are different from each other. For example, X is O, and Y is S; or as another example, X is S, and Y is O. As a result, the amine compound of the present disclosure includes two dibenzoheterole groups including different heteroatoms.

In Formula 1b, $R_3$ may be a hydrogen atom, a deuterium atom, a halogen atom, a substituted or unsubstituted alkyl group of 1 to 20 carbon atoms, or a substituted or unsubstituted aryl group of 6 to 40 carbon atoms for forming a ring. For example, $R_3$ may be a hydrogen atom, a deuterium atom, an unsubstituted t-butyl group, or an unsubstituted phenyl group. However, embodiments of the present disclosure are not limited thereto.

In Formula 1b, "s" may be an integer of 0 to 4. For example, "s" may be 0 or 1. A case where "s" is 0 may be the same as a case where "s" is 1, and $R_3$ is a hydrogen atom.

In Formula 1b, $A_1$ and $A_2$ may each independently be a hydrogen atom or a deuterium atom.

In Formula 1b, $B_1$ and $B_2$ may each independently be a hydrogen atom or a deuterium atom, where a (the) nitrogen atom in Formula 1a is bonded to either one of $B_1$ and $B_2$. For example, a nitrogen atom in Formula 1a may be bonded to $B_1$ (e.g., may be bonded to Formula 1b at its $B_1$ position), and $B_2$ may be a hydrogen atom or a deuterium atom. For example, a nitrogen atom in Formula 1a may be bonded to $B_2$ (e.g., may be bonded to Formula 1b at its $B_2$ position), and $B_1$ may be a hydrogen atom or a deuterium atom.

In Formula 1a, Ar may be a substituted or unsubstituted alkyl group of 1 to 20 carbon atoms, or a substituted or unsubstituted aryl group of 6 to 40 carbon atoms for forming a ring. However, a case where Ar is a substituted or unsubstituted fluorenyl group or represented by Formula 2 is excluded (e.g., Ar is not a substituted or unsubstituted divalent fluorenyl group or a 1,8-substituted naphthylene group as represented by Formula 2):

Formula 2

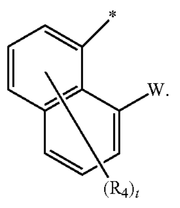

In Formula 2, W is a substituted or unsubstituted aryl group of 6 to 20 carbon atoms for forming a ring. For example, W may be a phenyl group. However, an embodiment of the present disclosure is not limited thereto.

In Formula 2, $R_4$ may be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 carbon atoms for forming a ring, or a substituted or unsubstituted heteroaryl group of 2 to 30 carbon atoms for forming a ring, and/or may be combined with an adjacent group to form a ring.

In Formula 2, "t" may be an integer of 0 to 6.

In Formula 2, " ——* " may be a position connected to L in Formula 1a.

The amine compound of an embodiment may be a monoamine compound (e.g., may include only one amine group). For example, the amine compound of an embodiment may not include a separate (additional) amine moiety or a carbazole moiety other than the nitrogen atom (amine group) explicitly represented in Formula 1a.

In an embodiment, the amine compound represented by Formula 1a may be represented by Formula 3-1 or Formula 3-2:

Formula 3-1

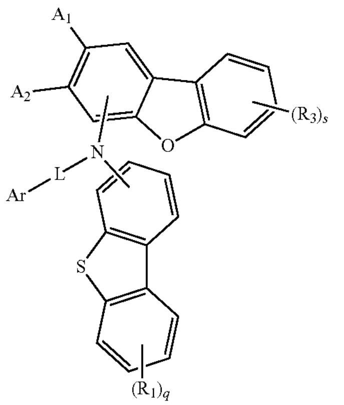

Formula 3-2

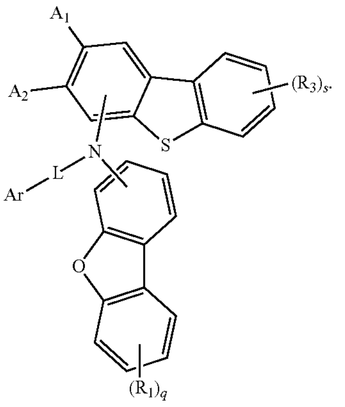

Formula 3-1 is an example embodiment of Formula 1a where X is S, and Y is O. Formula 3-2 is an example embodiment of Formula 1a where X is O, and Y is S.

In Formula 3-1, the hydrogen or deuterium atoms (e.g., $A_1$ and $A_2$) are connected to the carbon atoms at position 2 and position 3 of a dibenzofuranyl group.

In Formula 3-2, the hydrogen or deuterium atoms are connected to the carbon atoms at position 2 and position 3 of a dibenzothiophenyl group.

In Formula 3-1 and Formula 3-2, $A_1$, $A_2$, $R_1$, $R_3$, L, "q", "s", and Ar may each independently be the same as described in connection with Formula 1a and Formula 1b.

In an embodiment, the amine compound represented by Formula 1a may be represented by Formula 4-1 or Formula 4-2:

Formula 4-1

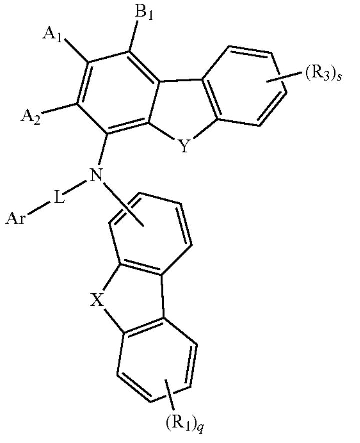

Formula 4-2

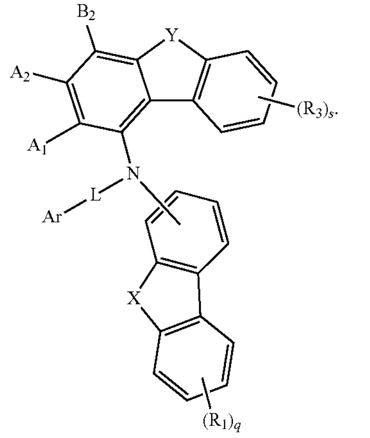

Formula 4-1 and Formula 4-2 are example embodiments of the amine compound represented by Formula 1a in which the bonding position of the central nitrogen atom (e.g., amine nitrogen) to the Y-substituted dibenzoheterole group of Formula 1b with a central nitrogen atom is specified.

In Formula 4-1 and Formula 4-2, $A_1$, $A_2$, X, Y, $R_1$, $R_3$, L, “q”, “s”, and Ar may each independently be the same as described in connection with Formula 1a and Formula 1b. The amine compound represented by Formula 4-1 may be represented by Formula 4-1a or Formula 4-1b:

Formula 4-1a

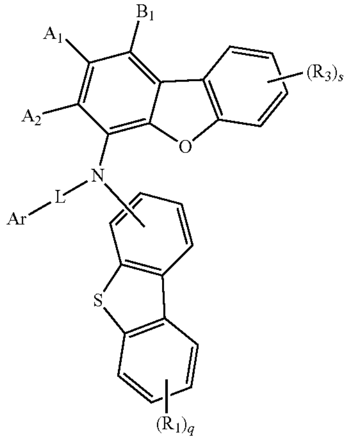

-continued

Formula 4-1b

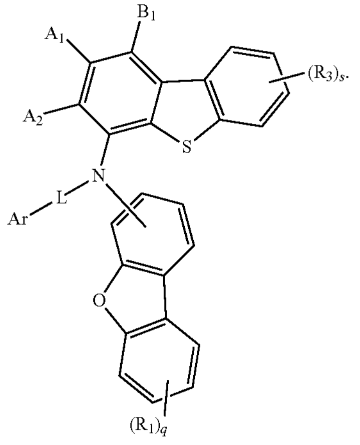

Formula 4-1a is an example embodiment of Formula 4-1 where X is S, and Y is O. In Formula 4-1a, the carbon atom at position 4 of the dibenzofuran group is connected with a (the) central nitrogen atom (amine group). In Formula 4-1a, the hydrogen or deuterium atoms (e.g., $A_1$ and $A_2$) are connected with the carbon atoms at position 2 and position 3 of the dibenzofuran group.

Formula 4-1b is an example embodiment of Formula 4-1 where X is O, and Y is S. In Formula 4-1b, the carbon atom at position 4 of the dibenzothiophene group is connected with a (the) central nitrogen atom (amine group). In Formula 4-1b, the hydrogen or deuterium atoms are connected with the carbon atoms at position 2 and position 3 of the dibenzothiophene group.

In Formula 4-1a and Formula 4-1b, $A_1$, $A_2$, $B_1$, $R_1$, $R_3$, L, “q”, “s”, and Ar may each independently be the same as described in connection with Formula 1a and Formula 1b.

The amine compound represented by Formula 4-2 may be represented by Formula 4-2a or Formula 4-2b:

Formula 4-2a

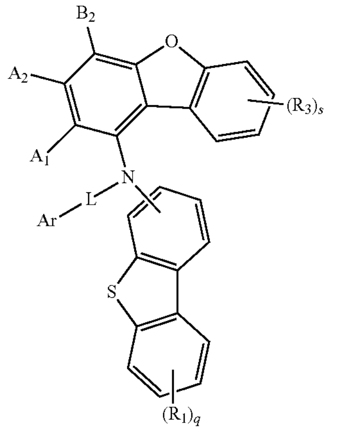

-continued

Formula 4-2b

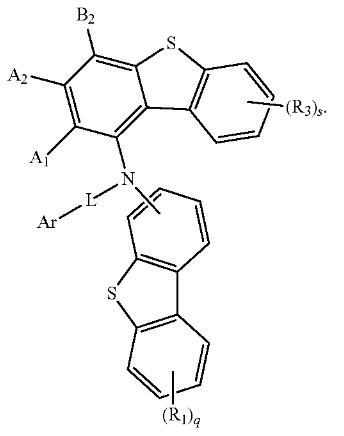

Formula 4-2a is an example embodiment of Formula 4-2 where X is S, and Y is O. In Formula 4-2a, the carbon atom at position 1 of the dibenzofuran group is connected with a (the) central nitrogen atom (amine group). In Formula 4-2a, the hydrogen or deuterium atoms (e.g., $A_1$ and $A_2$) are connected with the carbon atoms at position 2 and position 3 of the dibenzofuran group.

Formula 4-2b is an example embodiment of Formula 4-2 where X is O, and Y is S. In Formula 4-2b, the carbon atom at position 1 of the dibenzothiophene group is connected with a (the) central nitrogen atom (amine group). In Formula 4-2b, the hydrogen or deuterium atoms are connected with the carbon atoms at position 2 and position 3 of the dibenzothiophene group.

In Formula 4-2a and Formula 4-2b, $A_1$, $A_2$, $B_2$, $R_1$, $R_3$, L, "q", "s", and Ar may each independently be the same as described in connection with Formula 1a and Formula 1b.

In an embodiment, the amine compound represented by Formula 1a may be represented by any one among Formula 5-1 to Formula 5-4:

Formula 5-1

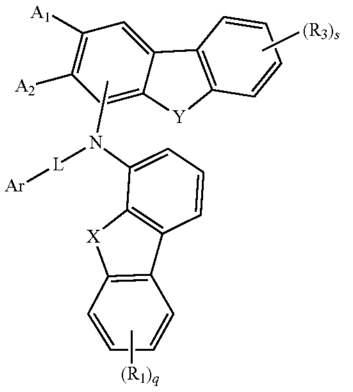

-continued

Formula 5-2

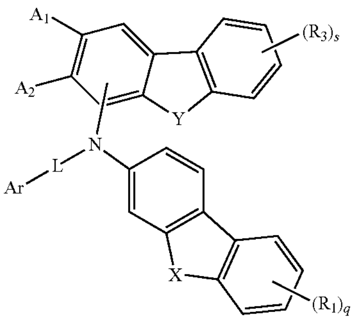

Formula 5-3

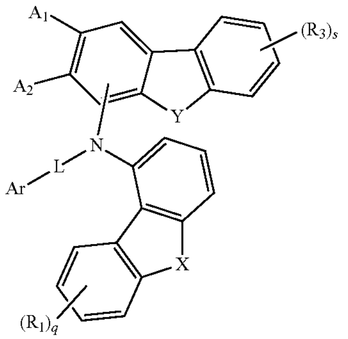

Formula 5-4

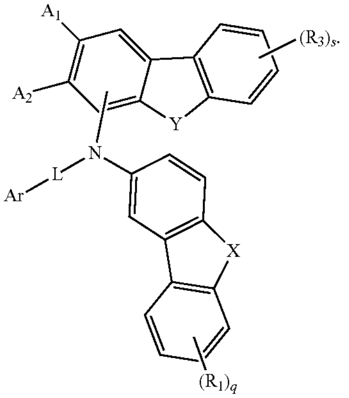

Formula 5-1 to Formula 5-4 are example embodiments of the amine compound represented by Formula 1a where the X-substituted dibenzoheterole group of Formula 1a is connected with a central nitrogen atom at a specified position.

In Formula 5-1 to Formula 5-4, $A_1$, $A_2$, X, Y, $R_1$, $R_3$, L, "q", "s", and Ar may each independently be the same as described in connection with Formula 1a and Formula 1b.

The amine compound represented by Formula 5-1 may be represented by Formula 5-1a or Formula 5-1b:

Formula 5-1a

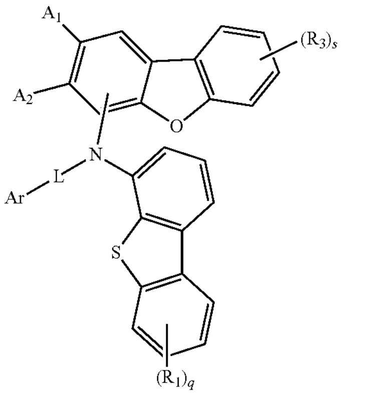

Formula 5-1b

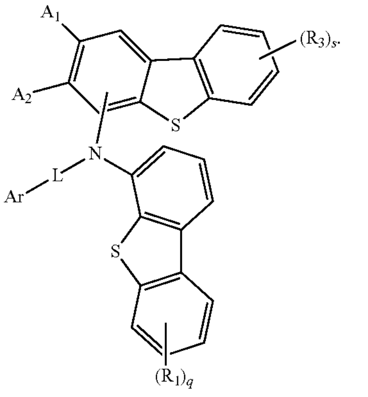

Formula 5-1a is an example embodiment of Formula 5-1 where X is S, and Y is O. In Formula 5-1a, the carbon atom at position 4 of the dibenzothiophene group is connected with a (the) central nitrogen atom.

Formula 5-1b is an example embodiment of Formula 5-1 where X is O, and Y is S. In Formula 5-1b, the carbon atom at position 4 of the dibenzofuran group is connected with a (the) central nitrogen atom.

In Formula 5-1a and Formula 5-1b, $A_1$, $A_2$, $R_1$, $R_3$, L, "q", "s", and Ar may each independently be the same as described in connection with Formula 1a and Formula 1b.

The amine compound represented by Formula 5-2 may be represented by Formula 5-2a or Formula 5-2b:

Formula 5-2a

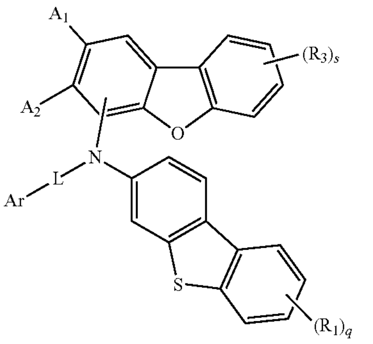

-continued

Formula 5-2b

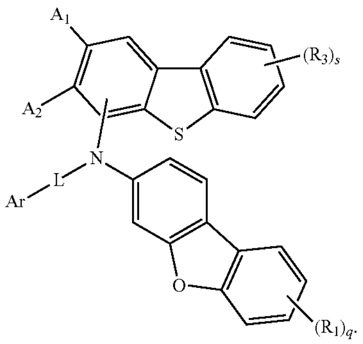

Formula 5-2a is an example embodiment of Formula 5-2 where X is S, and Y is O. In Formula 5-2a, the carbon atom at position 3 of the dibenzothiophene group is connected with a (the) central nitrogen atom (amine group).

Formula 5-2b is an example embodiment of Formula 5-2 where X is O, and Y is S. In Formula 5-2b, the carbon atom at position 3 of the dibenzofuran group is connected with a central nitrogen atom (amine group).

In Formula 5-2a and Formula 5-2b, $A_1$, $A_2$, $R_1$, $R_3$, L, "q", "s", and Ar may each independently be the same as described in connection with Formula 1a and Formula 1b.

The amine compound represented by Formula 5-3 may be represented by Formula 5-3a or Formula 5-3b:

Formula 5-3a

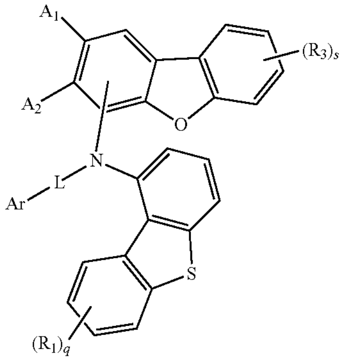

Formula 5-3b

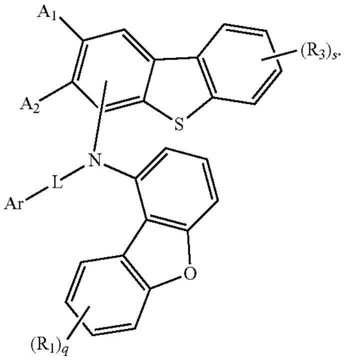

Formula 5-3a is an example embodiment of Formula 5-3 where X is S, and Y is O. In Formula 5-3a, the carbon atom at position 1 of the dibenzothiophene group is connected with a (the) central nitrogen atom (amine group).

Formula 5-3b is an example embodiment of Formula 5-3 where X is O, and Y is S. In Formula 5-3b, the carbon atom at position 1 of the dibenzofuran group is connected with a (the) central nitrogen atom (amine group).

In Formula 5-3a and Formula 5-3b, $A_1$, $A_2$, $R_1$, $R_3$, L, "q", "s", and Ar may each independently be the same as described in connection with Formula 1a and Formula 1b.

The amine compound represented by Formula 5-4 may be represented by Formula 5-4a or Formula 5-4b:

Formula 5-4a

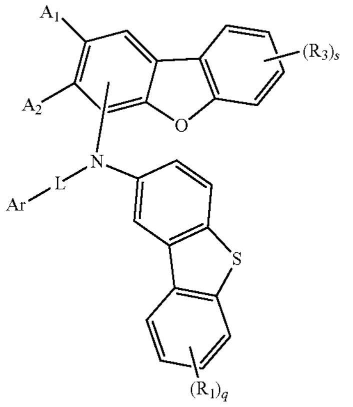

Formula 5-4b

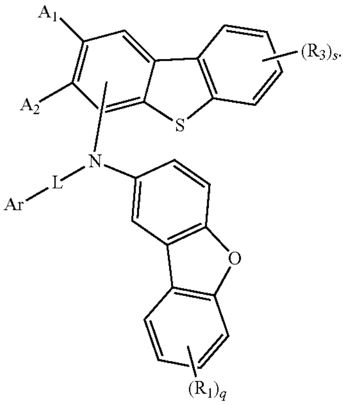

Formula 5-4a is an example embodiment of Formula 5-4 where X is S, and Y is O. In Formula 5-4a, the carbon atom at position 2 of the dibenzothiophene group is connected with a (the) central nitrogen atom (amine group).

Formula 5-4b is an example embodiment of Formula 5-4 where X is O, and Y is S. In Formula 5-4b, the carbon atom at position 2 of the dibenzofuran group is connected with a (the) central nitrogen atom (amine group).

In Formula 5-4a and Formula 5-4b, $A_1$, $A_2$, $R_1$, $R_3$, L, "q", "s", and Ar may each independently be the same as described in connection with Formula 1a and Formula 1b.

In an embodiment, the amine compound represented by Formula 1a may be any one among the compounds in Compound Group A and Compound Group B:

Compound Group A

A1

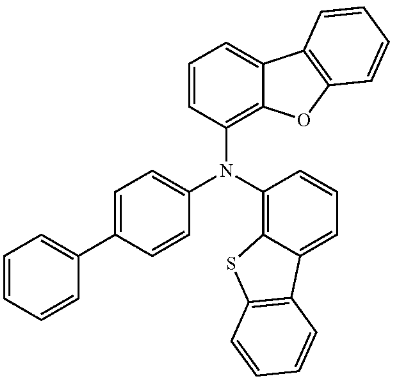

A2

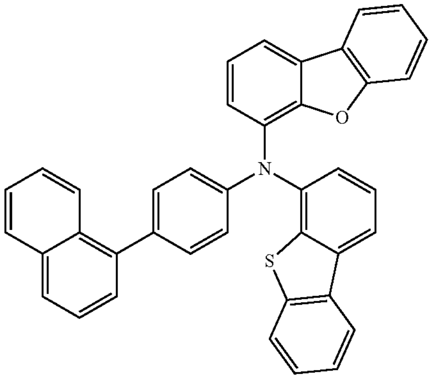

A3

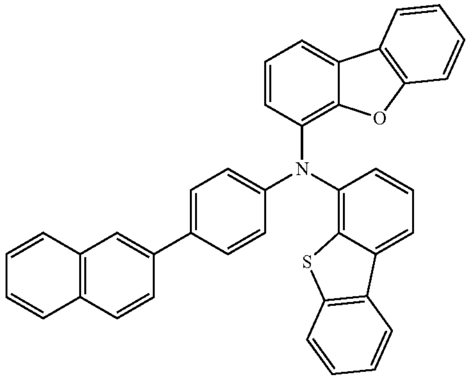

A4

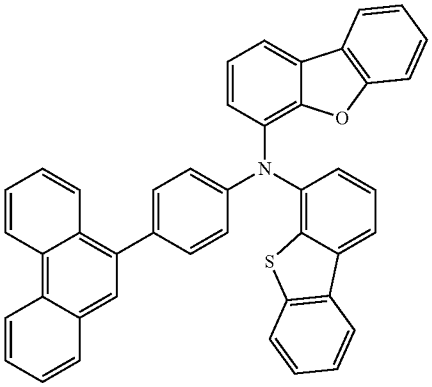

-continued
A5
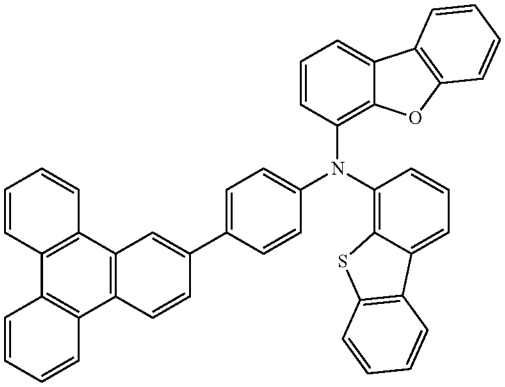
A6
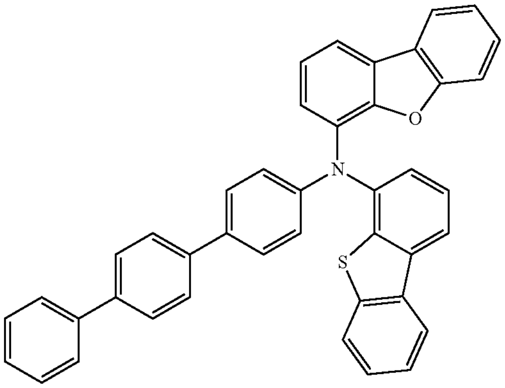
A7
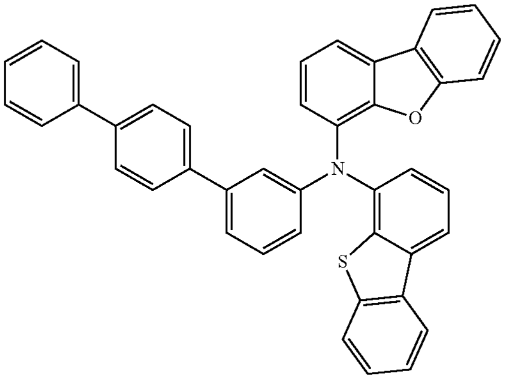
A8
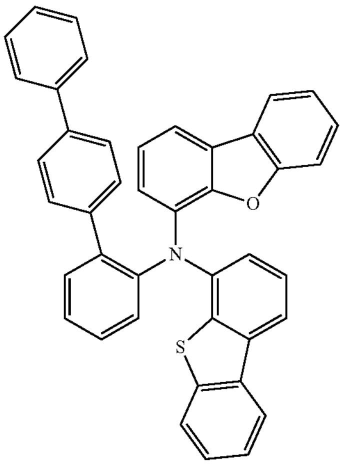
-continued
A9
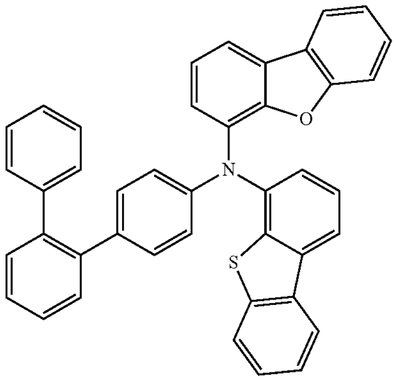
A10
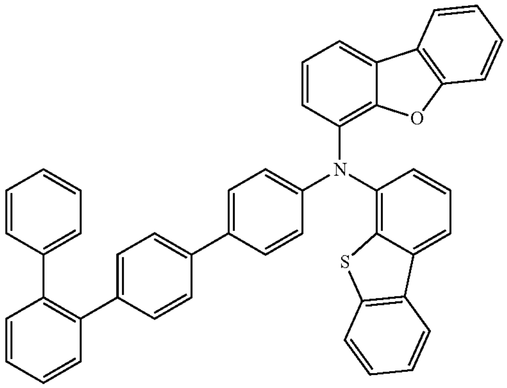
A11
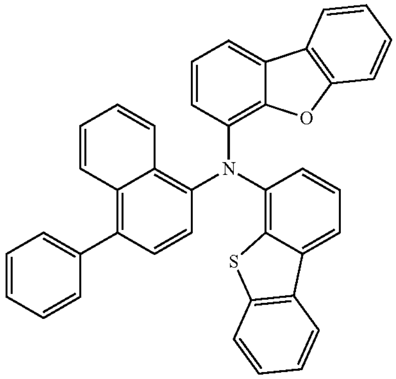
A12
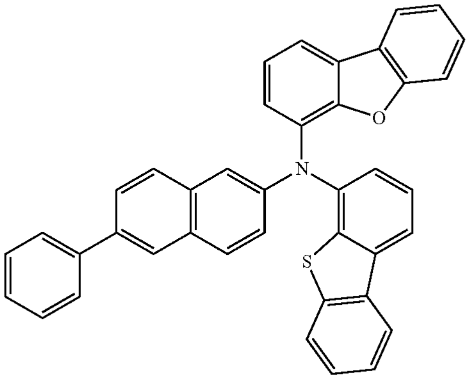

-continued
A13
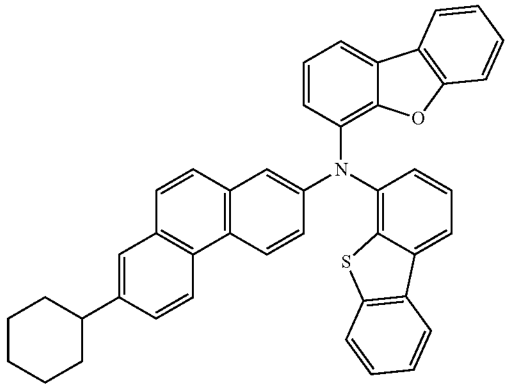
A14
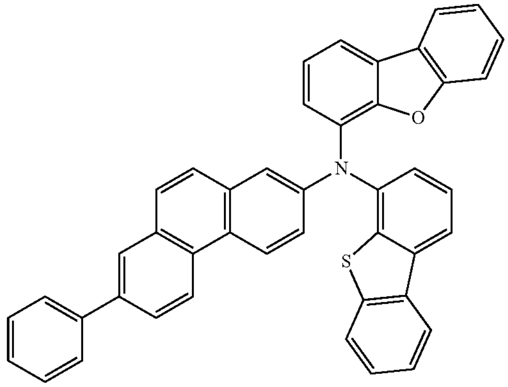
A15
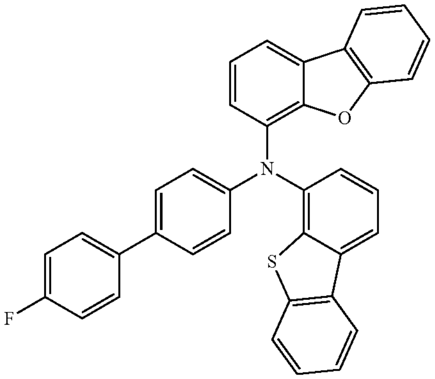
A16
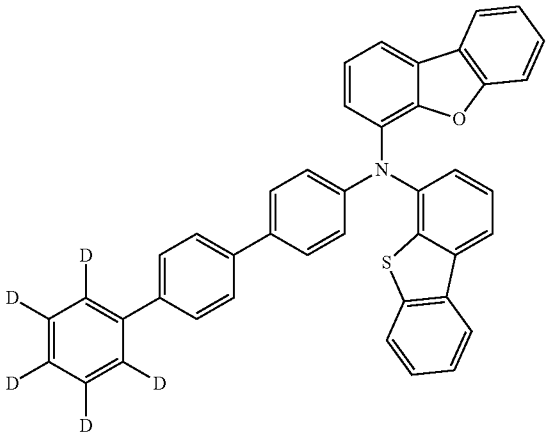
-continued
A17
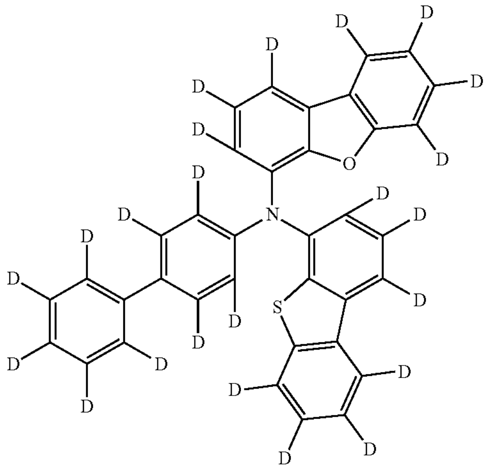
A18
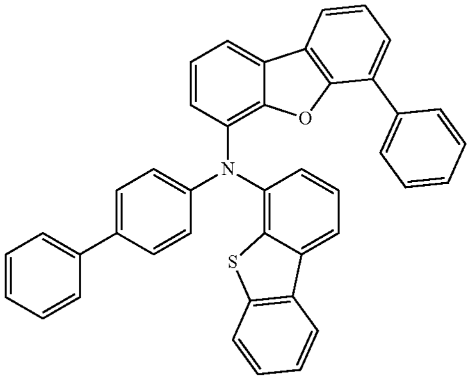
A19
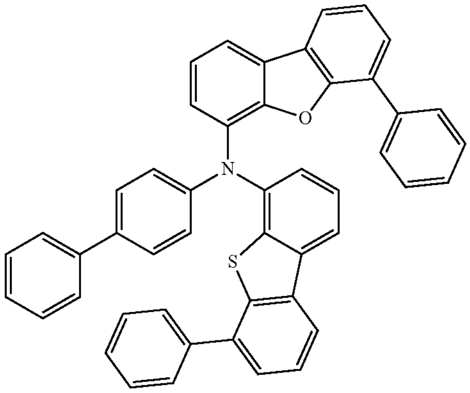
A20
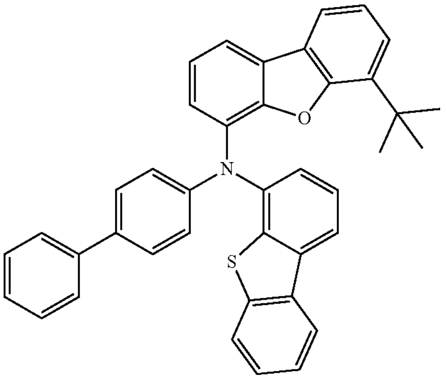

A21
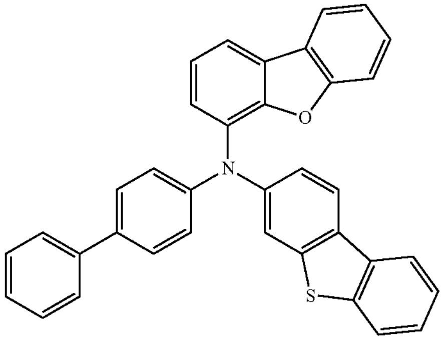
A22
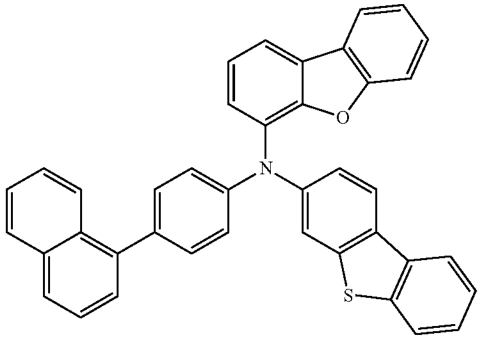
A23
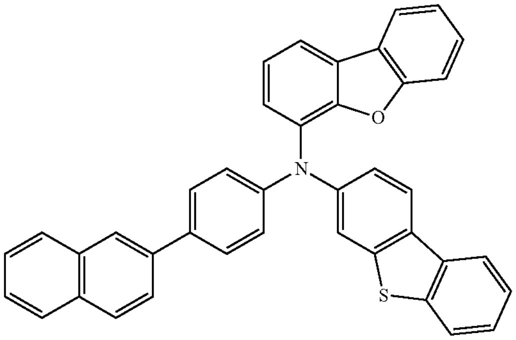
A24
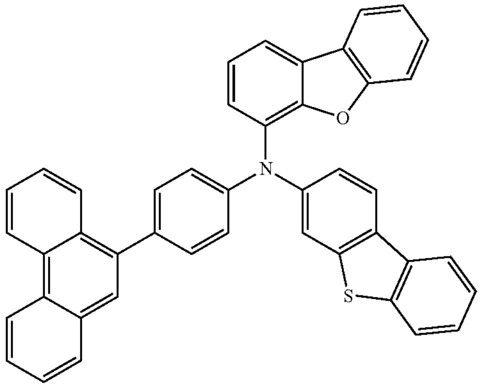
A25
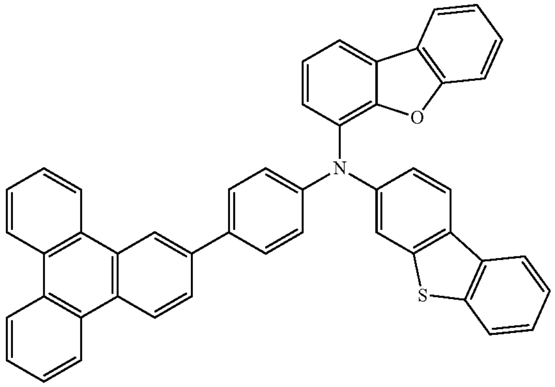
A26
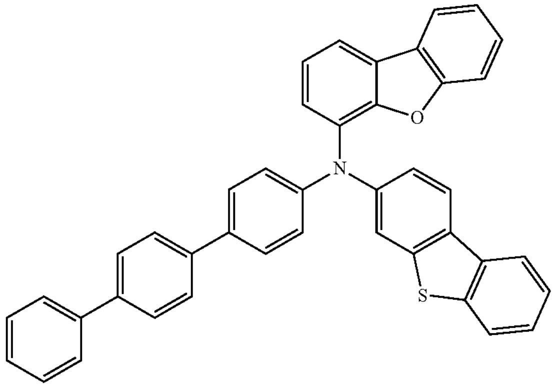
A27
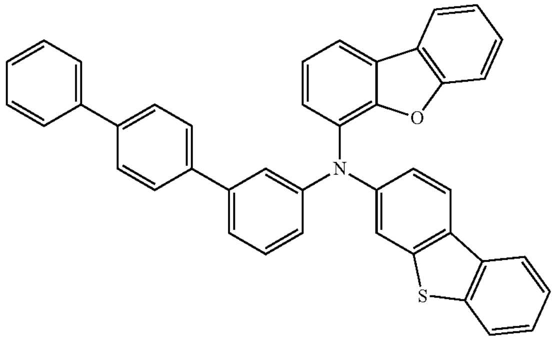
A28
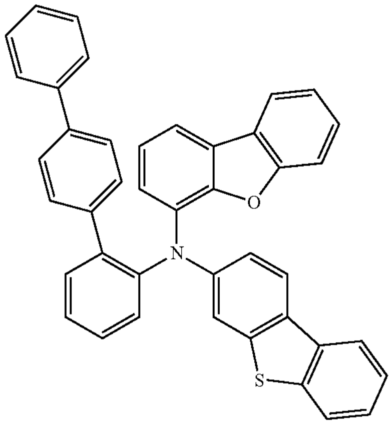

-continued
A29
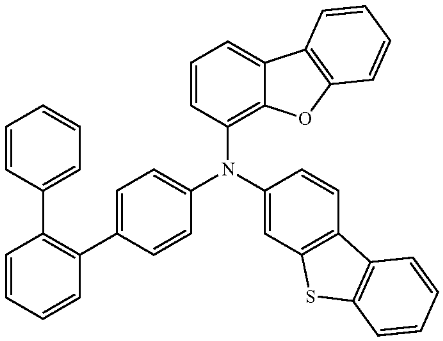
A30
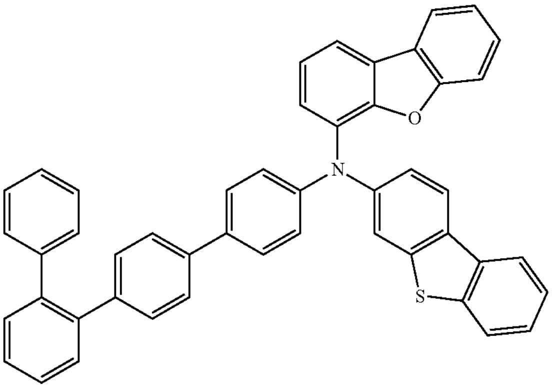
A31
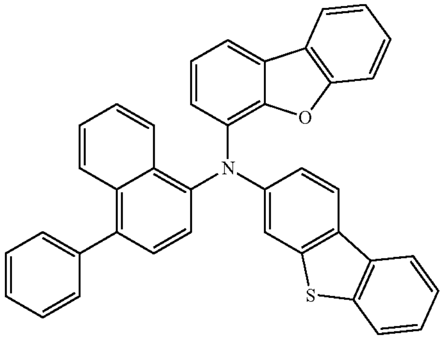
A32
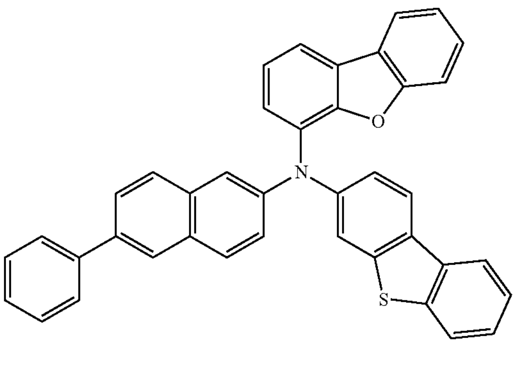
-continued
A33
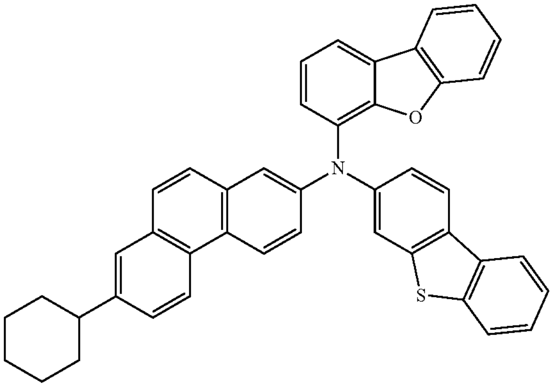
A34
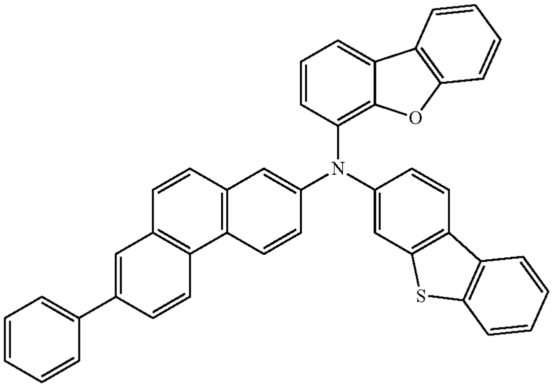
A35
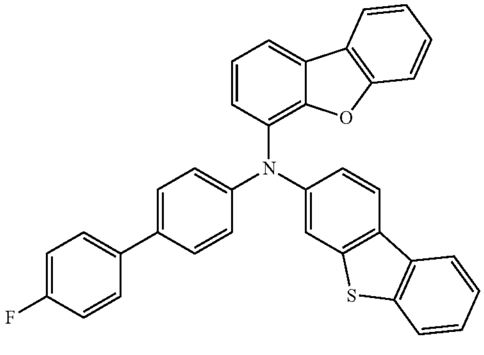
A36
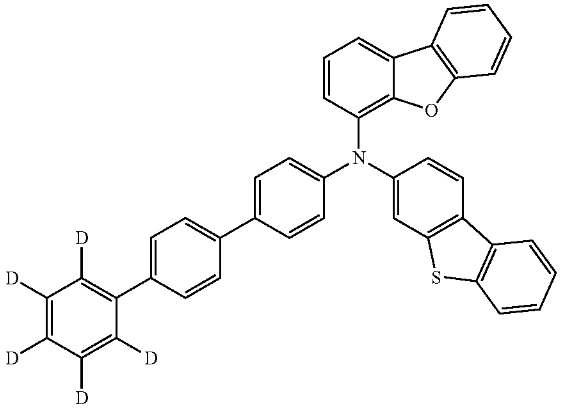

-continued
A37
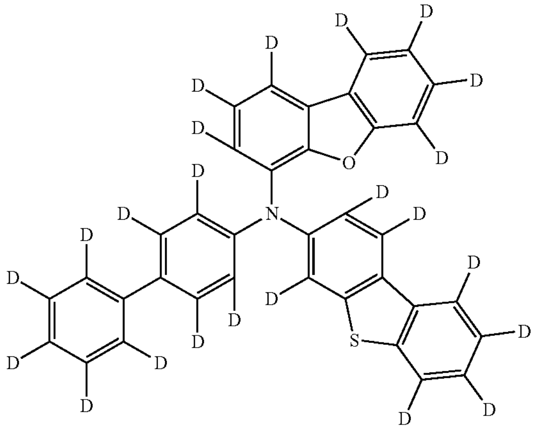
A38
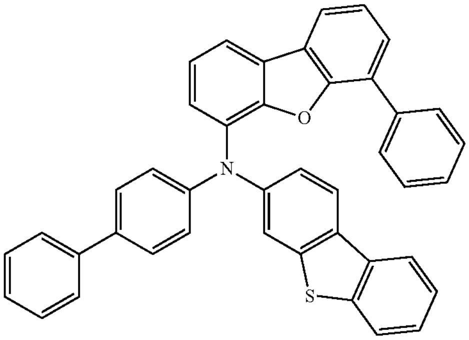
A39
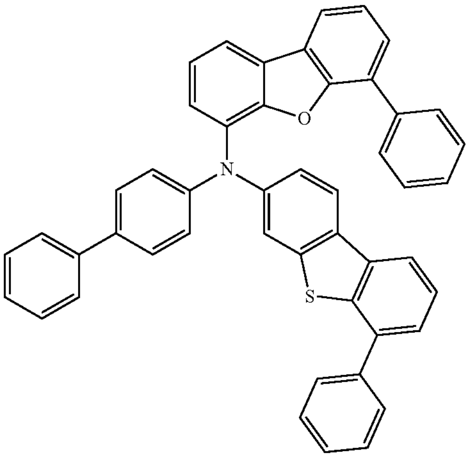
A40
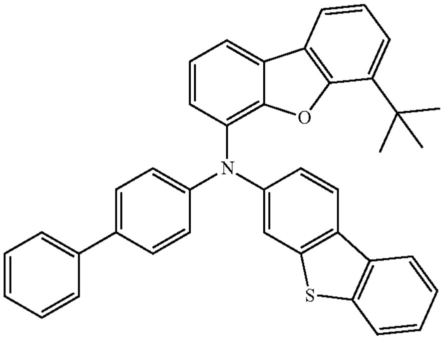
-continued
A41
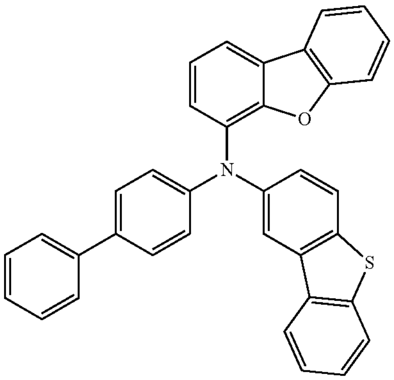
A42
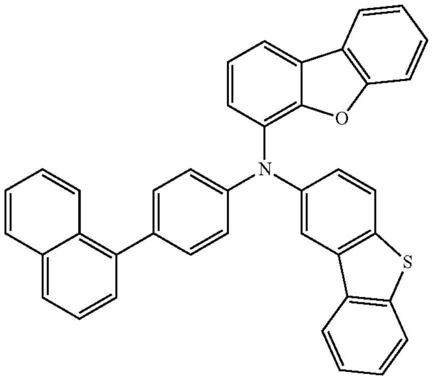
A43
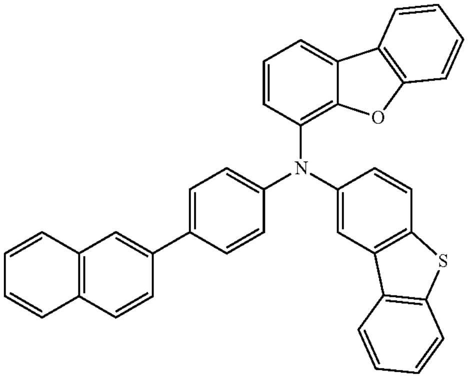
A44
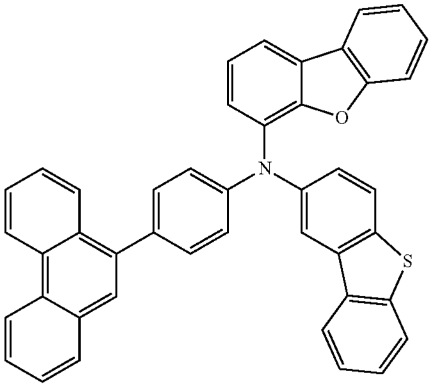

-continued
A45
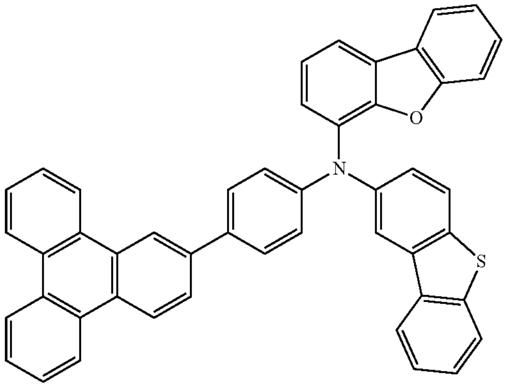
A46
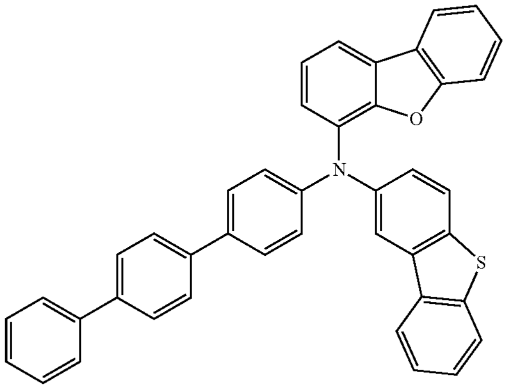
A47
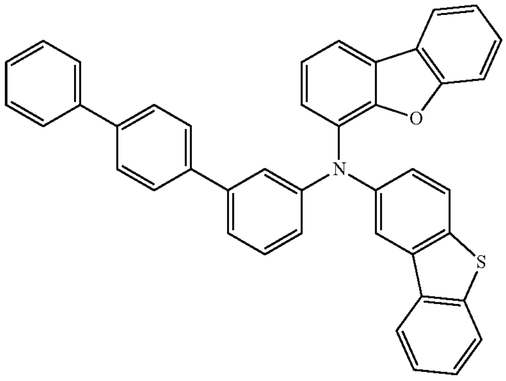
A48
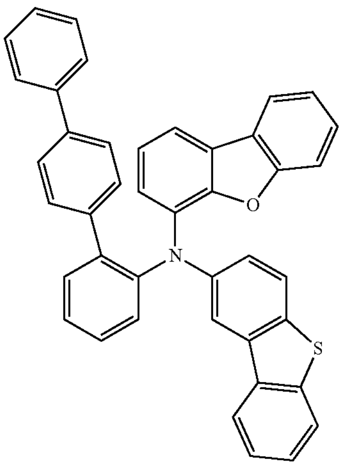
-continued
A49
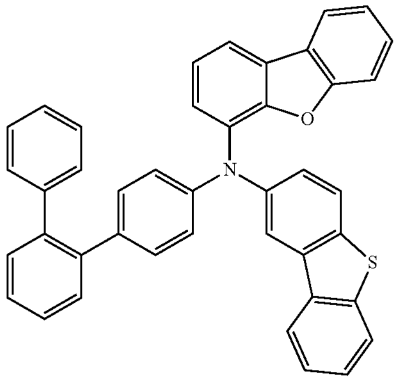
A50
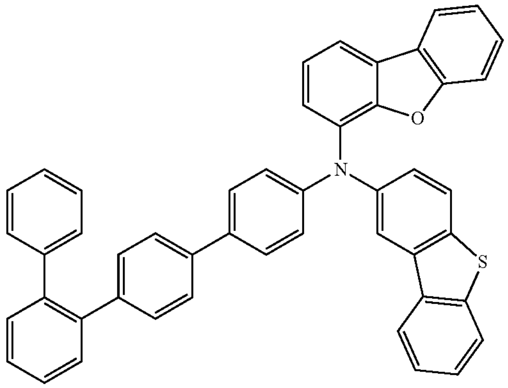
A51
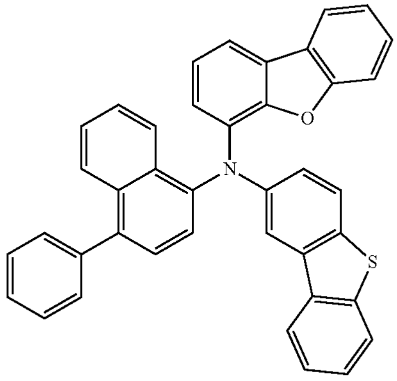
A52
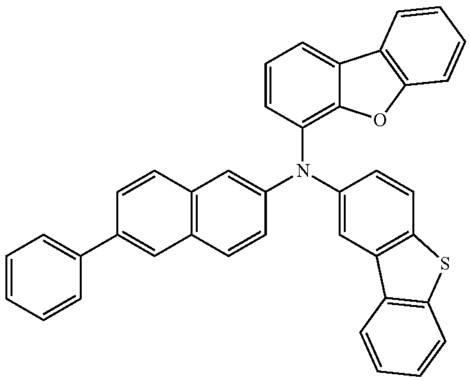

-continued
A53
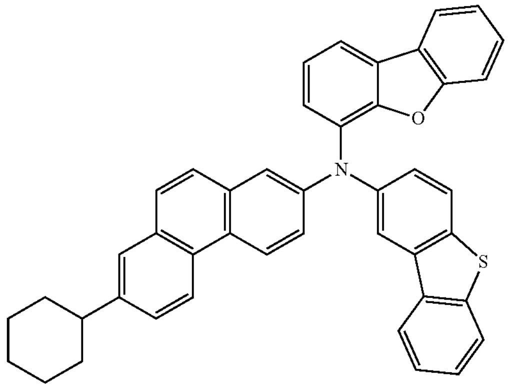
A54
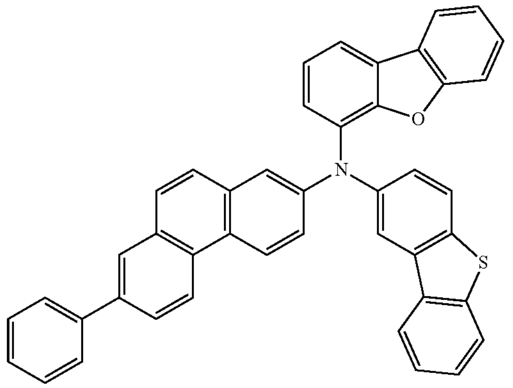
A55
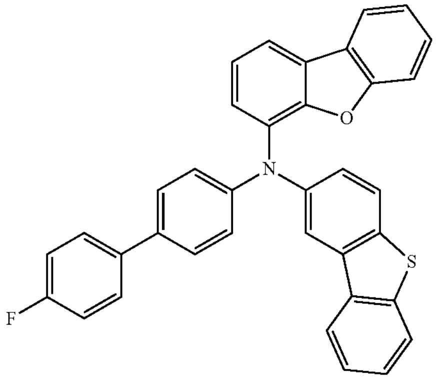
A56
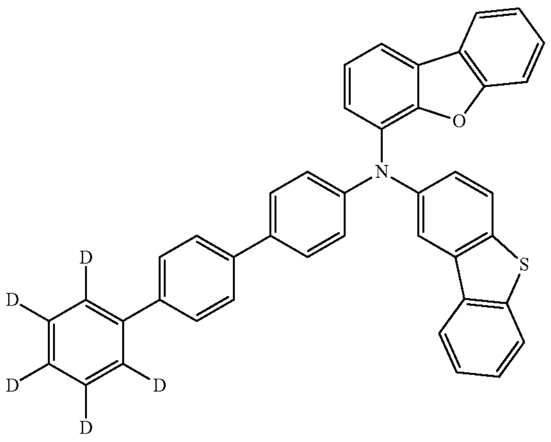
-continued
A57
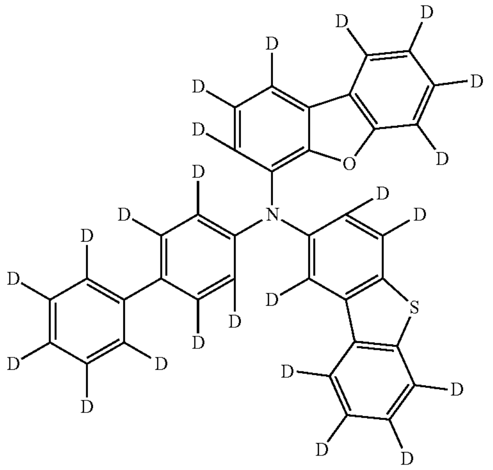
A58
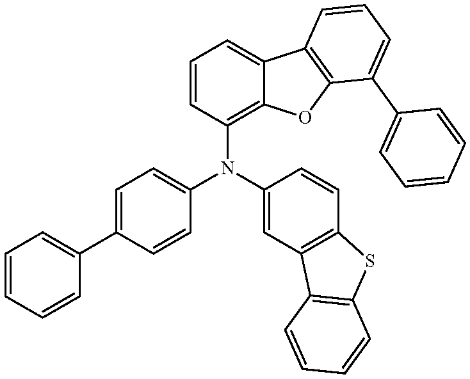
A59
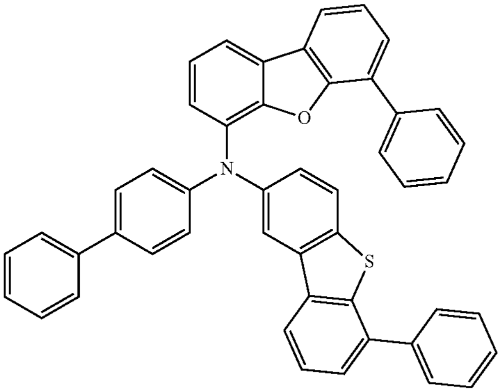
A60
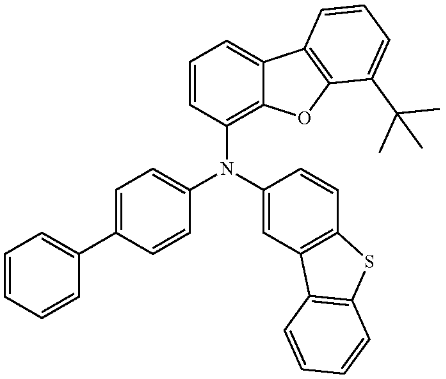

-continued
A61
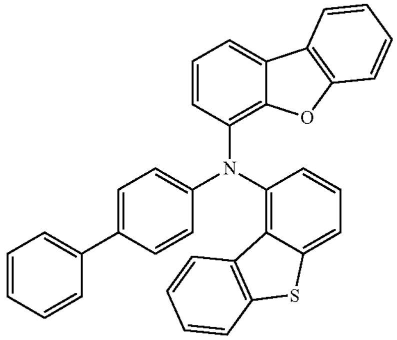
A62
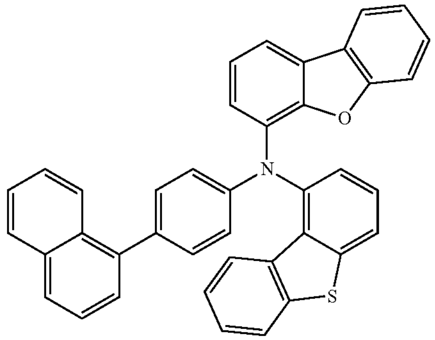
A63
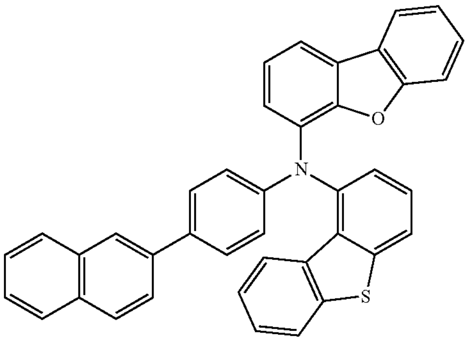
A64
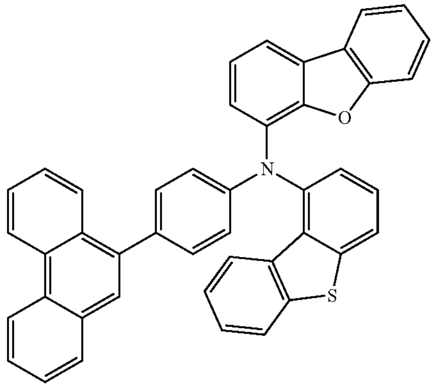
-continued
A65
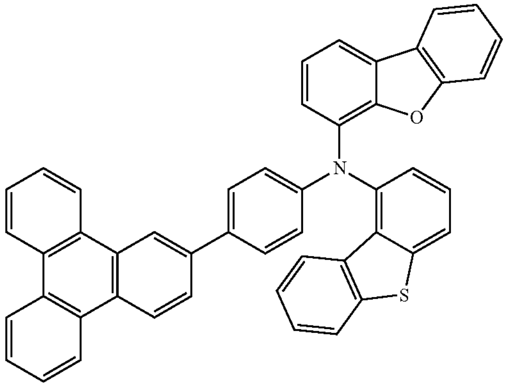
A66
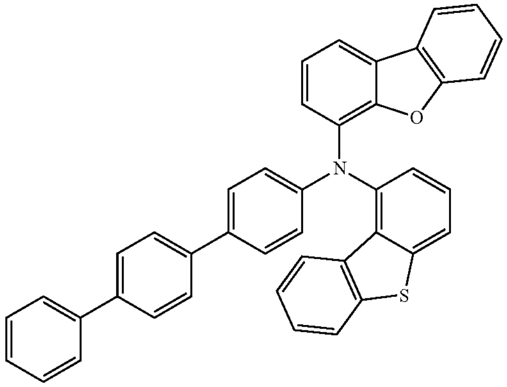
A67
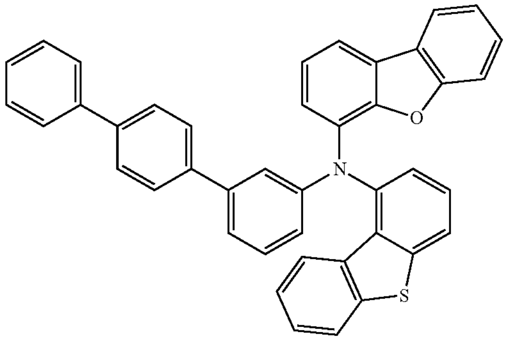
A68
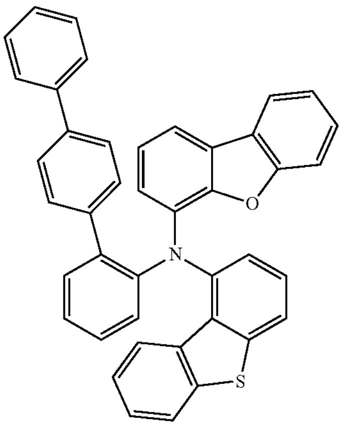

-continued
A69
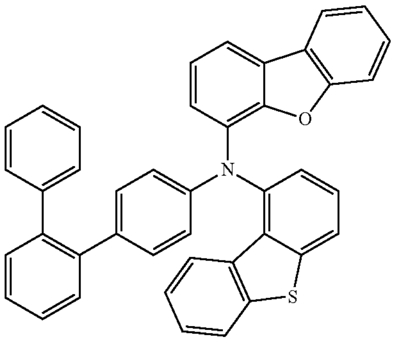
A70
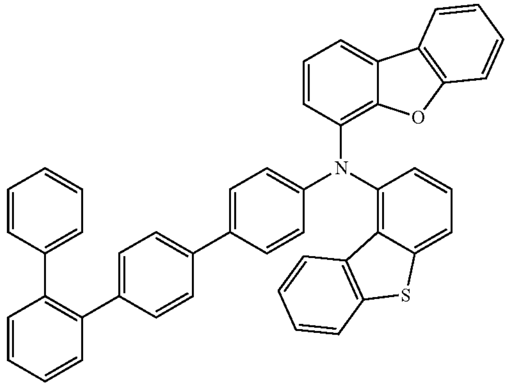
A71
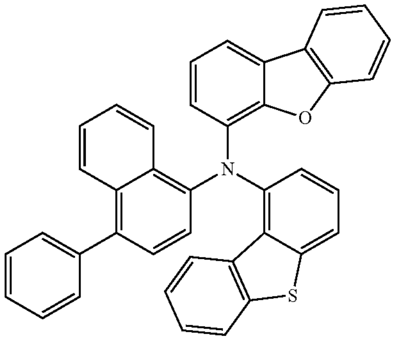
A72
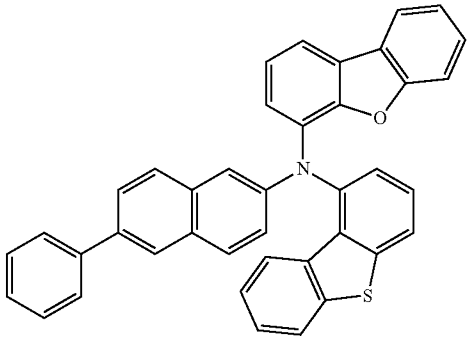
-continued
A73
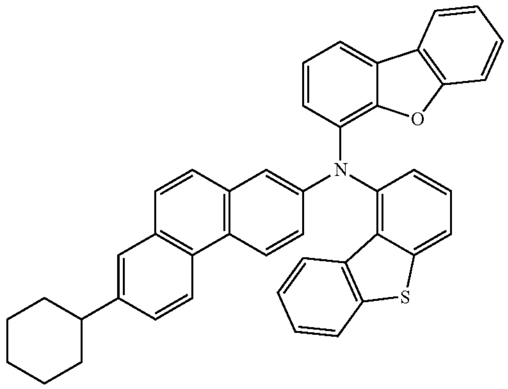
A74
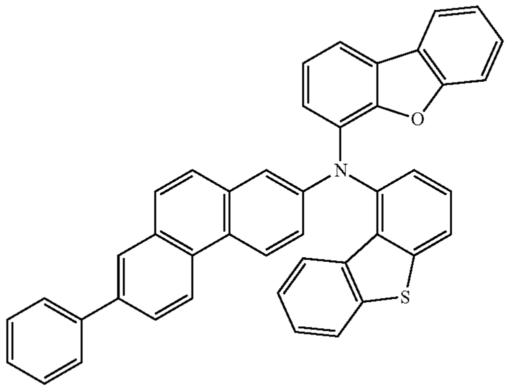
A75
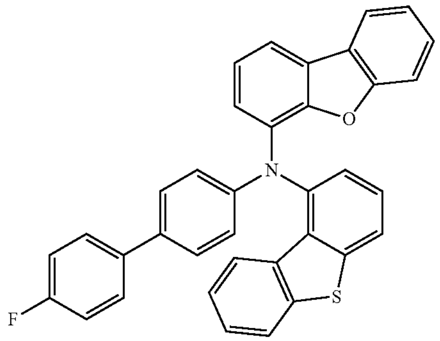
A76
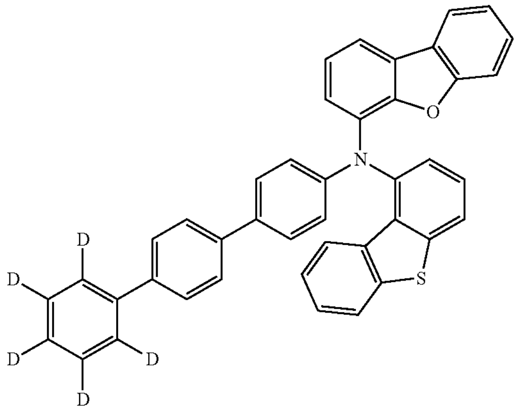

-continued
A77
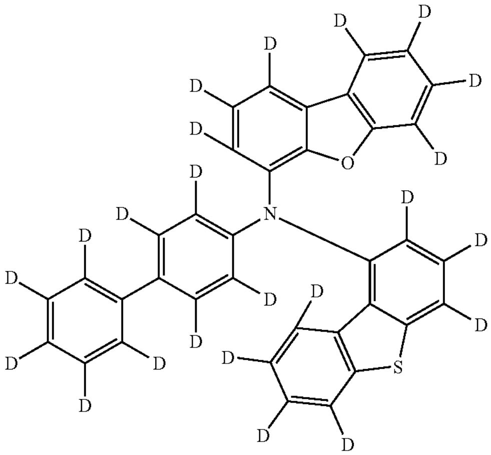
A78
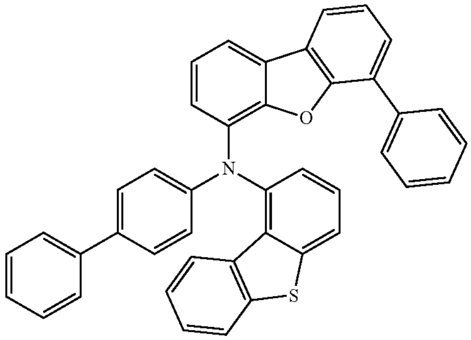
A79
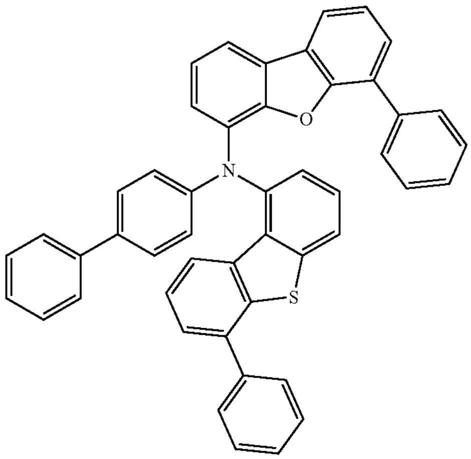
A80
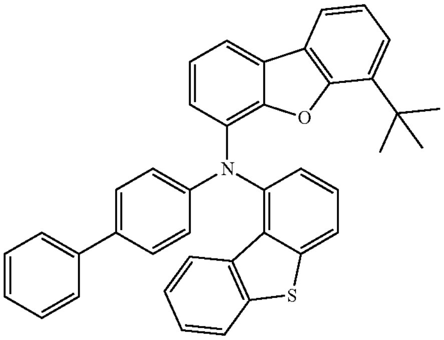
-continued
A81
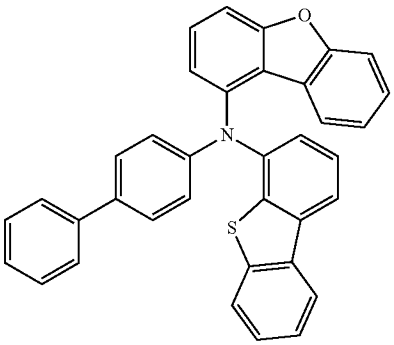
A82
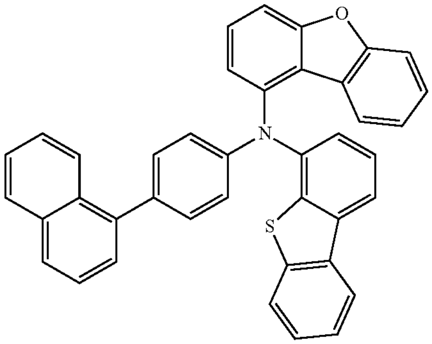
A83
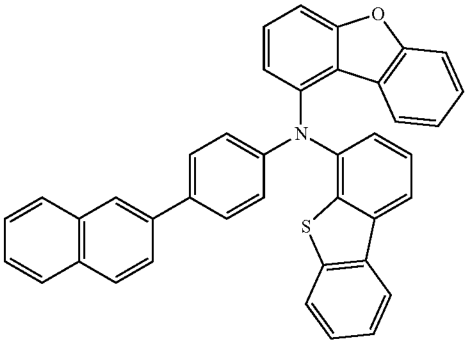
A84
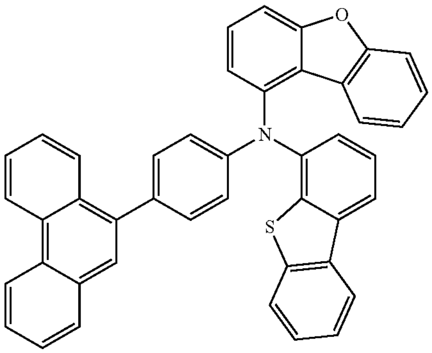

-continued
A85
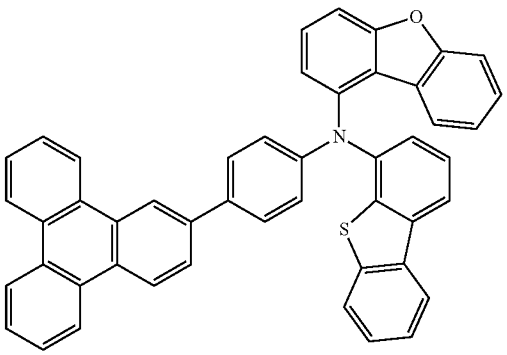
A86
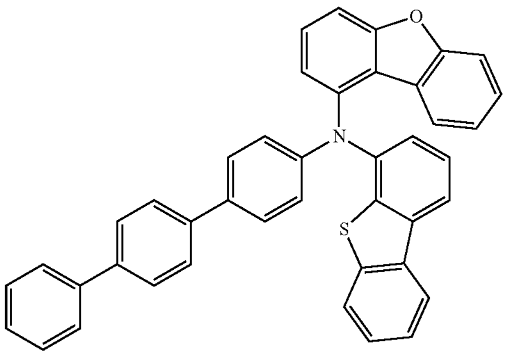
A87
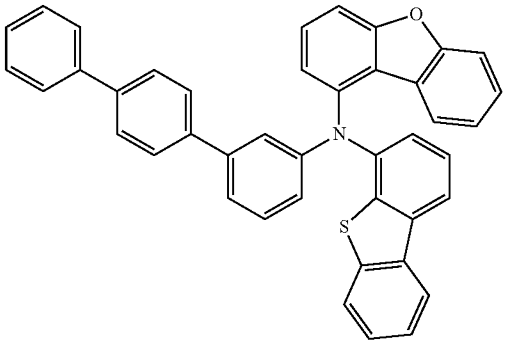
A88
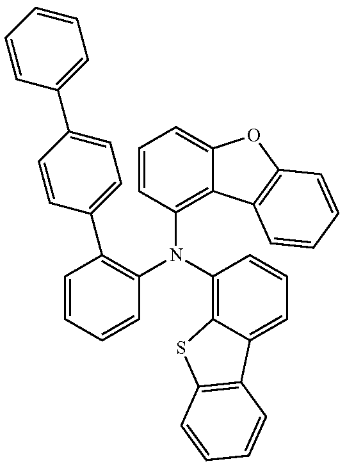
-continued
A89
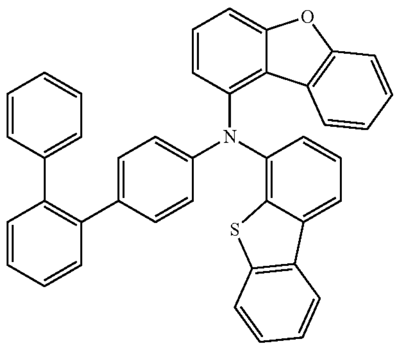
A90
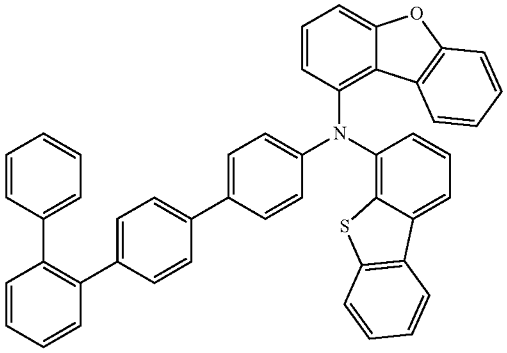
A91
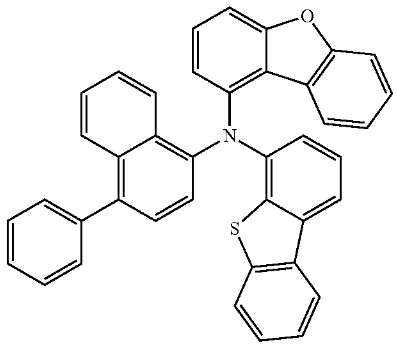
A92
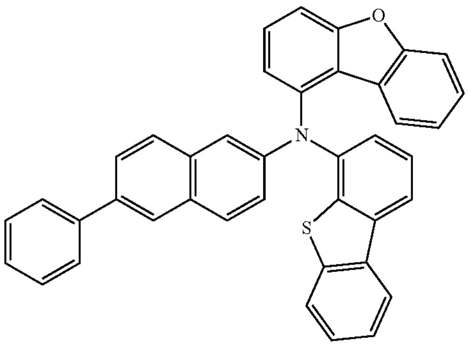

-continued
A93
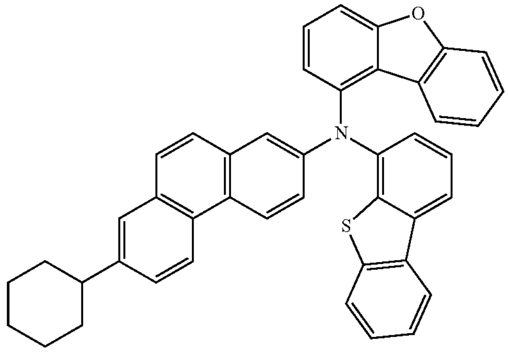
A94
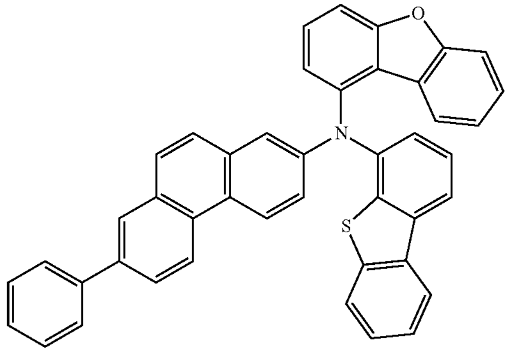
A95
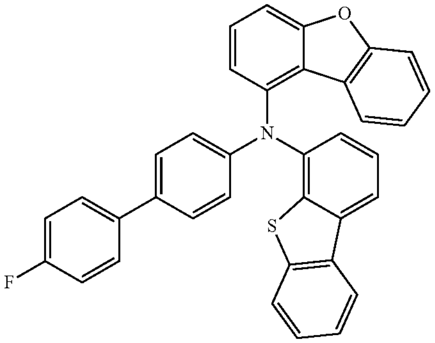
A96
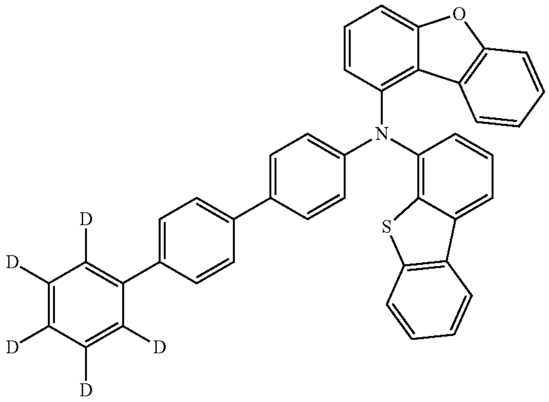
-continued
A97
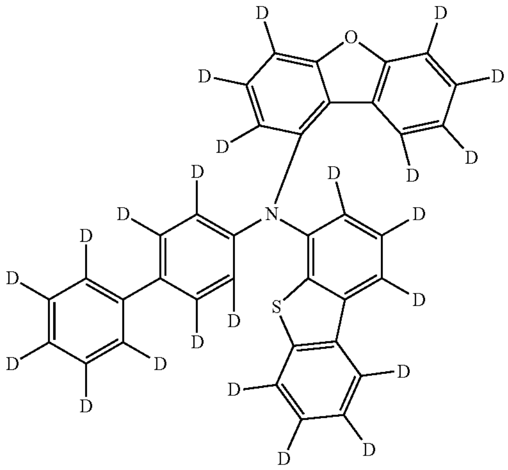
A98
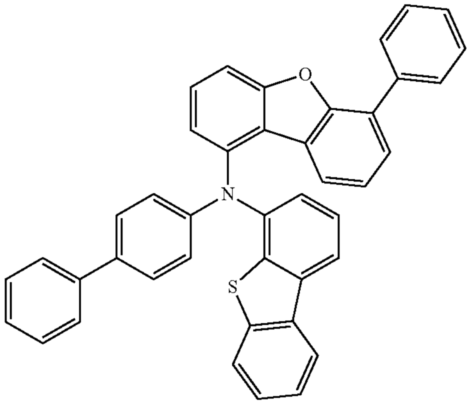
A99
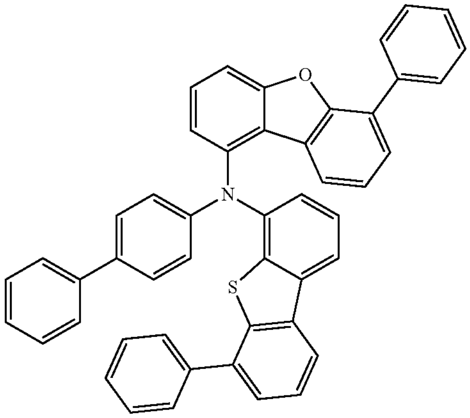

-continued
A100
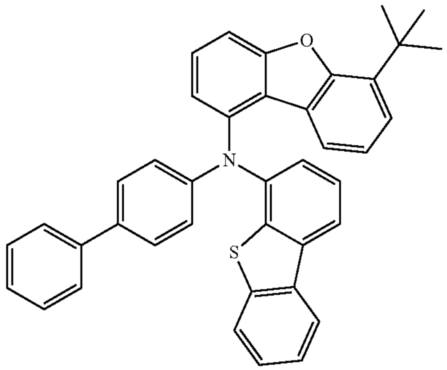
A101
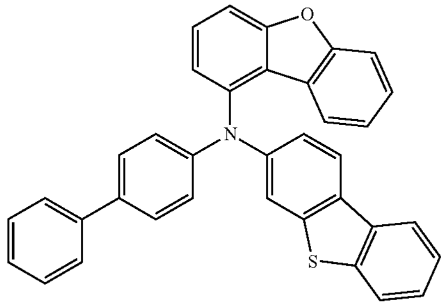
A102
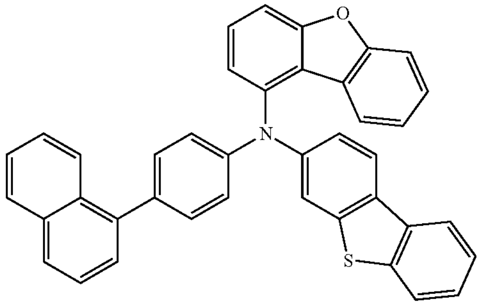
A103
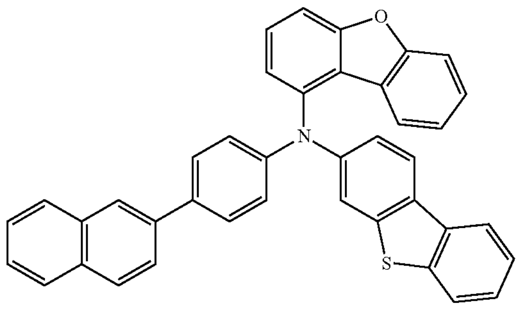
-continued
A104
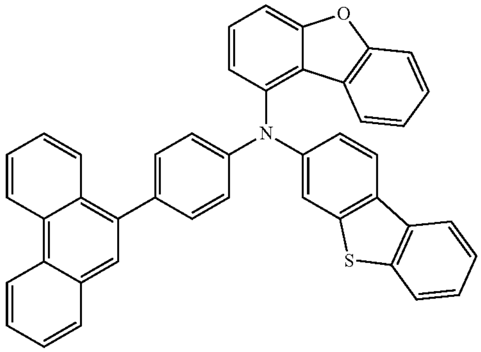
A105
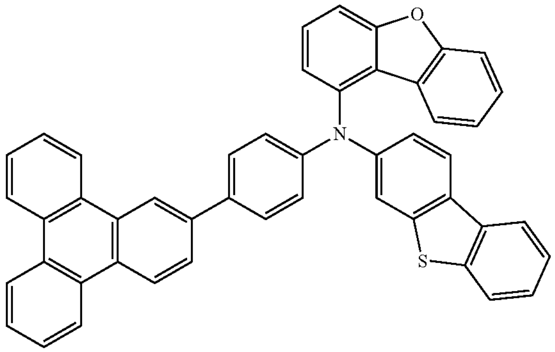
A106
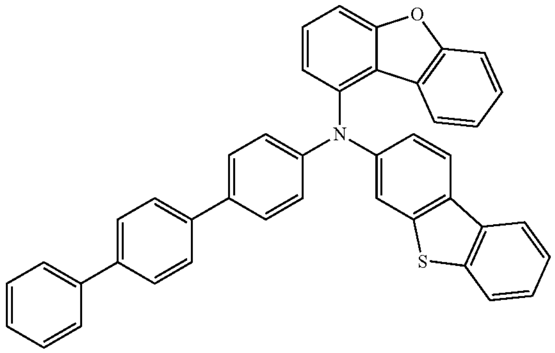
A107
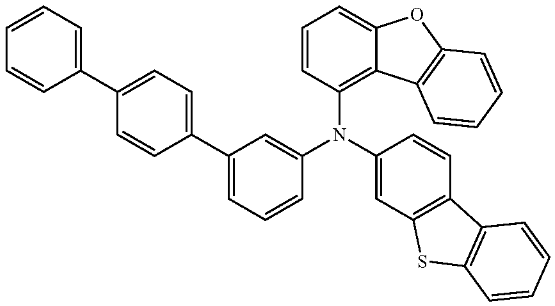

A108
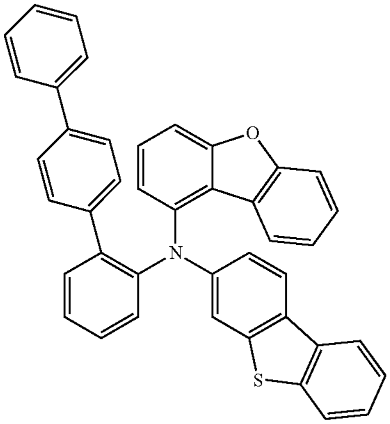
A109
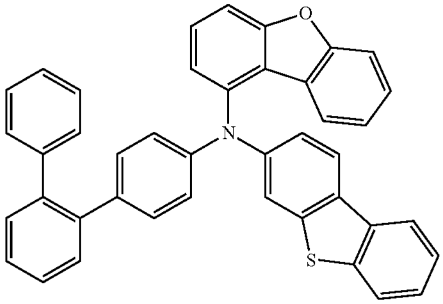
A110
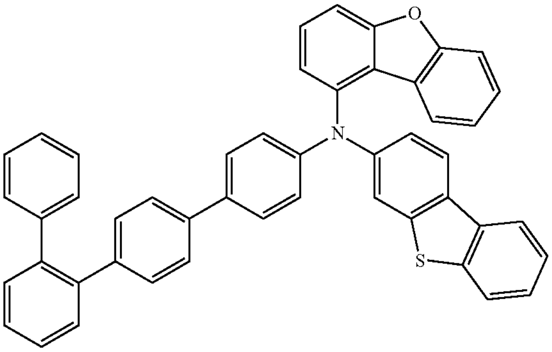
A111
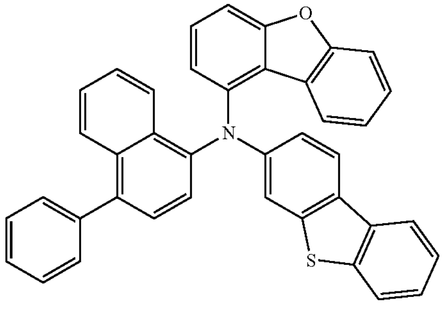
A112
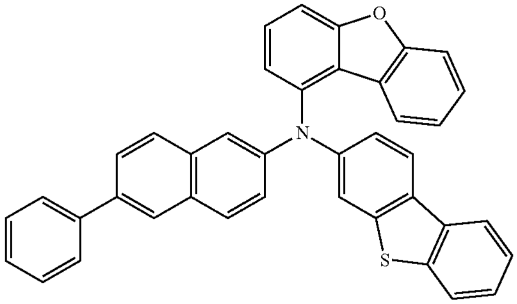
A113
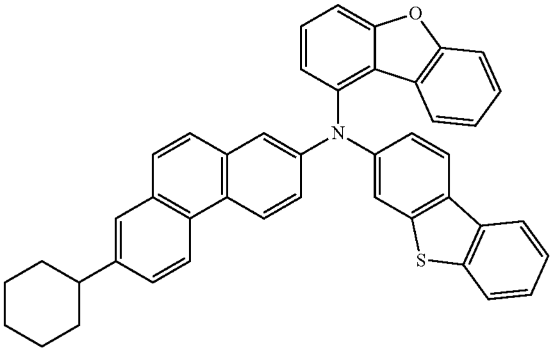
A114
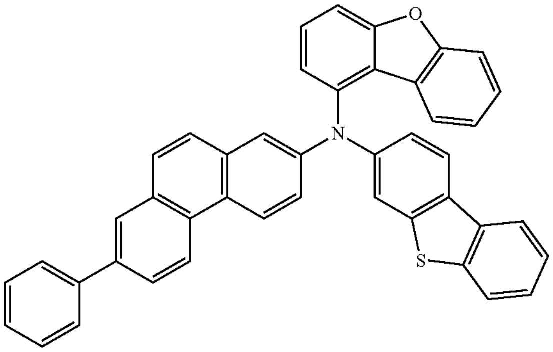
A115
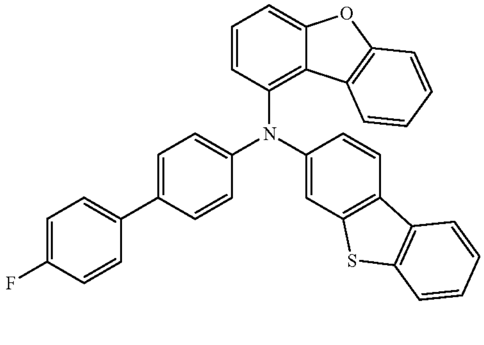

-continued
A116
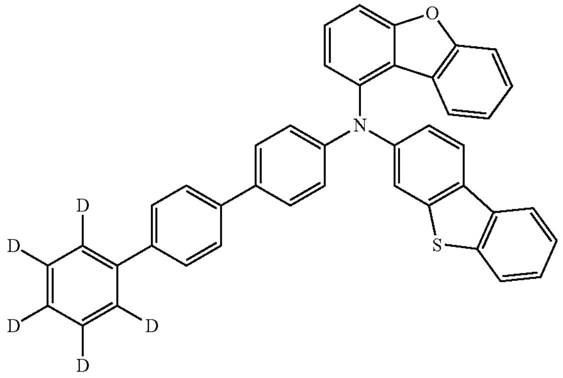
A117
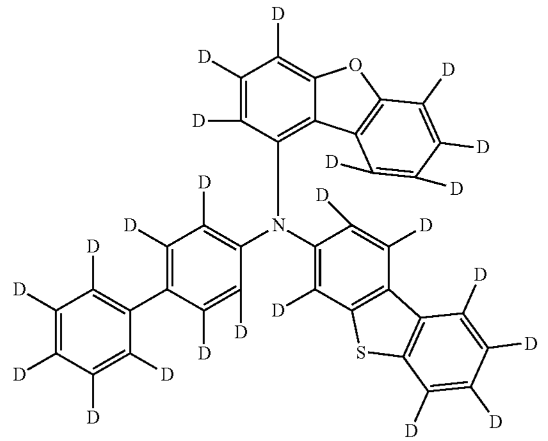
A118
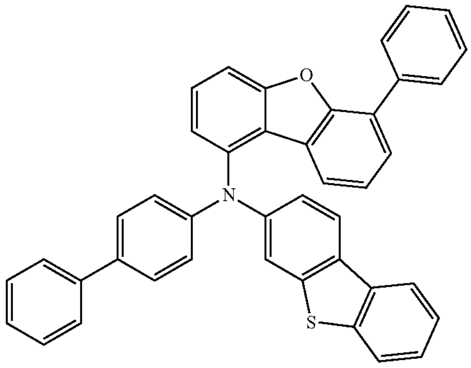
-continued
A119
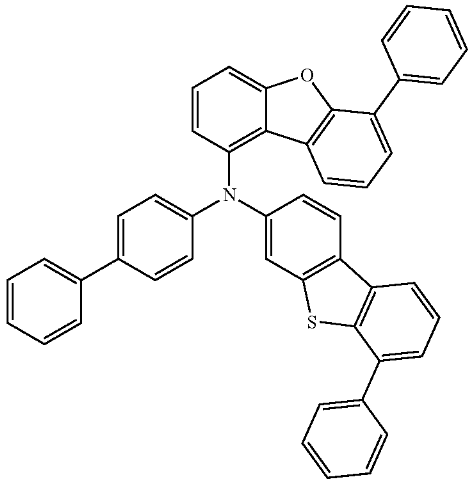
A120
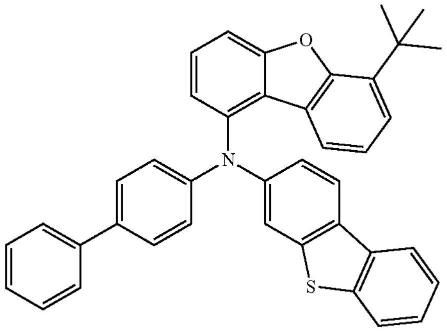
A121
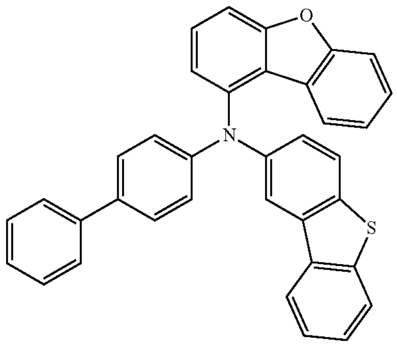
A122
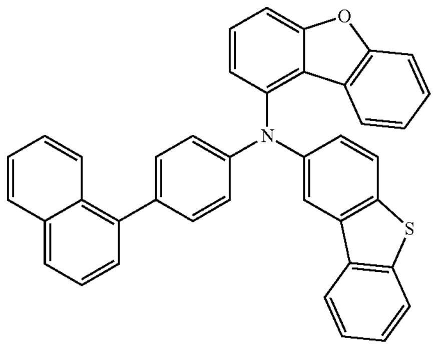

-continued
A123
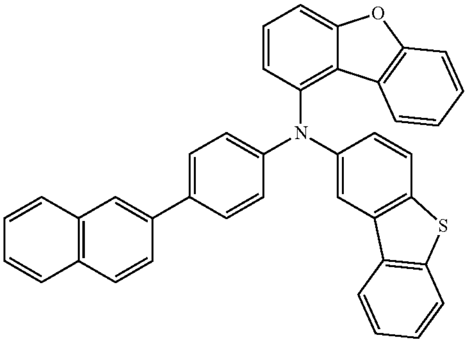
A124
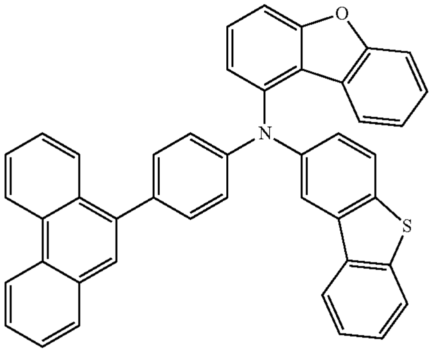
A125
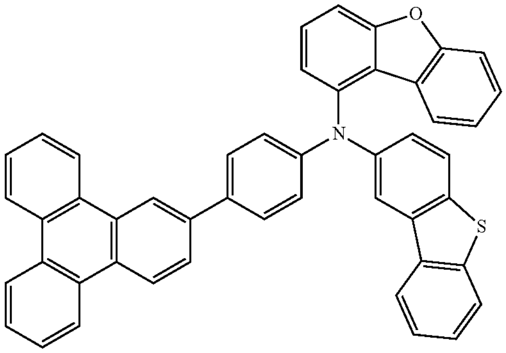
A126
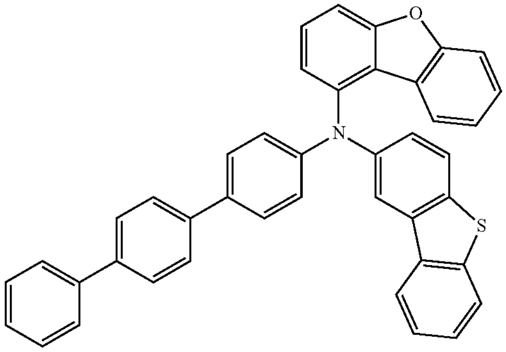
-continued
A127
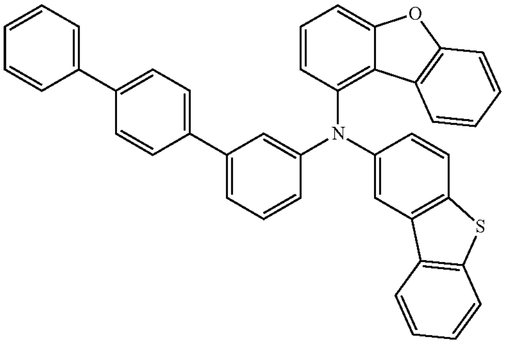
A128
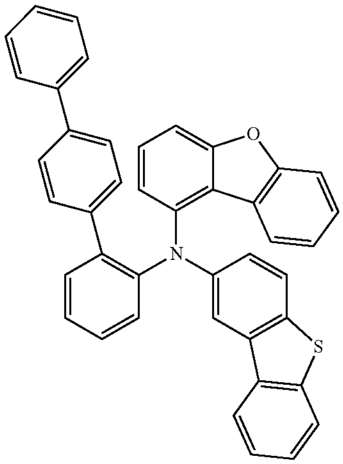
A129
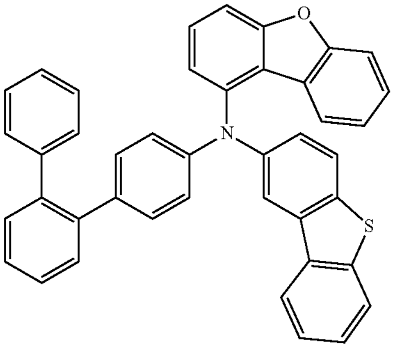
A130
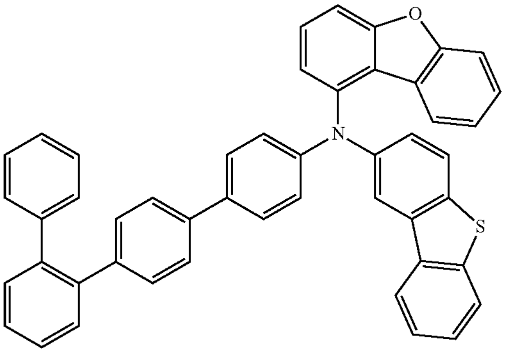

-continued
A131
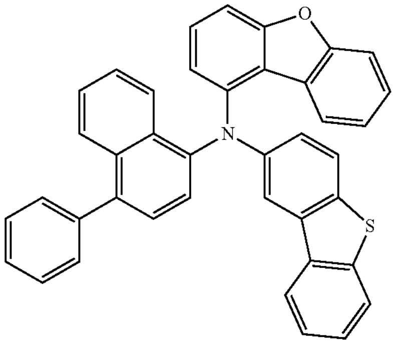
A132
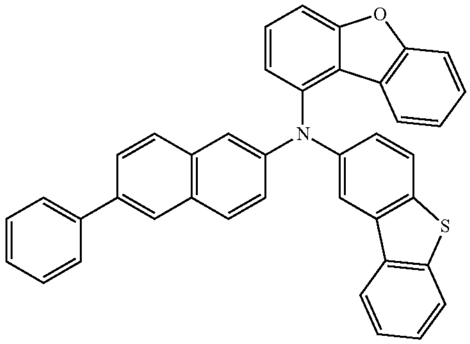
A133
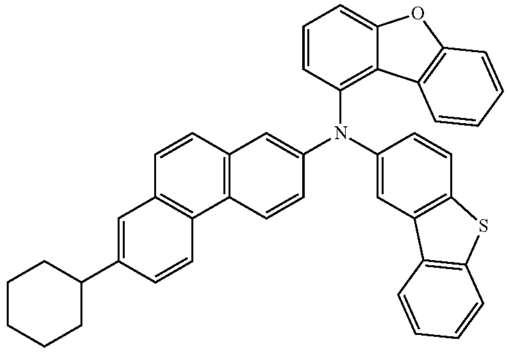
A134
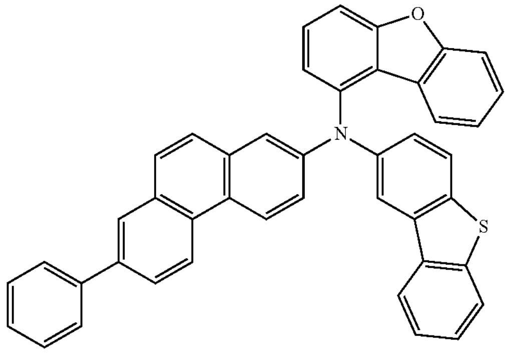
-continued
A135
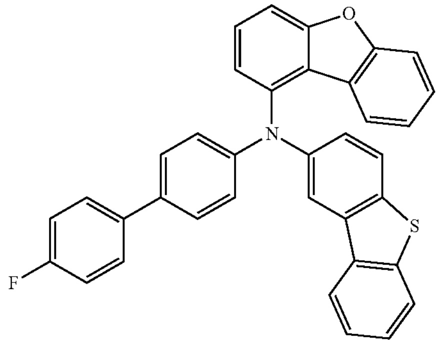
A136
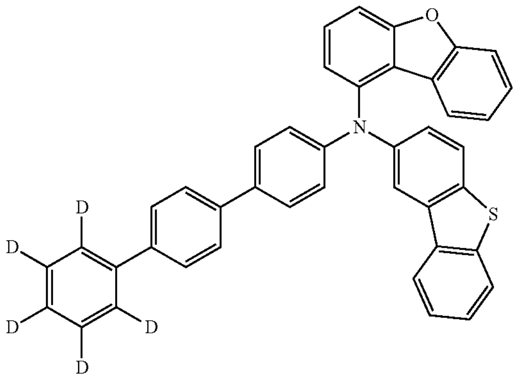
A137
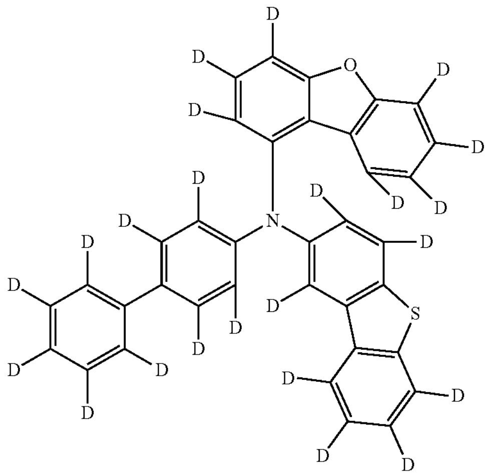
A138
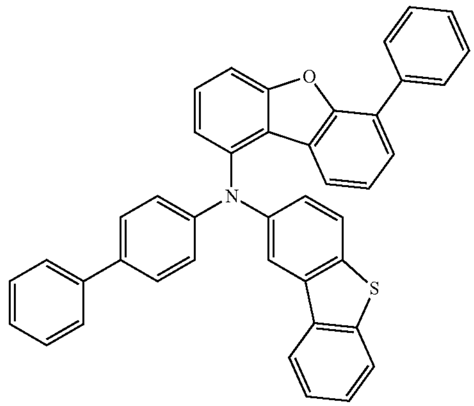

-continued
A139
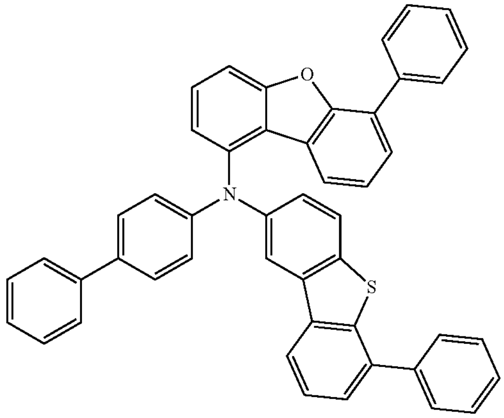
A140
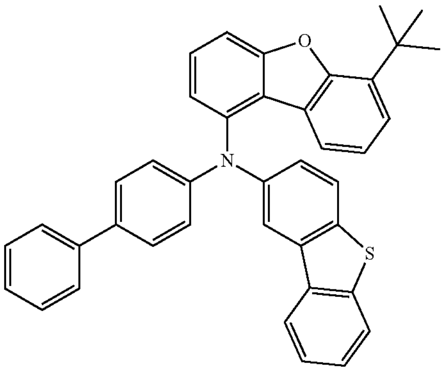
A141
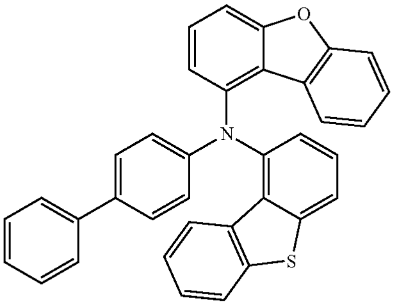
A142
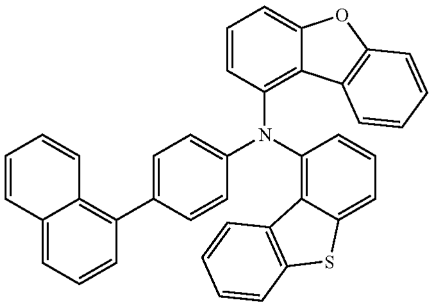
-continued
A143
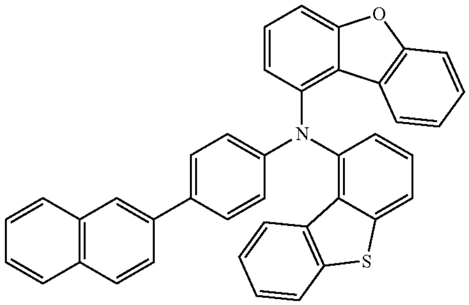
A144
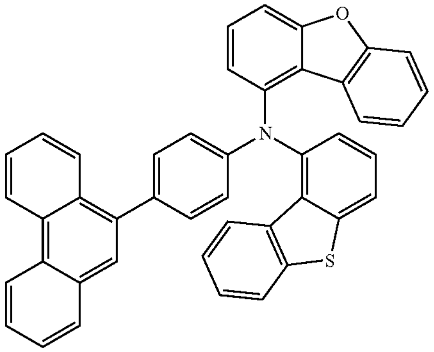
A145
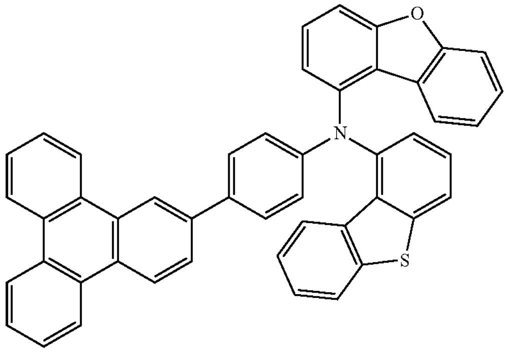
A146
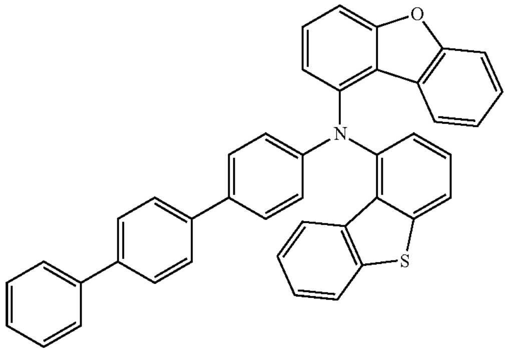

-continued
A147
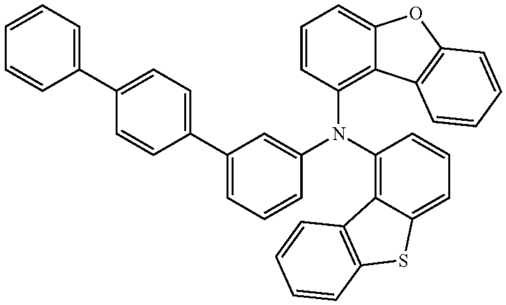
A148
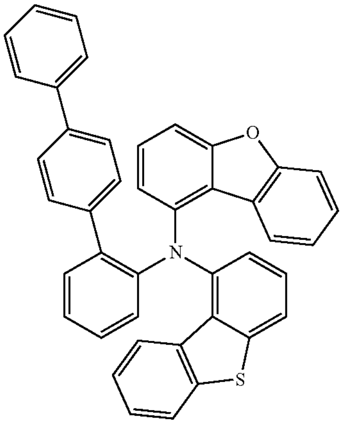
A149
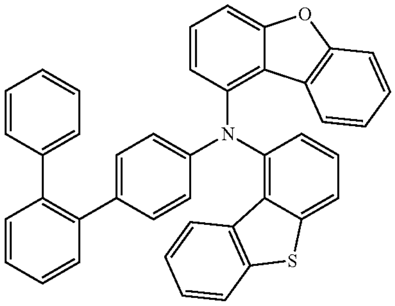
A150
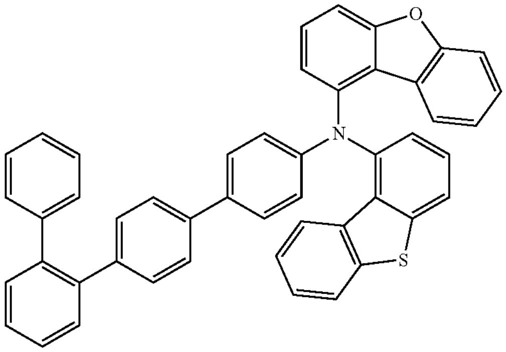
-continued
A151
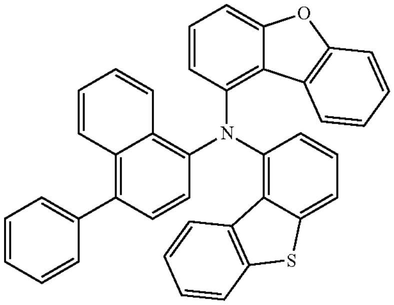
A152
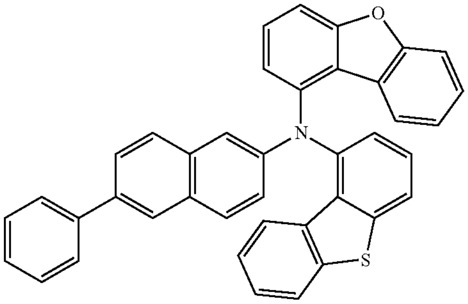
A153
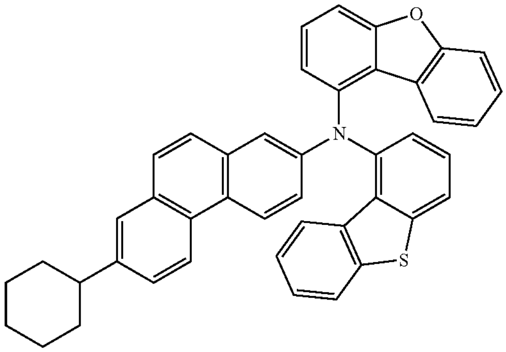
A154
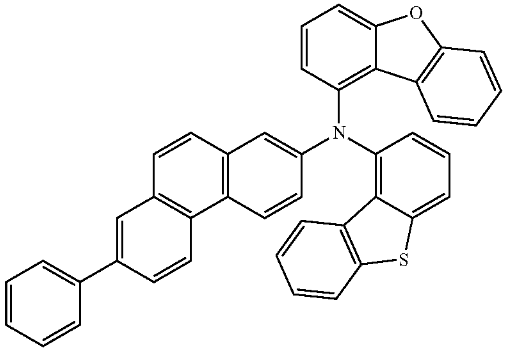

-continued
A155
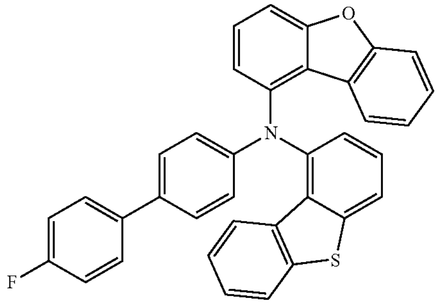
A156
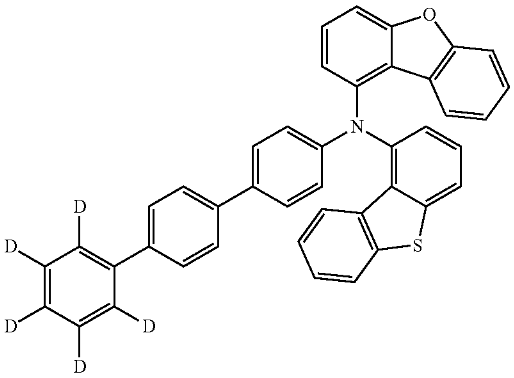
A157
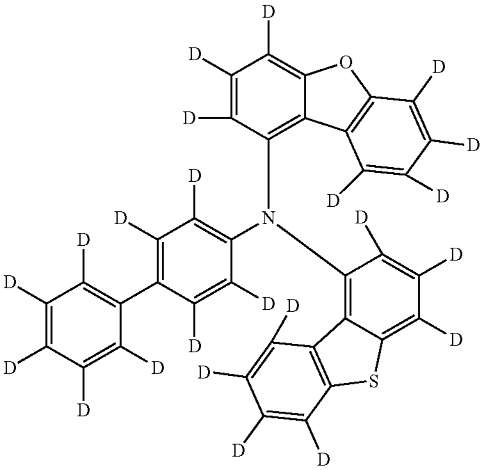
A158
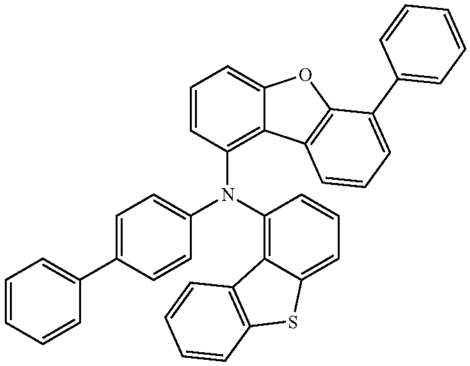
-continued
A159
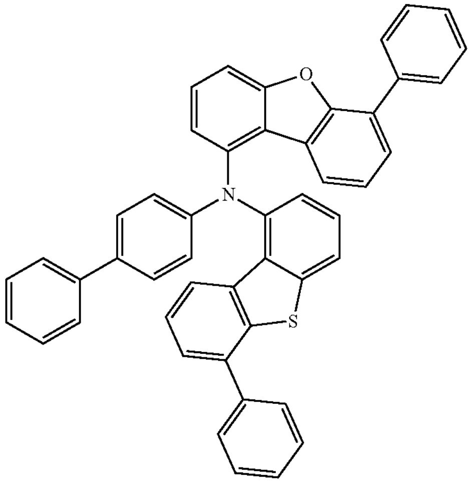
A160
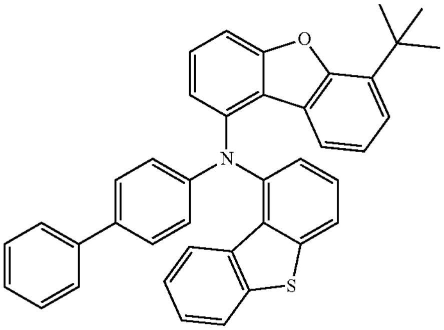
Compound Group B
B1
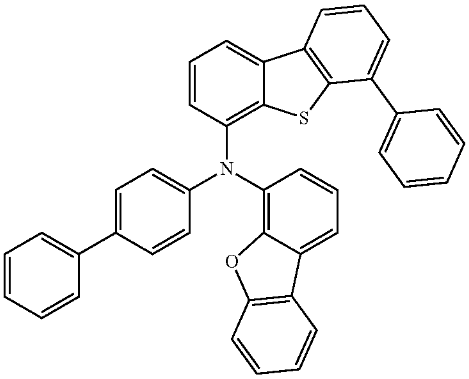
B2
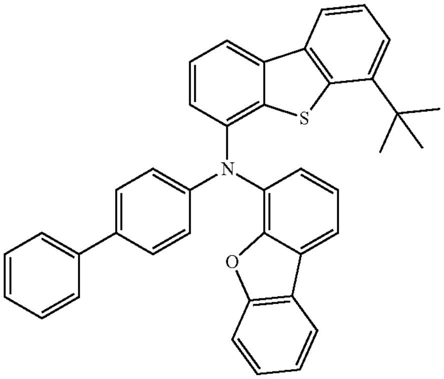

-continued
B3
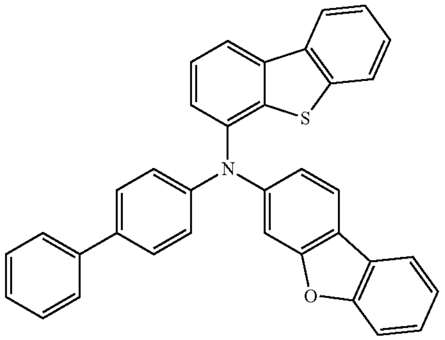
B4
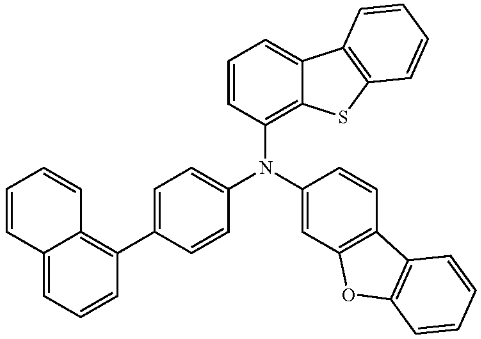
B5
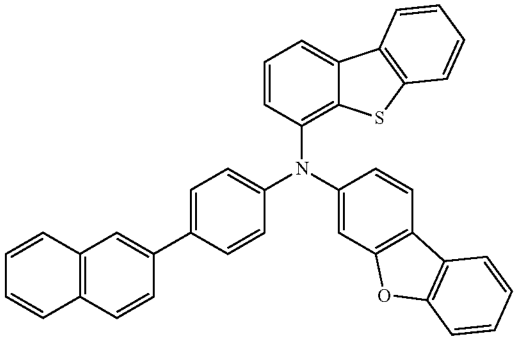
B6
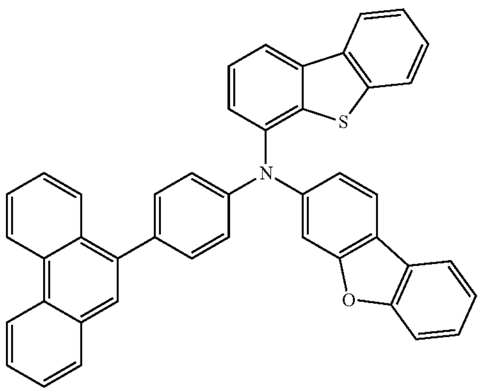
-continued
B7
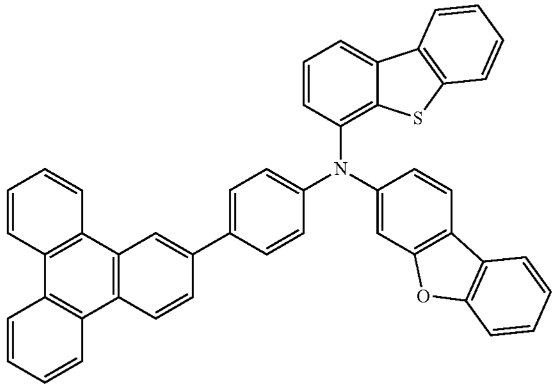
B8
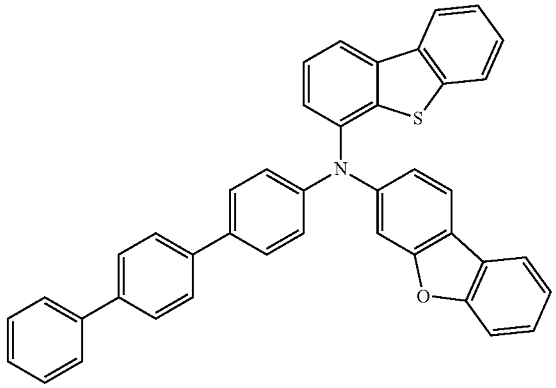
B9
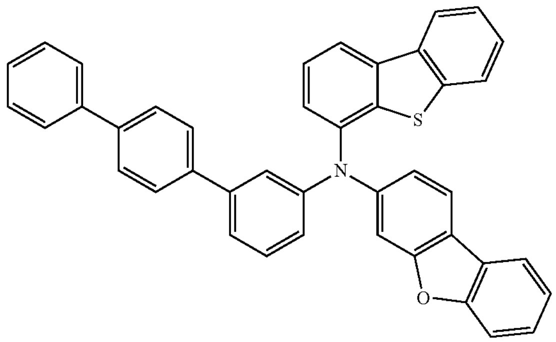
B10
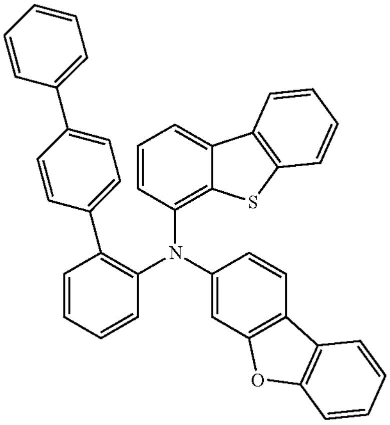

-continued
B11
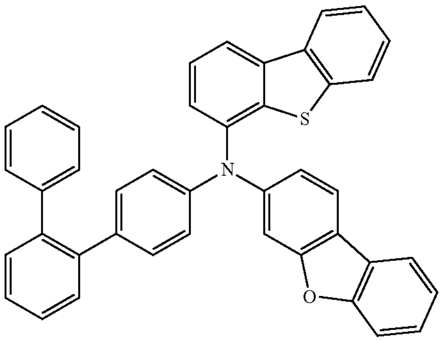
B12
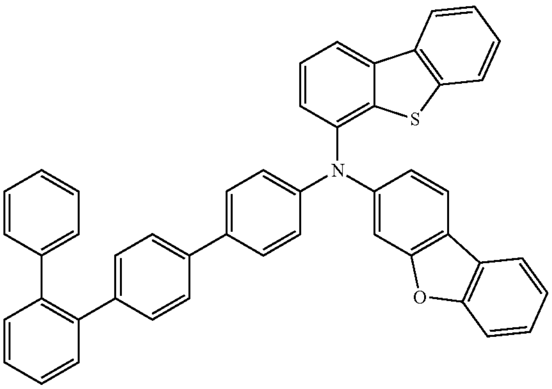
B13
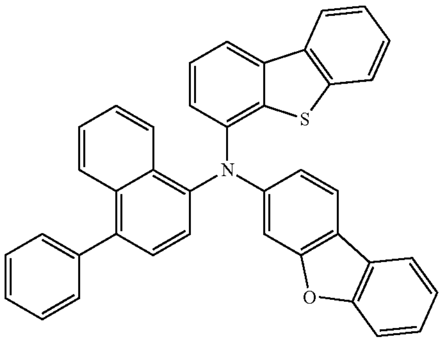
B14
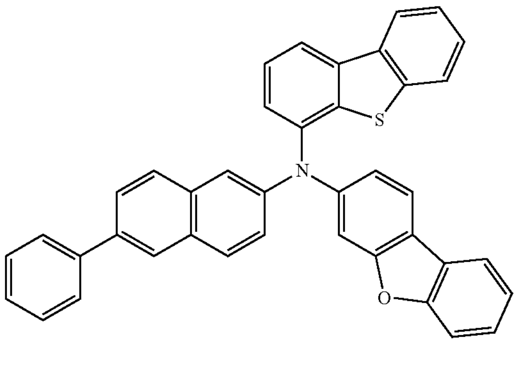
-continued
B15
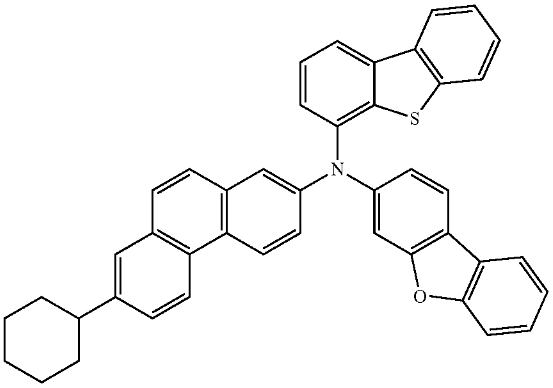
B16
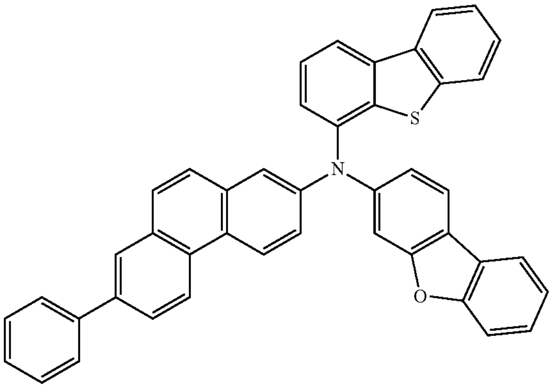
B17
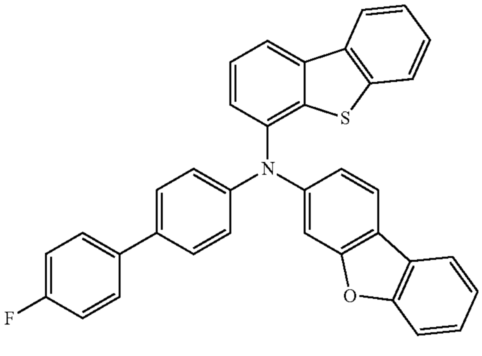
B18
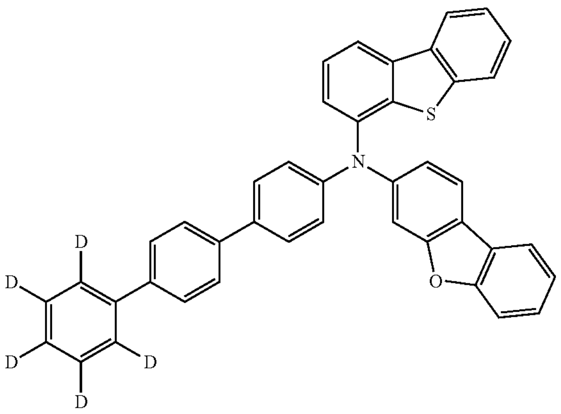

-continued
B19
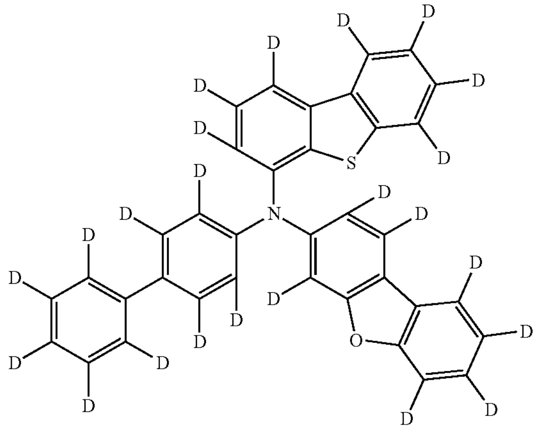
B20
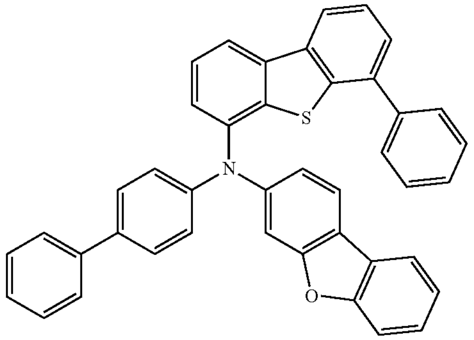
B21
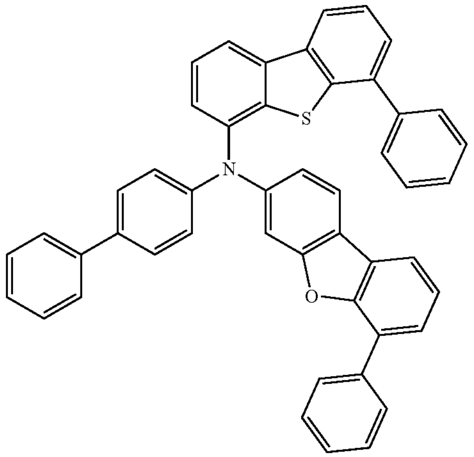
B22
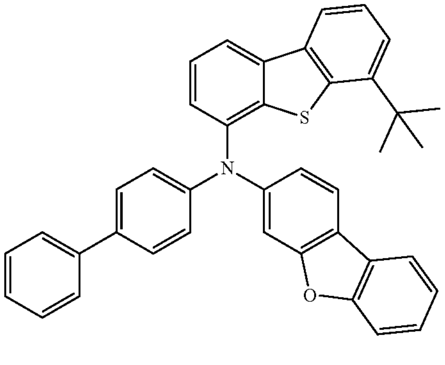
-continued
B23
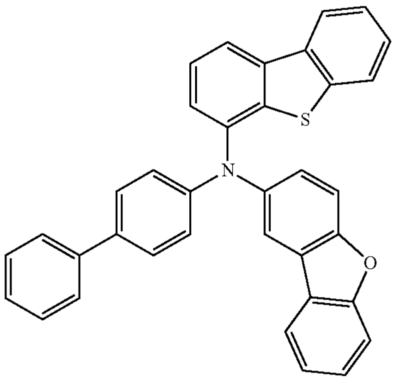
B24
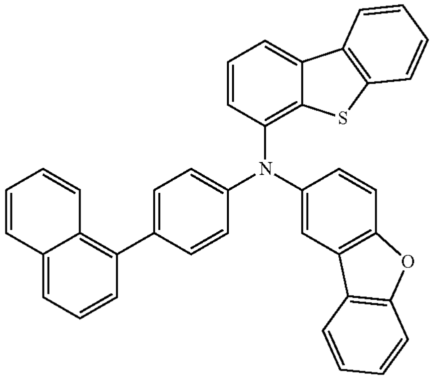
B25
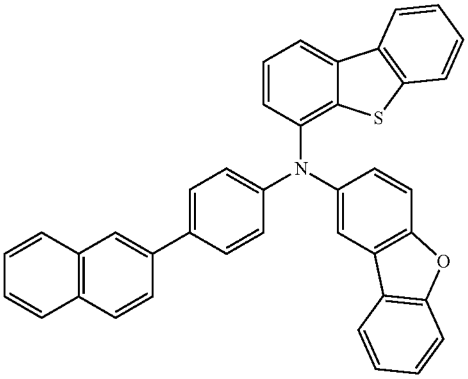
B26
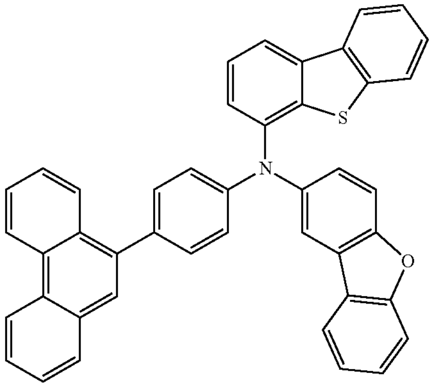

-continued
B27
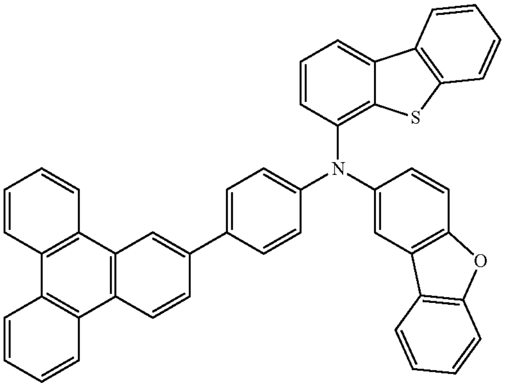
B28
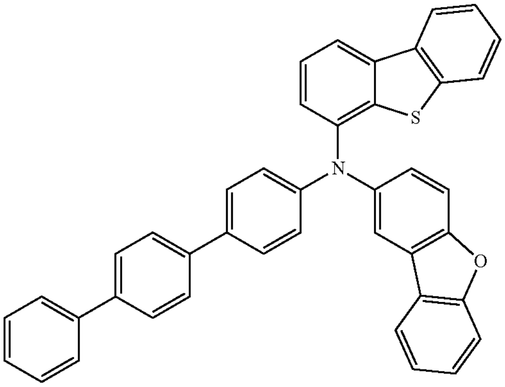
B29
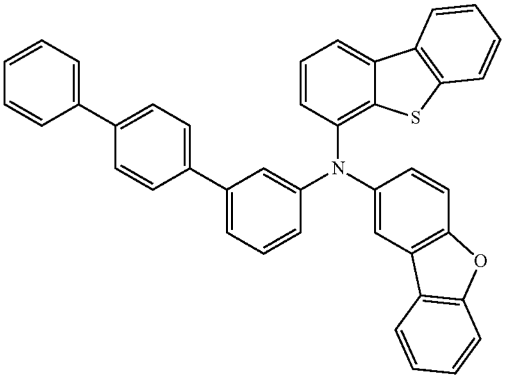
B30
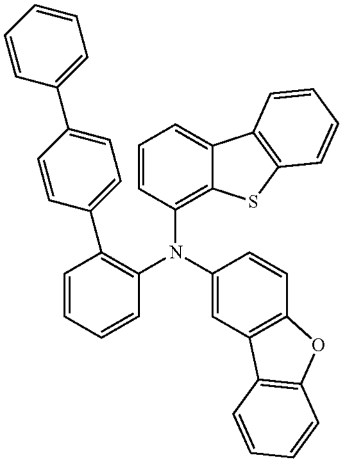
-continued
B31
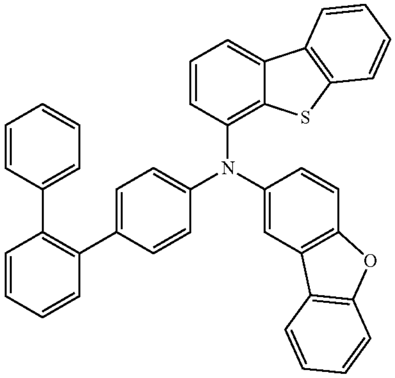
B32
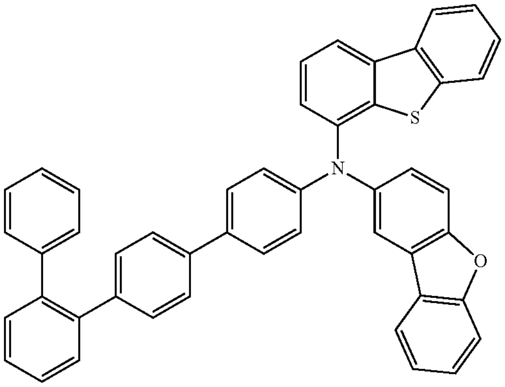
B33
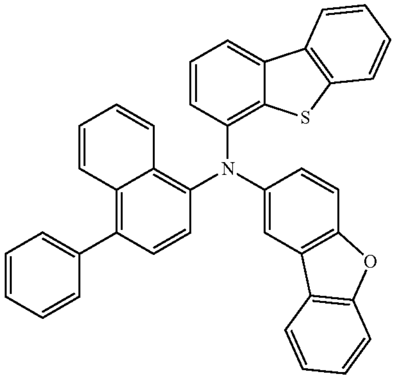
B34
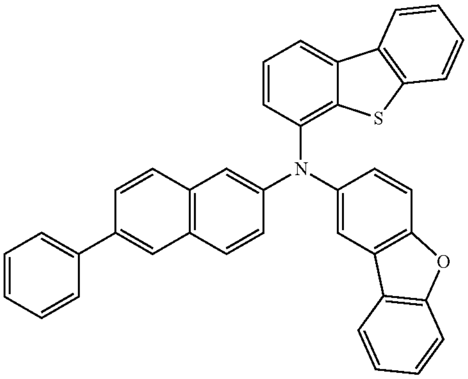

-continued
B35
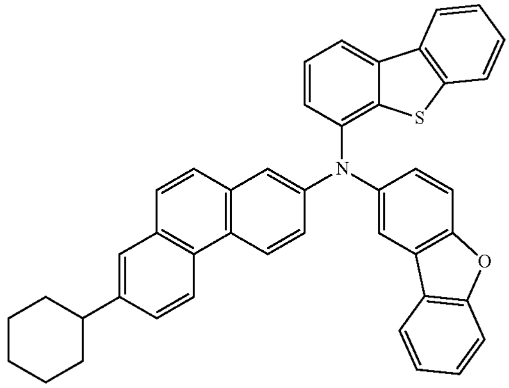
B36
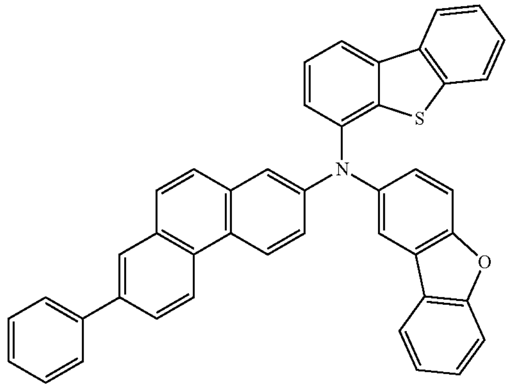
B37
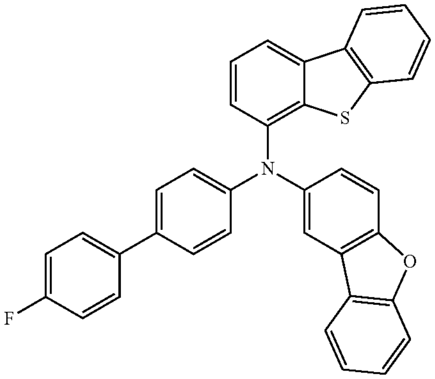
B38
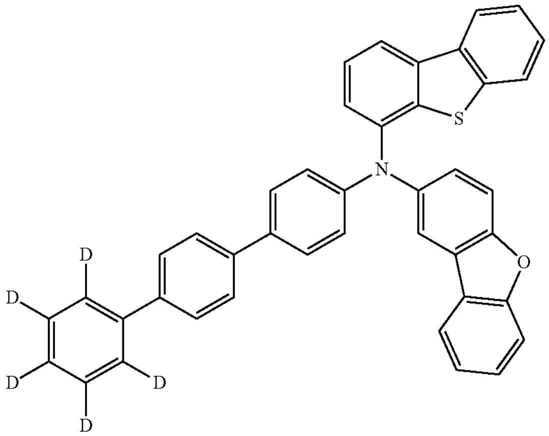
-continued
B39
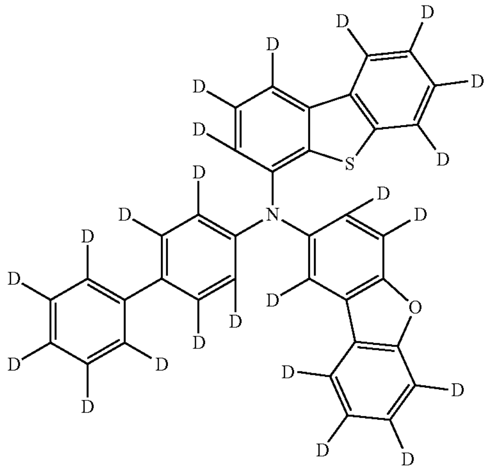
B40
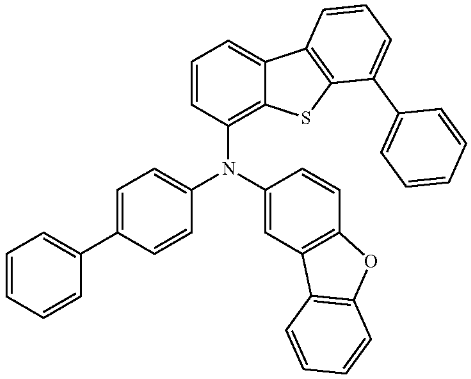
B41
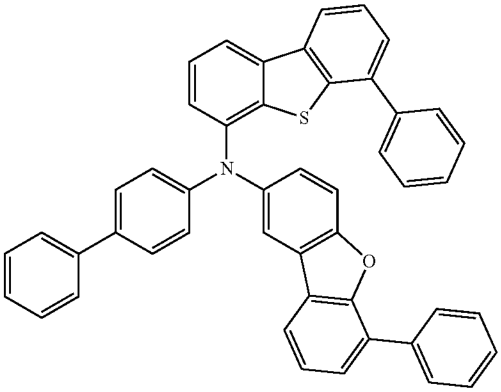
B42
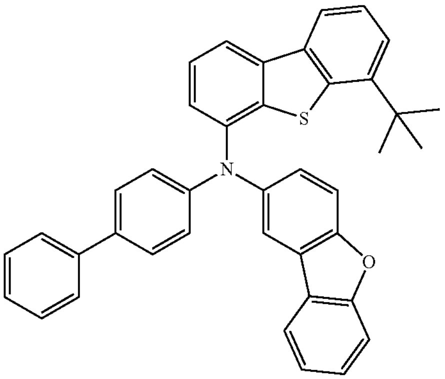

-continued
B43
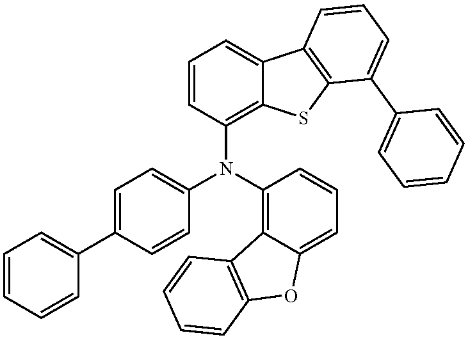
B44
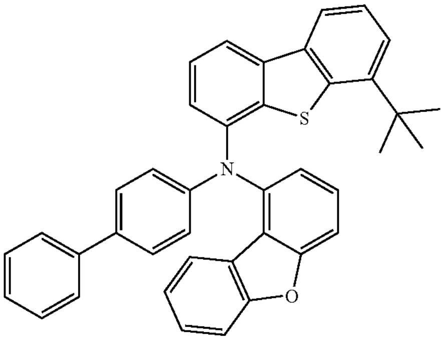
B45
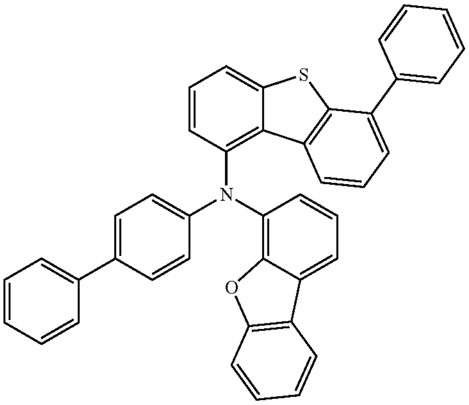
B46
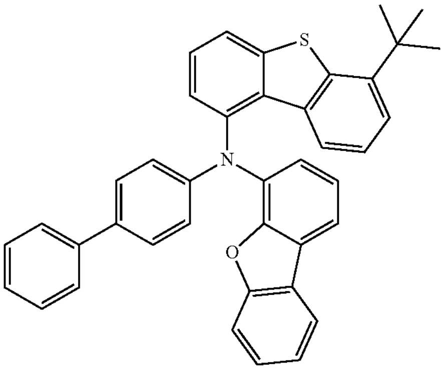
-continued
B47
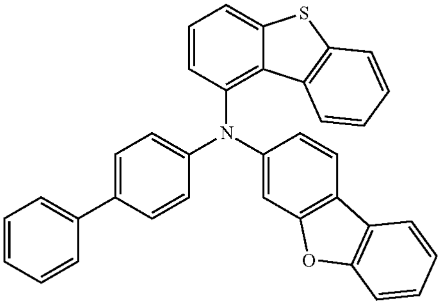
B48
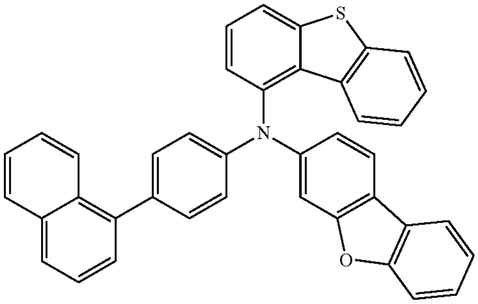
B49
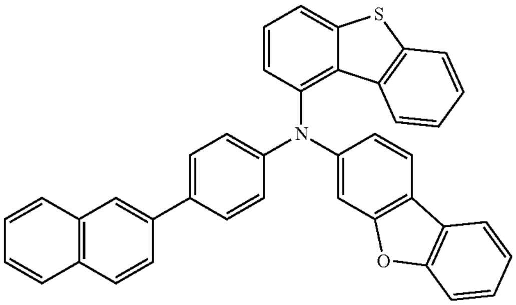
B50
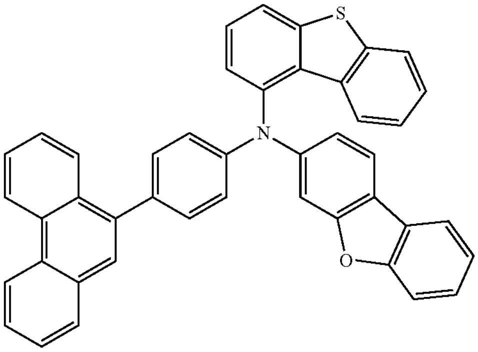

-continued
B51
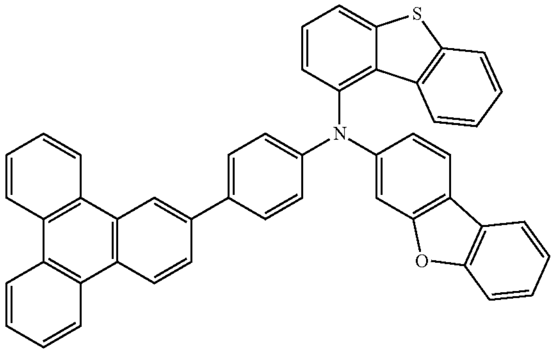
B52
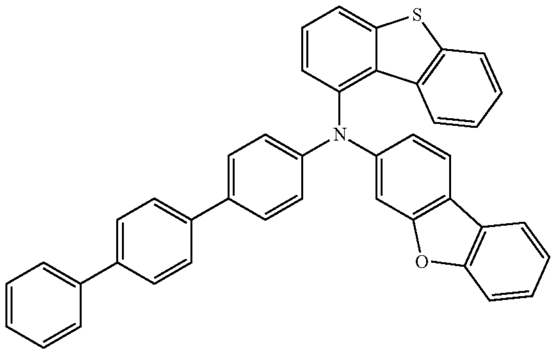
B53
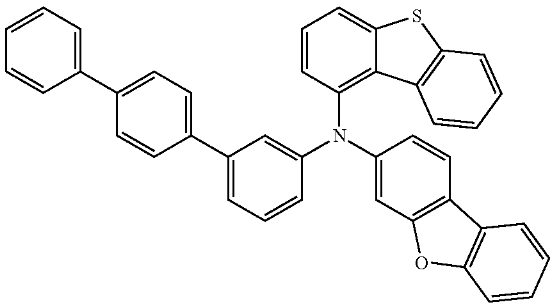
B54
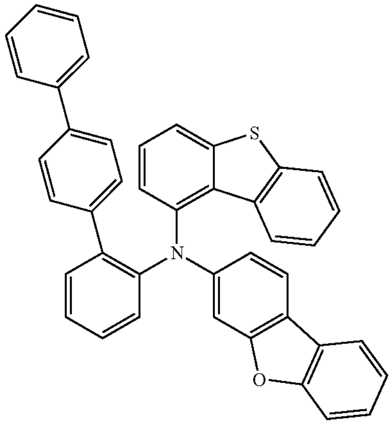
-continued
B55
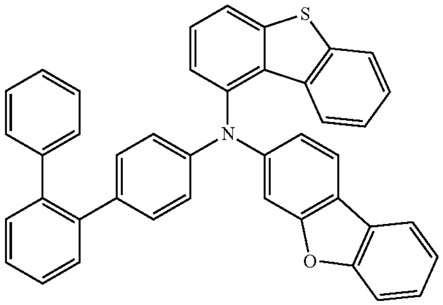
B56
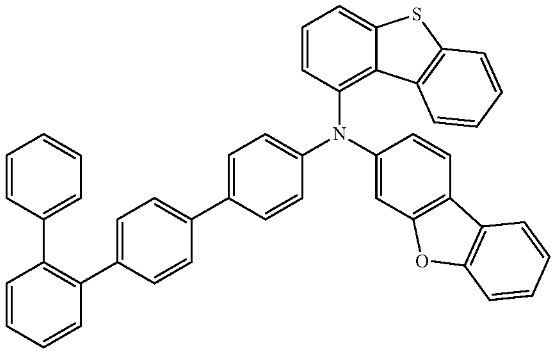
B57
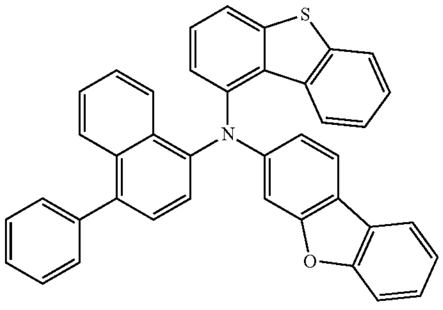
B58
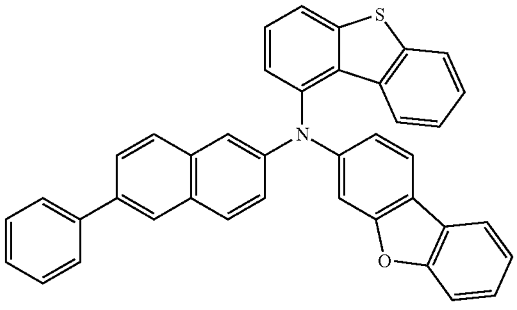

-continued
B59
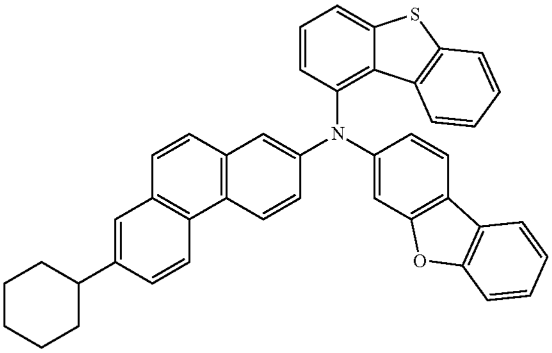
B60
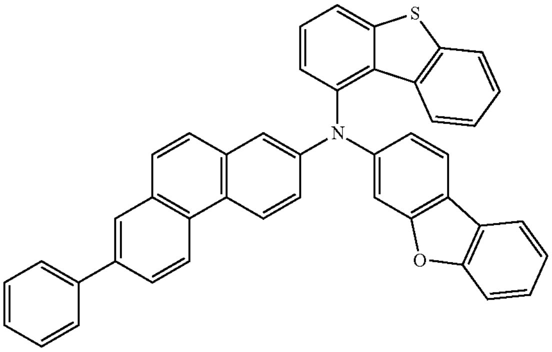
B61
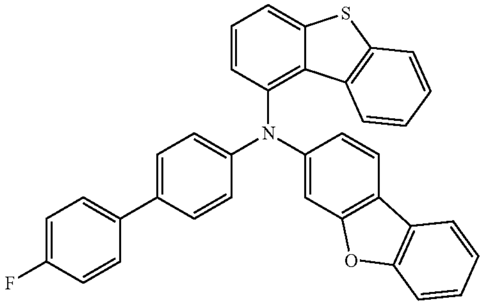
B62
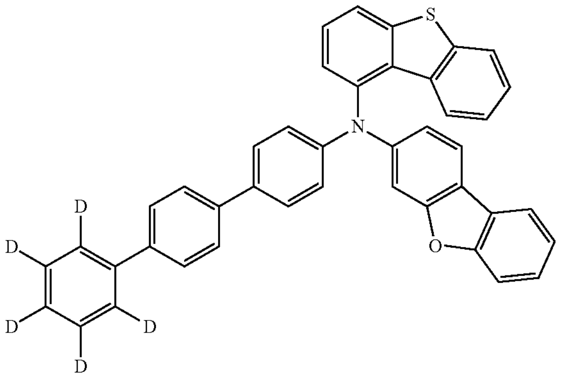
-continued
B63
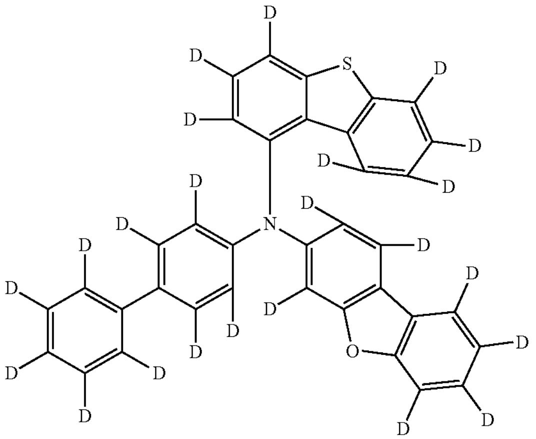
B64
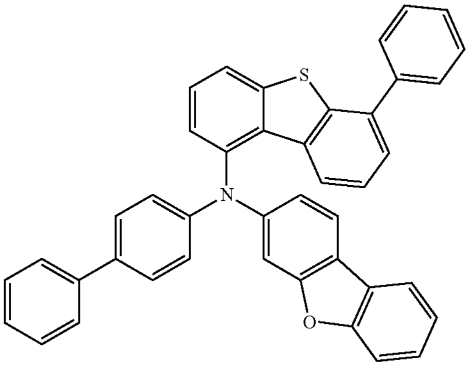
B65
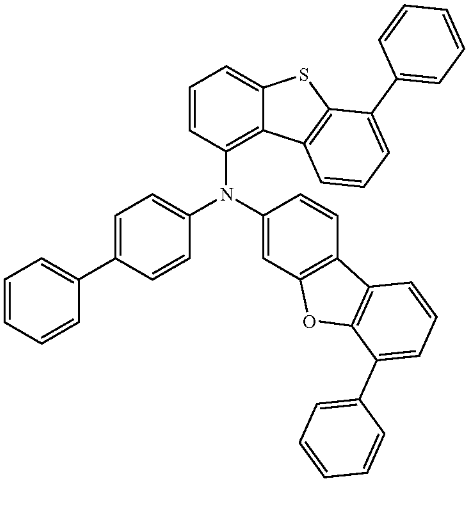
B66
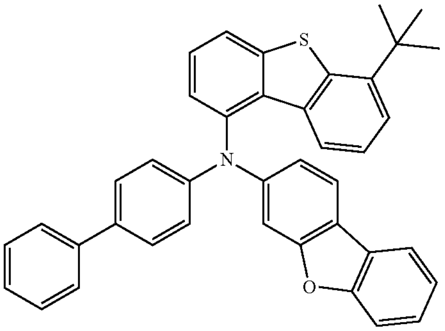

-continued
B67
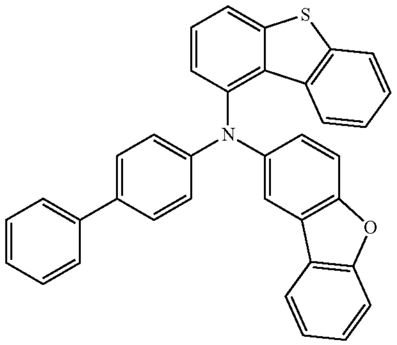
B68
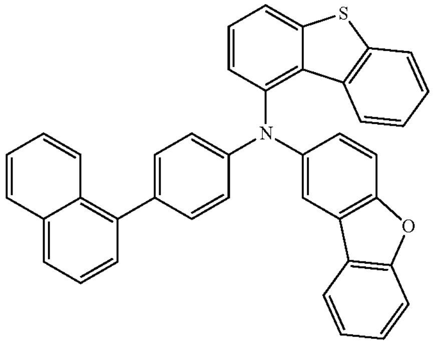
B69
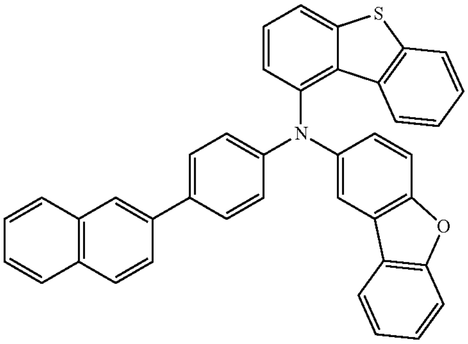
B70
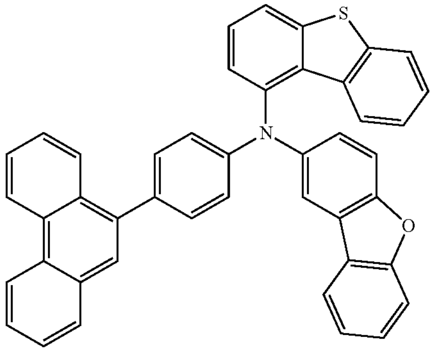
-continued
B71
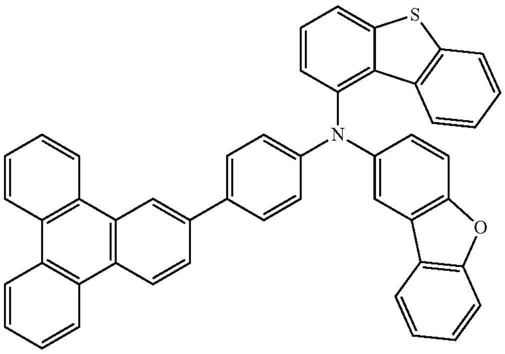
B72
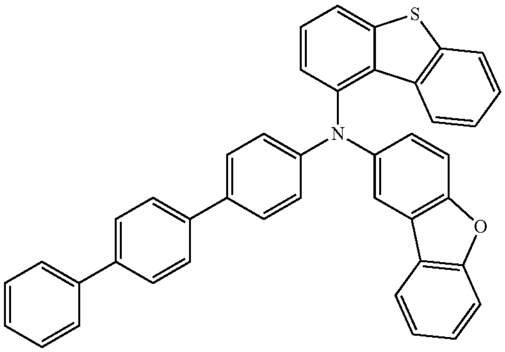
B73
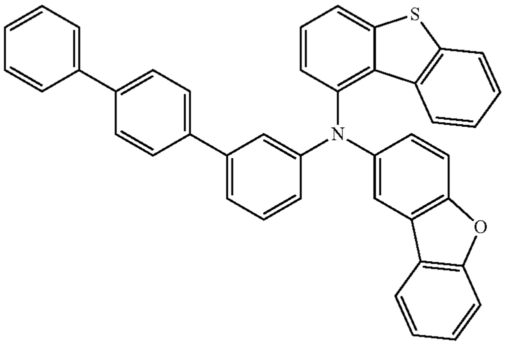
B74
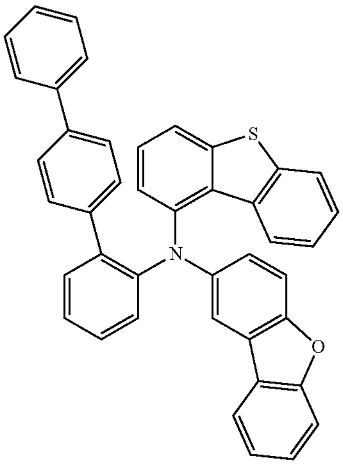

-continued
B75
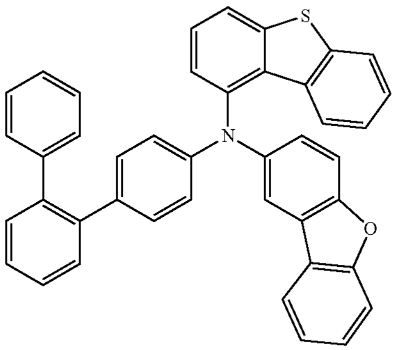
B76
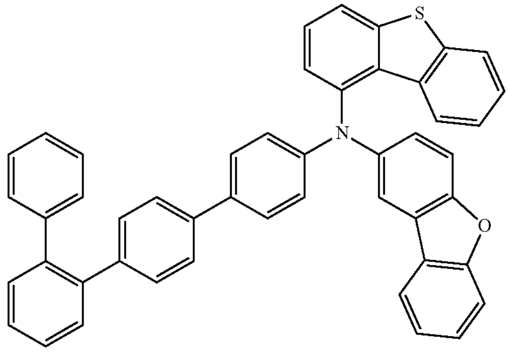
B77
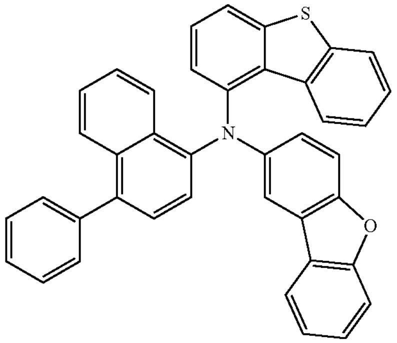
B78
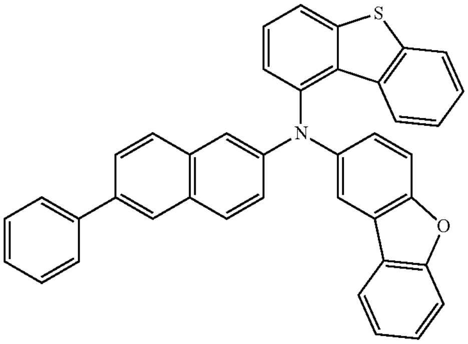
-continued
B79
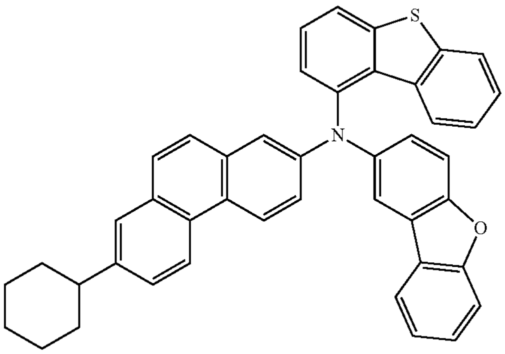
B80
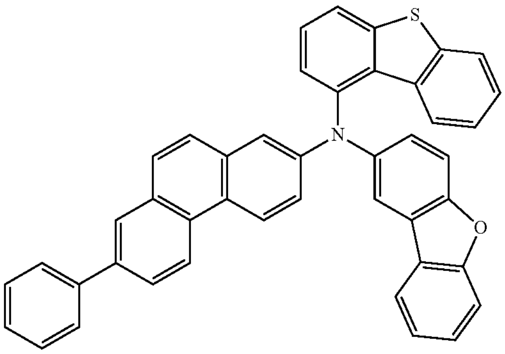
B81
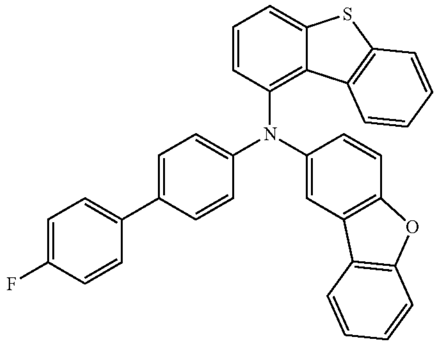
B82
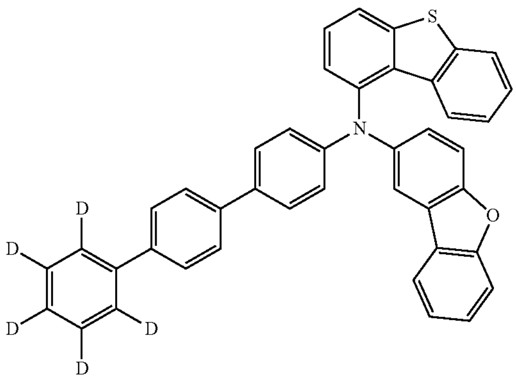

-continued

B83

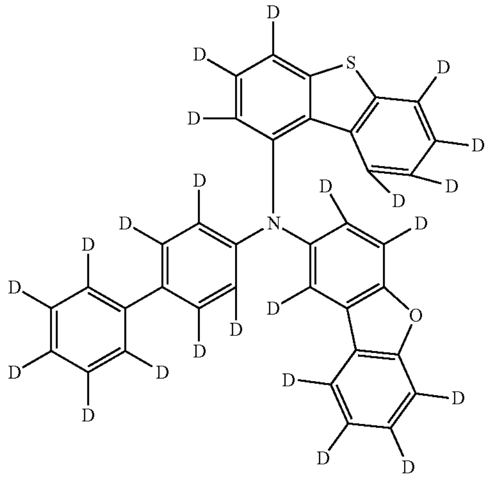

B84

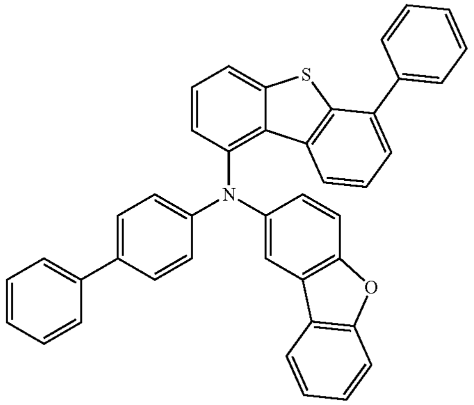

B85

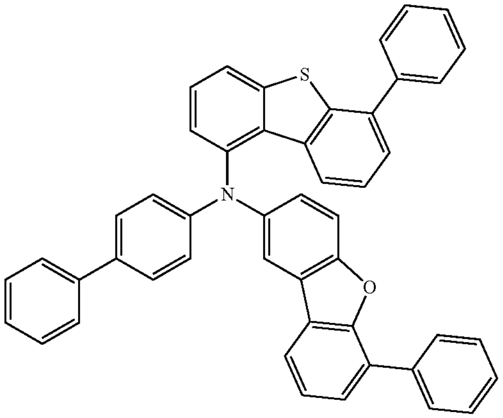

-continued

B86

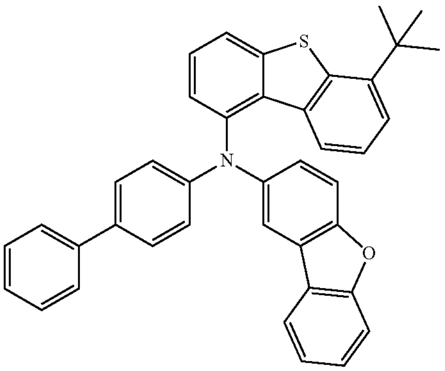

B87

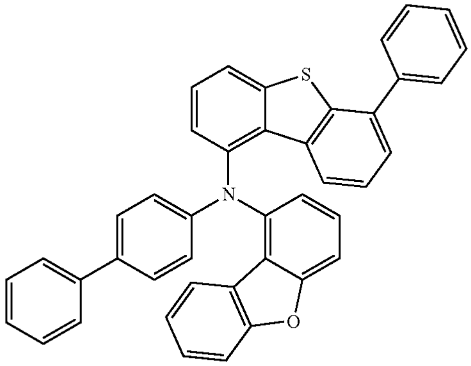

B88

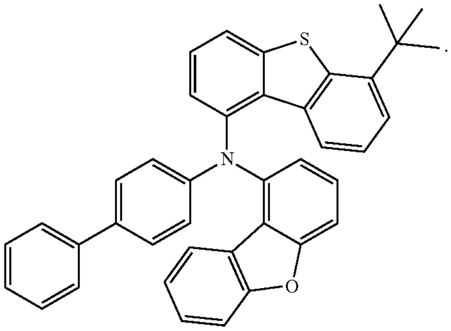

In the organic electroluminescence devices 10 of an embodiment, as shown in FIG. 1 to FIG. 4, the hole transport region HTR may include the amine compound represented by Formula 1a. For example, a hole transport layer HTL may include the amine compound represented by Formula 1a, for example as a (hole transport) material. However, an embodiment of the present disclosure is not limited thereto. For example, the hole transport layer HIL of the hole transport region HTR may include the amine compound represented by Formula 1a, for example as a (hole injection) material.

In some embodiments, the hole transport region HTR may include one kind or two or more kinds of the amine compounds in Compound Group A and Compound Group B. The hole transport region HTR may further include any suitable material in addition to the amine compound.

For example, the hole injection layer HIL may include a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine (m-MTDATA), 4,4',4"-tris(N,N-diphenylamino)triphenylamine (TDATA), 4,4',4"-tris{N,-2-naphthyl)-N-phenylamino}-triphenylamine (2-TNATA), poly(3,4-ethylene dioxythiophene)/poly(4-styrene sulfonate) (PEDOT/PSS), polyaniline/dodecylbenzene sulfonic acid (PANI/DBSA), polyaniline/camphor sulfonic acid (PANI/CSA), polyaniline/poly(4-styrene sulfonate) (PANI/PSS), N,N'-di(1-naphthalene-1-yl)-N,N'-diphenyl-benzidine (NPB), triphenylamine-containing polyether ketone (TPAPEK), 4-isopropyl-4'-methyldiphenyliodonium [tetrakis(pentafluorophenyl)borate], and dipyrazino[2,3-f:2',3'-h]quinoxaline-2,3,6,7,10,11-hexacarbonitrile (HAT-CN). However, an embodiment of the present disclosure is not limited thereto.

For example, the hole transport layer HTL may include carbazole derivatives (such as N-phenyl carbazole and/or polyvinyl carbazole), fluorene-based derivatives, N,N'-bis(3-methylphenyl)-N,N'-diphenyl-[1,1-biphenyl]-4,4'-diamine (TPD), triphenylamine-based derivatives (such as 4,4',4"-tris(N-carbazolyl)triphenylamine (TCTA)), N,N'-di(1-naphthalene-1-yl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 1,3-bis(N-carbazolyl)benzene (mCP), etc. However, an embodiment of the present disclosure is not limited thereto.

The electron blocking layer EBL may include, for example, carbazole derivatives (such as N-phenyl carbazole and/or polyvinyl carbazole), fluorene-based derivatives, N,N'-bis(3-methylphenyl)-N,N'-diphenyl-[1,1-biphenyl]-4,4'-diamine (TPD), triphenylamine-based derivatives (such as 4,4',4"-tris(N-carbazolyl)triphenylamine (TCTA)), N,N'-di(naphthalene-1-yl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 9-(4-tert-butylphenyl)-3,6-bis(triphenylsilyl)-9H-carbazole (CzSi), 9-phenyl-9H-3,9'-bicarbazole (CCP), 1,3-bis(N-carbazolyl)benzene (mCP), 1,3-bis(1,8-dimethyl-9H-carbazol-9-yl)benzene (mDCP), etc.

The thickness of the hole transport region HTR may be about 100 Å to about 10,000 Å, for example, about 100 Å to about 5,000 Å. The thickness of the hole injection region HIL may be, for example, about 30 Å to about 1,000 Å, and the thickness of the hole transport layer HTL may be about 30 Å to about 1,000 Å. For example, the thickness of the electron blocking layer EBL may be about 10 Å to about 1,000 Å. When the thicknesses of the hole transport region HTR, the hole injection layer HIL, the hole transport layer HTL, and the electron blocking layer EBL satisfy the above-described ranges, satisfactory hole transport properties may be achieved without substantial increase in driving voltage.

The hole transport region HTR may further include a charge generating material, in addition to the above-described materials, to increase conductivity. The charge generating material may be dispersed substantially uniformly or non-uniformly in the hole transport region HTR. The charge generating material may be, for example, a p-dopant. The p-dopant may be a quinone derivative, a metal oxide, or a cyano group-containing compound, without limitation. Non-limiting examples of the p-dopant include quinone derivatives (such as tetracyanoquinodimethane (TCNQ) and/or 2,3,5,6-tetrafluoro-7,7',8,8'-tetracyanoquinodimethane (F4-TCNQ)), and metal oxides (such as tungsten oxide and/or molybdenum oxide).

As described above, the hole transport region HTR may further include at least one among a hole buffer layer and an electron blocking layer (EBL) in addition to the hole injection layer HIL and the hole transport layer HTL. The hole buffer layer may compensate for an optical resonance distance of the wavelength of light emitted from an emission layer EML, and may increase light emission efficiency. Materials that may be included in the hole transport region HTR may also be included in a hole buffer layer. The electron blocking layer EBL may prevent or reduce electron injection from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed using a single material, a single layer formed using a plurality of different materials, or a multi-layer structure having a plurality of layers formed using a plurality of different materials.

In the organic electroluminescence device 10 of an embodiment, the emission layer EML may include anthracene derivatives, pyrene derivatives, fluoranthene derivatives, chrysene derivatives, dihydrobenzanthracene derivatives, and/or triphenylene derivatives. For example, the emission layer EML may include anthracene derivatives or pyrene derivatives.

The emission layer EML may include an anthracene derivative represented by Formula 6:

Formula 6

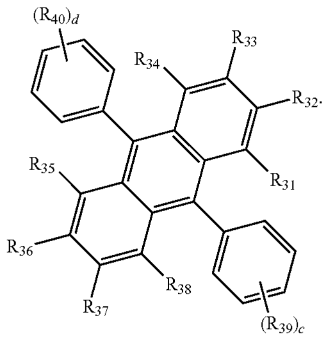

In Formula 6, $R_{31}$ to $R_{40}$ may be each independently a hydrogen atom, a deuterium atom, a halogen atom, a substituted or unsubstituted silyl group, a substituted or unsubstituted alkyl group of 1 to 10 carbon atoms, a substituted or unsubstituted aryl group of 6 to 30 carbon atoms for forming a ring, or a substituted or unsubstituted heteroaryl group of 2 to 30 carbon atoms for forming a ring, and/or may be combined with an adjacent group to form a ring. In some embodiments, $R_{31}$ to $R_{40}$ may be combined with an adjacent group to form a saturated hydrocarbon ring or an unsaturated hydrocarbon ring.

In the above Formula, "c" and "d" may each independently be an integer of 0 to 5.

Formula 6 may be represented by any one among Compound 6-1 to Compound 6-16:

-continued
6-1
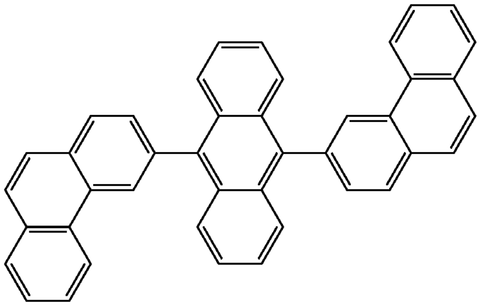
6-2
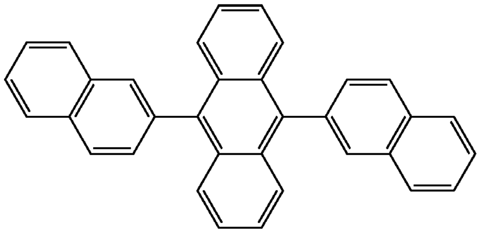
6-3
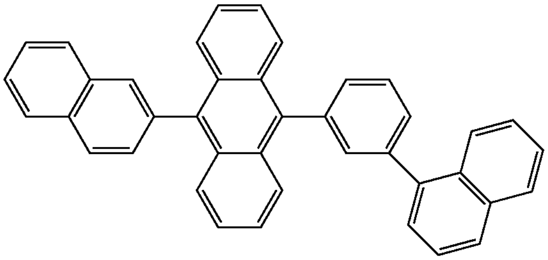
6-4
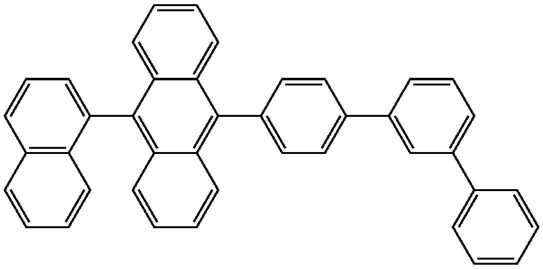
6-5
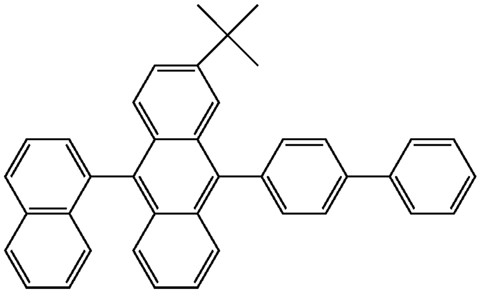
6-6
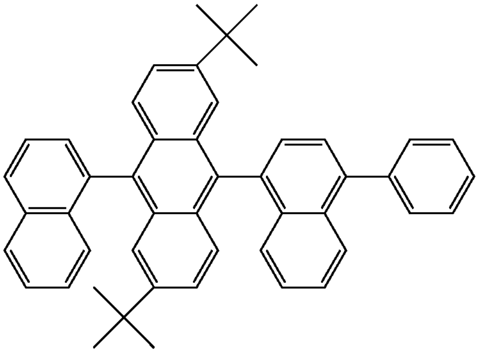
6-7
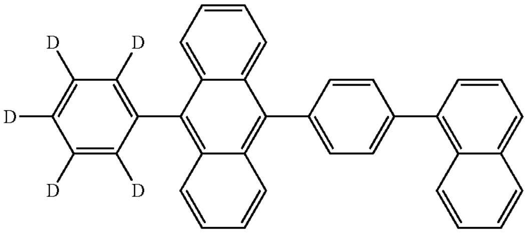
6-8
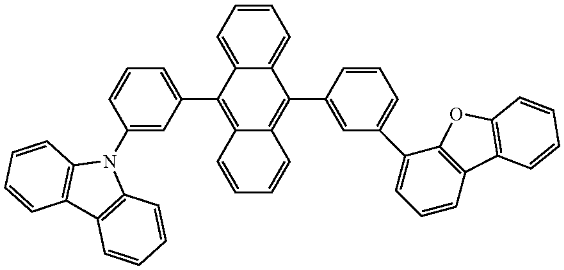
6-9
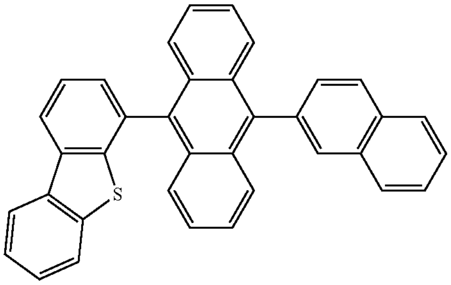
6-10
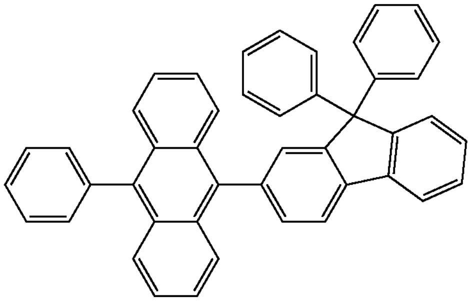

-continued 6-11

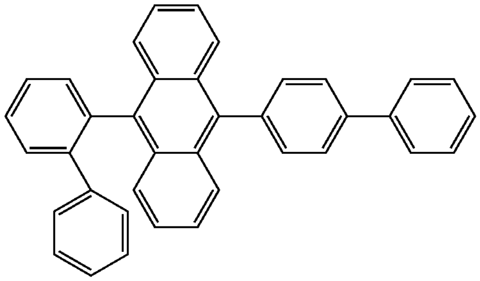

6-12

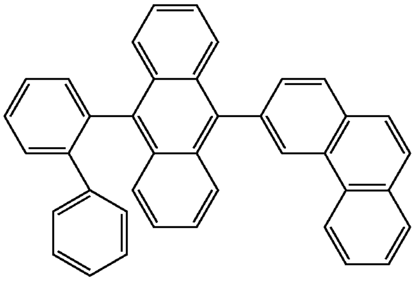

6-13

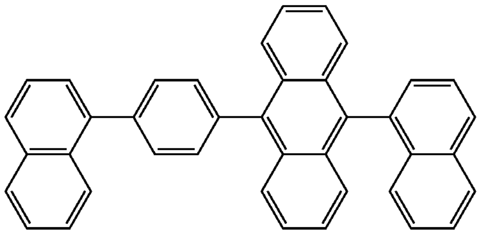

6-14

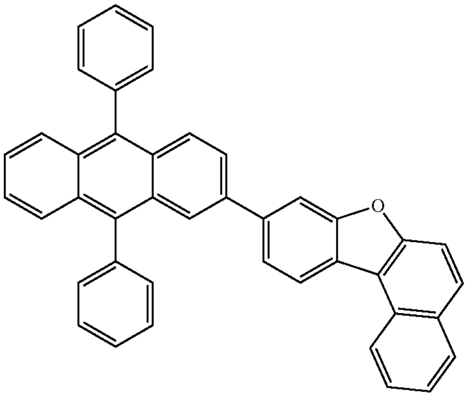

-continued 6-15

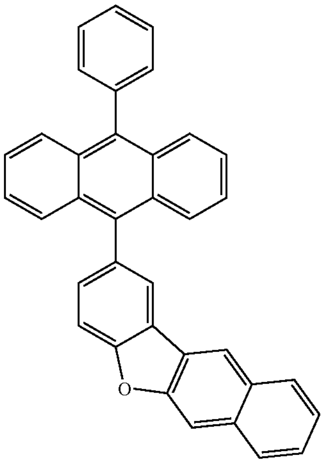

6-16

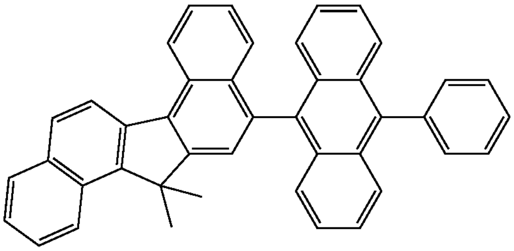

.

The emission layer EML may include any suitable material available in the art as a host material. For example, the emission layer EML may include as the host material, at least one among bis[2-(diphenylphosphino)phenyl]ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), and 1,3,5-tris(1-phenyl-1H-benzo[d]imidazole-2-yl)benzene (TPBi). However, embodiments of the present disclosure are not limited thereto, and for example, tris(8-hydroxyquinolino)aluminum ($Alq_3$), poly(N-vinylcarbazole) (PVK), 9,10-di(naphthalene-2-yl)anthracene (ADN), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), etc., may be used as the host material.

In an embodiment, the emission layer EML may further include as a dopant material, styryl derivatives (for example, 1,4-bis[2-(3-N-ethylcarbazolyl) vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl) naphthalen-2-yl) vinyl)phenyl)-N-phenylbenzenamine (N-BDAVBi)), perylene and derivatives thereof (for example, 2,5,8,11-tetra-t-butylperylene (TBPe)), pyrene and derivatives thereof (for example, 1,1-dipyrene, 1,4-dipyrenylbenzene, and 1,4-bis(N,N-diphenylamino) pyrene), etc.

The emission layer EML may include any suitable phosphorescence dopant material. For example, the phosphorescence dopant may be or include a metal complex including iridium (Ir), platinum (Pt), osmium (Os), gold (Au), titanium (Ti), zirconium (Zr), hafnium (Hf), europium (Eu), terbium (Tb), or thulium (Tm). For example, iridium (III) bis(4,6-difluorophenylpyridinato-N,C2') (FIrpic), bis(2,4-difluorophenylpyridinato) (Fir6), and/'or platinum octaethyl porphyrin (PtOEP) may be used as the phosphorescence dopant. However, embodiments of the present disclosure are not limited thereto.

In some embodiments, the emission layer EML may further include any suitable phosphorescence host material available in the art, for example, bis(4-(9H-carbazol-9-yl) phenyl)diphenylsilane (BCPDS).

In the organic electroluminescence device 10 of an embodiment, as shown in FIGS. 1 to 4, the electron transport region ETR may be provided on the emission layer EML. The electron transport region ETR may include at least one of an electron blocking layer HBL, an electron transport layer ETL, or an electron injection layer EIL. However, embodiments of the present disclosure are not limited thereto.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. In some embodiments, the electron transport region ETR may have a single layer structure having a plurality of different materials, or a structure stacked from the emission layer EML of electron transport layer ETL/electron injection layer EIL, or hole blocking layer HBL/electron transport layer ETL/electron injection layer EIL, without limitation. The thickness of the electron transport region ETR may be, for example, about 1,000 Å to about 1,500 Å.

The electron transport region ETR may be formed using any suitable method (such as a vacuum deposition method, a spin coating method, a cast method, a Langmuir-Blodgett (LB) method, an inkjet printing method, a laser printing method, and/or a laser induced thermal imaging (LITI) method).

When the electron transport region ETR includes an electron transport layer ETL, the electron transport region ETR may include an anthracene-based compound. The electron transport region may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzimidazolyl-1-ylphenyl)-9,10-dinaphthylanthracene, 1,3,5-tri (1-phenyl-1H-benz[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), beryllium bis(benzoquinolin-10-olate (Bebq2), 9,10-di(naphthalene-2-yl)anthracene (ADN), 1,3-bis[3,5-di(pyridine-3-yl)phenyl]benzene (BmPyPhB)), or a mixture thereof, without limitation. The thickness of the electron transport layer ETL may be about 100 Å to about 1,000 Å and may be, for example, about 150 Å to about 500 Å. When the thickness of the electron transport layer ETL satisfies the above-described range, satisfactory electron transport properties may be obtained without a substantial increase in driving voltage.

When the electron transport region ETR includes the electron injection layer EIL, the electron transport region ETR may include a metal halide (such as LiF, NaCl, CsF, RbCl, RbI, and/or CuI), a lanthanide metal (such as ytterbium (Yb)), or a metal oxide (such as $Li_2O$ and/or BaO), and/or 8-hydroxyl-lithium quinolate (LiQ). However, embodiments of the present disclosure are not limited thereto. The electron injection layer EIL also may be formed using a mixture of an electron transport material and an insulating organo metal salt. The organo metal salt may have an energy band gap of about 4 eV or more. The organo metal salt may include, for example, metal acetates, metal benzoates, metal acetoacetates, metal acetylacetonates, and/or metal stearates. The thickness of the electron injection layer EIL may be about 1 Å to about 100 Å, or about 3 Å to about 90 Å. When the thickness of the electron injection layer EIL satisfies the above described range, satisfactory electron injection properties may be obtained without inducing substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), or 4,7-diphenyl-1,10-phenanthroline (Bphen). However, embodiments of the present disclosure are not limited thereto.

The second electrode EL2 is provided on the electron transport region ETR. The second electrode EL2 may be a common electrode or a cathode. The second electrode EL2 may be a transmissive electrode, a transflective electrode, or a reflective electrode. When the second electrode EL2 is a transmissive electrode, the second electrode EL2 may include a transparent metal oxide, for example, ITO, IZO, ZnO, ITZO, etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, etc.

In some embodiments, the second electrode EL2 may be connected with an auxiliary electrode. When the second electrode EL2 is connected with the auxiliary electrode, the resistance of the second electrode EL2 may decrease.

On the second electrode EL2 of the organic electroluminescence device 10 of an embodiment, a capping layer (CPL) may be further disposed. The capping layer (CPL) may include, for example, α-NPD, NPB, TPD, m-MTDATA, $Alq_3$, CuPc, N4,N4,N4',N4'-tetra(biphenyl-4-yl)biphenyl-4,4'-diamine (TPD15), 4,4',4"-tris(carbazol-9-yl)triphenylamine (TCTA), etc. However, an embodiment of the present disclosure is not limited thereto. The capping layer CPL may include an amine compound. For example, the capping layer CPL may include Compound CPL1 and/or Compound CPL2:

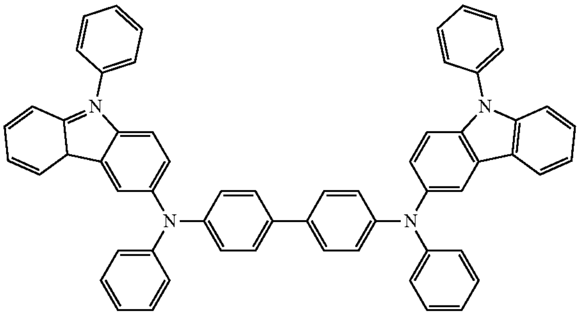

CPL1

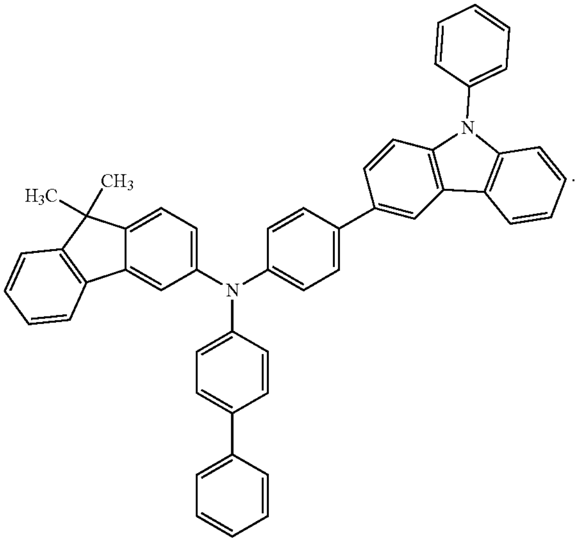

CPL2

In some embodiments, the refractive index of the capping layer CPL may be about 1.6 or more. For example, the refractive index of the capping layer CPL with respect to light of a wavelength range of about 550 nm to about 660 nm may be about 1.6 or more.

The organic electroluminescence device 10 according to an embodiment of the present disclosure may include the amine compound of an embodiment in a hole transport region HTR disposed between the first electrode EL1 and the second electrode EL2, and may thereby show excellent emission efficiency in the emission wavelength region of blue light and green light and show improved life characteristics.

In the amine compound of an embodiment, two dibenzoheterole groups including different heteroatoms are connected to a central nitrogen atom (amine group), such that the molecular symmetry and crystallinity of the amine compound may decrease, and the layer forming properties of the compound may be improved. For example, the amine compound of the present disclosure includes one dibenzofuran group and one dibenzothiophene group, which are connected with central nitrogen, and may provide improved layer forming properties when used to form the hole transport layer HTL. In some embodiments, in the amine compound of an embodiment, at least one of the dibenzoheterole groups is connected to the central nitrogen via the carbon at position 1 or position 4, such that the planarity and the symmetry of the molecule is reduced, its layer forming properties are improved, and accordingly, its hole transport properties are when used as a material for a hole transport layer HTL.

The organic electroluminescence device of an embodiment includes the amine compound of the present disclosure in a hole transport layer HTL, and therefore hole transport capacity may be improved, recombination of holes and electrons in the emission layer EML may be increased, and emission efficiency may be improved.

Hereinafter, the amine compound according to an embodiment and the organic electroluminescence device of an embodiment of the present disclosure will be explained in more detail with reference to example embodiments and comparative embodiments. The illustrated embodiments are provided to facilitate the understanding of the present disclosure, and the scope of the present disclosure is not limited thereto.

A. Synthetic Examples

The amine compound according to an embodiment may be synthesized, for example, as follows. The synthetic methods of the amine compounds explained below are only example embodiments, and the synthetic method of the amine compound according to an embodiment of the present disclosure is not limited thereto.

The molecular weights of compounds were measured by FAB-MS, using a JMS-700V manufactured by JEOL Co.

1. Synthesis of Compound A2

Reaction 1

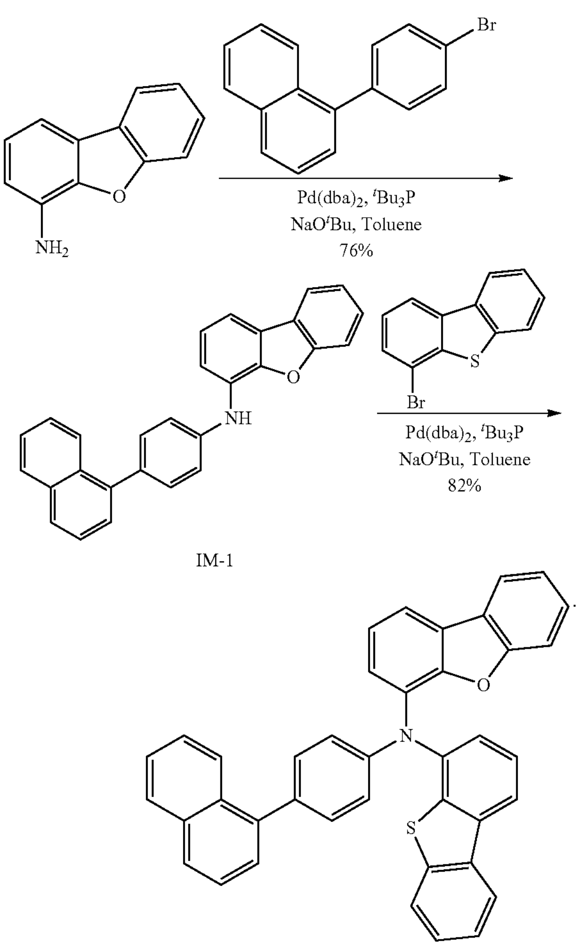

IM-1

A2

Synthesis of Intermediate IM-1

Under an Ar atmosphere, to a 500 mL, three-neck flask, 10.00 g (54.6 mmol) of 4-aminodibenzofuran, 0.94 g (0.03 eq, 1.6 mmol) of $Pd(dba)_2$, 5.25 g (1.0 eq, 54.6 mmol) of NaOtBu, 273 mL of toluene, 17.00 g (1.1 eq, 60.0 mmol) of 1-(4-bromophenyl) naphthalene and 1.10 g (0.1 eq, 5.5 mmol) of $^tBu_3P$ were added in order, followed by heating, refluxing, and stirring. After cooling in the air to room temperature, water was added to the reaction solution, and an organic layer was separately taken. Toluene was added to an aqueous layer, and organic layers were extracted further. The organic layers were collected, washed with a saline solution, and dried with $MgSO_4$. $MgSO_4$ was separated by filtering, and an organic layer was concentrated. The crude product thus obtained was separated by silica gel column chromatography (using a mixture of hexane and toluene as an eluent) to obtain Intermediate IM-1 (15.99 g, yield 76%).

By FAB-MS measurement, a mass number of m/z=385 was observed as a molecular ion peak, and Intermediate IM-1 was identified.

Synthesis of Compound A2

Under an Ar atmosphere, to a 300 mL, three-neck flask, 10.00 g (25.9 mmol) of IM-1, 0.45 g (0.03 eq, 0.8 mmol) of $Pd(dba)_2$, 4.99 g (2.0 eq, 51.9 mmol) of $NaO^tBu$, 130 mL of toluene, 7.51 g (1.1 eq, 28.5 mmol) of 4-bromodibenzothiophene and 0.52 g (0.1 eq, 2.6 mmol) of $^tBu_3P$ were added in order, followed by heating, refluxing, and stirring. After cooling in the air to room temperature, water was added to the reaction solution, and an organic layer was separately taken. Toluene was added to an aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Compound A2 (12.08 g, yield 82%) as a solid.

By FAB-MS measurement, a mass number of m/z=567 was observed as a molecular ion peak, and Compound A2 was identified.

2. Synthesis of Compound A14

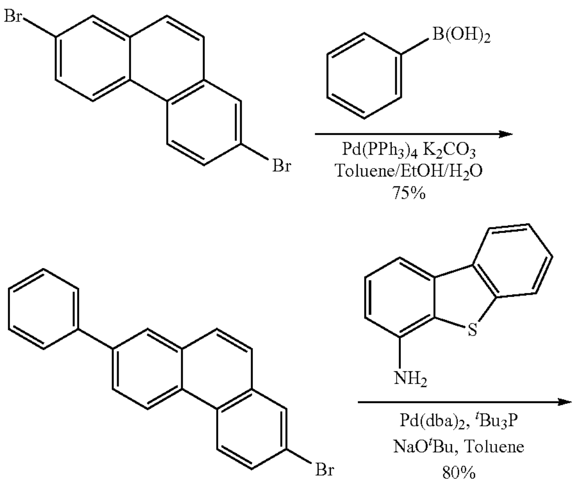

IM-2

-continued

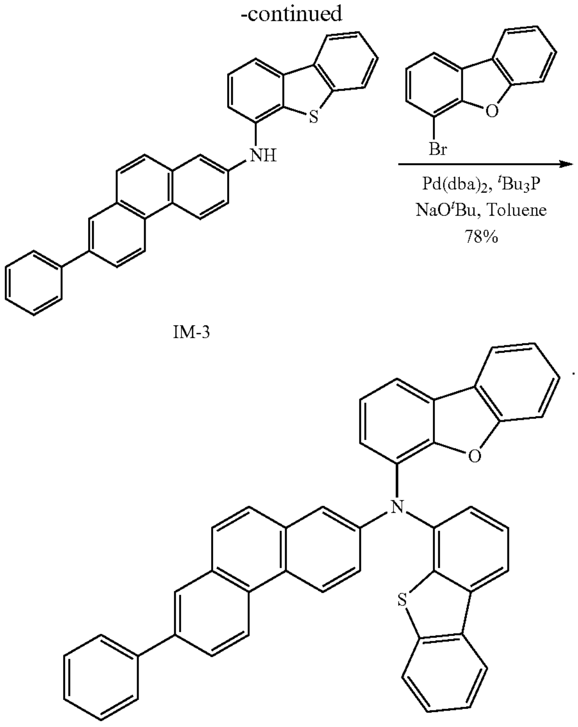

IM-3

A14

Synthesis of Intermediate IM-2

Under an Ar atmosphere, to a 1,000 mL, three-neck flask, 30.00 g (89.3 mmol) of 2,7-dibromophenanthrene, 11.97 g (1.1 eq, 98.2 mmol) of phenylboronic acid, 37.02 g (3.0 eq, 267.8 mmol) of $K_2CO_3$, 5.16 g (0.05 eq, 4.5 mmol) of $Pd(PPh_3)_4$, and 625 mL of a mixture of toluene/EtOH/$H_2O$ (4/2/1) were added in order, followed by heating to about 80° C. and stirring. After cooling in the air to room temperature, the reaction solution was extracted with toluene. An aqueous layer was removed, and an organic layer was washed with a saturated saline solution and dried with $MgSO_4$. $MgSO_4$ was filtered, and the organic layer was concentrated. The crude product thus obtained was separated by silica gel column chromatography (using a mixture of hexane and toluene as an eluent) to obtain Intermediate IM-2 (22.31 g, yield 75%).

By FAB-MS measurement, a mass number of m/z=333 was observed as a molecular ion peak, and Intermediate IM-2 was identified.

Synthesis of Intermediate IM-3

Under an Ar atmosphere, to a 500 mL, three-neck flask, 10.00 g (50.2 mmol) of 4-aminodibenzothiophene, 0.87 g (0.03 eq, 1.5 mmol) of $Pd(dba)_2$, 4.82 g (1.0 eq, 50.2 mmol) of NaOtBu, 250 ml of toluene, 18.39 g (1.1 eq, 55.2 mmol) of IM-2, and 1.02 g (0.1 eq, 5.0 mmol) of $^tBu_3P$ were added in order, followed by heating, refluxing, and stirring. After cooling in the air to room temperature, water was added to the reaction solution, and an organic layer was separately taken. Toluene was added to an aqueous layer, and additional organic layers were extracted. The organic layers were collected, washed with a saline solution, and dried with $MgSO_4$. $MgSO_4$ was separated by filtering, and an organic layer was concentrated. The crude product thus obtained was separated by silica gel column chromatography (using a mixture solvent of hexane and toluene as an eluent) to obtain Intermediate IM-3 (18.13 g, yield 80%).

By FAB-MS measurement, a mass number of m/z=451 was observed as a molecular ion peak, and Intermediate IM-3 was identified.

Synthesis of Compound A14

Under an Ar atmosphere, to a 300 mL, three-neck flask, 10.00 g (22.1 mmol) of IM-3, 0.38 g (0.03 eq, 0.7 mmol) of $Pd(dba)_2$, 4.26 g (2.0 eq, 44.3 mmol) of $NaO^tBu$, 110 mL of toluene, 6.02 g (1.1 eq, 2.2 mmol) of 4-bromodibenzofuran, and 0.45 g (0.1 eq, 2.2 mmol) of $^tBu_3P$ were added in order, followed by heating, refluxing, and stirring. After cooling in the air to room temperature, water was added to the reaction solution, and an organic layer was separately taken. Toluene was added to the aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Compound A14 (10.67 g, yield 78%) as a solid.

By FAB-MS measurement, a mass number of m/z=617 was observed as a molecular ion peak, and Compound A14 was identified.

3. Synthesis of Compound A29

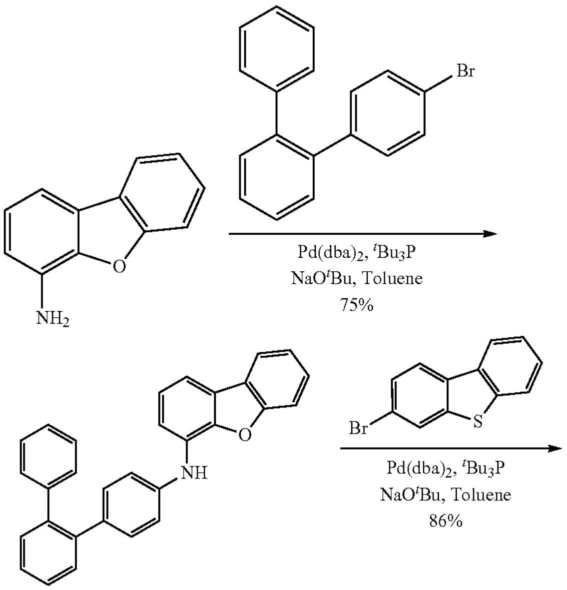

IM-4

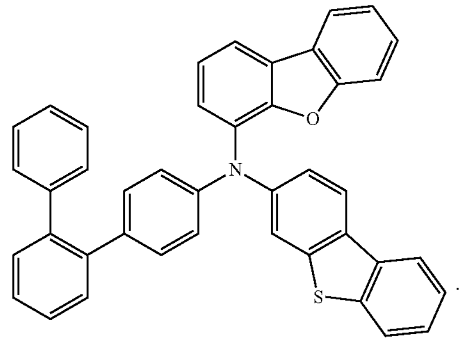

A29

Synthesis of Intermediate IM-4

Under an Ar atmosphere, to a 500 mL, three-neck flask, 10.00 g (54.6 mmol) of 4-aminobenzofuran, 0.94 g (0.03 eq, 1.6 mmol) of $Pd(dba)_2$, 5.25 (1.0 eq, 54.6 mmol) of NaOtBu, 273 mL of toluene, 18.57 g (1.1 eq, 60.0 mmol) of 4-bromo-1,1':2',1"-terphenyl, and 1.10 g (0.1 eq, 5.5 mmol) of $^tBu_3P$ were added in order, followed by heating, refluxing, and stirring. After cooling in the air to room temperature, water was added to the reaction solution, and an organic layer was separately taken. Toluene was added to an aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Intermediate IM-4 (16.85 g, yield 75%).

By FAB-MS measurement, a mass number of m/z=411 was observed as a molecular ion peak, and Intermediate IM-4 was identified.

Synthesis of Compound A29

Under an Ar atmosphere, to a 300 mL, three-neck flask, 10.00 g (24.3 mmol) of IM-4, 0.42 g (0.03 eq, 0.8 mmol) of $Pd(dba)_2$, 4.67 g (2.0 eq, 48.6 mmol) of NaOtBu, 122 mL of toluene, 7.03 g (1.1 eq, 26.7 mmol) of 3-bromodibenzothiophene, and 0.49 g (0.1 eq, 2.4 mmol) of $^tBu_3P$ were added in order, followed by heating, refluxing, and stirring. After cooling in the air to room temperature, water was added to the reaction solution, and an organic layer was separately taken. Toluene was added to the aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Compound A29 (12.41 g, yield 86%) as a solid.

By FAB-MS measurement, a mass number of m/z=593 was observed as a molecular ion peak, and Compound A29 was identified.

4. Synthesis of Compound A44

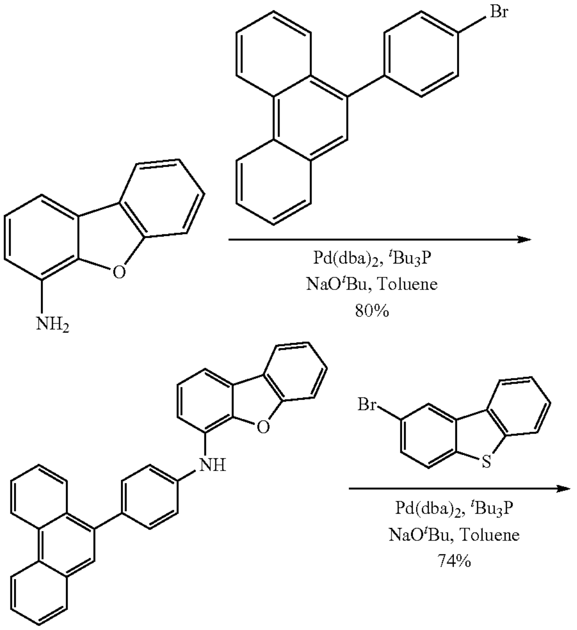

IM-5

-continued

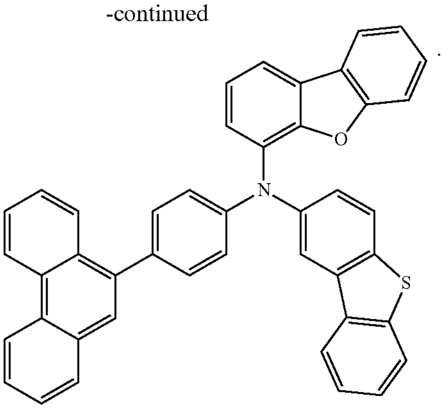

A44

Synthesis of Intermediate IM-5

Under an Ar atmosphere, to a 500 mL, three-neck flask, 10.00 g (54.6 mmol) of 4-aminodibenzofuran, 0.94 g (0.03 eq, 1.6 mmol) of $Pd(dba)_2$, 5.25 g (1.0 eq, 54.6 mmol) of NaOtBu, 273 mL of toluene, 20.01 g (1.1 eq, 60.0 mmol) of 9-(4-bromophenyl) phenanthrene, and 1.10 g (0.1 eq, 5.5 mmol) of $^tBu_3P$ were added in order, followed by heating, refluxing, and stirring. After cooling in the air to room temperature, water was added to the reaction solution, and an organic layer was separately taken. Toluene was added to the aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Intermediate IM-5 (19.02 g, yield 80%).

By FAB-MS measurement, a mass number of m/z=435 was observed as a molecular ion peak, and Intermediate IM-5 was identified.

Synthesis of Compound A44

Under an Ar atmosphere, to a 300 mL, three-neck flask, 10.00 g (23.0 mmol) of IM-5, 0.40 g (0.03 eq, 0.7 mmol) of $Pd(dba)_2$, 4.41 g (2.0 eq, 45.9 mmol) of NaOtBu, 115 mL of toluene, 6.65 g (1.1 eq, 25.3 mmol) of 2-bromodibenzothiophene, and 0.46 g (0.1 eq, 2.3 mmol) of $^tBu_3P$ were added in order, followed by heating, refluxing, and stirring. After cooling in the air to room temperature, water was added to the reaction solution, and an organic layer was separately taken. Toluene was added to the aqueous layer, and additional organic layers were extracted. Organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Compound A44 (10.50 g, yield 74%) as a solid.

By FAB-MS measurement, a mass number of m/z=617 was observed as a molecular ion peak, and Compound A44 was identified.

5. Synthesis of Compound A66

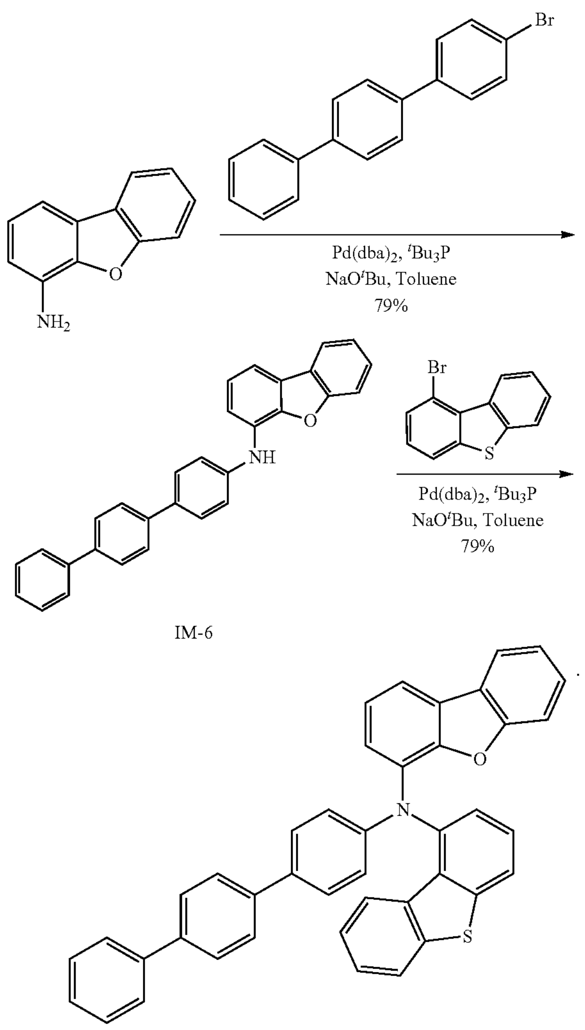

IM-6

A66

Synthesis of Intermediate IM-6

Under an Ar atmosphere, to a 500 mL, three-neck flask, 10.00 g (54.6 mmol) of 4-aminodibenzofuran, 0.94 g (0.03 eq, 1.6 mmol) of $Pd(dba)_2$, 5.25 g (1.0 eq, 54.6 mmol) of NaOtBu, 273 mL of toluene, 18.57 g (1.1 eq, 60.0 mmol) of 4-bromo-1,1':4',1"-terphenyl, and 1.10 g (0.1 eq, 5.5 mmol) of $^tBu_3P$ were added in order, followed by heating, refluxing, and stirring. After cooling in the air to room temperature, water was added to the reaction solution, and an organic layer was separately taken. Toluene was added to an aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Intermediate IM-6 (17.74 g, yield 79%).

By FAB-MS measurement, a mass number of m/z=435 was observed as a molecular ion peak, and Intermediate IM-6 was identified.

Synthesis of Compound A66

Under an Ar atmosphere, to a 300 mL, three-neck flask, 10.00 g (24.3 mmol) of IM-6, 0.42 g (0.03 eq, 0.7 mmol) of $Pd(dba)_2$, 4.67 g (2.0 eq, 48.6 mmol) of NaO$^t$Bu, 122 mL of toluene, 7.03 g (1.1 eq, 26.7 mmol) of 1-bromodibenzothiophene, and 0.49 g (0.1 eq, 2.4 mmol) of $^tBu_3P$ were added in order, followed by heating, refluxing, and stirring. After cooling in the air to room temperature, water was added to the reaction solution, and an organic layer was separately taken. Toluene was added to the aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Compound A66 (11.40 g, yield 79%) as a solid.

By FAB-MS measurement, a mass number of m/z=593 was observed as a molecular ion peak, and Compound A66 was identified.

6. Synthesis of Compound A72

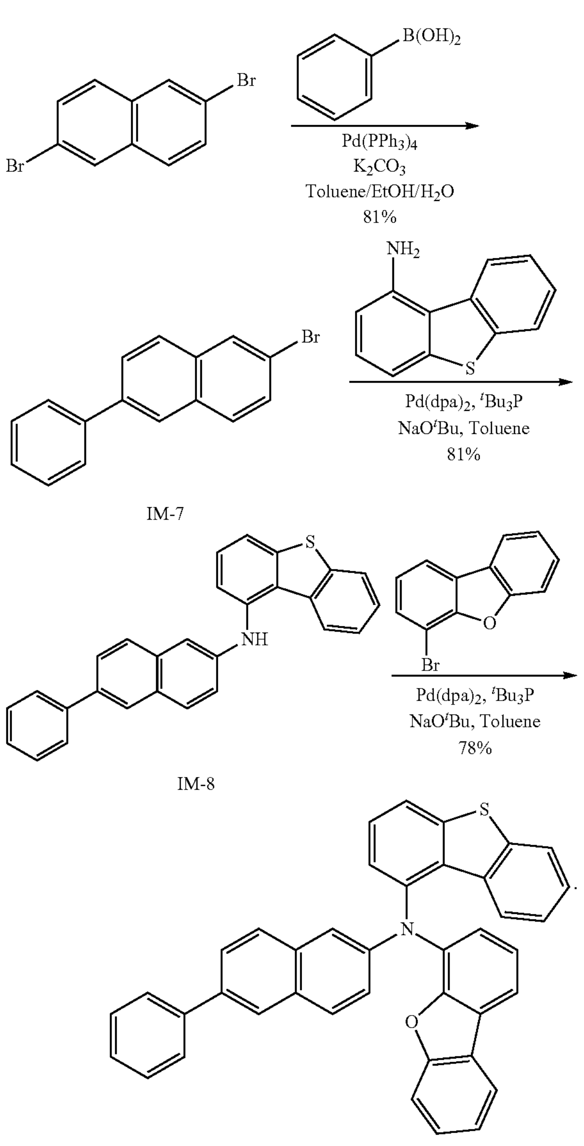

A72

Synthesis of Intermediate IM-7

Under an Ar atmosphere, to a 1,000 mL, three-neck flask, 30.00 g (104.9 mmol) of 2,6-dibromonaphthalene, 14.07 g (1.1 eq, 115.4 mmol) of phenylboronic acid, 43.50 g (3.0 eq, 314.7 mmol) of $K_2CO_3$, 6.06 g (0.05 eq, 5.2 mmol) of $Pd(PPh_3)_4$, and 734 mL of a mixture solution of toluene/ $EtOH/H_2O$ (4/2/1) were added in order, followed by heating to about 80° C. and stirring. After cooling in the air to room temperature, the reaction solution was extracted with toluene. An aqueous layer was removed, and an organic layer was washed with a saturated saline solution and dried with $MgSO_4$. $MgSO_4$ was filtered, and an organic layer was concentrated. The crude product thus obtained was separated by silica gel column chromatography (using a mixture of hexane and toluene as an eluent) to obtain Intermediate IM-7 (24.06 g, yield 81%).

By FAB-MS measurement, a mass number of m/z=283 was observed as a molecular ion peak, and Intermediate IM-7 was identified.

Synthesis of Intermediate IM-8

Under an Ar atmosphere, to a 500 mL, three-neck flask, 10.00 g (50.2 mmol) of 1-aminodibenzothiophene, 0.87 g (0.03 eq, 1.5 mmol) of $Pd(dba)_2$, 4.82 g (1.0 eq, 50.2 mmol) of NaO$^t$Bu, 250 mL of toluene, 15.63 g (1.1 eq, 55.2 mmol) of IM-7, and 1.02 g (0.1 eq, 5.0 mmol) of $^tBu_3P$ were added in order, followed by heating, refluxing, and stirring. After cooling in the air to room temperature, water was added to the reaction solution, and an organic layer was separately taken. Toluene was added to the aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Intermediate IM-8 (16.32 g, yield 81%).

By FAB-MS measurement, a mass number of m/z=401 was observed as a molecular ion peak, and Intermediate IM-8 was identified.

Synthesis of Compound A72

Under an Ar atmosphere, to a 300 mL, three-neck flask, 10.00 g (24.9 mmol) of IM-8, 0.43 g (0.03 eq, 0.7 mmol) of $Pd(dba)_2$, 4.79 g (2.0 eq, 49.8 mmol) of NaOtBu, 125 ml of toluene, 6.77 g (1.1 eq, 27.4 mmol) of 4-bromodibenzofuran, and 0.50 g (0.1 eq, 2.5 mmol) of $^tBu_3P$ were added in order, followed by heating, refluxing, and stirring. After cooling in the air to room temperature, water was added to the reaction solution, and an organic layer was separately taken. Toluene was added to the aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Compound A72 (11.03 g, yield 78%) as a solid.

By FAB-MS measurement, a mass number of m/z=567 was observed as a molecular ion peak, and Compound A72 was identified.

7. Synthesis of Compound A81

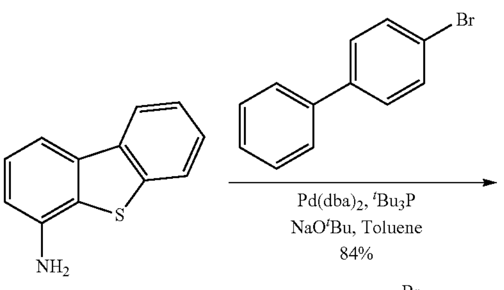

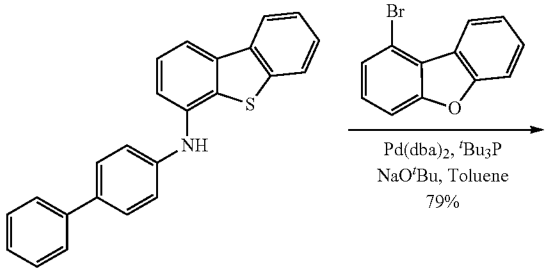

IM-9

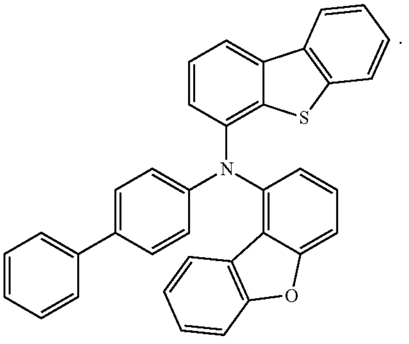

A81

Synthesis of Intermediate IM-9

Under an Ar atmosphere, to a 500 mL, three-neck flask, 10.00 g (50.2 mmol) of 4-aminodibenzothiophene, 0.87 g (0.03 eq, 1.5 mmol) of $Pd(dba)_2$, 4.82 g (1.0 eq, 50.2 mmol) of NaOtBu, 250 ml of toluene, 12.87 g (1.1 eq, 55.2 mmol) of 4-bromobiphenyl, and 1.02 g (0.1 eq, 5.0 mmol) of $^tBu_3P$ were added in order, followed by heating, refluxing, and stirring. After cooling in the air to room temperature, water was added to the reaction solution, and an organic layer was separately taken. Toluene was added to the aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Intermediate IM-9 (14.82 g, yield 84%).

By FAB-MS measurement, a mass number of m/z=351 was observed as a molecular ion peak, and Intermediate IM-9 was identified.

Synthesis of Compound A81

Under an Ar atmosphere, to a 300 mL, three-neck flask, 10.00 g (28.5 mmol) of IM-9, 0.49 g (0.03 eq, 0.9 mmol) of $Pd(dba)_2$, 5.47 g (2.0 eq, 56.9 mmol) of NaOtBu, 142 mL of toluene, 7.73 g (1.1 eq, 31.3 mmol) of 1-bromodibenzofuran, and 0.58 g (0.1 eq, 2.9 mmol) of $^tBu_3P$ were added in order, followed by heating, refluxing, and stirring. After cooling in the air to room temperature, water was added to the reaction solution, and an organic layer was separately taken. Toluene was added to the aqueous layer, and additional organic layers were extracted. Organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Compound A81 (11.64 g, yield 79%) as a solid.

By FAB-MS measurement, a mass number of m/z=517 was observed as a molecular ion peak, and Compound A81 was identified.

8. Synthesis of Compound A83

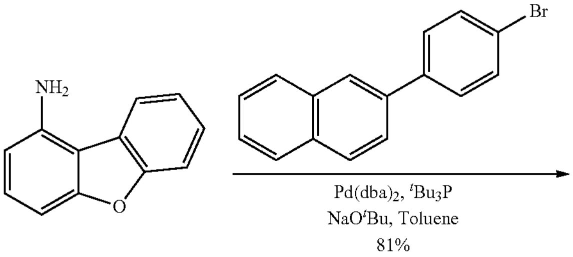

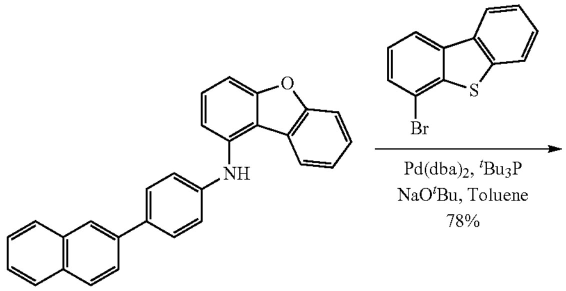

IM-10

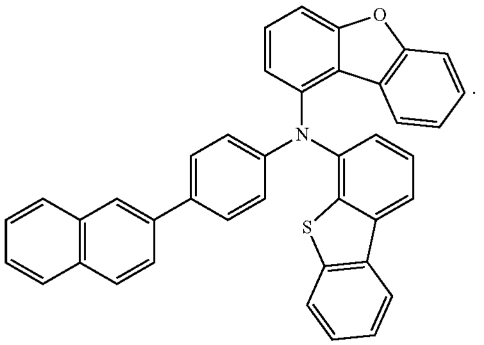

A83

Synthesis of Intermediate IM-10

Under an Ar atmosphere, to a 500 mL, three-neck flask, 10.00 g (54.6 mmol) of 1-aminodibenzofuran, 0.94 g (0.03 eq, 1.6 mmol) of $Pd(dba)_2$, 5.25 g (1.0 eq, 54.6 mmol) of NaOtBu, 273 mL of toluene, 17.00 g (1.1 eq, 60.0 mmol) of 2-(4-bromophenyl) naphthalene, and 1.10 g (0.1 eq, 5.5 mmol) of $^tBu_3P$ were added in order, followed by heating, refluxing, and stirring. After cooling in the air to room temperature, water was added to the reaction solution, and an organic layer was separately taken. Toluene was added to the aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Intermediate IM-10 (17.04 g, yield 81%).

By FAB-MS measurement, a mass number of m/z=385 was observed as a molecular ion peak, and Intermediate IM-10 was identified.

Synthesis of Compound A83

Under an Ar atmosphere, to a 300 mL, three-neck flask, 10.00 g (25.9 mmol) of IM-10, 0.45 g (0.03 eq, 0.8 mmol) of $Pd(dba)_2$, 4.99 g (2.0 eq, 51.9 mmol) of NaOtBu, 130 mL of toluene, 7.51 g (1.1 eq, 28.5 mmol) of 4-bromodibenzothiophene, and 0.52 g (0.1 eq, 2.6 mmol) of $^t$Bu$_3$P were added in order, followed by heating, refluxing, and stirring. After cooling in the air to room temperature, water was added to the reaction solution, and an organic layer was separately taken. Toluene was added to the aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Compound A83 (11.49 g, yield 78%) as a solid.

By FAB-MS measurement, a mass number of m/z=567 was observed as a molecular ion peak, and Compound A83 was identified.

9. Synthesis of Compound A105

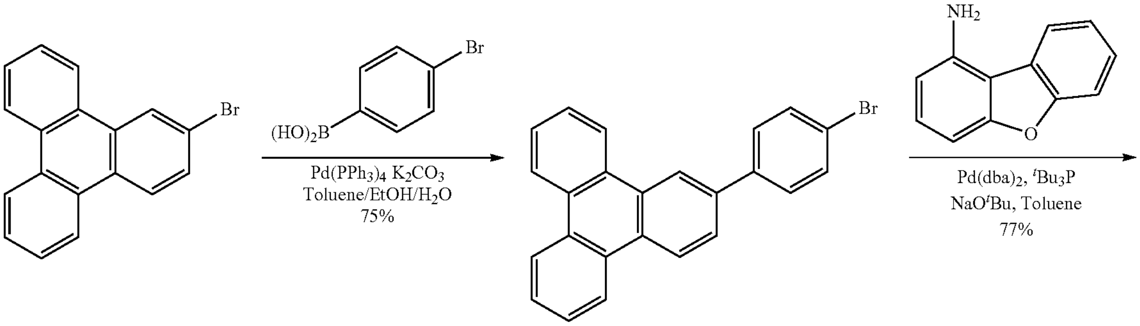

IM-11

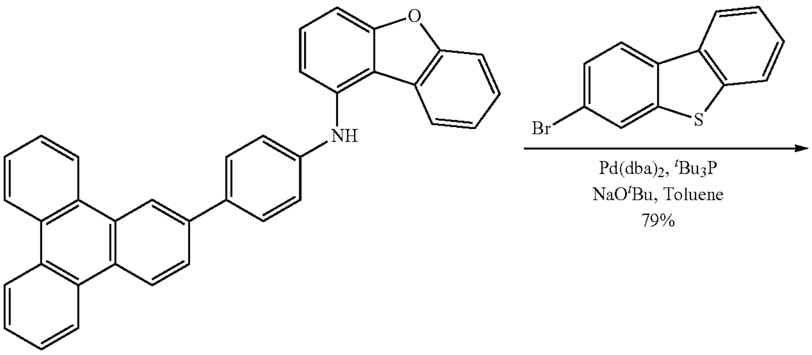

IM-12

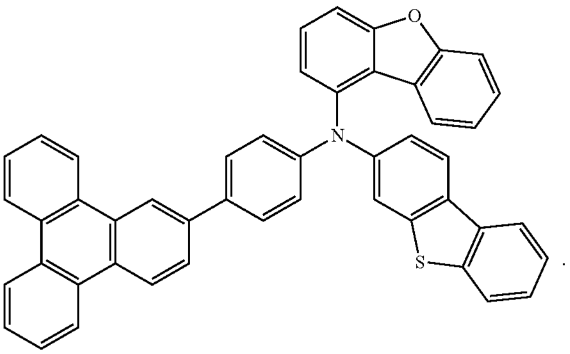

A105

Synthesis of Intermediate IM-11

Under an Ar atmosphere, to a 1,000 mL, three-neck flask, 30.00 g (97.7 mmol) of 2-bromotriphenylene, 21.57 g (1.1 eq, 107.4 mmol) of 4-bromophenylboronic acid, 40.49 g (3.0 eq, 293.0 mmol) of $K_2CO_3$, 5.64 g (0.05 eq, 4.9 mmol) of $Pd(PPh_3)_4$, and 683 mL of a mixture of toluene/EtOH/$H_2O$ (4/2/1) were added in order, followed by heating to about 80° C. and stirring. After cooling in the air to room temperature, the reaction solution was extracted with toluene. An aqueous layer was removed, and an organic layer was washed with a saturated saline solution and dried with $MgSO_4$. $MgSO_4$ was filtered, and an organic layer was concentrated. The crude product thus obtained was separated by silica gel column chromatography (using a mixture of hexane and toluene as an eluent) to obtain Intermediate IM-11 (28.07 g, yield 75%).

By FAB-MS measurement, a mass number of m/z=383 was observed as a molecular ion peak, and Intermediate IM-11 was identified.

Synthesis of Intermediate IM-12

Under an Ar atmosphere, to a 500 mL, three-neck flask, 10.00 g (54.6 mmol) of 1-aminodibenzofuran, 0.94 g (0.03 eq, 1.6 mmol) of $Pd(dba)_2$, 5.25 g (1.0 eq, 54.6 mmol) of NaOtBu, 273 mL of toluene, 23.01 g (1.1 eq, 60.0 mmol) of IM-11, and 1.10 g (0.1 eq, 5.5 mmol) of $^tBu_3P$ were added in order, followed by heating, refluxing, and stirring. After cooling in the air to room temperature, water was added to the reaction solution, and an organic layer was separately taken. Toluene was added to the aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Intermediate IM-12 (20.41 g, yield 77%).

By FAB-MS measurement, a mass number of m/z=485 was observed as a molecular ion peak, and Intermediate IM-12 was identified.

Synthesis of Compound A105

Under an Ar atmosphere, to a 300 mL, three-neck flask, 10.00 g (20.6 mmol) of IM-12, 0.36 g (0.03 eq, 0.6 mmol) of $Pd(dba)_2$, 3.96 g (2.0 eq, 41.2 mmol) of NaO$^t$Bu, 103 mL of toluene, 5.96 g (1.1 eq, 22.7 mmol) of 3-bromodibenzothiophene, and 0.42 g (0.1 eq, 2.1 mmol) of $^tBu_3P$ were added in order, followed by heating, refluxing, and stirring. After cooling in the air to room temperature, water was added to the reaction solution, and an organic layer was separately taken. Toluene was added to the aqueous layer, and additional organic layers were extracted. Organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Compound A105 (10.86 g, yield 79%) as a solid.

By FAB-MS measurement, a mass number of m/z=667 was observed as a molecular ion peak, and Compound A105 was identified.

10. Synthesis of Compound A127

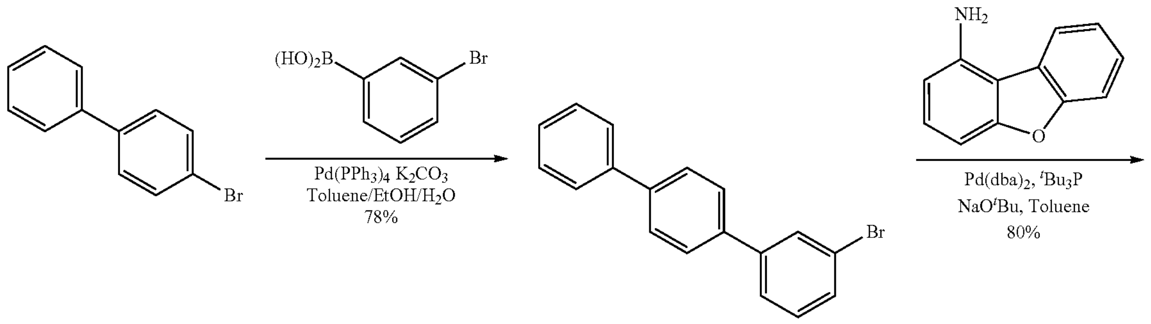

IM-13

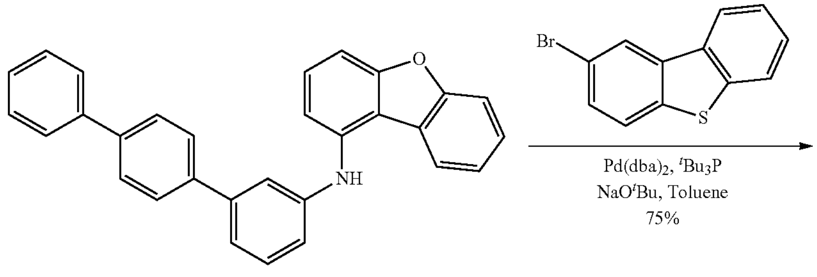

IM-14

-continued

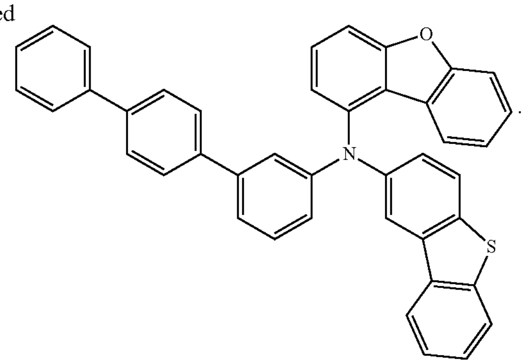

A127

Synthesis of Intermediate IM-13

Under an Ar atmosphere, to a 2,000 mL, three-neck flask, 30.00 g (128.7 mmol) of 4-bromobiphenyl, 28.43 g (1.1 eq, 141.6 mmol) of 3-bromophenylboronic acid, 53.36 g (3.0 eq, 386.1 mmol) of $K_2CO_3$, 7.44 g (0.05 eq, 6.4 mmol) of $Pd(PPh_3)_4$, and 900 mL of a mixture of toluene/EtOH/$H_2O$ (4/2/1) were added in order, followed by heating to about 80° C. and stirring. After cooling in the air to room temperature, the reaction solution was extracted with toluene. An aqueous layer was removed, and an organic layer was washed with a saturated saline solution and dried with $MgSO_4$. $MgSO_4$ was filtered, and an organic layer was concentrated. The crude product thus obtained was separated by silica gel column chromatography (using a mixture of hexane and toluene as an eluent) to obtain Intermediate IM-13 (31.04 g, yield 78%).

By FAB-MS measurement, a mass number of m/z=309 was observed as a molecular ion peak, and Intermediate IM-13 was identified.

Synthesis of Intermediate IM-14

Under an Ar atmosphere, to a 500 mL, three-neck flask, 10.00 g (54.6 mmol) of 1-aminodibenzofuran, 0.94 g (0.03 eq, 1.6 mmol) of $Pd(dba)_2$, 5.25 g (1.0 eq, 54.6 mmol) of NaOtBu, 273 mL of toluene, 18.57 g (1.1 eq, 60.0 mmol) of IM-13, and 1.10 g (0.1 eq, 5.5 mmol) of $^t$Bu$_3$P were added in order, followed by heating, refluxing, and stirring. After cooling in the air to room temperature, water was added to the reaction solution, and an organic layer was separately taken. Toluene was added to the aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Intermediate IM-14 (17.96 g, yield 80%).

By FAB-MS measurement, a mass number of m/z=411 was observed as a molecular ion peak, and Intermediate IM-14 was identified.

Synthesis of Compound A127

Under an Ar atmosphere, to a 300 mL, three-neck flask, 10.00 g (24.3 mmol) of IM-14, 0.42 g (0.03 eq, 0.7 mmol) of $Pd(dba)_2$, 4.67 g (2.0 eq, 48.6 mmol) of NaOtBu, 122 mL of toluene, 7.03 g (1.1 eq, 26.7 mmol) of 2-bromodibenzothiophene, and 0.49 g (0.1 eq, 2.4 mmol) of $^t$Bu$_3$P were added in order, followed by heating, refluxing, and stirring. After cooling in the air to room temperature, water was added to the reaction solution, and an organic layer was separately taken. Toluene was added to the aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Compound A127 (10.82 g, yield 75%) as a solid.

By FAB-MS measurement, a mass number of m/z=593 was observed as a molecular ion peak, and Compound A127 was identified.

11. Synthesis of Compound A143

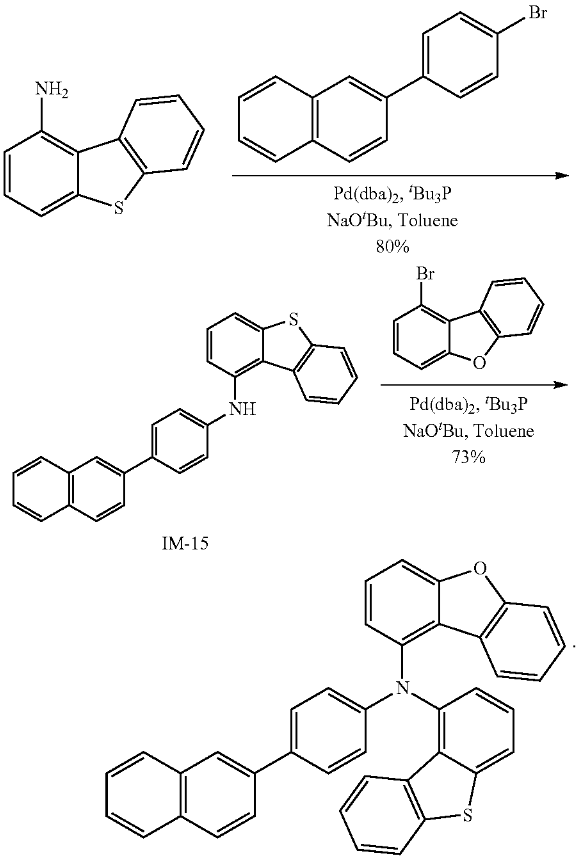

IM-15

A143

Synthesis of Intermediate IM-15

Under an Ar atmosphere, to a 500 mL, three-neck flask, 10.00 g (50.2 mmol) of 1-aminodibenzothiophene, 0.87 g (0.03 eq, 1.5 mmol) of $Pd(dba)_2$, 4.82 g (1.0 eq, 50.2 mmol) of NaOtBu, 250 mL of toluene, 15.63 g (1.1 eq, 55.2 mmol) of 2-(4-bromophenyl) naphthalene, and 1.02 g (0.1 eq, 5.0 mmol) of $^tBu_3P$ were added in order, followed by heating, refluxing, and stirring. After cooling in the air to room temperature, water was added to the reaction solution, and an organic layer was separately taken. Toluene was added to the aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Intermediate IM-15 (16.12 g, yield 80%).

By FAB-MS measurement, a mass number of m/z=401 was observed as a molecular ion peak, and Intermediate IM-15 was identified.

Synthesis of Compound A143

Under an Ar atmosphere, to a 300 mL, three-neck flask, 10.00 g (24.9 mmol) of IM-15, 0.43 g (0.03 eq, 0.7 mmol) of $Pd(dba)_2$, 4.79 g (2.0 eq, 49.8 mmol) of $NaO^tBu$, 125 mL of toluene, 6.77 g (1.1 eq, 27.4 mmol) of 1-bromodibenzofuran, and 0.50 g (0.1 eq, 2.5 mmol) of $^tBu_3P$ were added in order, followed by heating, refluxing, and stirring. After cooling in the air to room temperature, water was added to the reaction solution, and an organic layer was separately taken. Toluene was added to the aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Compound A143 (10.32 g, yield 73%) as a solid.

By FAB-MS measurement, a mass number of m/z=567 was observed as a molecular ion peak, and Compound A143 was identified.

12. Synthesis of Compound A150

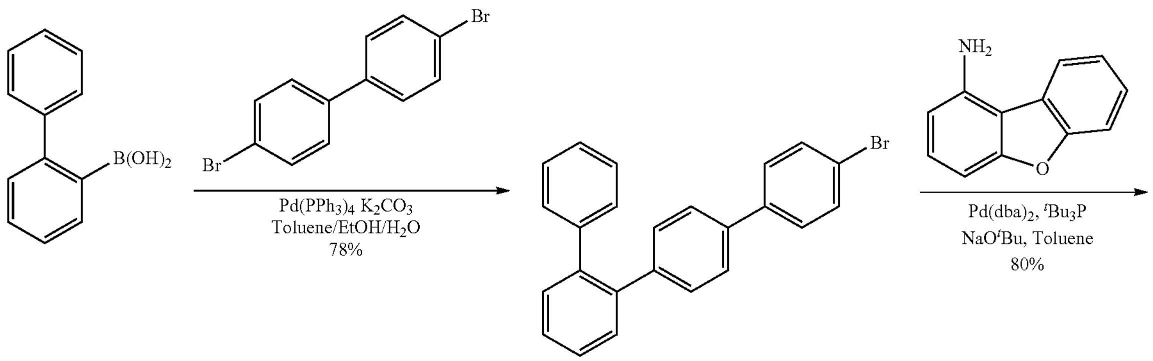

IM-16

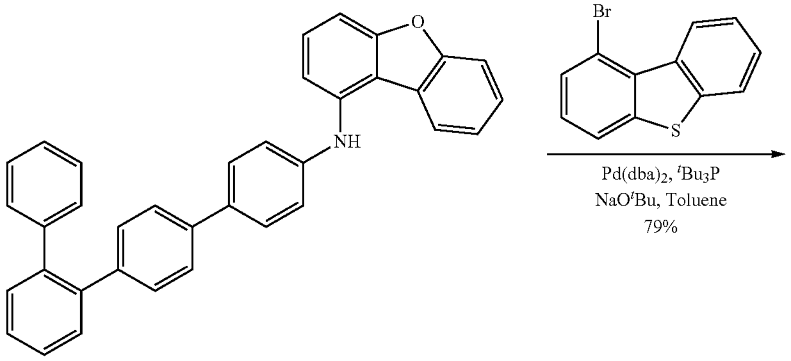

IM-17

-continued

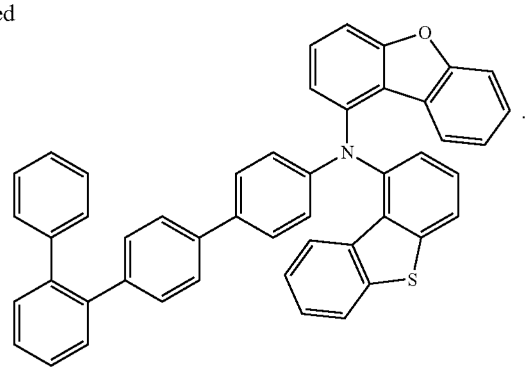

A150

Synthesis of Intermediate IM-16

Under an Ar atmosphere, to a 1,000 mL, three-neck flask, 30.00 g (96.2 mmol) of 4,4'-dibromobiphenyl, 20.95 g (1.1 eq, 105.8 mmol) of 2-biphenylboronic acid, 39.87 g (3.0 eq, 288.5 mmol) of $K_2CO_3$, 5.56 g (0.05 eq, 4.8 mmol) of $Pd(PPh_3)_4$, and 673 mL of a mixture of toluene/EtOH/$H_2O$ (4/2/1) were added in order, followed by heating to about 80° C. and stirring. After cooling in the air to room temperature, the reaction solution was extracted with toluene. An aqueous layer was removed, and an organic layer was washed with a saturated saline solution and dried with $MgSO_4$. $MgSO_4$ was filtered, and an organic layer was concentrated. The crude product thus obtained was separated by silica gel column chromatography (using a mixture of hexane and toluene as an eluent) to obtain Intermediate IM-16 (28.90 g, yield 78%).

By FAB-MS measurement, mass number of m/z=385 was observed as a molecular ion peak, and Intermediate IM-16 was identified.

Synthesis of Intermediate IM-17

Under an Ar atmosphere, to a 500 mL, three-neck flask, 10.00 g (54.6 mmol) of 1-aminodibenzofuran, 0.94 g (0.03 eq, 1.6 mmol) of $Pd(dba)_2$, 5.25 g (1.0 eq, 54.6 mmol) of NaOtBu, 273 mL of toluene, 23.13 g (1.1 eq, 60.0 mmol) of IM-16, and 1.10 g (0.1 eq, 5.5 mmol) of $^{t}Bu_3P$ were added in order, followed by heating, refluxing, and stirring. After cooling in the air to room temperature, water was added to the reaction solution, and an organic layer was separately taken. Toluene was added to the aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Intermediate IM-17 (21.29 g, yield 80%).

By FAB-MS measurement, a mass number of m/z=487 was observed as a molecular ion peak, and Intermediate IM-17 was identified.

Synthesis of Compound A150

Under an Ar atmosphere, to a 300 mL, three-neck flask, 10.00 g (20.5 mmol) of IM-17, 0.35 g (0.03 eq, 0.6 mmol) of $Pd(dba)_2$, 3.94 g (2.0 eq, 41.0 mmol) of NaOtBu, 103 mL of toluene, 5.94 g (1.1 eq, 22.6 mmol) of 1-bromodibenzothiophene, and 0.41 g (0.1 eq, 2.1 mmol) of $^{t}Bu_3P$ were added in order, followed by heating, refluxing, and stirring. After cooling in the air to room temperature, water was added to the reaction solution, and an organic layer was separately taken. Toluene was added to the aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Compound A150 (10.85 g, yield 79%) as a solid.

By FAB-MS measurement, a mass number of m/z=669 was observed as a molecular ion peak, and Compound A150 was identified.

13. Synthesis of Compound B13

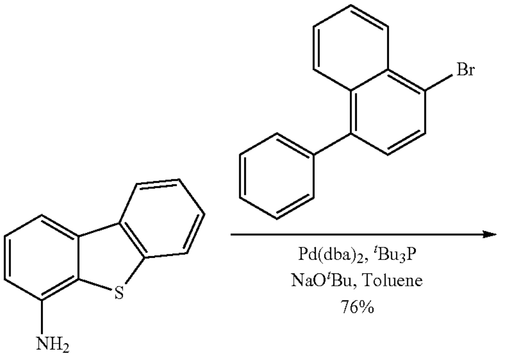

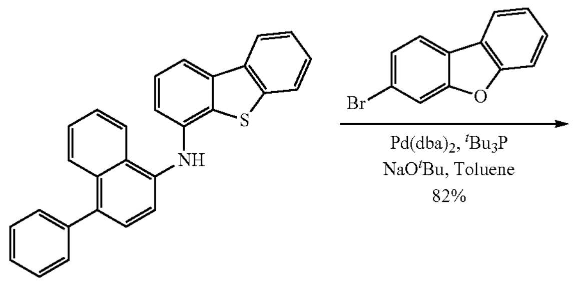

IM-18

-continued

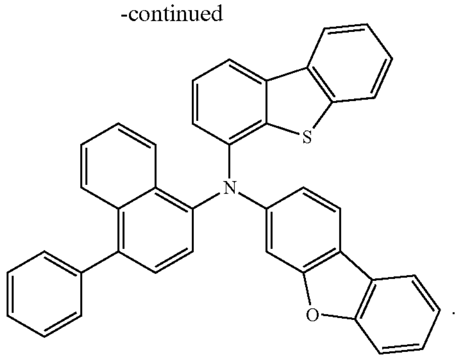

B13

Synthesis of Intermediate IM-18

Under an Ar atmosphere, to a 500 mL, three-neck flask, 10.00 g (50.2 mmol) of 4-aminodibenzothiophene, 0.87 g (0.03 eq, 1.5 mmol) of $Pd(dba)_2$, 4.82 g (1.0 eq, 50.2 mmol) of NaOtBu, 250 mL of toluene, 15.63 g (1.1 eq, 55.2 mmol) of 1-bromo-4-phenylnaphthalene, and 1.02 g (0.1 eq, 5.0 mmol) of $^{t}Bu_3P$ were added in order, followed by heating, refluxing, and stirring. After cooling in the air to room temperature, water was added to the reaction solution, and an organic layer was separately taken. Toluene was added to the aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Intermediate IM-18 (15.31 g, yield 76%).

By FAB-MS measurement, a mass number of m/z=401 was observed as a molecular ion peak, and Intermediate IM-18 was identified.

Synthesis of Compound B13

Under an Ar atmosphere, to a 300 mL, three-neck flask, 10.00 g (24.9 mmol) of IM-18, 0.43 g (0.03 eq, 0.7 mmol) of $Pd(dba)_2$, 4.79 g (2.0 eq, 49.8 mmol) of NaOtBu, 124 mL of toluene, 6.77 g (1.1 eq, 27.4 mmol) of 3-bromodibenzofuran, and 0.50 g (0.1 eq, 2.5 mmol) of $^{t}Bu_3P$ were added in order, followed by heating, refluxing, and stirring. After cooling in the air to room temperature, water was added to the reaction solution, and an organic layer was separately taken. Toluene was added to the aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Compound B13 (11.59 g, yield 82%) as a solid.

By FAB-MS measurement, a mass number of m/z=567 was observed as a molecular ion peak, and Compound B13 was identified.

14. Synthesis of Compound B40

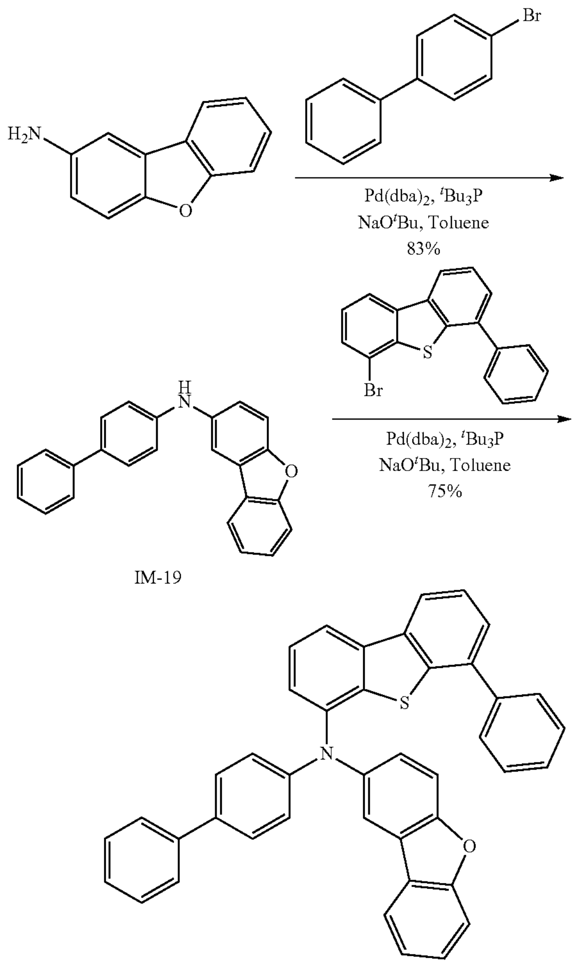

IM-19

B40

Synthesis of Intermediate IM-19

Under an Ar atmosphere, to a 500 mL, three-neck flask, 10.00 g (54.6 mmol) of 2-aminodibenzofuran, 0.94 g (0.03 eq, 1.6 mmol) of $Pd(dba)_2$, 5.25 g (1.0 eq, 54.6 mmol) of NaOtBu, 273 mL of toluene, 14.00 g (1.1 eq, 60.0 mmol) of 4-bromobiphenyl, and 1.10 g (0.1 eq, 5.5 mmol) of $^{t}Bu_3P$ were added in order, followed by heating, refluxing, and stirring. After cooling in the air to room temperature, water was added to the reaction solution, and an organic layer was separately taken. Toluene was added to the aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Intermediate IM-19 (15.20 g, yield 83%).

By FAB-MS measurement, a mass number of m/z=335 was observed as a molecular ion peak, and Intermediate IM-19 was identified.

Synthesis of Compound B40

Under an Ar atmosphere, to a 300 mL, three-neck flask, 10.00 g (29.8 mmol) of IM-19, 0.51 g (0.03 eq, 0.9 mmol) of $Pd(dba)_2$, 5.73 g (2.0 eq, 59.6 mmol) of NaOtBu, 149 mL of toluene, 11.13 g (1.1 eq, 32.8 mmol) of 4-bromo-6- phenyldibenzothiophene, and 0.60 g (0.1 eq, 3.0 mmol) of $^tBu_3P$ were added in order, followed by heating, refluxing, and stirring. After cooling in the air to room temperature, water was added to the reaction solution, and an organic layer was separately taken. Toluene was added to the aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Compound B40 (13.28 g, yield 75%) as a solid.

By FAB-MS measurement, a mass number of m/z=593 was observed as a molecular ion peak, and Compound B40 was identified.

15. Synthesis of Compound B54

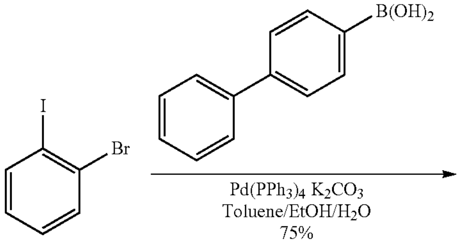

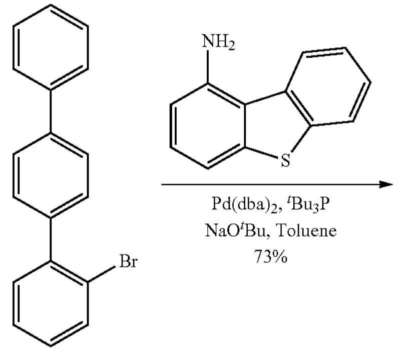

IM-20

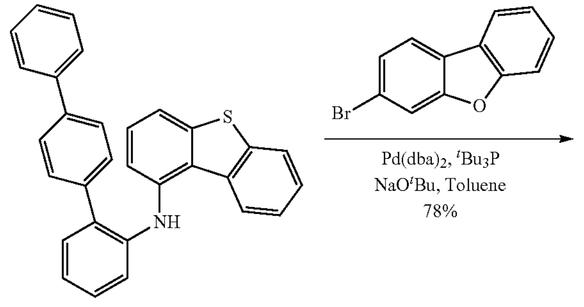

IM-21

-continued

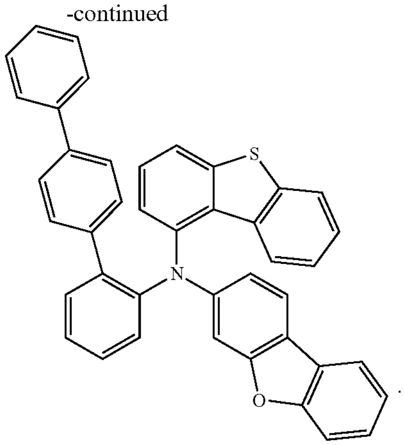

B54

Synthesis of Intermediate IM-20

Under an Ar atmosphere, to a 2,000 mL, three-neck flask, 30.00 g (106.0 mmol) of 1-bromo-2-iodobenzene, 23.10 g (1.1 eq, 116.6 mmol) of 4-biphenylboronic acid, 43.97 g (3.0 eq, 318.1 mmol) of $K_2CO_3$, 6.13 g (0.05 eq, 5.3 mmol) of $Pd(PPh_3)_4$, and 742 mL of a mixture of toluene/EtOH/$H_2O$ (4/2/1) were added in order, followed by heating to about 80° C. and stirring. After cooling in the air to room temperature, the reaction solution was extracted with toluene. An aqueous layer was removed, and an organic layer was washed with a saturated saline solution and dried with $MgSO_4$. $MgSO_4$ was filtered, and an organic layer was concentrated. The crude product thus obtained was separated by silica gel column chromatography (using a mixture of hexane and toluene as an eluent) to obtain Intermediate IM-20 (24.59 g, yield 75%).

By FAB-MS measurement, a mass number of m/z=309 was observed as a molecular ion peak, and Intermediate IM-20 was identified.

Synthesis of Intermediate IM-21

Under an Ar atmosphere, to a 500 mL, three-neck flask, 10.00 g (50.2 mmol) of 1-aminodibenzothiophene, 0.87 g (0.03 eq, 1.5 mmol) of $Pd(dba)_2$, 4.82 g (1.0 eq, 50.2 mmol) of NaOtBu, 250 ml of toluene, 17.07 g (1.1 eq, 55.2 mmol) of IM-20, and 1.02 g (0.1 eq, 5.0 mmol) of $^tBu_3P$ were added in order, followed by heating, refluxing, and stirring. After cooling in the air to room temperature, water was added to the reaction solution, and an organic layer was separately taken. Toluene was added to the aqueous layer, and organic layers were additionally extracted. Organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Intermediate IM-21 (15.66 g, yield 73%).

By FAB-MS measurement, a mass number of m/z=427 was observed as a molecular ion peak, and Intermediate IM-21 was identified.

Synthesis of Compound B54

Under an Ar atmosphere, to a 300 mL, three-neck flask, 10.00 g (23.4 mmol) of IM-21, 0.40 g (0.03 eq, 0.7 mmol) of $Pd(dba)_2$, 4.50 g (2.0 eq, 46.8 mmol) of NaOtBu, 117 mL of toluene, 6.36 g (1.1 eq, 25.7 mmol) of 3-bromodibenzofuran, and 0.47 g (0.1 eq, 2.3 mmol) of $^tBu_3P$ were added in order, followed by heating, refluxing, and stirring. After cooling in the air to room temperature, water was added to the reaction solution, and an organic layer was separately taken. Toluene was added to the aqueous layer, and additional organic layers were extracted. The organic layers were collected, washed with a saline solution, and dried with $MgSO_4$. $MgSO_4$ was filtered, and an organic layer was concentrated. The crude product thus obtained was separated by silica gel column chromatography (using a mixture of hexane and toluene as an eluent) to obtain Compound B54 (10.83 g, yield 78%) as a solid.

By FAB-MS measurement, a mass number of m/z=593 was observed as a molecular ion peak, and Compound B54 was identified.

B. Manufacture and Evaluation of Organic Electroluminescence Device Including Amine Compound The evaluation on the emission properties of the amine compound of an embodiment and the organic electroluminescence device of an embodiment, including the amine compound of an embodiment in a hole transport layer, was conducted by methods described below. Compounds used for the evaluation are as follows.

Example Compounds

A2

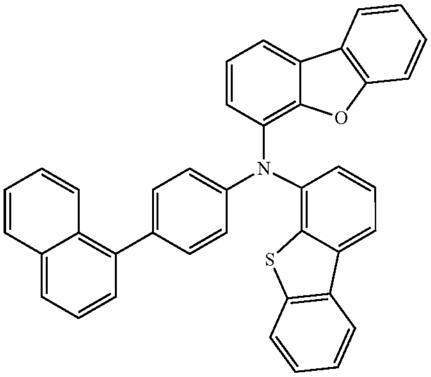

A14

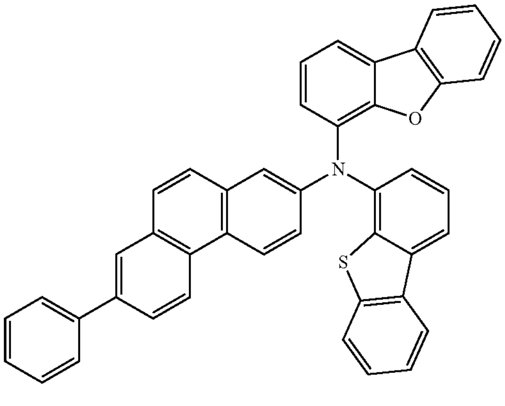

-continued

A29

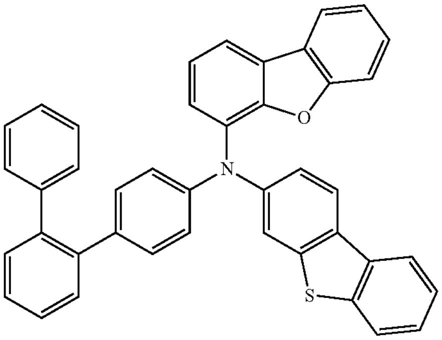

A44

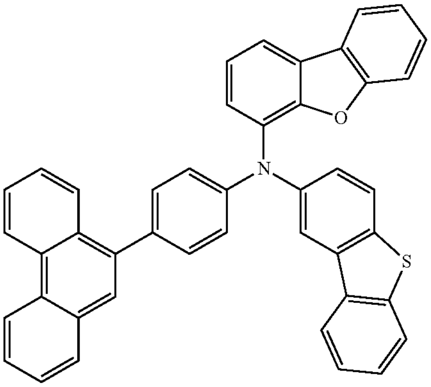

A66

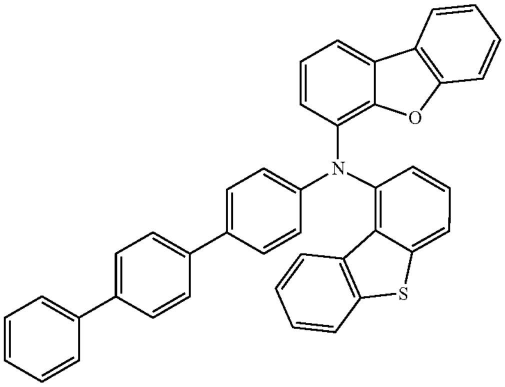

A72

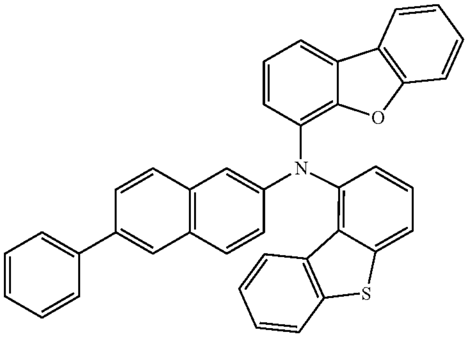

-continued
A81
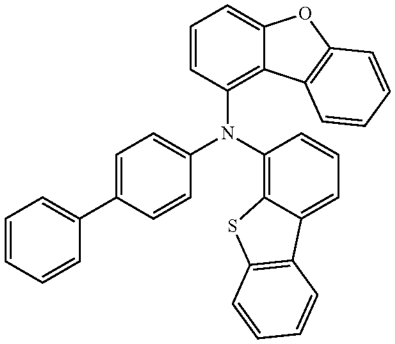
A83
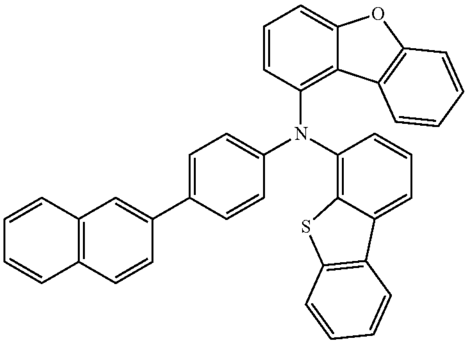
A105
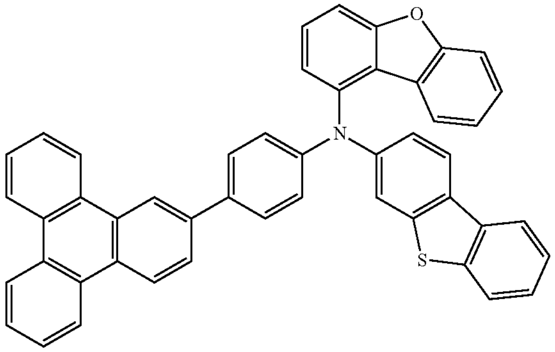
A127
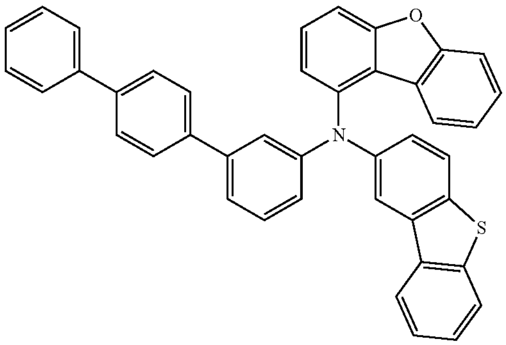
-continued
A143
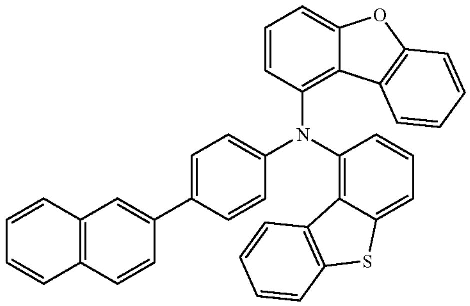
A150
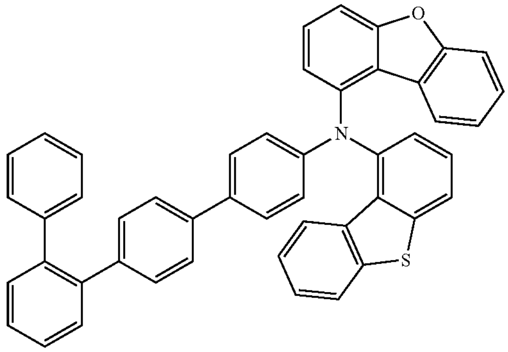
B13
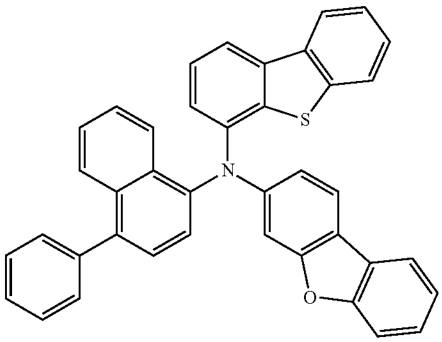
B40
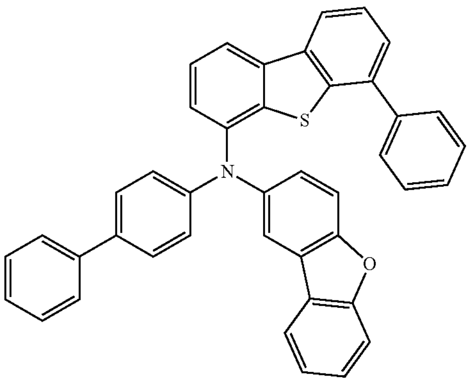

-continued
B54
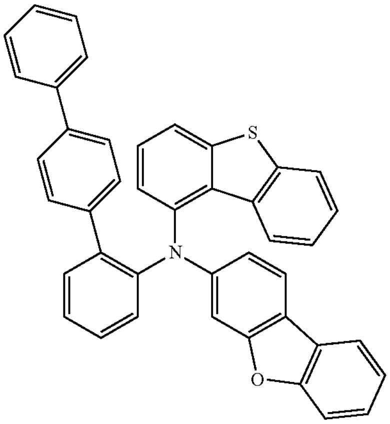
Comparative Compounds
R1
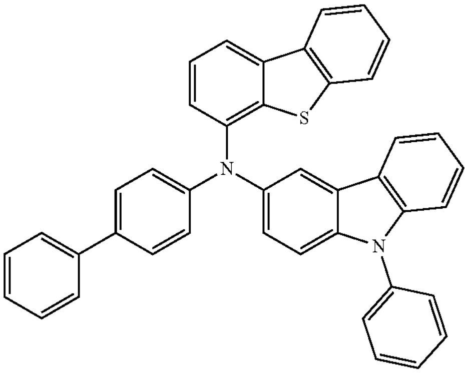
R2
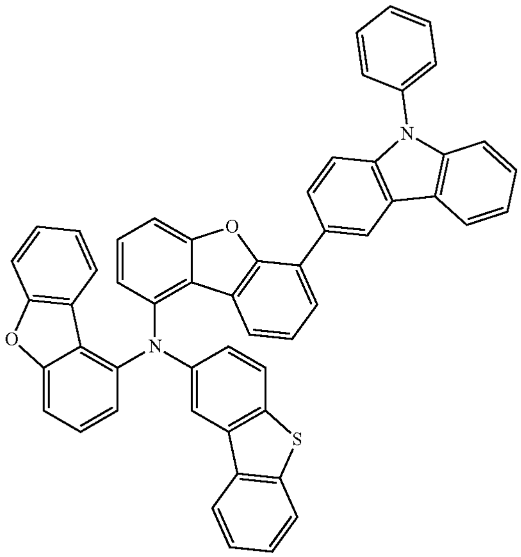
-continued
R3
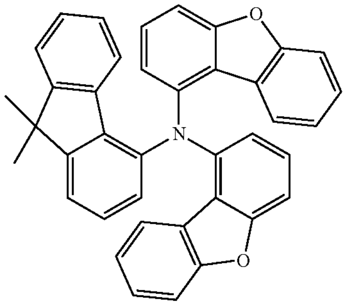
R4
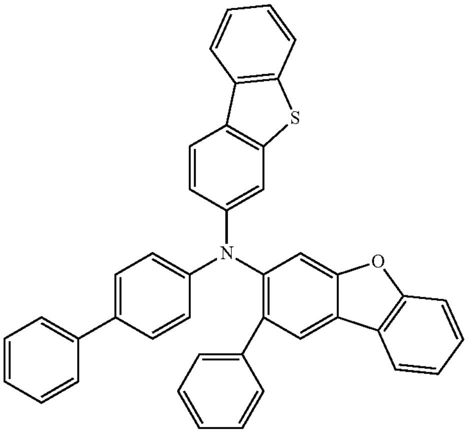
R5
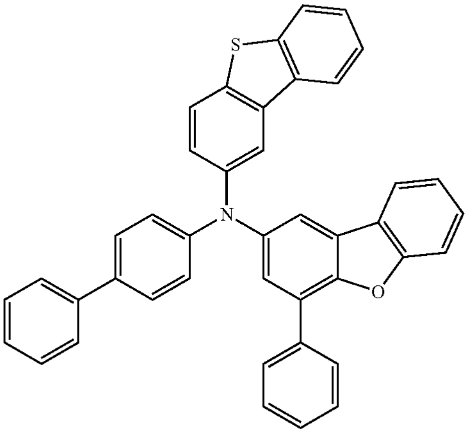
R6
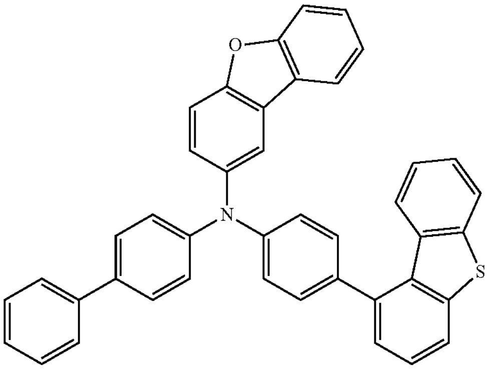

-continued
R7
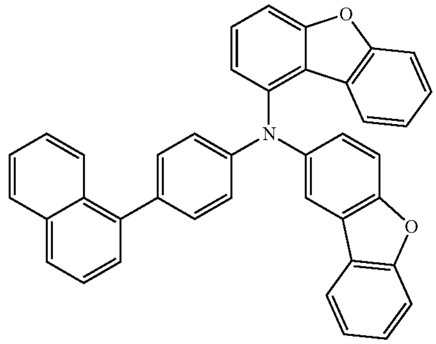
R8
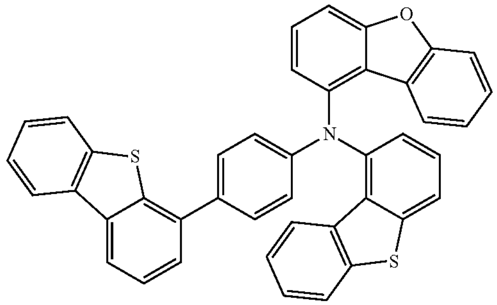
R9
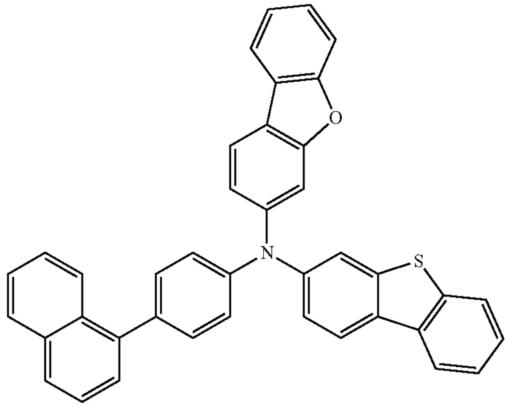
R10
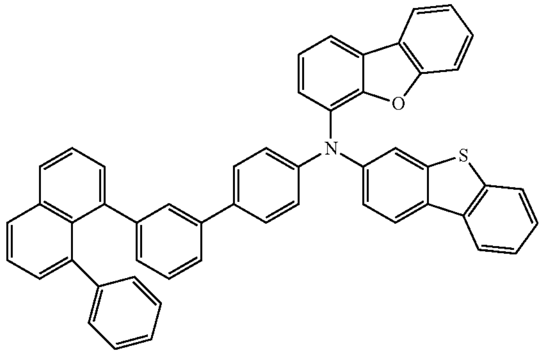
-continued
R11
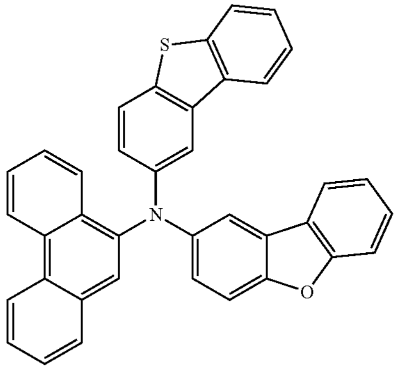
R12
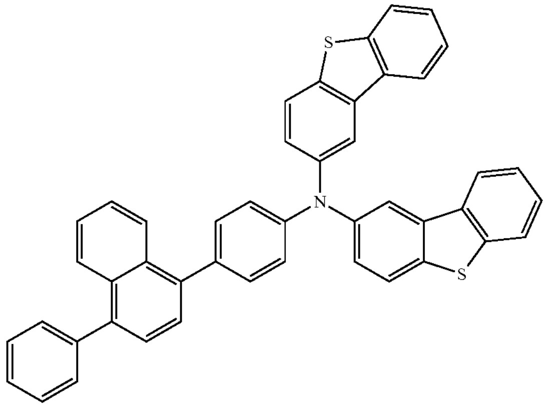
R13
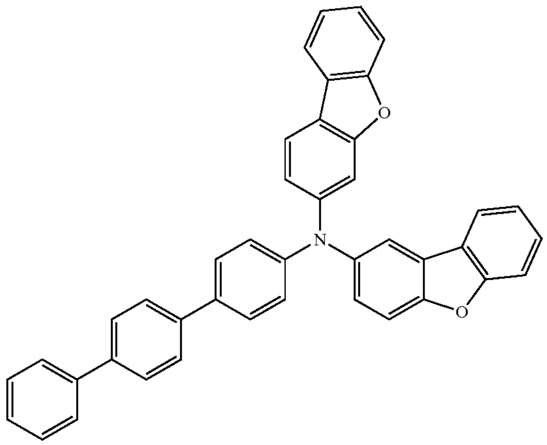

-continued

R14

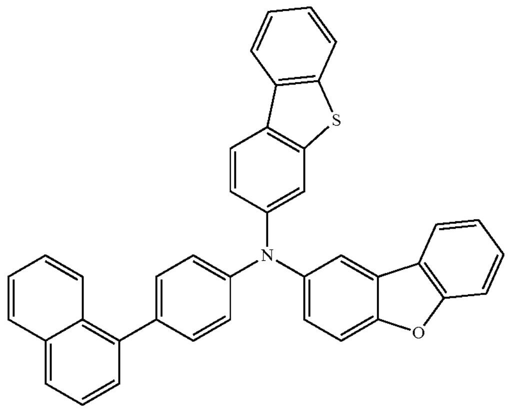

R15

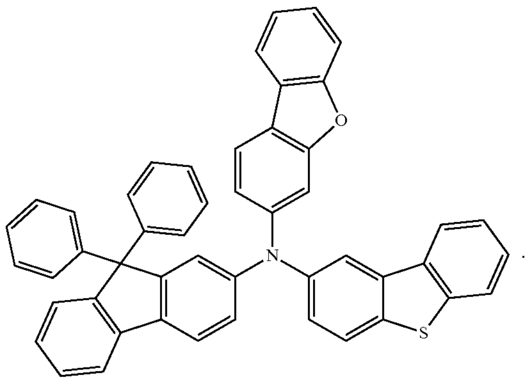

Example 1 to Example 15 are organic electroluminescence devices manufactured using the aforementioned Example Compound A2, Example Compound A14, Example Compound A29, Example Compound A44, Example Compound A66, Example Compound A72, Example Compound A81, Example Compound A83, Example Compound A105, Example Compound A127, Example Compound A143, Example Compound A150, Example Compound B13, Example Compound B40, and Example Compound B54, respectively, as materials for a hole transport layer.

Comparative Example 1 to Comparative Example 15 are organic electroluminescence devices manufactured using Comparative Compound R1 to Comparative Compound R15, respectively, as materials for a hole transport layer.

The method for manufacturing an organic electroluminescence device for the device evaluation is as follows.

Manufacture of Organic Electroluminescence Device

On a glass substrate, ITO with a thickness of about 1,500 Å was patterned and washed with ultra-pure water and ultrasonic waves, exposed to UV for about 30 minutes, and treated with ozone. Then, 1-TNATA was deposited to a thickness of about 600 Å to form a hole injection layer. Then, the amine compound of an embodiment or Comparative Compound was deposited to a thickness of about 300 Å to form a hole transport layer.

For example, the hole transport layer was formed by respectively depositing Example Compound A2, Example Compound A14, Example Compound A29, Example Compound A44, Example Compound A66, Example Compound A72, Example Compound A81, Example Compound A83, Example Compound A105, Example Compound A127, Example Compound A143, Example Compound A150, Example Compound B13, Example Compound B40, and Example Compound B54 in Example 1 to Example 15, and by respectively depositing Comparative Compound R1 to Comparative Compound R15 in Comparative Example 1 to Comparative Example 15.

After that, an emission layer was formed by co-depositing ADN and TBP in a ratio of 97:3 to a thickness of about 250 Å.

Then, an electron transport region was formed by depositing $Alq_3$ to a thickness of about 250 Å, and depositing LiF to a thickness of about 10 Å in order. Then, a second electrode was formed using aluminum (Al) to a thickness of about 1,000 Å. On the second electrode, a capping layer was formed using CPL1 to a thickness of about 700 Å.

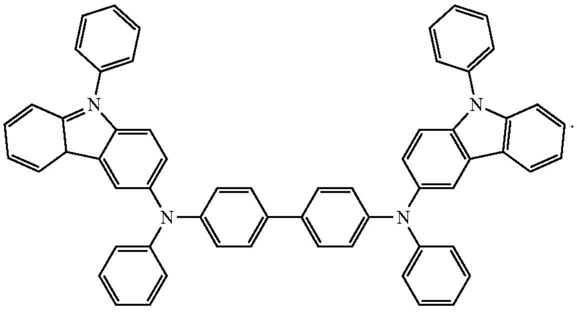

CPL1

Evaluation of Properties of Organic Electroluminescence Device

The voltage, emission efficiency, and life span of the organic electroluminescence devices of Example 1 to Example 15 and Comparative Example 1 to Comparative Example 15 are shown in Table 1. The current density, voltage, and emission efficiency of the organic electroluminescence devices were measured using a 2400 Series Source Meter manufactured by Keithley Instrument Co., and a PC Program LabVIEW 8.2 for measurement, which is a product of National Instrument Co.

The device life span was obtained by measuring the time (half life, LT50) required to reduce the initial luminance to 50% at a current density of at about 1.0 $mA/cm^2$. The luminance was measured in a dark room using a color meter CS-200, which is a product of Konica Minolta Co. The emission efficiency value was measured at a current density of 1.0 $mA/cm^2$.

TABLE 1

| Division | Hole transport layer material | Voltage (V) | Emission efficiency (cd/A) | Life span $LT_{50}$ (h) |
|---|---|---|---|---|
| Example 1 | Example Compound A2 | 5.4 | 7.8 | 2050 |
| Example 2 | Example Compound A14 | 5.6 | 7.8 | 2100 |
| Example 3 | Example Compound A29 | 5.5 | 7.7 | 2100 |
| Example 4 | Example Compound A44 | 5.6 | 7.6 | 2050 |
| Example 5 | Example Compound A66 | 5.7 | 7.8 | 1950 |
| Example 6 | Example Compound A72 | 5.5 | 7.9 | 1900 |

TABLE 1-continued

| Division | Hole transport layer material | Voltage (V) | Emission efficiency (cd/A) | Life span $LT_{50}$ (h) |
|---|---|---|---|---|
| Example 7 | Example Compound A81 | 5.6 | 7.8 | 2000 |
| Example 8 | Example Compound A83 | 5.4 | 7.8 | 2050 |
| Example 9 | Example Compound A105 | 5.6 | 7.6 | 2050 |
| Example 10 | Example Compound A127 | 5.5 | 7.7 | 1950 |
| Example 11 | Example Compound A143 | 5.6 | 7.8 | 2000 |
| Example 12 | Example Compound A150 | 5.5 | 7.8 | 1950 |
| Example 13 | Example Compound B13 | 5.7 | 7.6 | 2000 |
| Example 14 | Example Compound B40 | 5.7 | 7.6 | 2050 |
| Example 15 | Example Compound B54 | 5.4 | 7.7 | 1950 |
| Comparative Example 1 | Comparative Compound R1 | 6.0 | 6.4 | 1600 |
| Comparative Example 2 | Comparative Compound R2 | 6.2 | 6.5 | 1500 |
| Comparative Example 3 | Comparative Compound R3 | 6.4 | 6.4 | 1550 |
| Comparative Example 4 | Comparative Compound R4 | 6.5 | 6.4 | 1500 |
| Comparative Example 5 | Comparative Compound R5 | 6.2 | 6.3 | 1600 |
| Comparative Example 6 | Comparative Compound R6 | 6.0 | 5.7 | 1650 |
| Comparative Example 7 | Comparative Compound R7 | 6.0 | 6.7 | 1750 |
| Comparative Example 8 | Comparative Compound R8 | 6.0 | 6.7 | 1700 |
| Comparative Example 9 | Comparative Compound R9 | 5.9 | 6.8 | 1800 |
| Comparative Example 10 | Comparative Compound R10 | 6.2 | 6.9 | 1750 |
| Comparative Example 11 | Comparative Compound R11 | 5.9 | 7.0 | 1750 |
| Comparative Example 12 | Comparative Compound R12 | 6.0 | 6.8 | 1850 |
| Comparative Example 13 | Comparative Compound R13 | 6.2 | 6.7 | 1850 |
| Comparative Example 14 | Comparative Compound R14 | 5.9 | 6.9 | 1800 |
| Comparative Example 15 | Comparative Compound R15 | 6.1 | 6.9 | 1850 |

Referring to the results of Table 1, the organic electroluminescence devices of Example 1 to Example 15 showed reduced driving voltage, increased device efficiency, and increased life span compared with the organic electroluminescence devices of Comparative Example 1 to Comparative Example 15. In the amine compound according to an embodiment of the present disclosure, two different dibenzoheterole groups are connected with a central nitrogen atom, and improved thermal tolerance and charge tolerance may be achieved; and when the amine compound is applied to a device, device life-characteristics may be improved.

In the compounds of embodiments included in the organic electroluminescence devices of Examples 1, 2, 5, 6, 7, 8, 11 and 12, the carbon atoms at position 1 and position 4 of two respective dibenzoheterole groups are combined with the central nitrogen atom. Accordingly, the HOMO energy level of the compound may increase, and when the compound is applied to a device, hole transport capacity may be improved, and the recombination probability of holes and electrons in an emission layer may increase. In Table 1, it could be confirmed that the organic electroluminescence devices of Examples 1, 2, 5, 6, 7, 8, 11 and 12 had emission efficiencies of about 7.8 cd/A or more, along with improved high efficiency properties when compared with the organic electroluminescence devices of the Comparative Examples.

In each of the Example Compounds included in the organic electroluminescence devices of Examples 3, 4, 9, 10, 13, 14, and 15, a carbon atom at position 2 or position 3 of one of the two dibenzoheterole groups is combined with the central nitrogen atom. Accordingly, the HOMO orbital may expand to include the dibenzoheterole group, and the stability of the amine compound in a radical state may be improved. In Table 1, it could be confirmed that the organic electroluminescence devices of Examples 3, 4, 9, 10, 13, 14 and 15 each had a device half life of about 2,000 h or more, a significant increase over the organic electroluminescence devices of the Comparative Examples.

The devices of Comparative Examples 1 to 15 each showed higher driving voltage, lower emission efficiency, and shorter device life when compared with each of the devices of Examples 1 to 15.

Comparative Compounds R1 and R2 each include one dibenzoheterole group and one carbazole group, in contrast to the Example Compounds including two dibenzoheterole groups (and only one amine nitrogen), and accordingly showed collapsed carrier balance, such that the efficiency and life span of the corresponding devices were degraded.

Comparative Compound R3 is an amine compound including a fluorenyl group connected with a central nitrogen atom, and the $sp^3$ hybrid structure of the carbon atom at position 9 of the fluorenyl group skeleton was unstable, such that when the compound was applied to a device, device life was reduced.

In the dibenzofuran group of Comparative Compounds R4 and R5, a benzene ring to which a nitrogen atom was connected and a benzene ring to which an aryl group was connected are the same (e.g., the nitrogen atom and a phenyl group substituent are connected to the same benzene ring, and for example, in adjacent ortho positions), and molecular stability was reduced due to steric interactions around the central nitrogen atom. For example, in Comparative Compound R4, a phenyl group is substituted at position 2 of a dibenzofuran group, and a central nitrogen atom is connected at position 3. In Comparative Compound R5, a central nitrogen atom is connected at position 2 of a dibenzofuran group, and a phenyl group is substituted at position 4. Accordingly, the molecules of Comparative Compounds R4 and R5 were unstable, and the material decomposed when applied to the device so that device efficiency and life span were both (e.g., simultaneously) degraded. Referring to Compound B40 of Example 12 as a counter example, the dibenzothiophene group is substituted on a different benzene ring with respect to the nitrogen atom, and the compound is stable and provides excellent device properties.

Comparative Compound R6 is an amine compound including a (phenylene) linker between a central nitrogen atom and a dibenzoheterole group, and when applied to a device, both emission efficiency and life span were (e.g., simultaneously) degraded. Without being bound by the correctness of any theory or explanation, it is thought that the linker increases the planarity of the entire molecule so that stacking between molecules increased during deposition, resulting in thermal decomposition and the degradation of layer forming properties occurred under elevation of the temperature.

Comparative Compound R7 is an amine compound including two dibenzofuran groups, and when applied to a device, emission efficiency and life span were degraded.

Without being bound by the correctness of any theory or explanation, it is thought that the glass transition temperature (Tg) of the material including two identical dibenzoheterole groups was insufficiently high, and when applied to a device and continuously driven, the material was deteriorated. Alternatively, it is thought that in the Example Compounds including different dibenzoheterole groups, the glass transition temperature was elevated, the stability of a material was improved, and excellent device properties were shown.

Comparative Compound R8 is an amine compound including three dibenzoheterole groups, and carrier balance was collapsed; when applied to a device, both emission efficiency and device life span were (e.g., simultaneously) degraded.

Comparative Compounds R9 and R11 to R15 are amine compounds including two dibenzoheterole groups, but are structures in which the nitrogen atom was bonded at position 2 or position 3 of each dibenzoheterole group, and when applied to a device, both emission efficiency and device life were (e.g., simultaneously) degraded. The results are thought to be due to the increased symmetricity and planarity of the molecule, so that stacking between molecules was increased during deposition, and the thermal decomposition of the compound due to the elevation of the temperature occurred, and layer forming properties of the compound were degraded. In addition, without being bound by the correctness of any theory or explanation, it is thought that a HOMO energy level was lowered, and hole transport capacity was degraded.

Comparative Compound R10 is an amine compound including 8-phenylnaphthalene as a substituent with an intermediary phenylene group linker, and when applied to a device, both emission efficiency and device life span were (e.g., simultaneously) degraded. Without being bound by the correctness of any theory or explanation, it is thought that because 8-phenylnaphthalene includes substituents at position 1 and position 8, adjacent to each other, steric effects were increased, and heat resistance was decreased, and thus, when applied to a device, thermal decomposition was carried out.

Referring to the evaluation results of the Example Compounds and the Examples of the organic electroluminescence devices, the amine compound of an embodiment includes a central nitrogen atom and two dibenzoheterole groups including two different heteroatoms, such that the glass transition temperature may increase, and heat resistance and hole transport capacity may increase. In addition, when the structure includes a bond between the central nitrogen atom and a carbon atom at position 1 or position 4 of the dibenzoheterole group, and the stability of a molecule may be increased, and if applied to a device, emission efficiency and device life span may be improved.

The organic electroluminescence device according to an embodiment of the present disclosure may exhibit excellent emission efficiency and long-life span characteristics.

The amine compound according to an embodiment of the present disclosure may be applied to an organic electroluminescence device and show high efficiency and long-life characteristics.

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the example embodiments of the present disclosure have been described, it is understood that the present disclosure should not be limited to these example embodiments, but various changes and modifications can be made by one ordinary skilled in the art within the spirit and scope of the present disclosure as set forth in claims and equivalents thereof.

What is claimed is:

1. An organic electroluminescence device, comprising:

a first electrode;

a second electrode opposite the first electrode; and a plurality of organic layers between the first electrode and the second electrode, wherein at least one organic layer among the plurality of organic layers comprises an amine compound selected from among compounds represented in Compound Group A and Compound Group B:

Compound Group A

A2

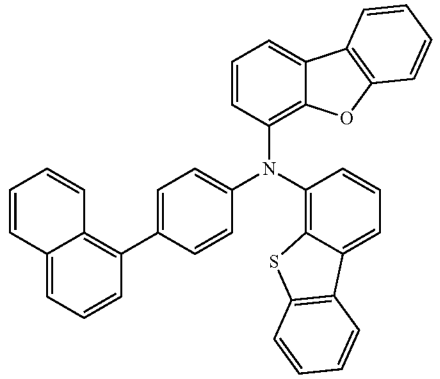

A3

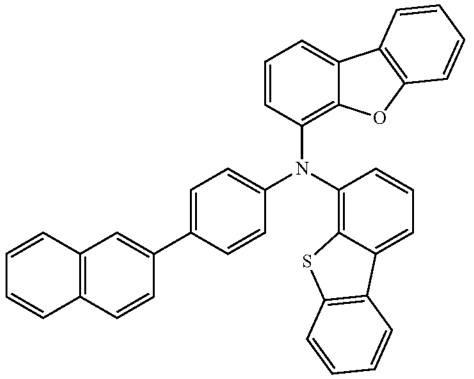

-continued
A4
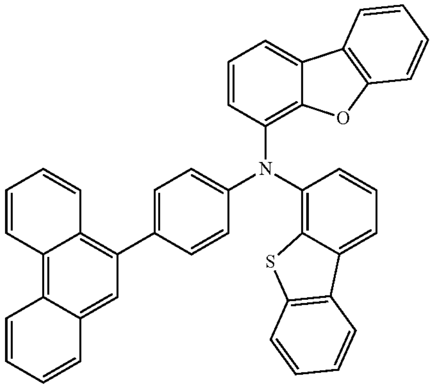
A5
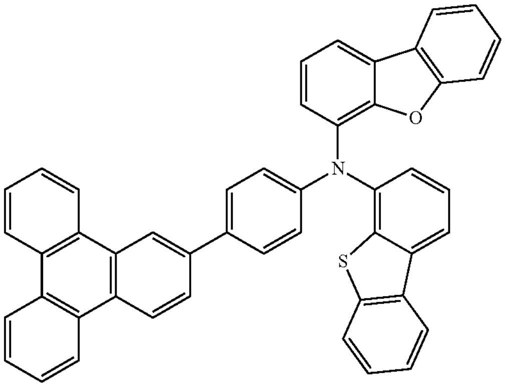
A6
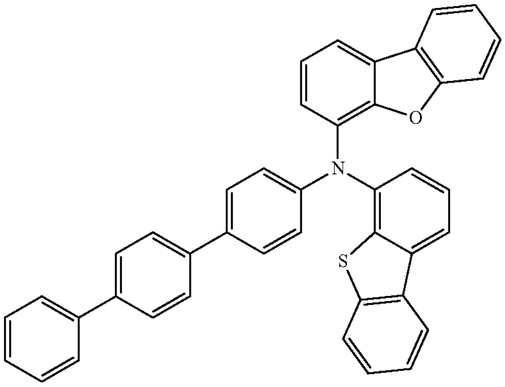
A7
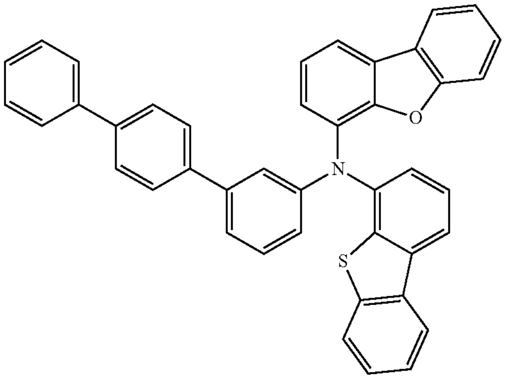
-continued
A8
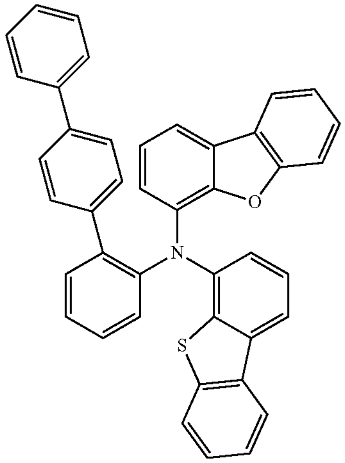
A9
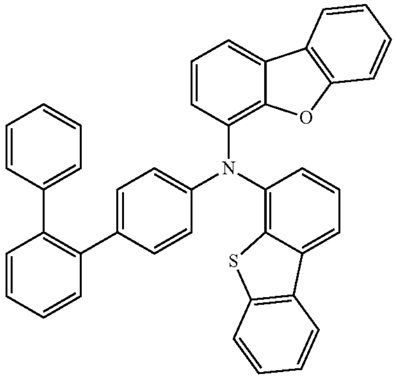
A10
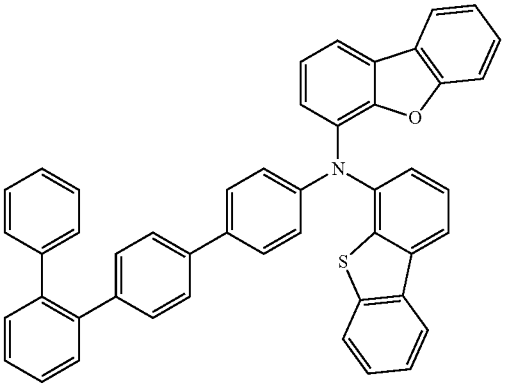
A11
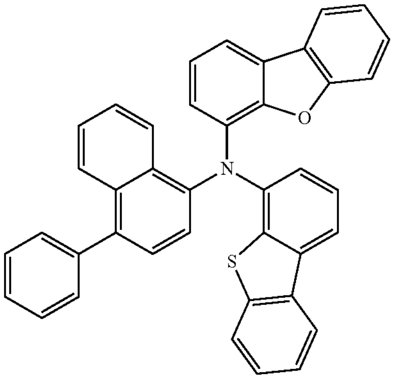

-continued
A12
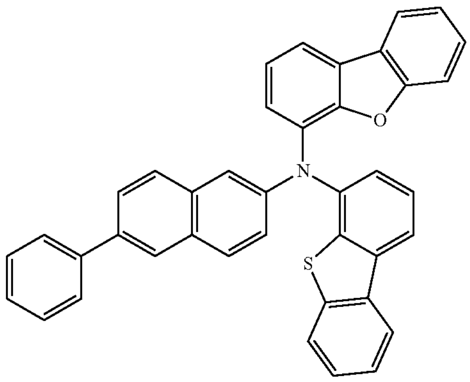
A13
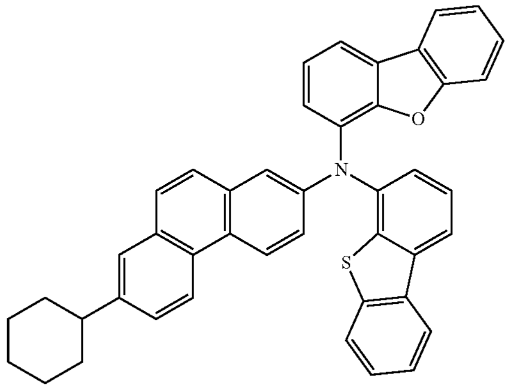
A14
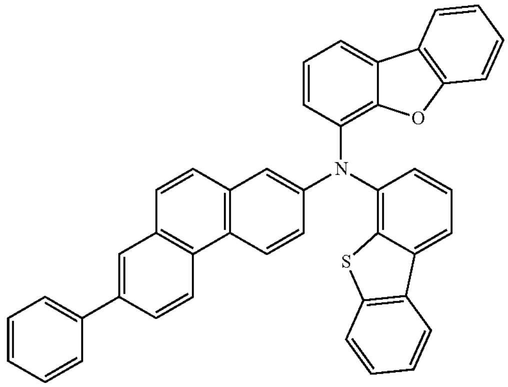
A15
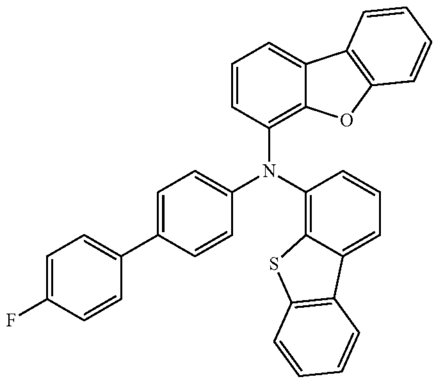
-continued
A16
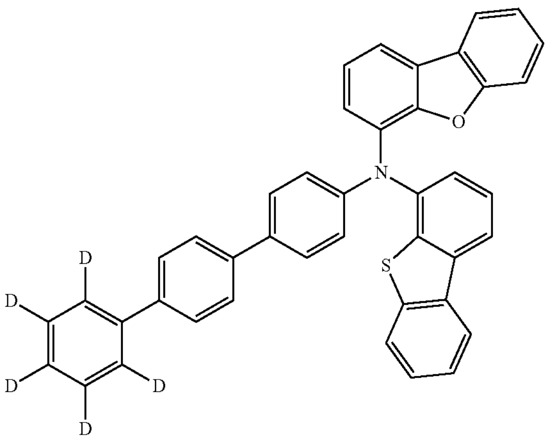
A17
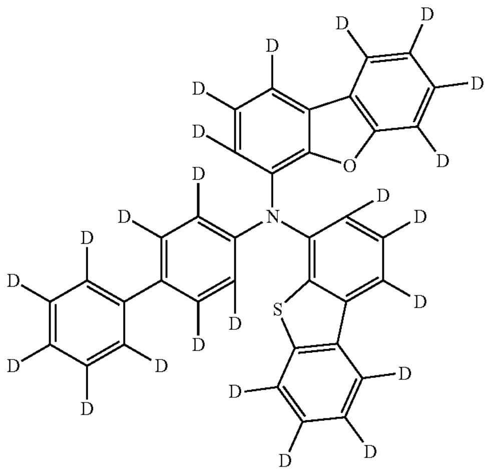
A18
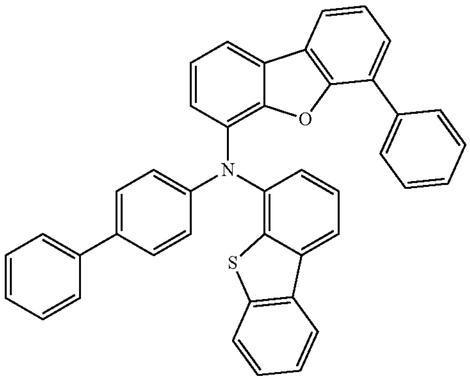

-continued
A19
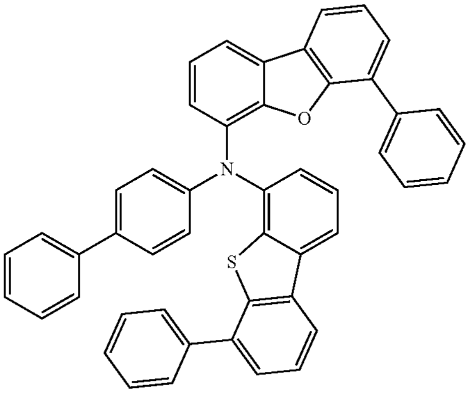
A20
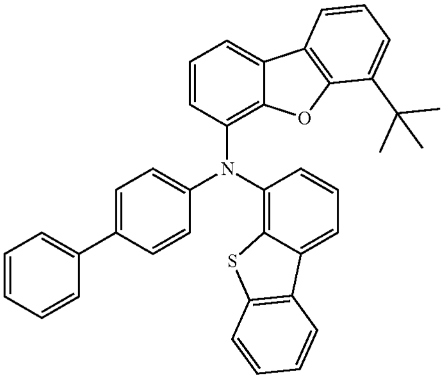
A22
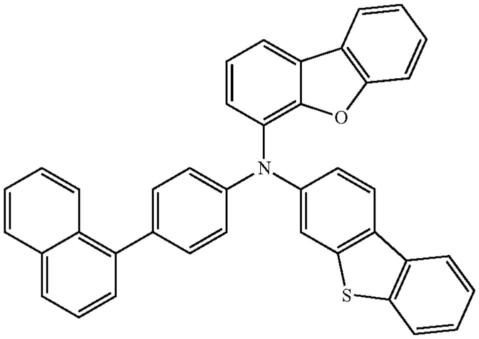
A23
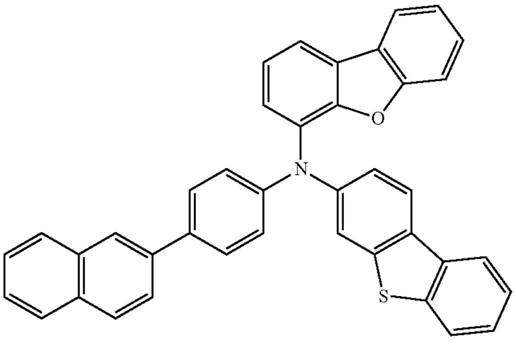
-continued
A24
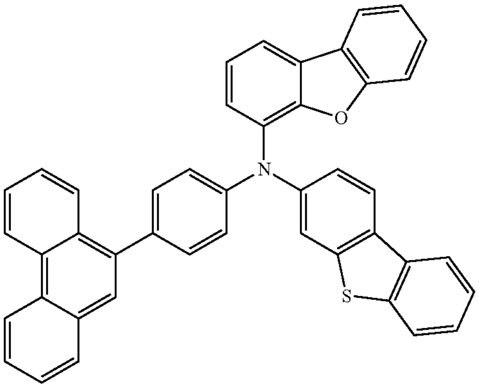
A25
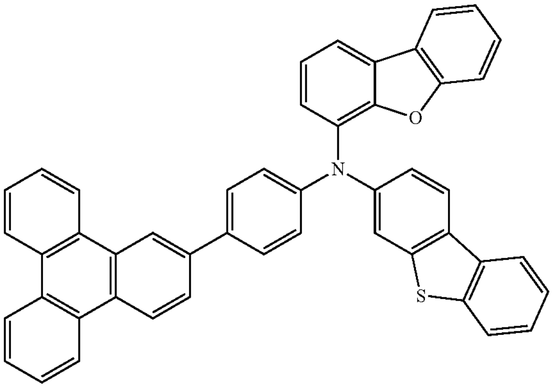
A26
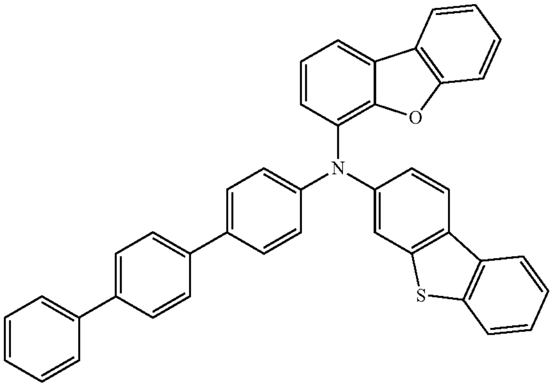
A27
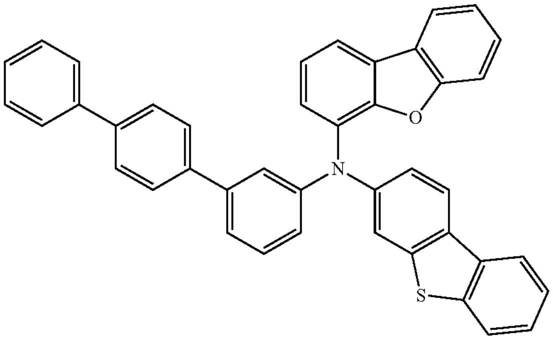

A28
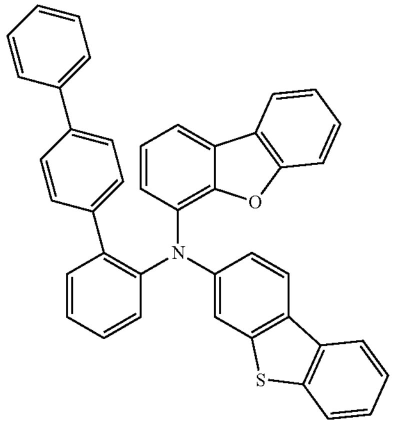
A29
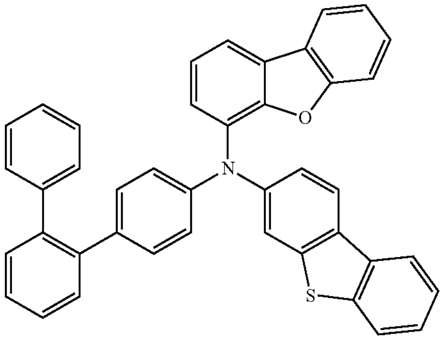
A30
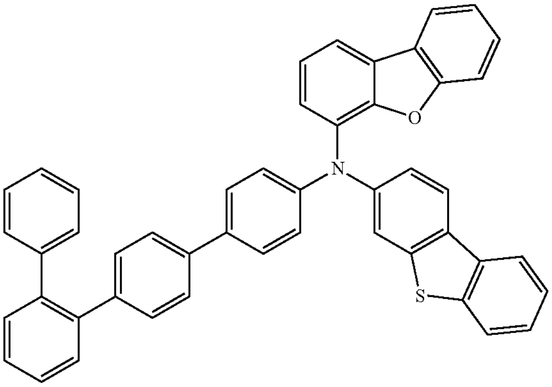
A31
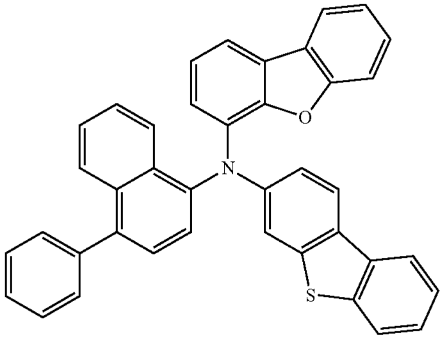
A32
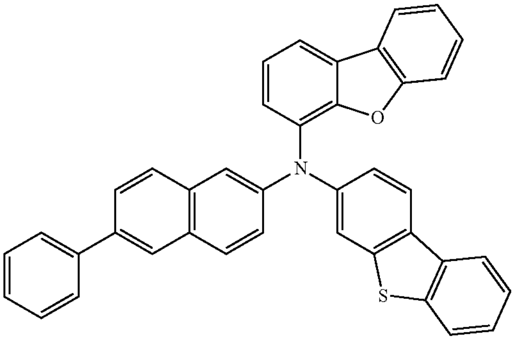
A33
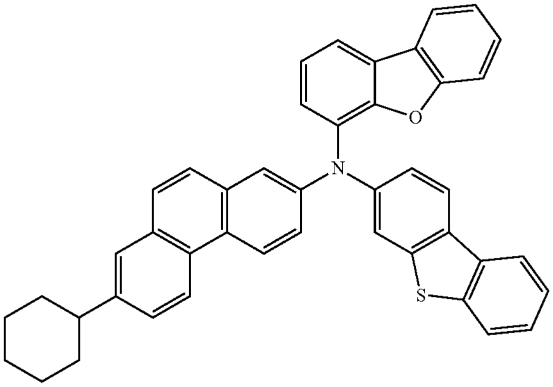
A34
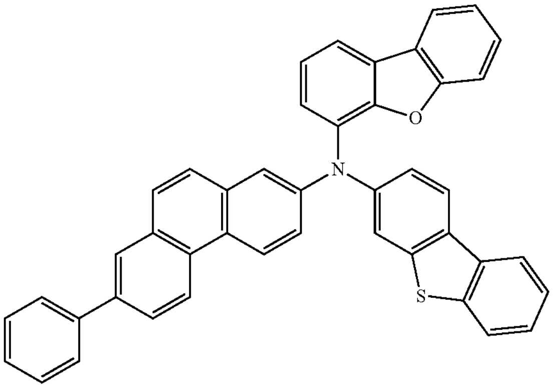
A35
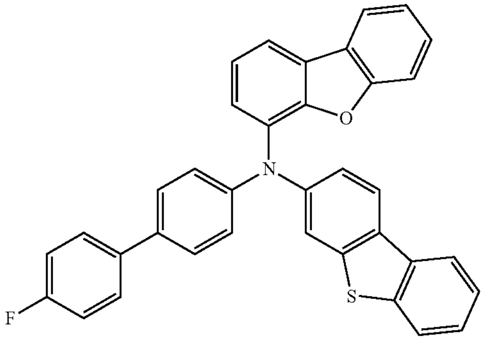

-continued
A36
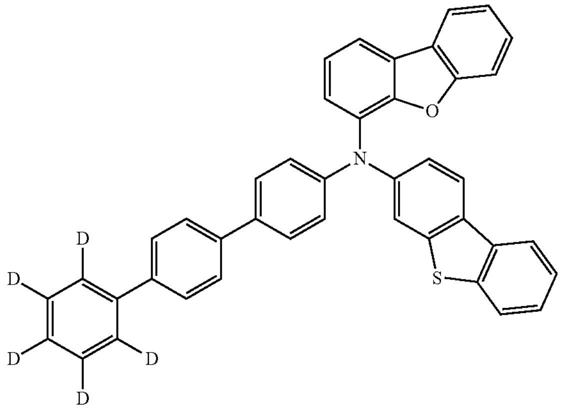
A37
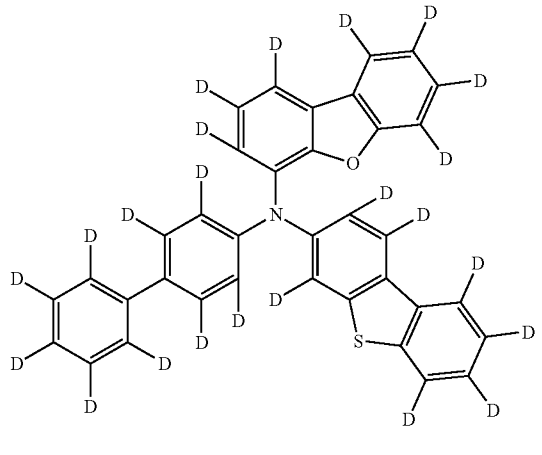
A38
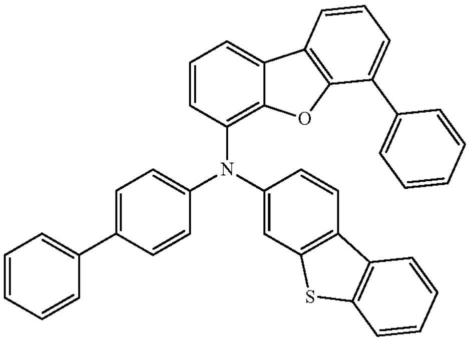
-continued
A39
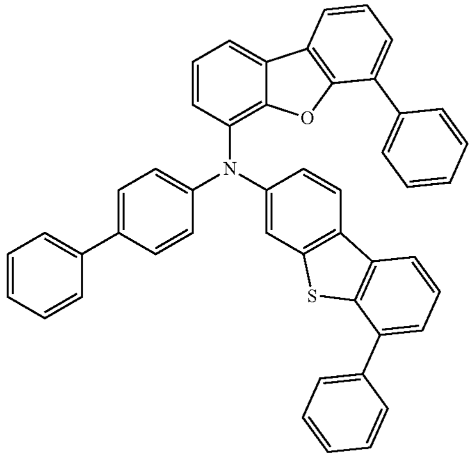
A40
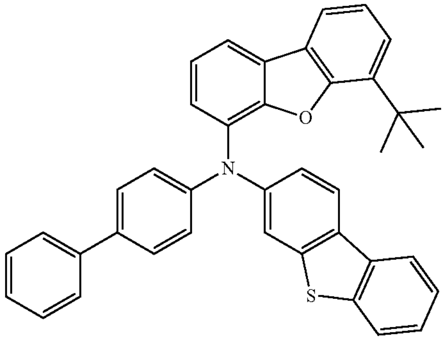
A42
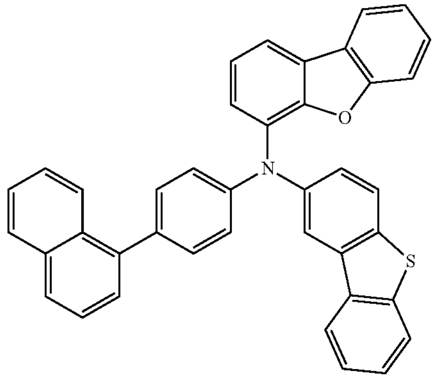
A43
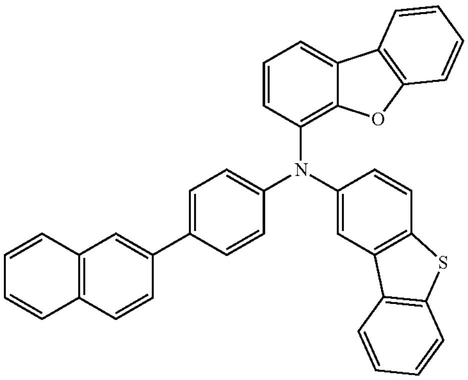

-continued
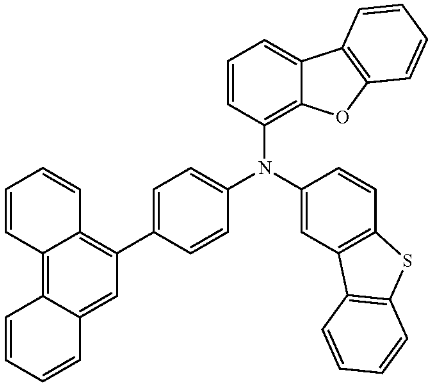
A44
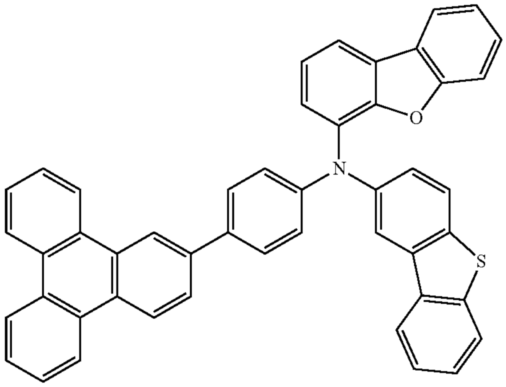
A45
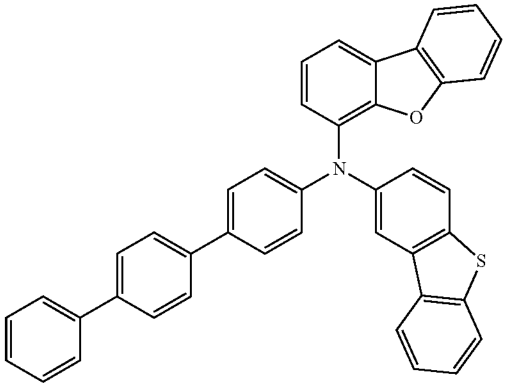
A46
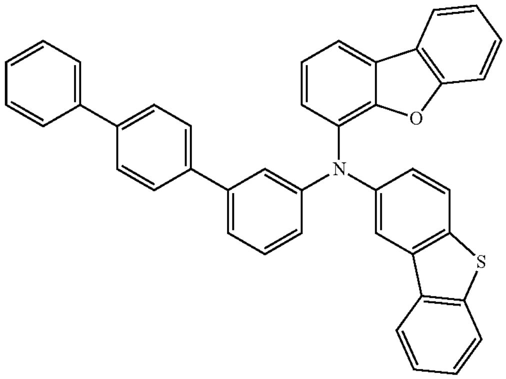
A47
-continued
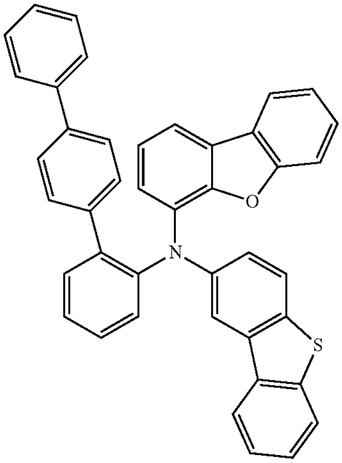
A48
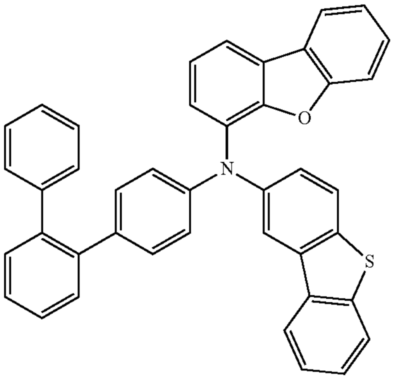
A49
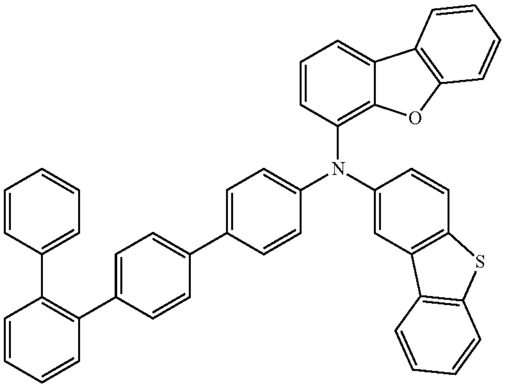
A50
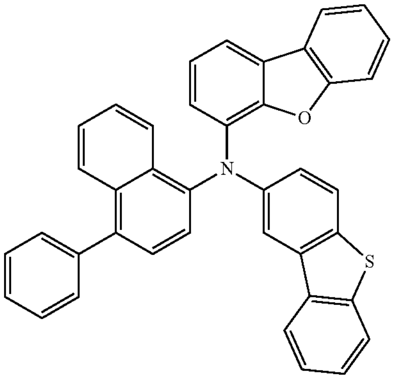
A51

A52
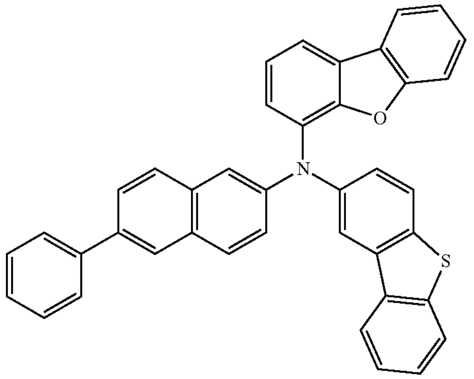
A53
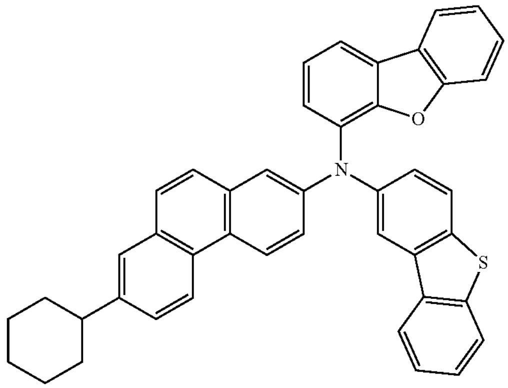
A54
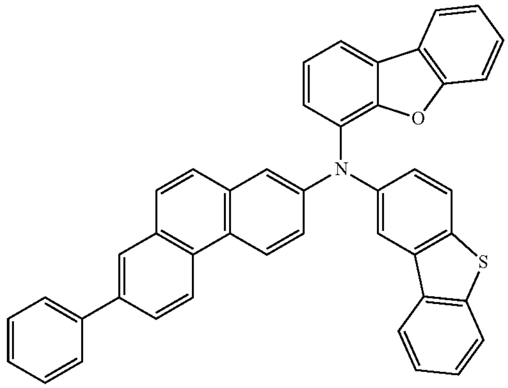
A55
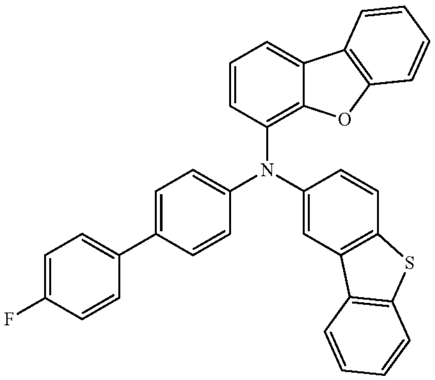
-continued
A56
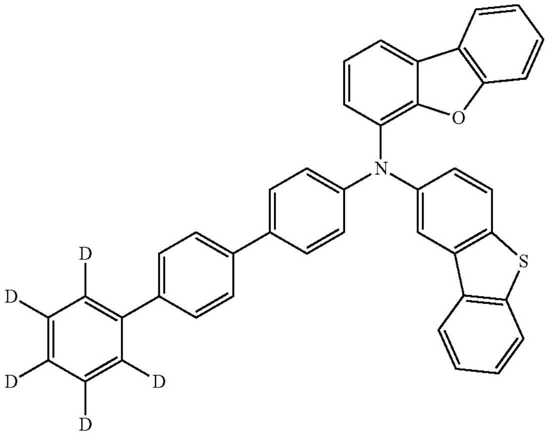
A57
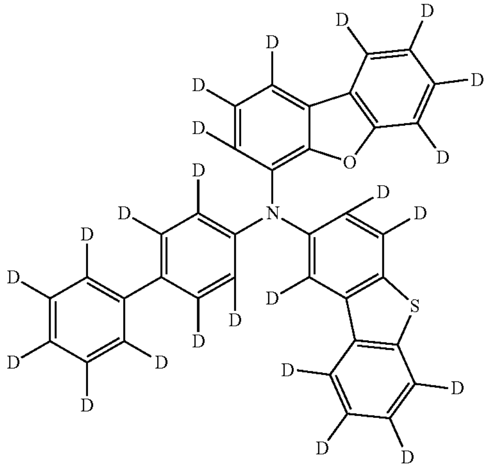
A58
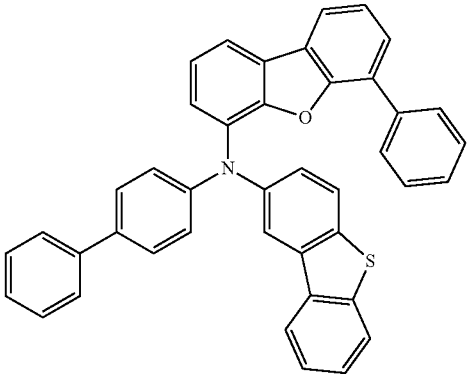

-continued
A59
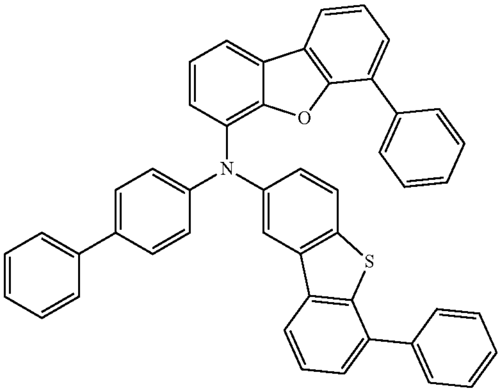
A60
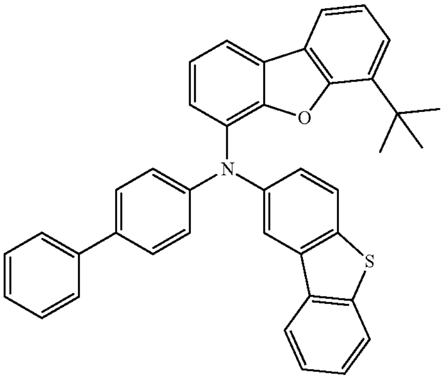
A62
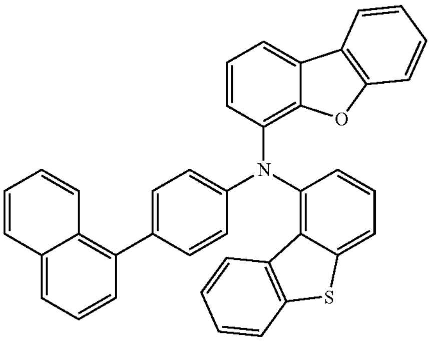
A63
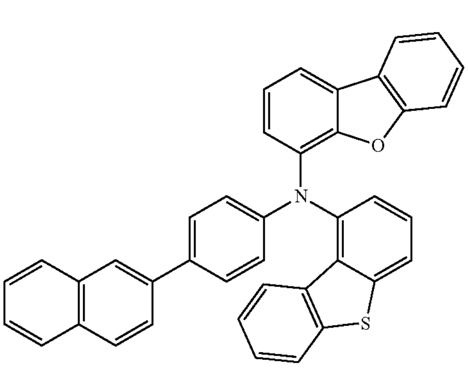
-continued
A64
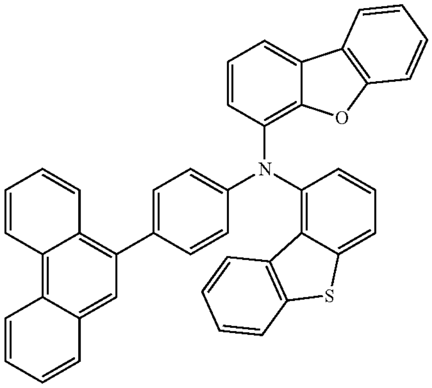
A65
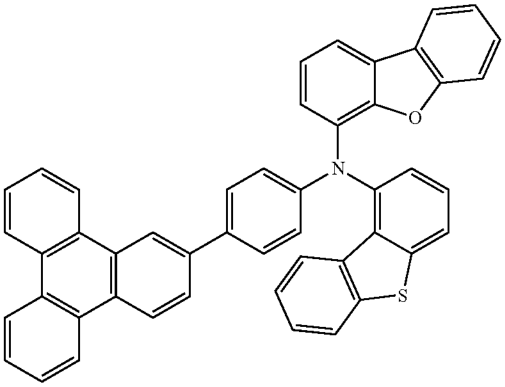
A66
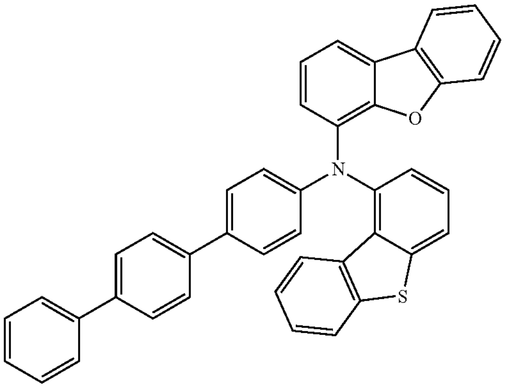
A67
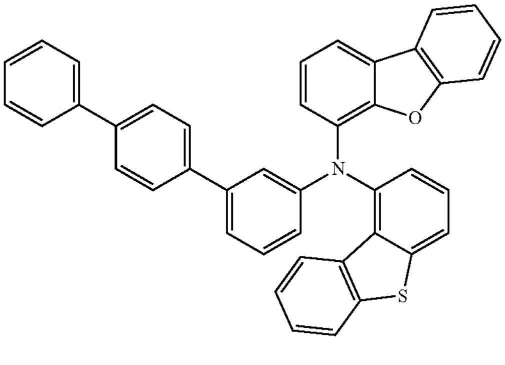

-continued
A68
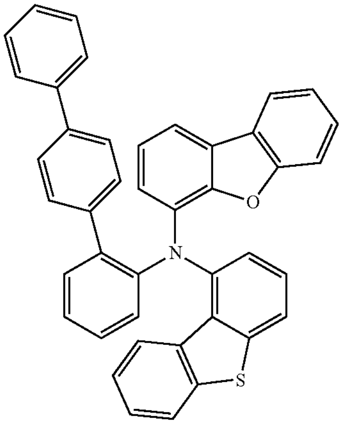
A69
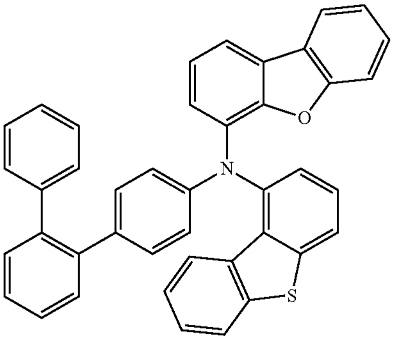
A70
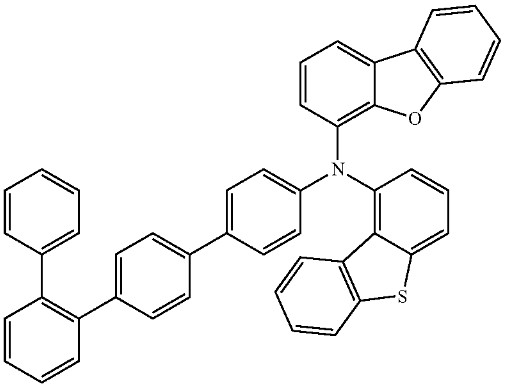
A71
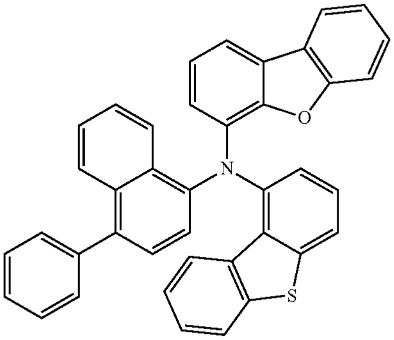
-continued
A72
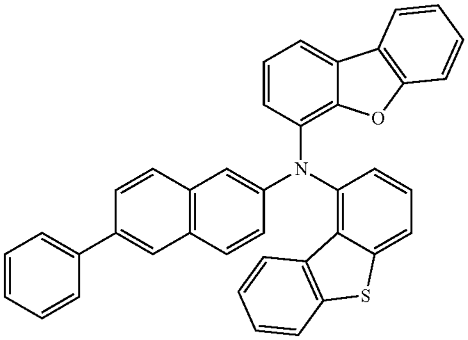
A73
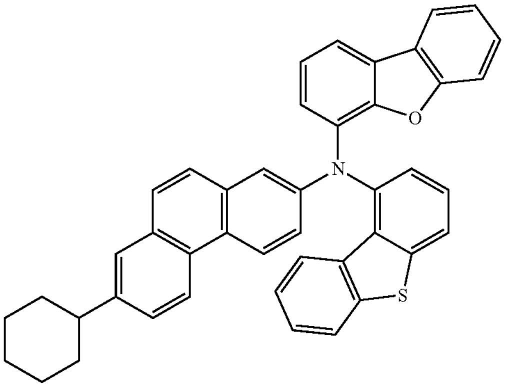
A74
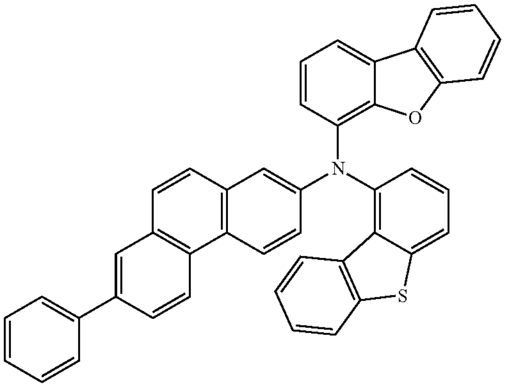
A75
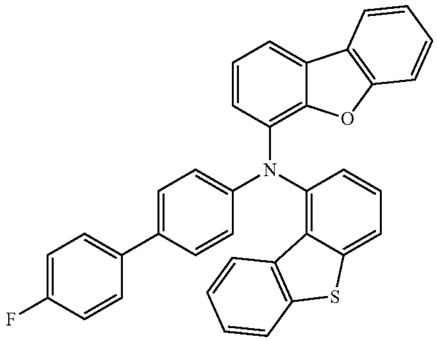

-continued
A76
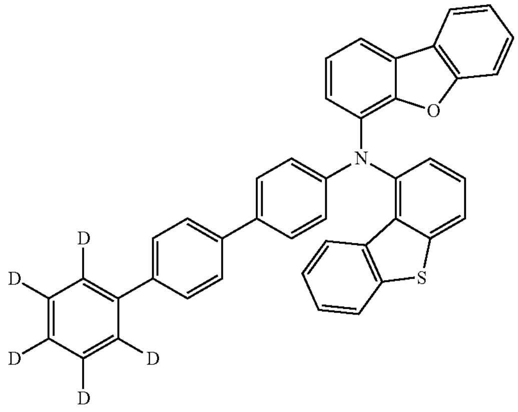
A77
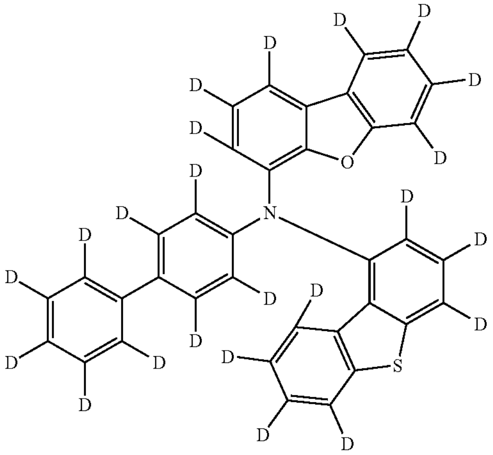
A78
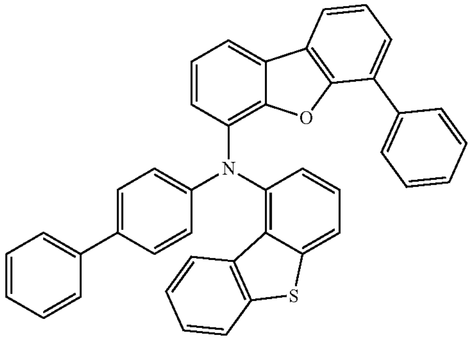
-continued
A79
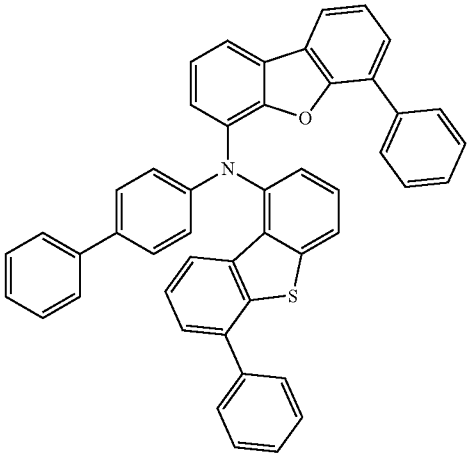
A80
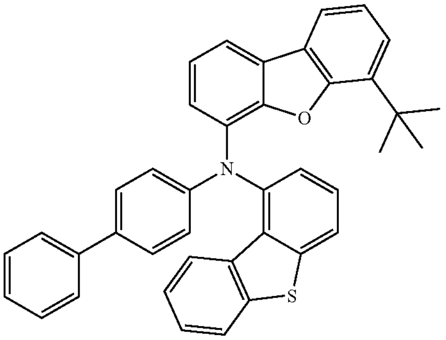
A82
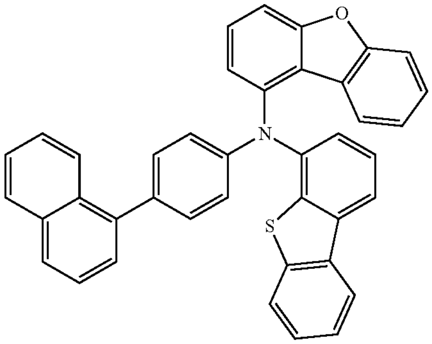
A83
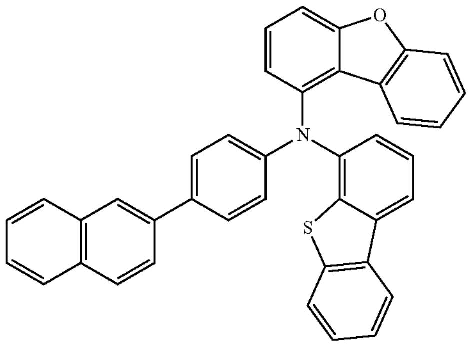

-continued
A84
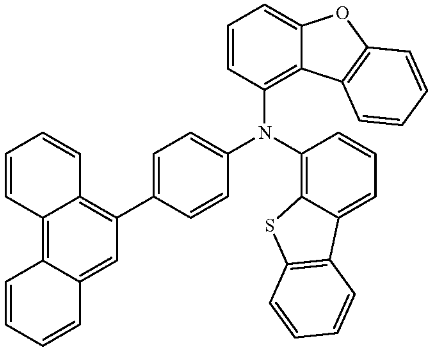
A85
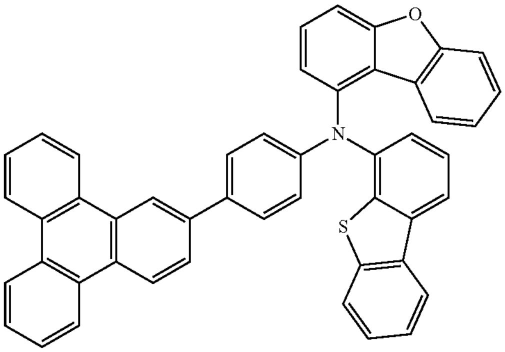
A86
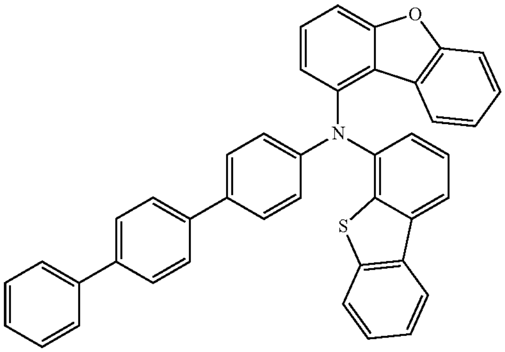
A87
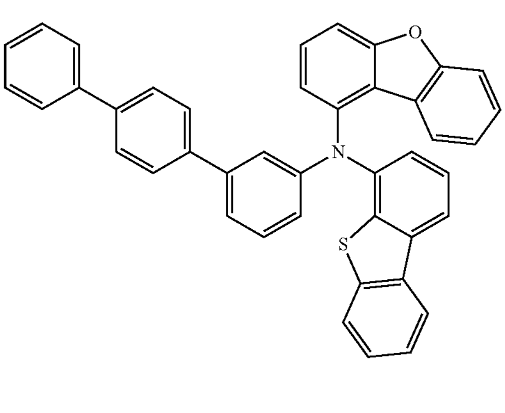
-continued
A88
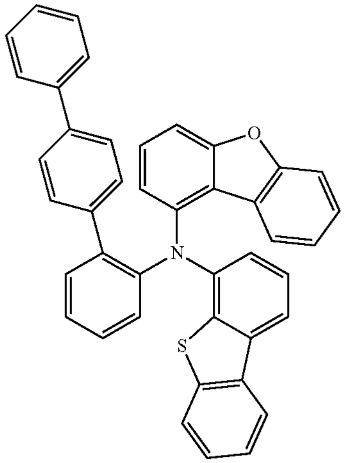
A89
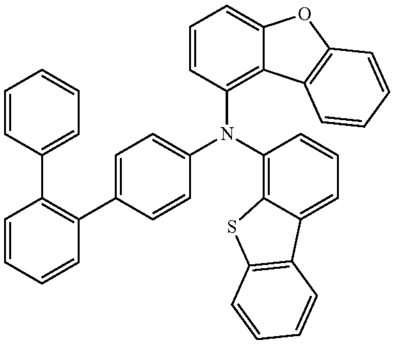
A90
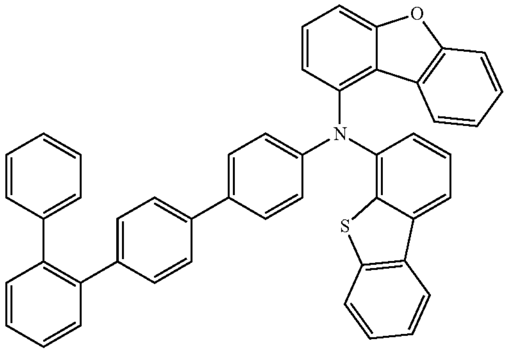
A91
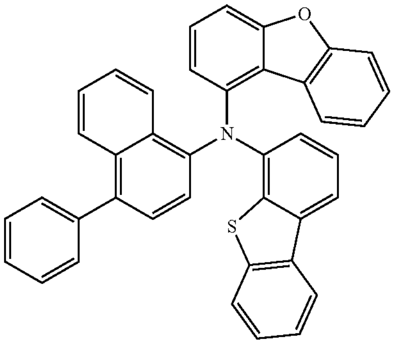

-continued
A92
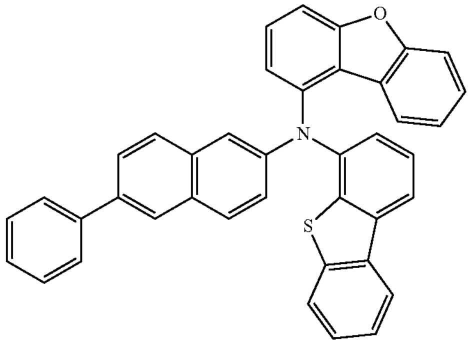
A93
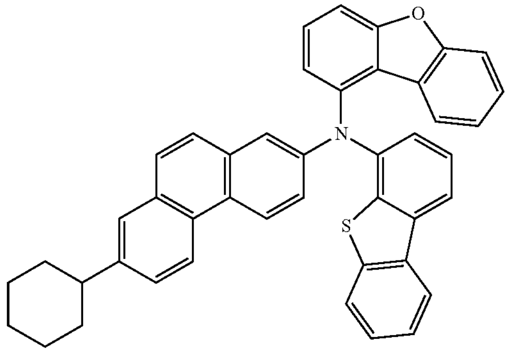
A94
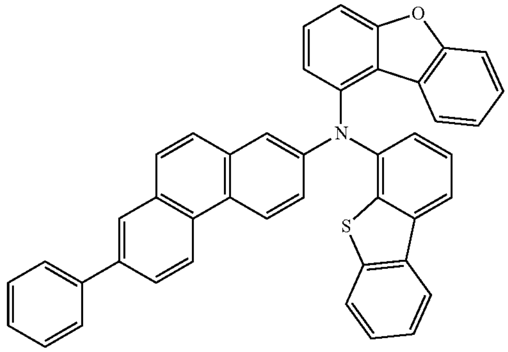
A95
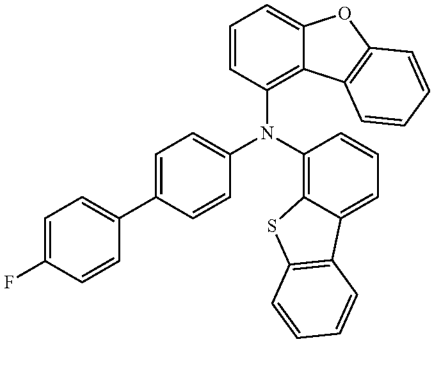
-continued
A96
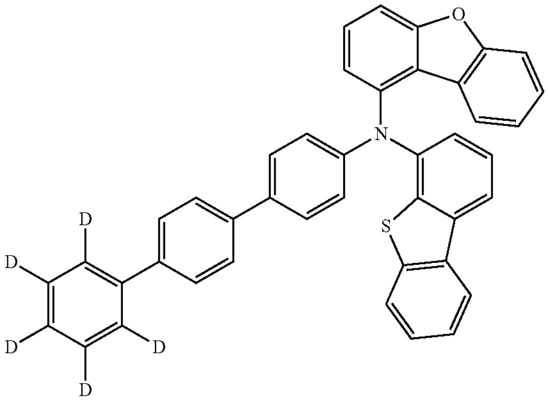
A97
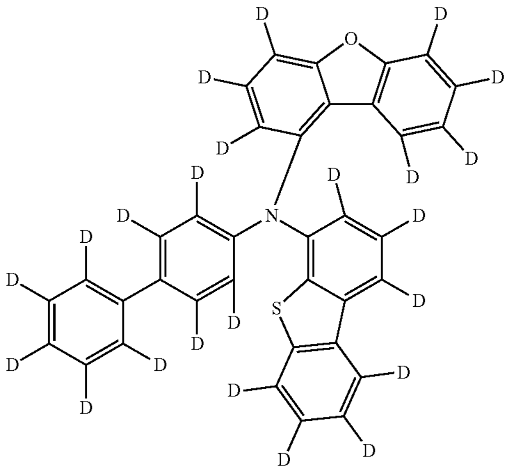
A98
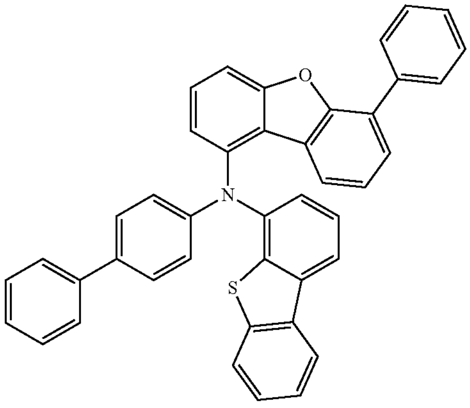

-continued
A99
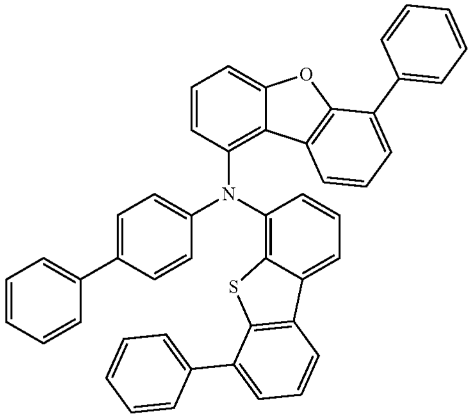
A100
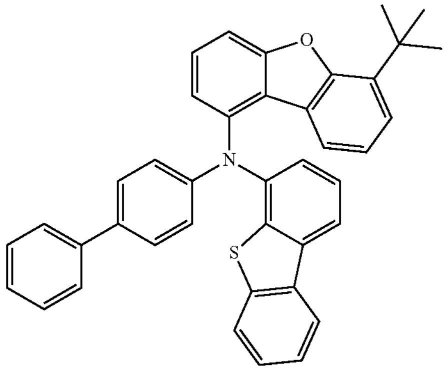
A102
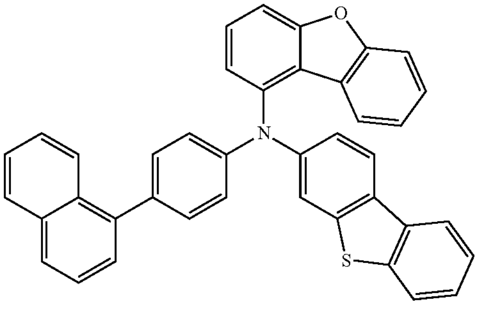
A103
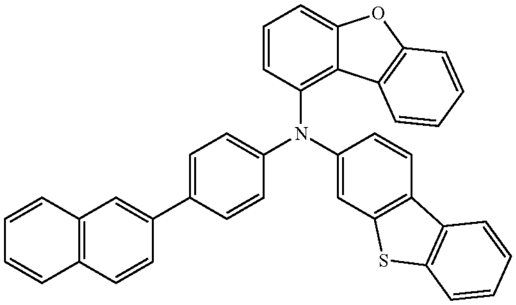
-continued
A104
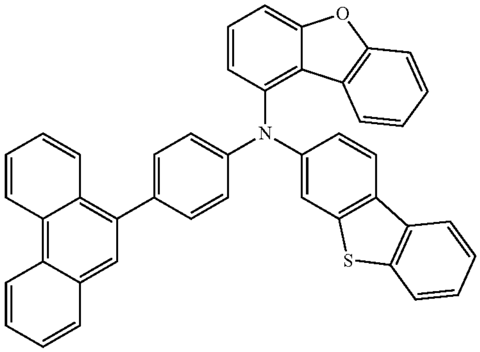
A105
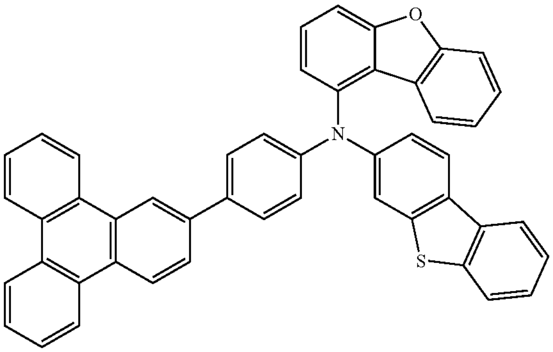
A106
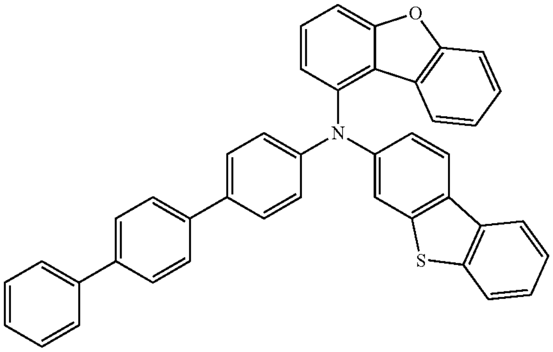
A107
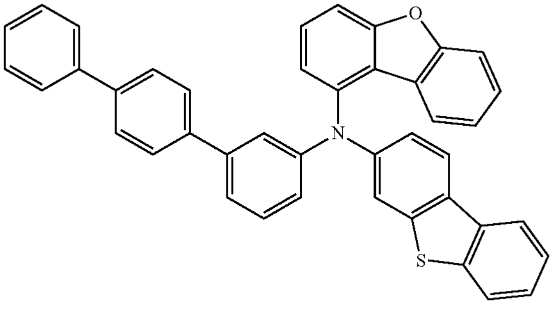

-continued
A108
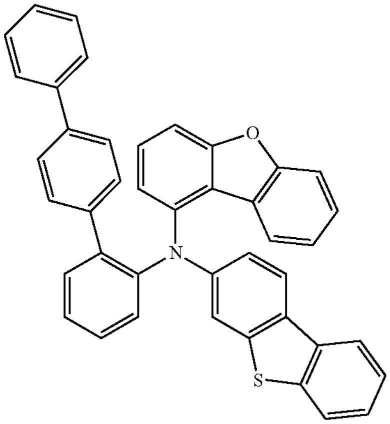
A109
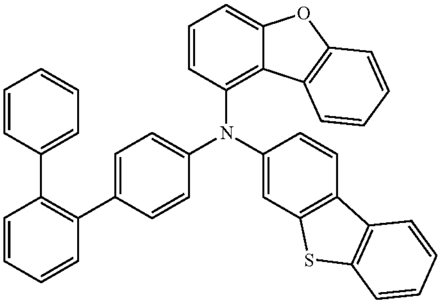
A110
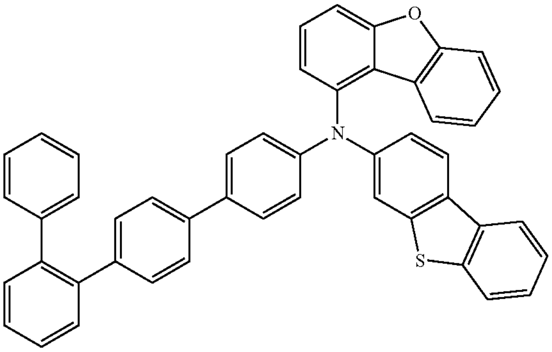
A111
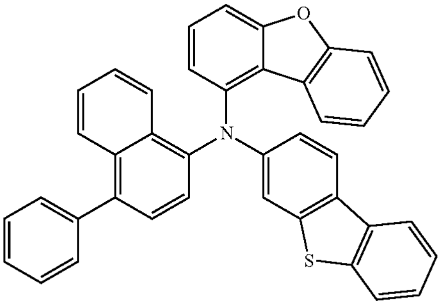
A112
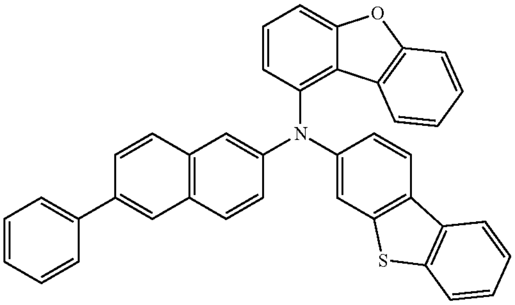
A113
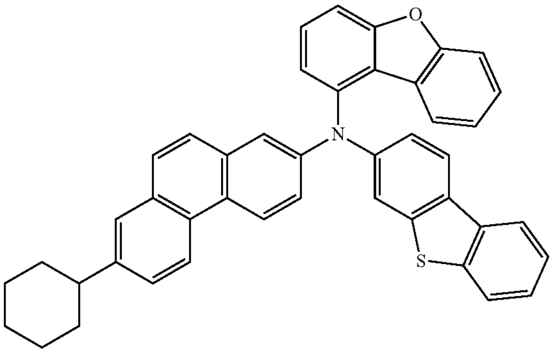
A114
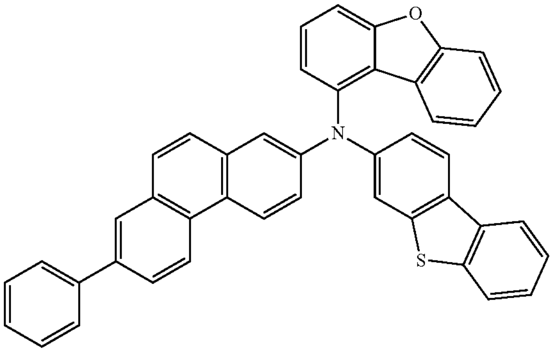
A115
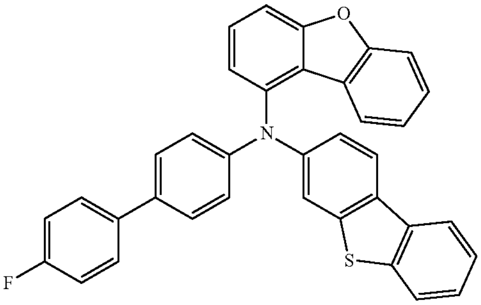

-continued
A116
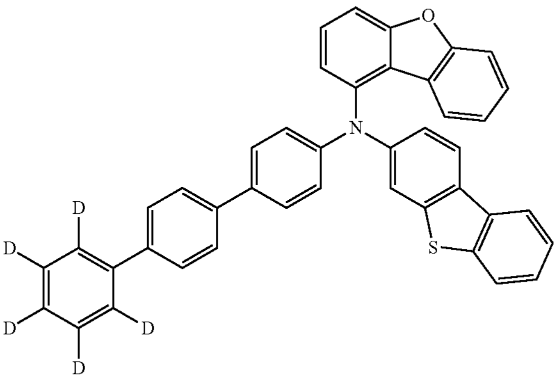
A117
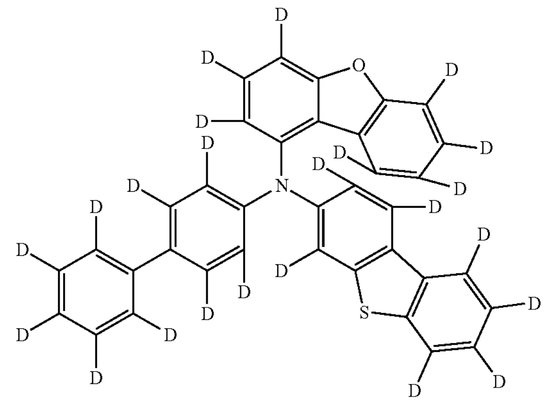
A118
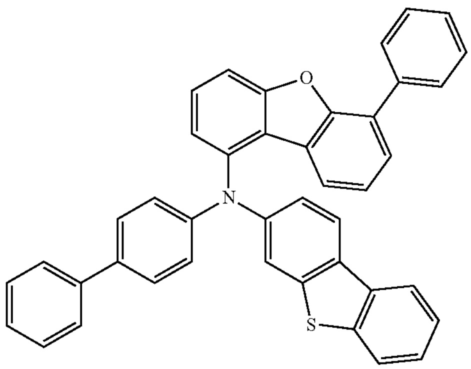
-continued
A119
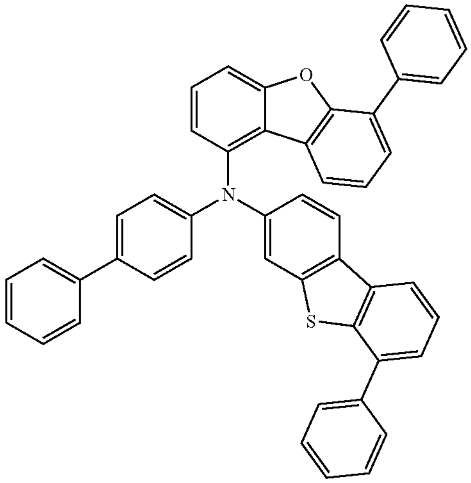
A120
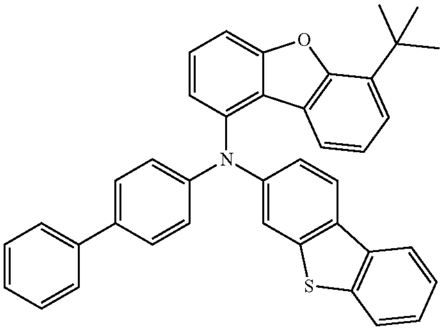
A122
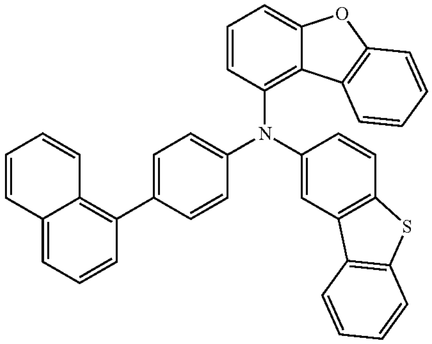
A123
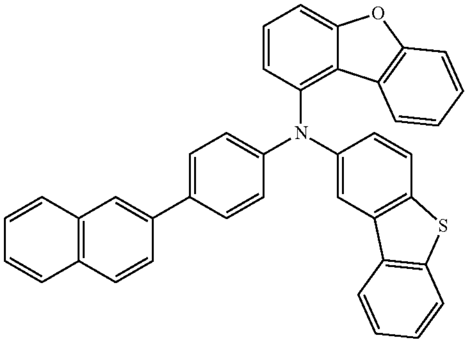

-continued
A124
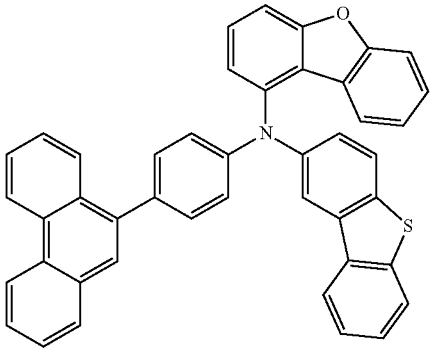
A125
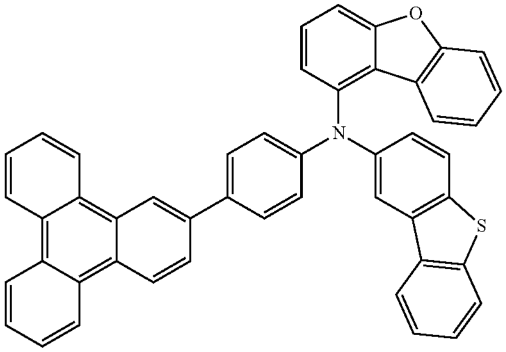
A126
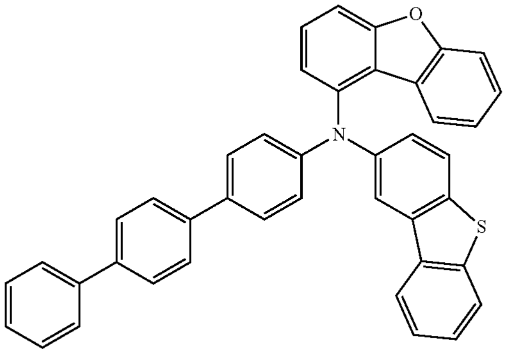
A127
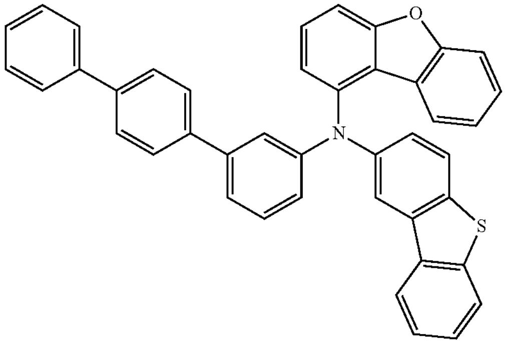
-continued
A128
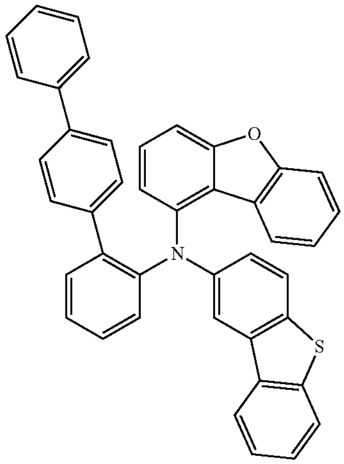
A129
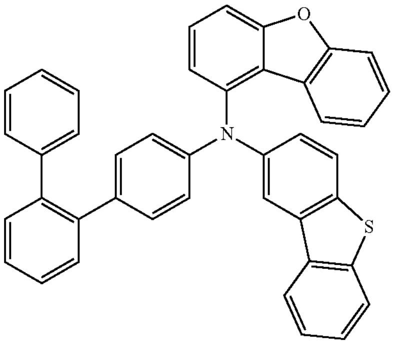
A130
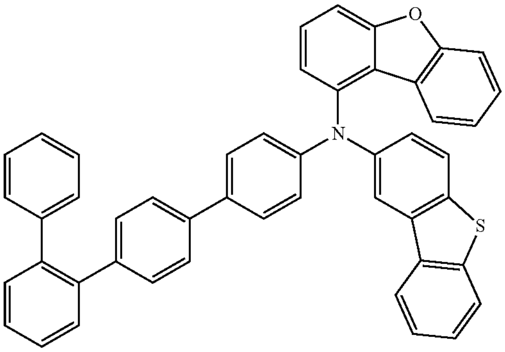
A131
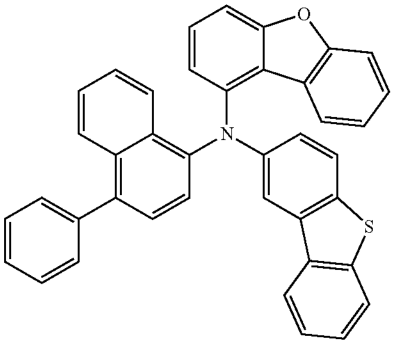

-continued
A132
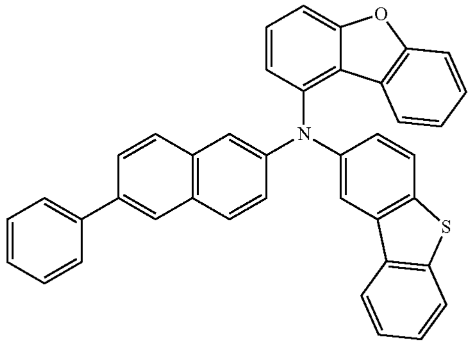
A133
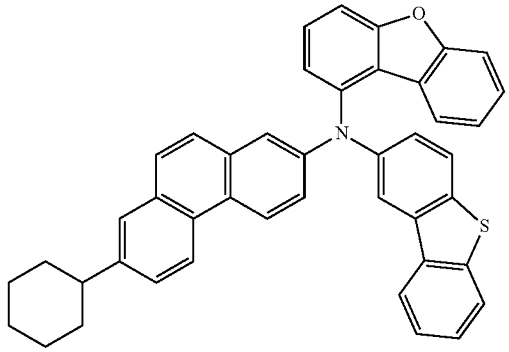
A134
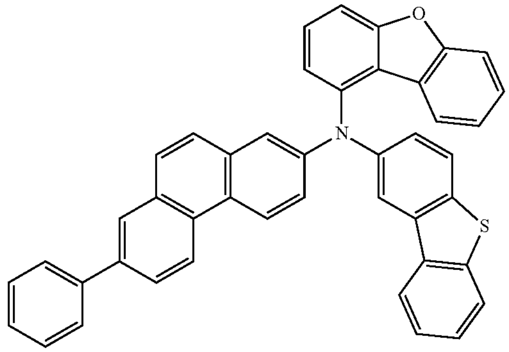
A135
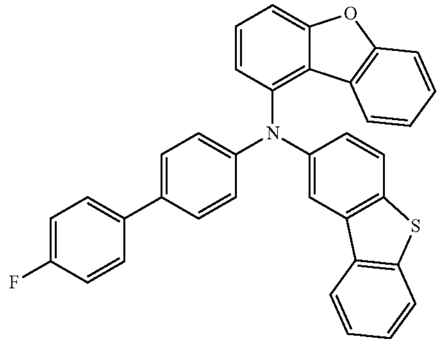
-continued
A136
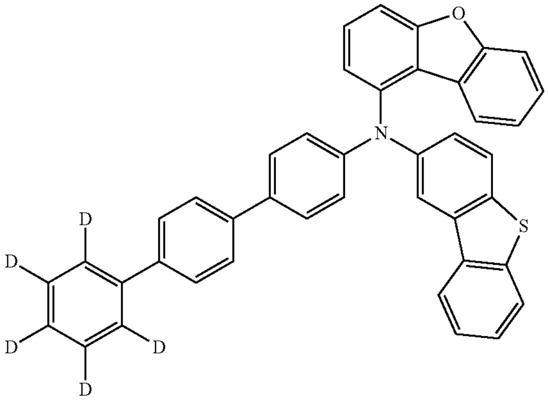
A137
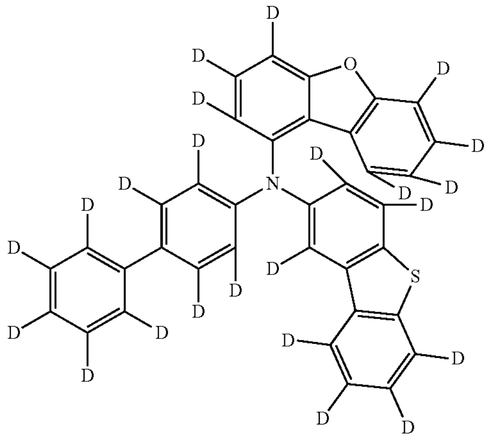
A138
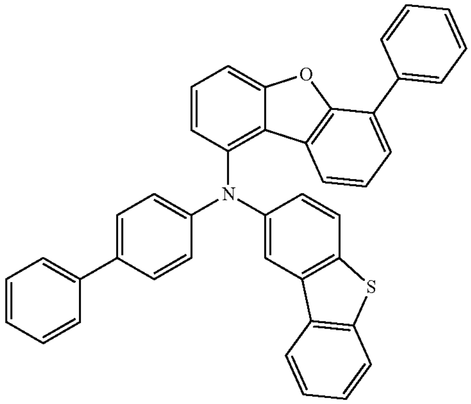

-continued
A139
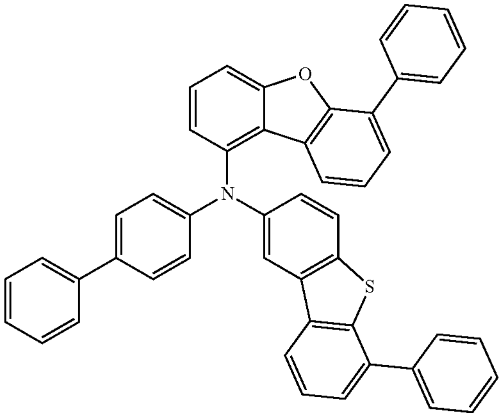
A140
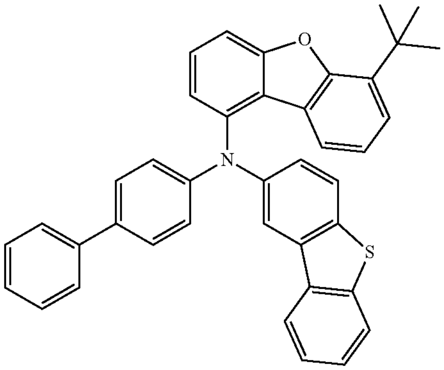
A142
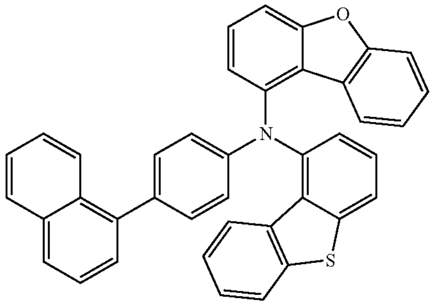
A143
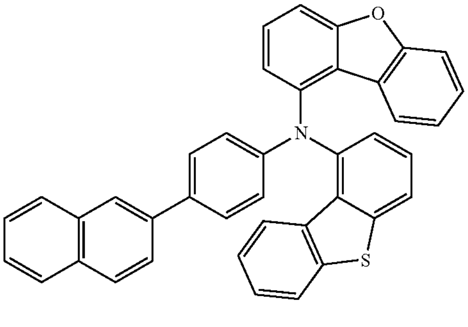
-continued
A144
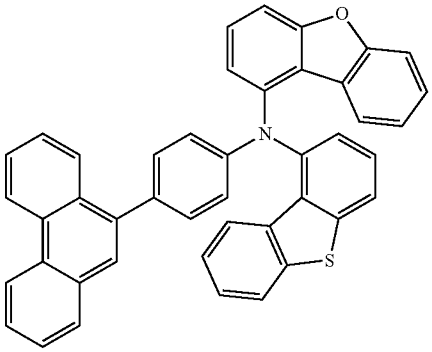
A145
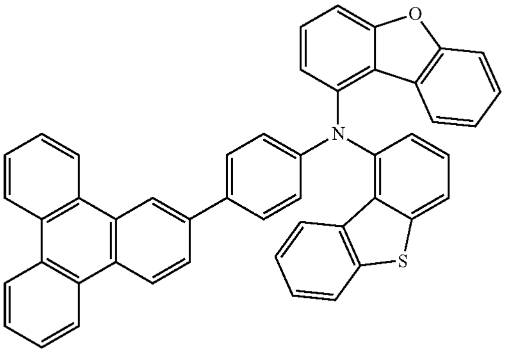
A146
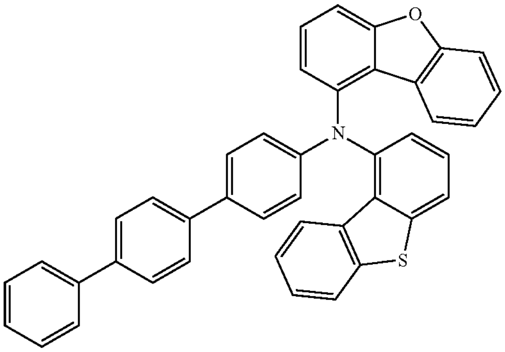
A147
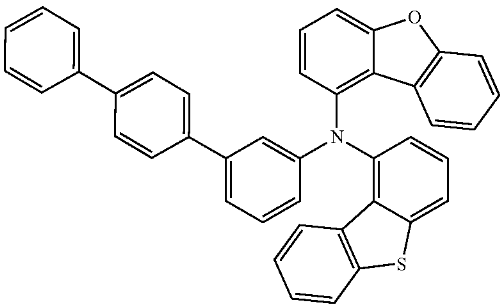

-continued
A148
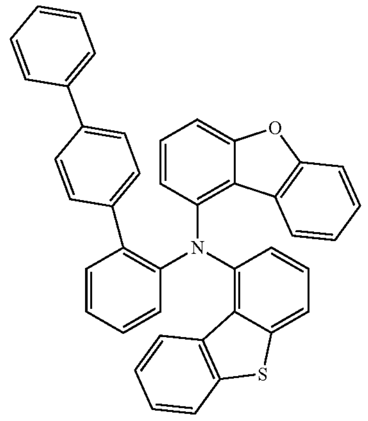
A149
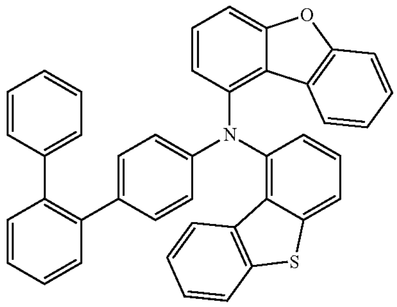
A150
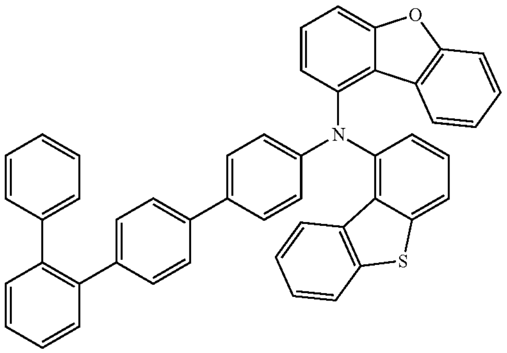
A151
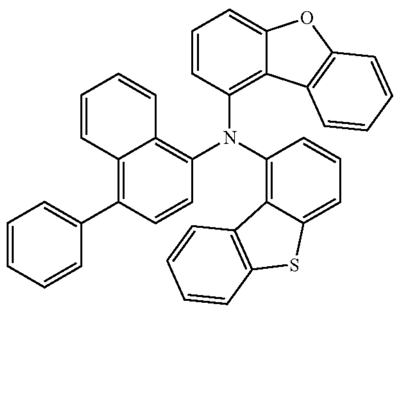
-continued
A152
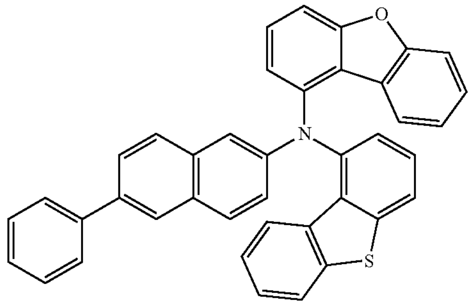
A153
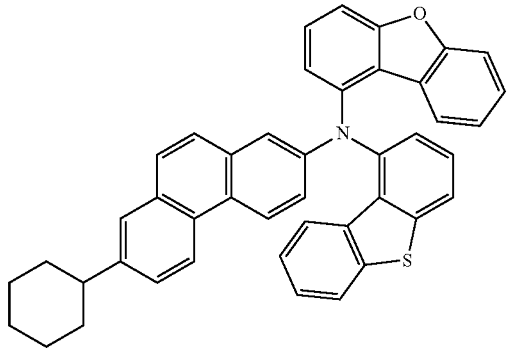
A154
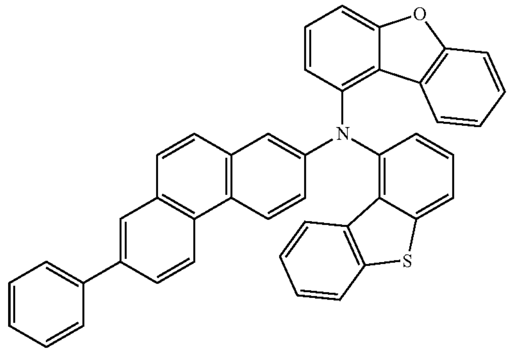
A155
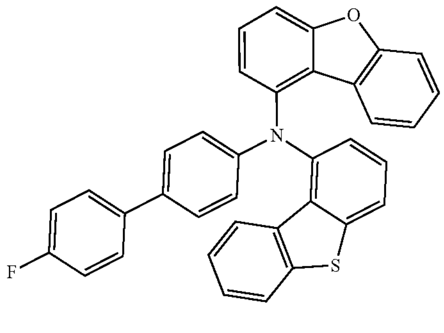

-continued
A156
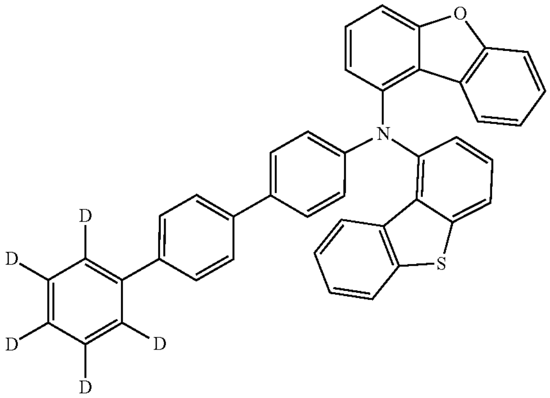
A157
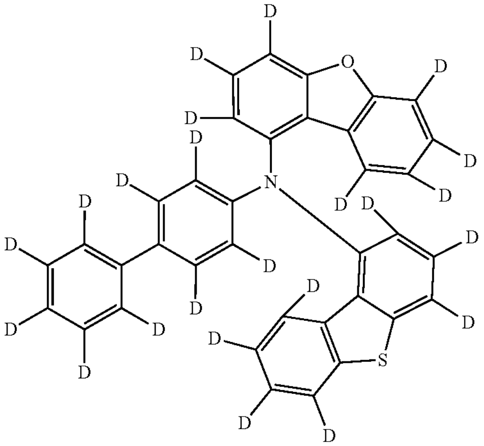
A158
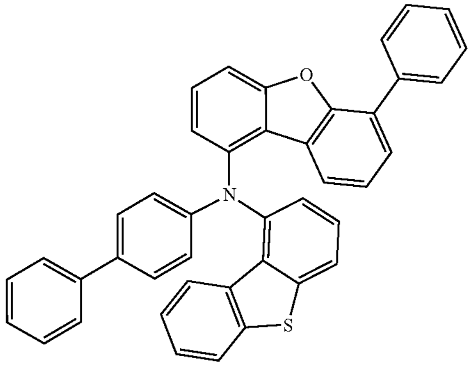
-continued
A159
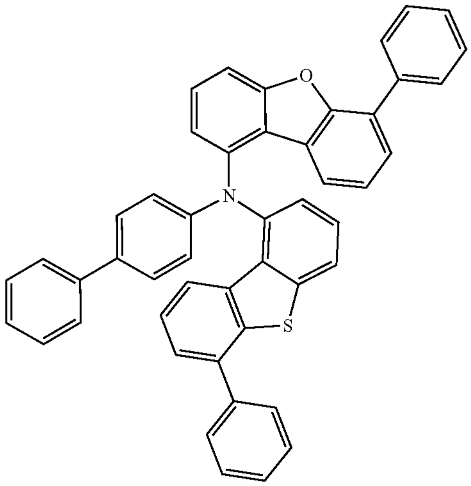
A160
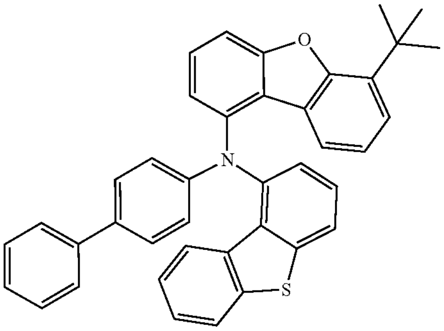
Compound Group B
B1
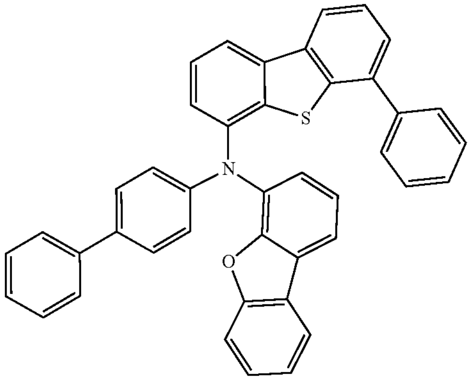
B2
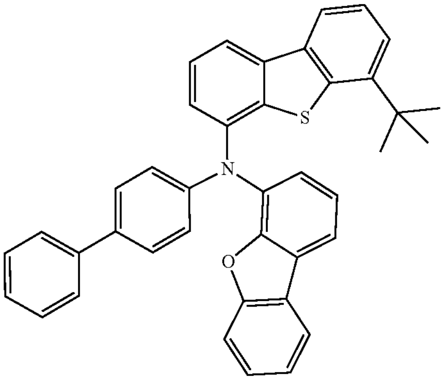

-continued
B4
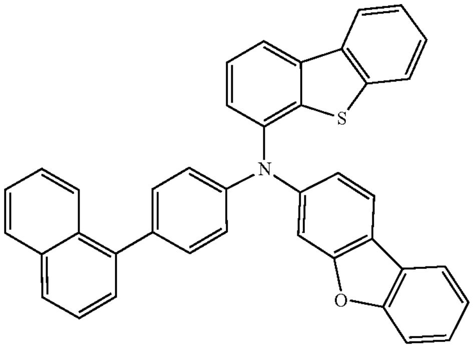
B5
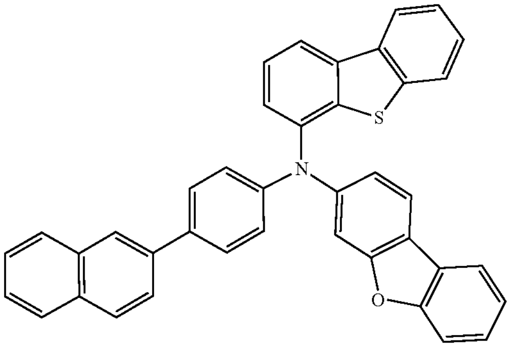
B6
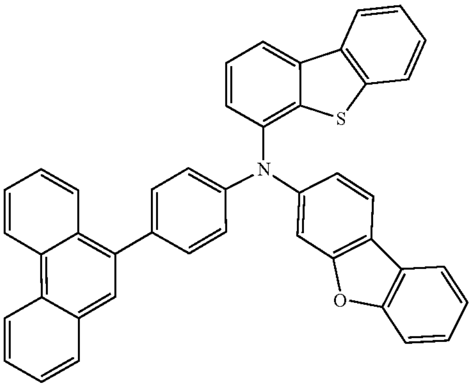
B7
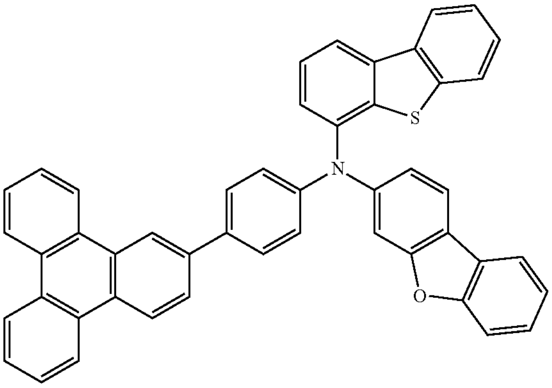
-continued
B8
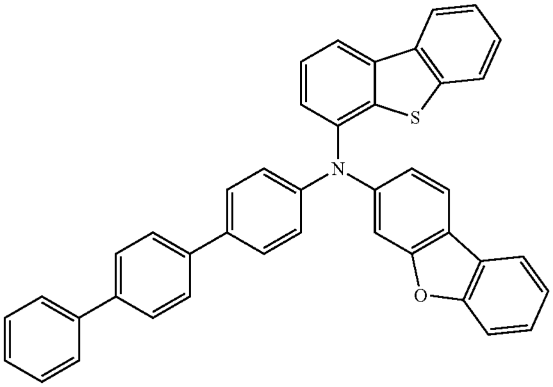
B9
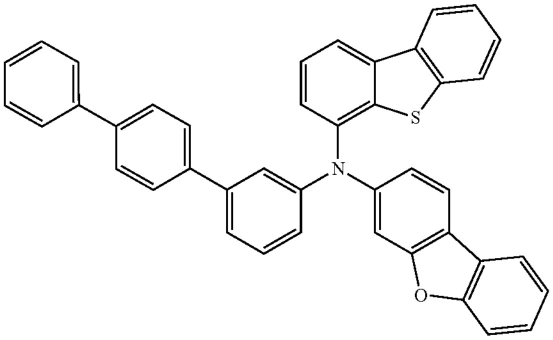
B10
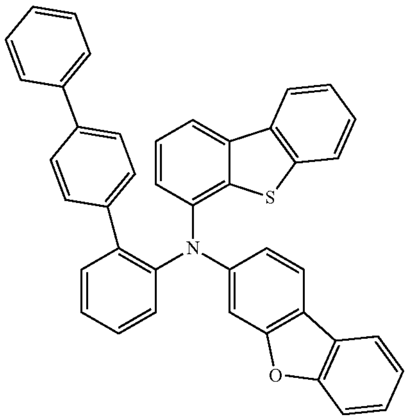
B11
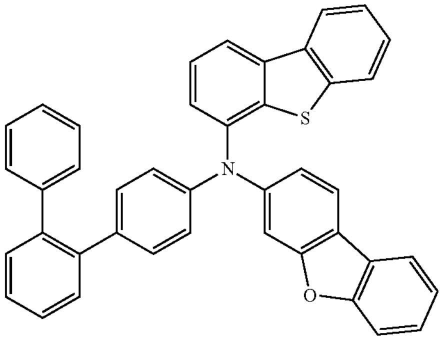

-continued
B12
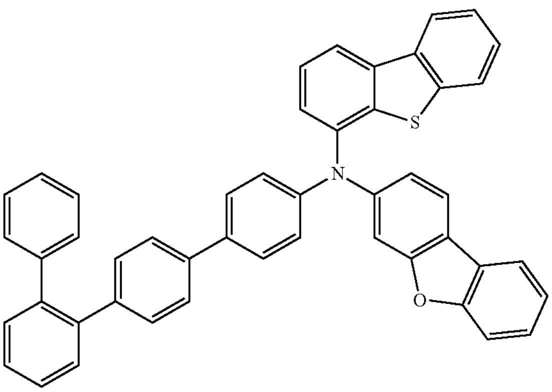
B13
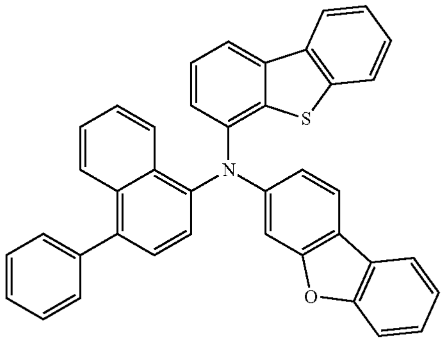
B14
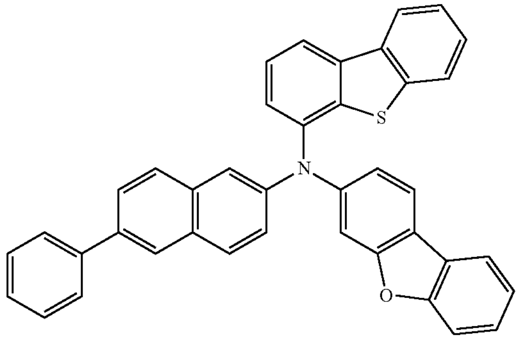
B15
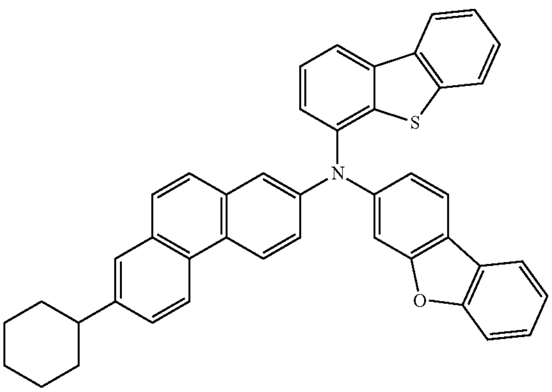
-continued
B16
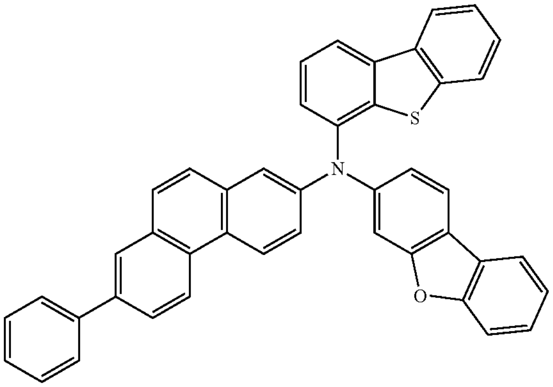
B17
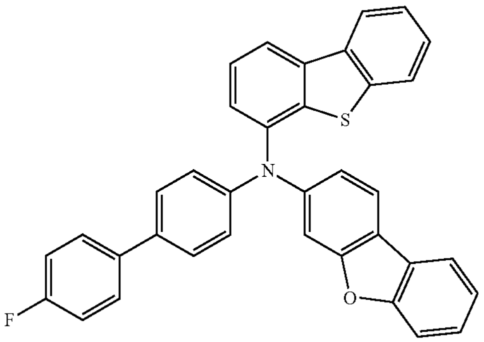
B18
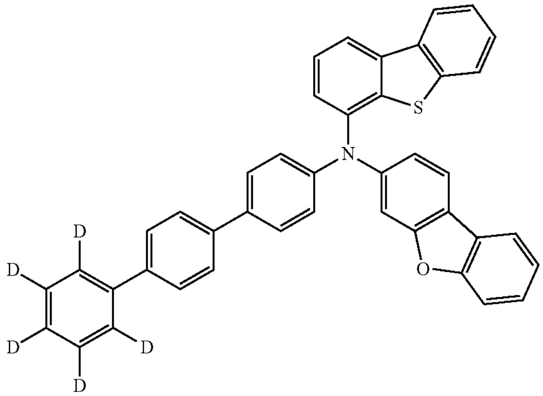
B19
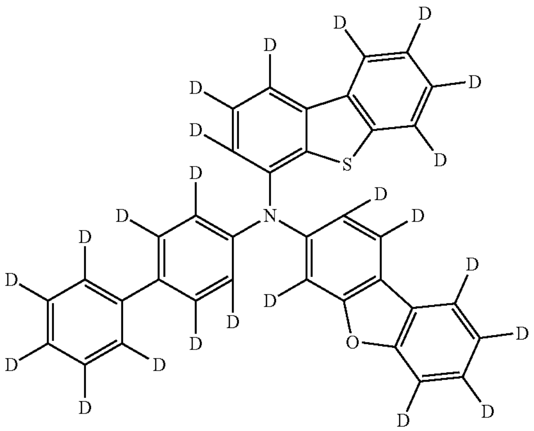

B20
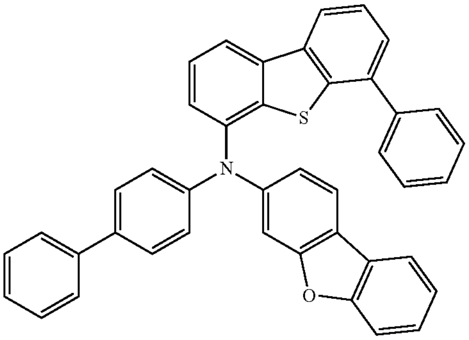
B21
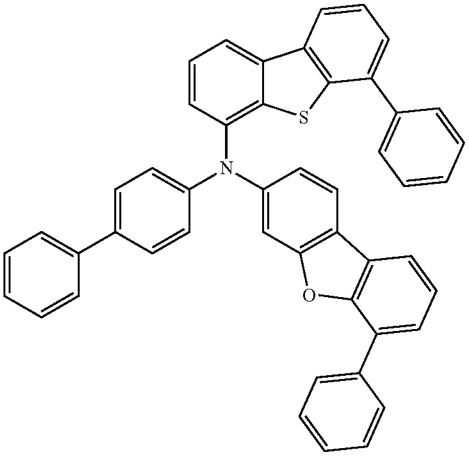
B22
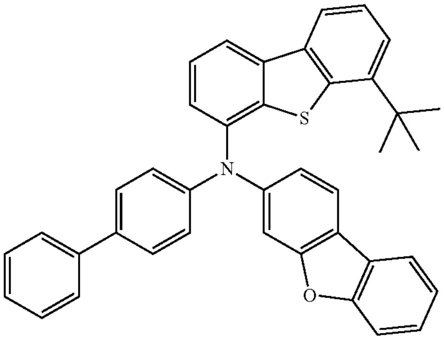
B24
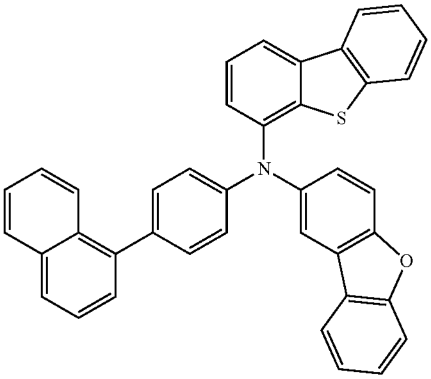
B25
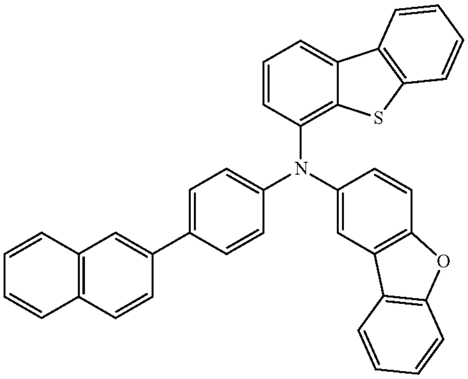
B26
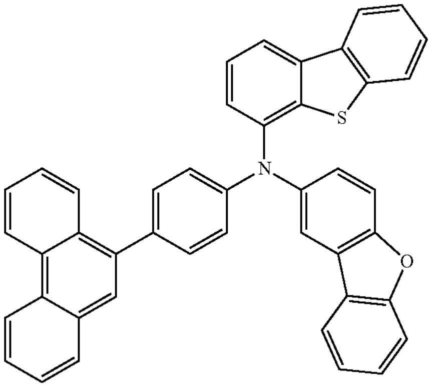
B27
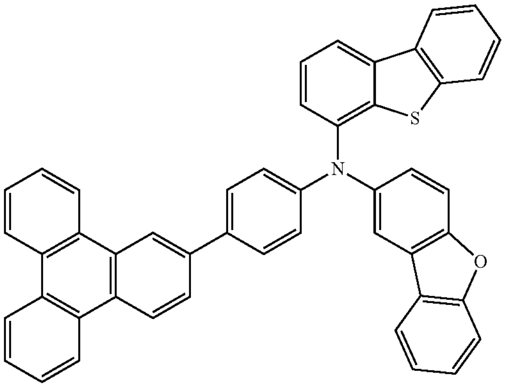
B28
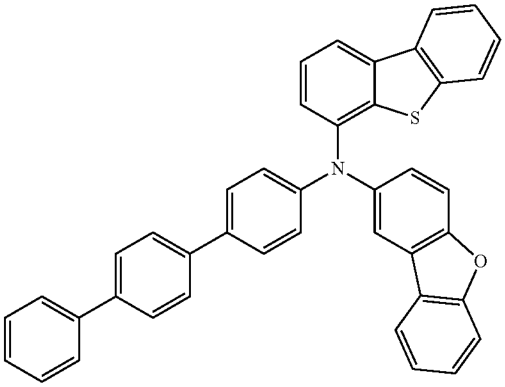

-continued
B29
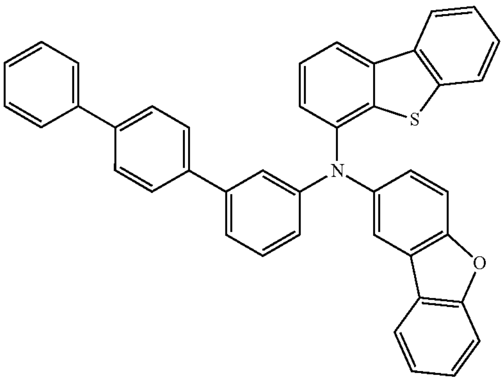
B30
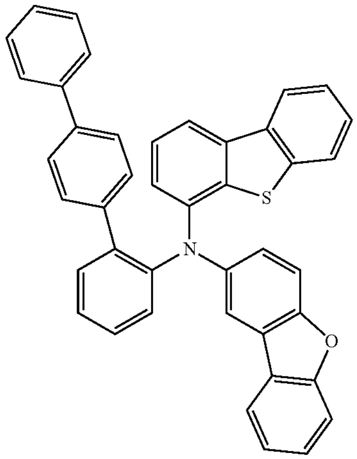
B31
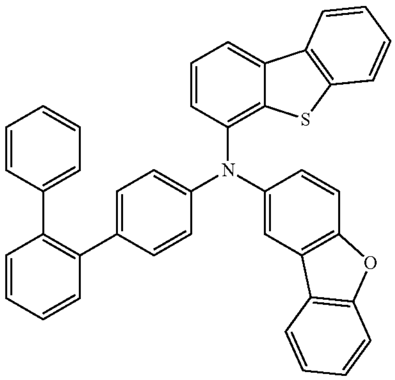
B32
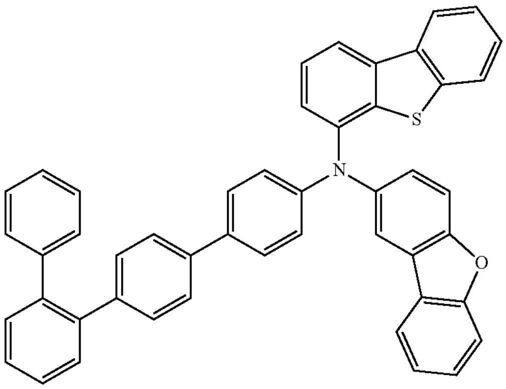
-continued
B33
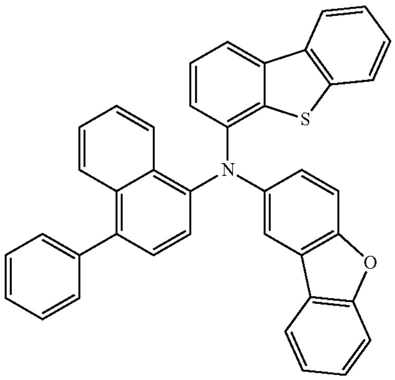
B34
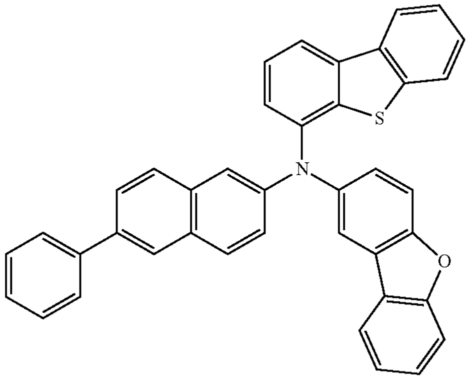
B35
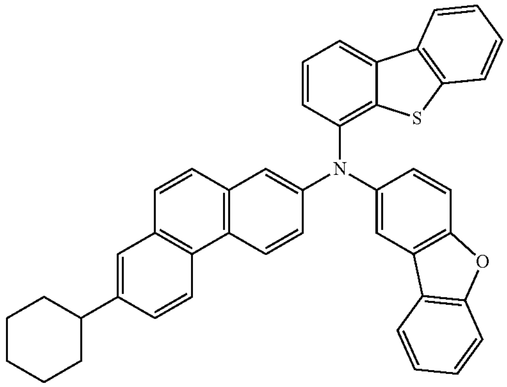
B36
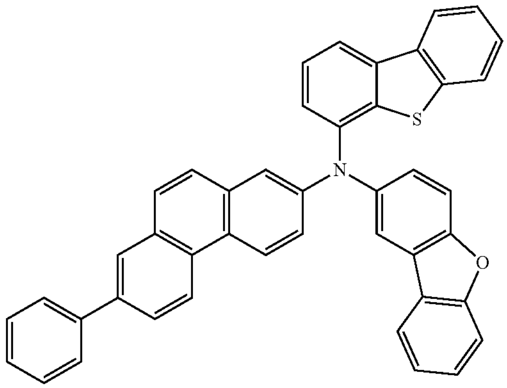

-continued
B37
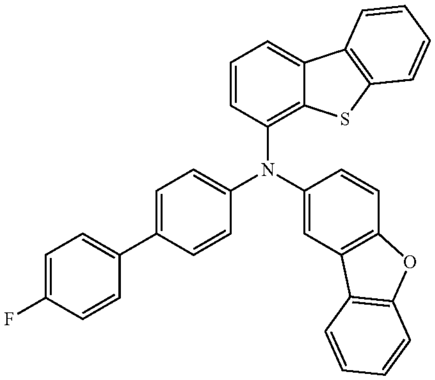
B38
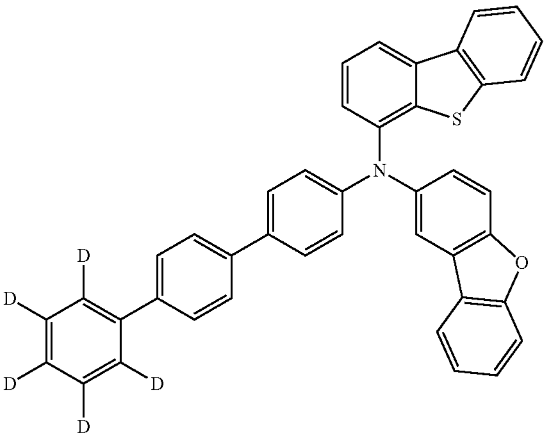
B39
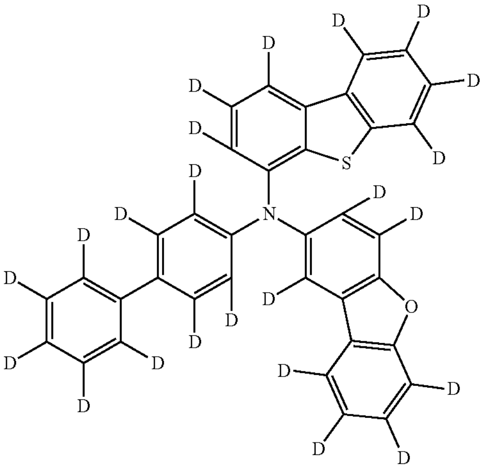
-continued
B40
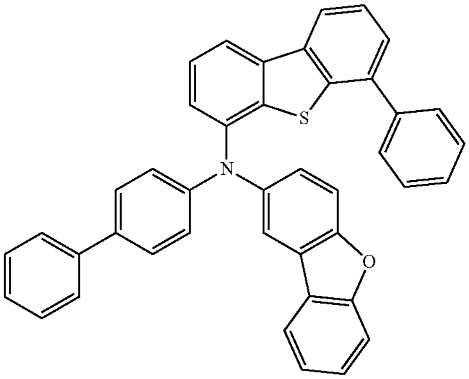
B41
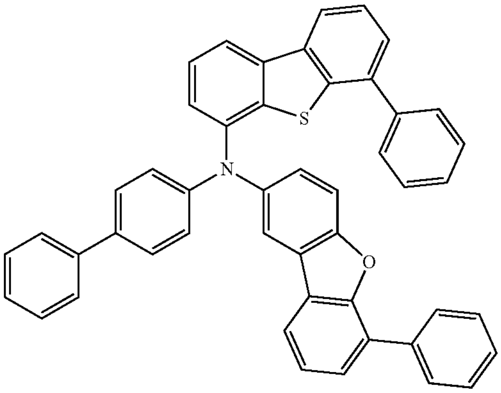
B42
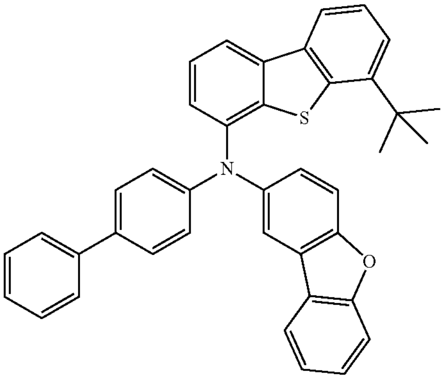
B43
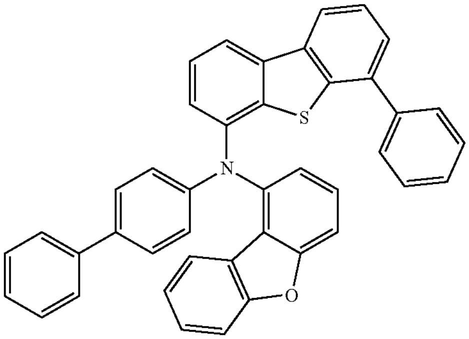

B44
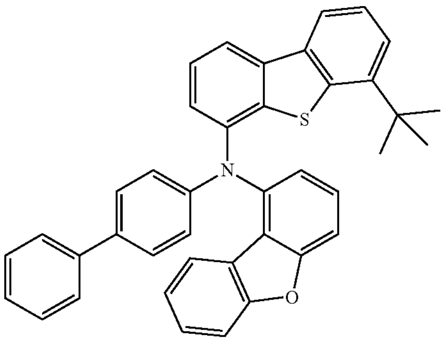
B45
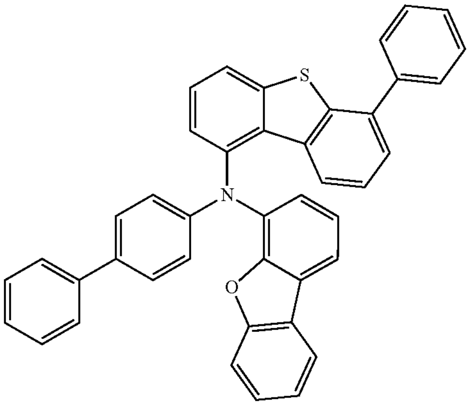
B46
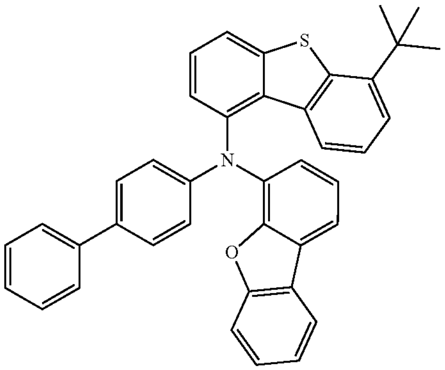
B48
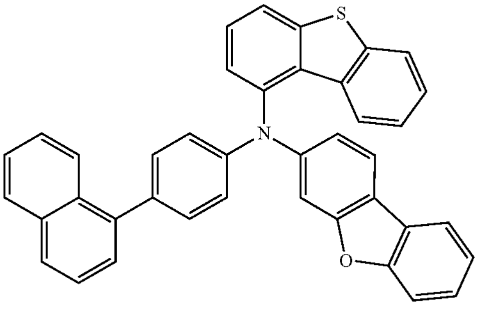
B49
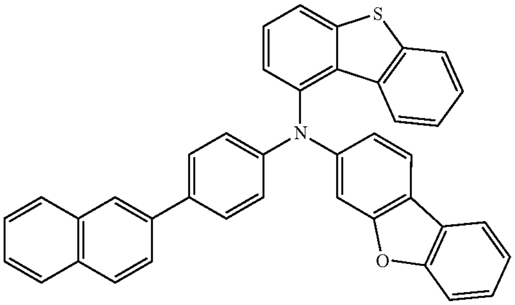
B50
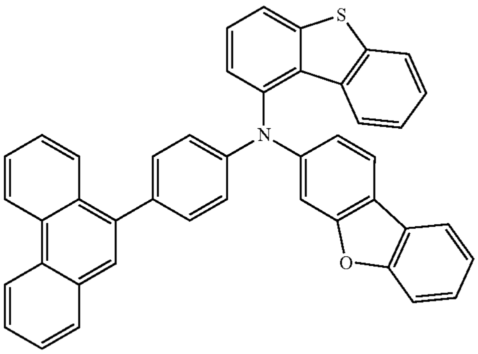
B51
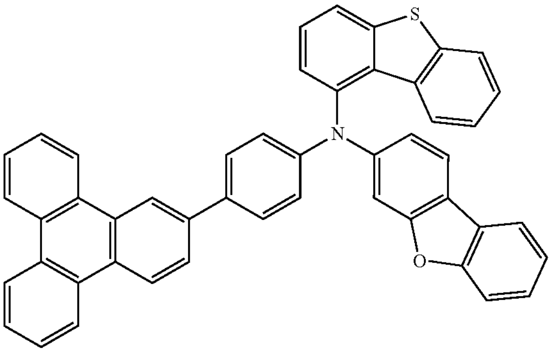
B52
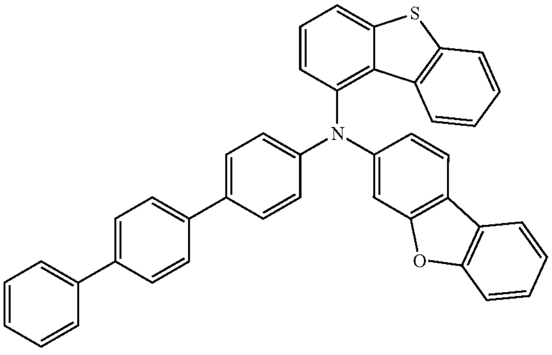

-continued
B53
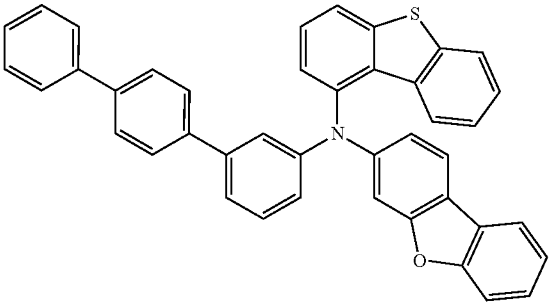
B54
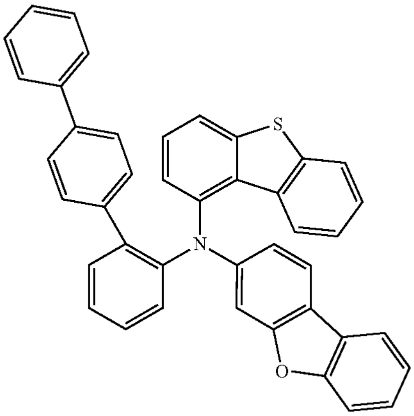
B55
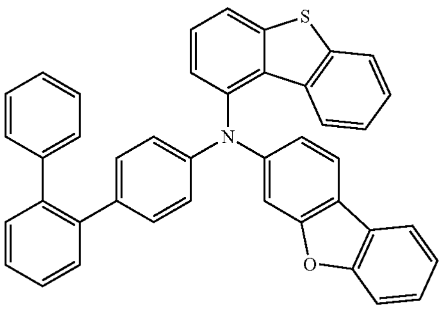
B56
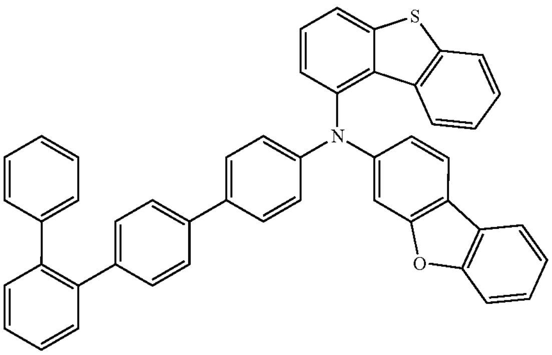
-continued
B57
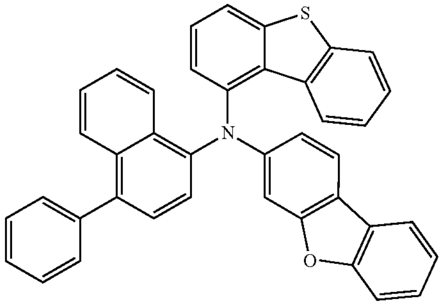
B58
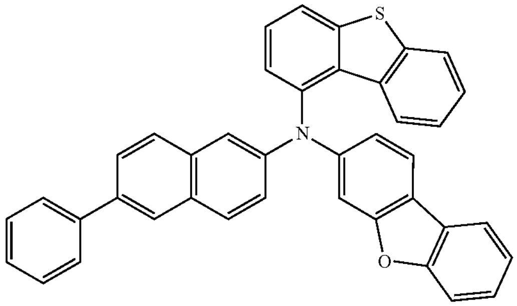
B59
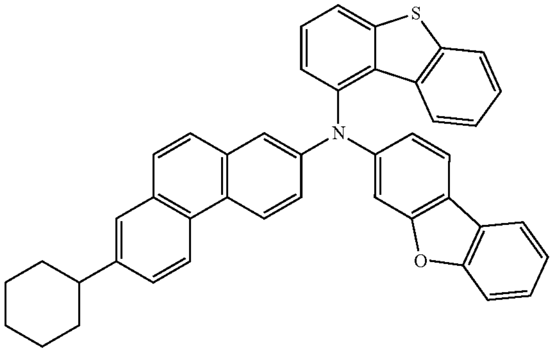
B60
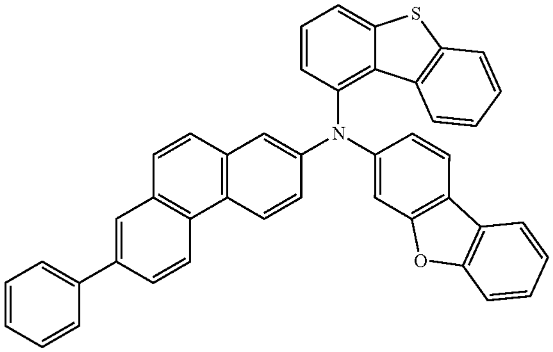

-continued
B61
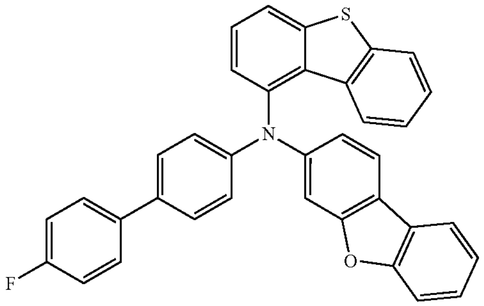
B62
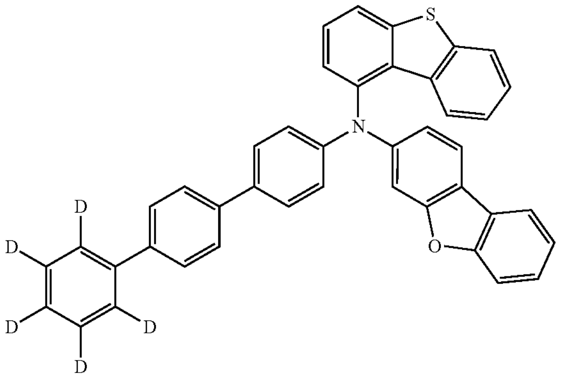
B63
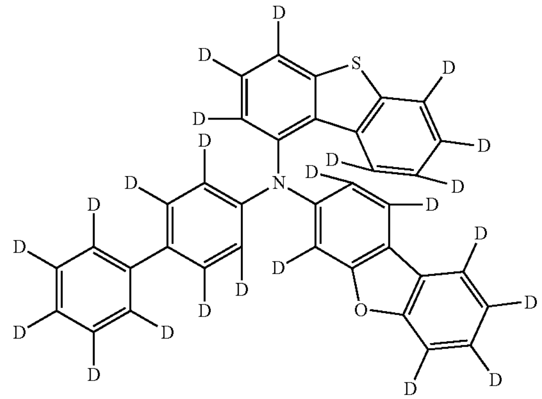
B64
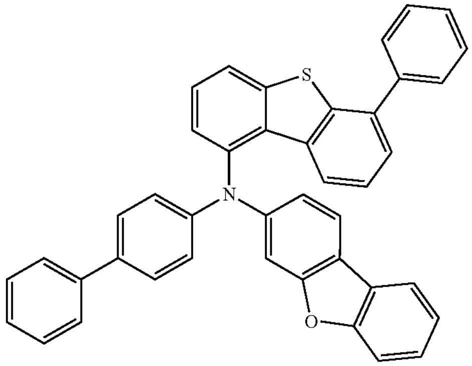
-continued
B65
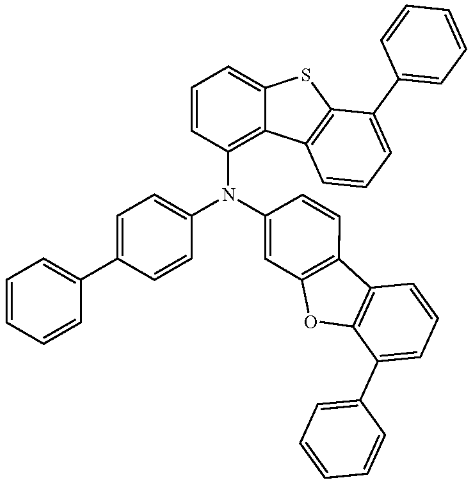
B66
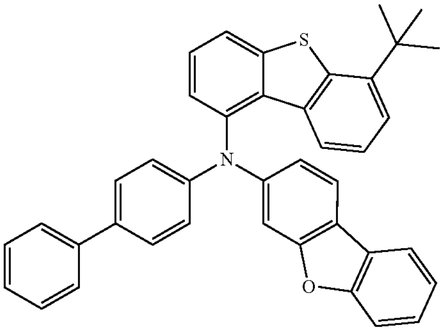
B68
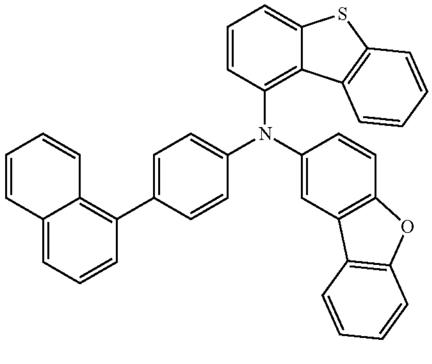
B69
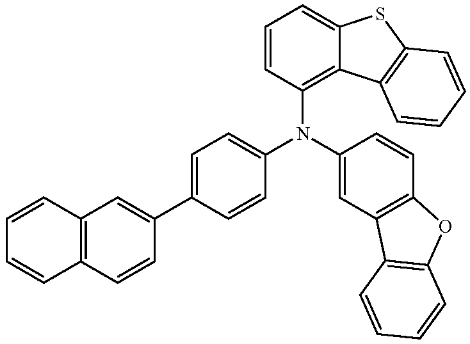

-continued
B70
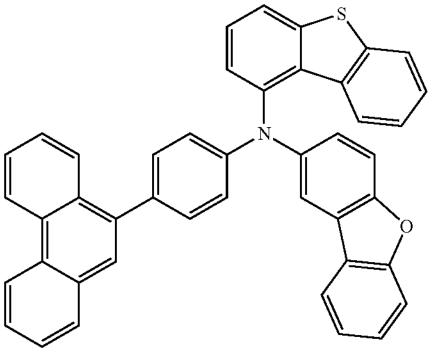
B71
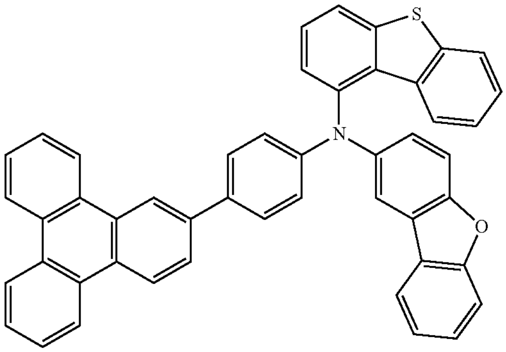
B72
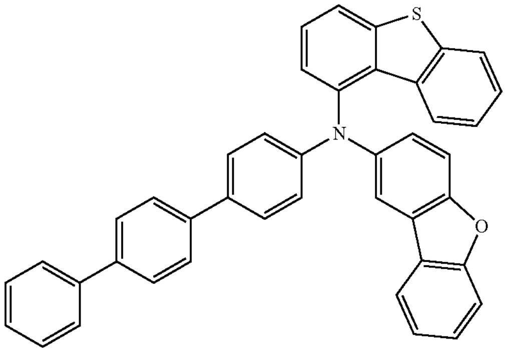
B73
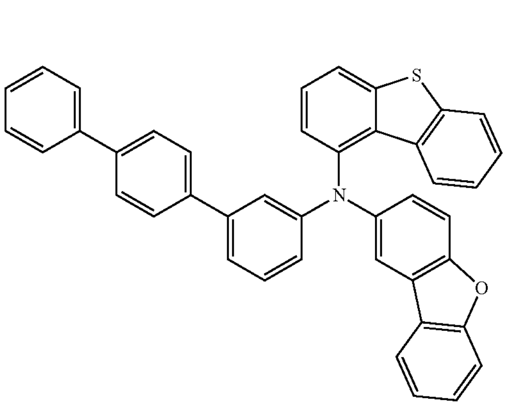
-continued
B74
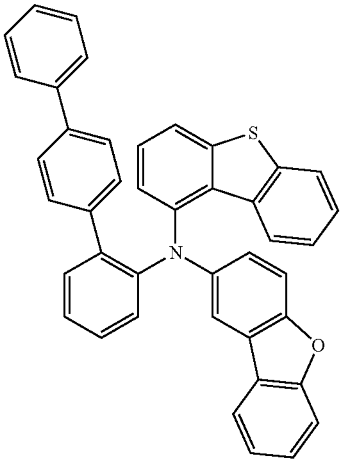
B75
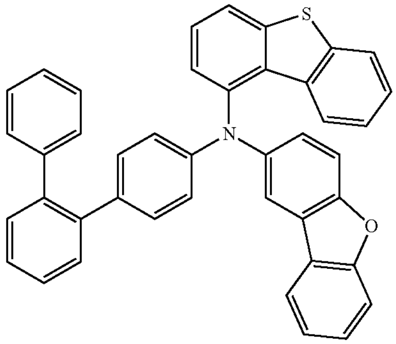
B76
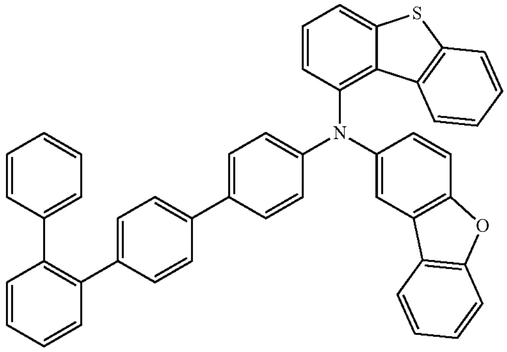
B77
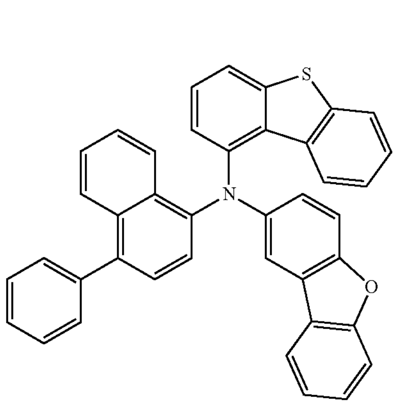

B78
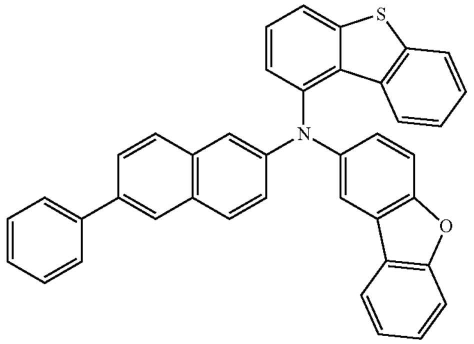
B79
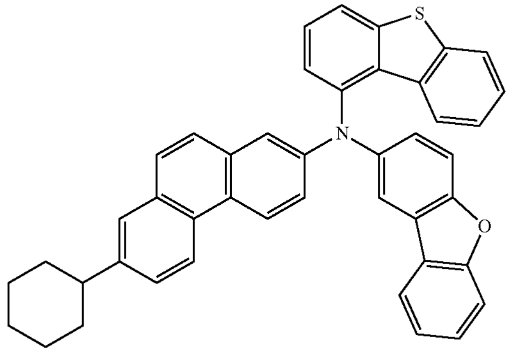
B80
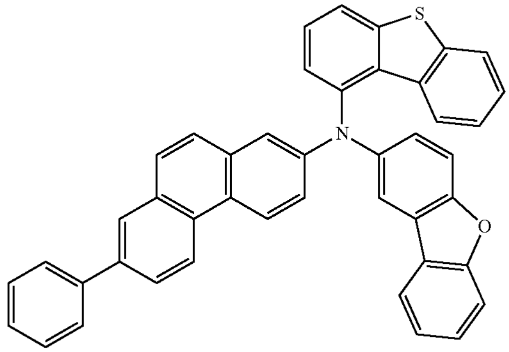
B81
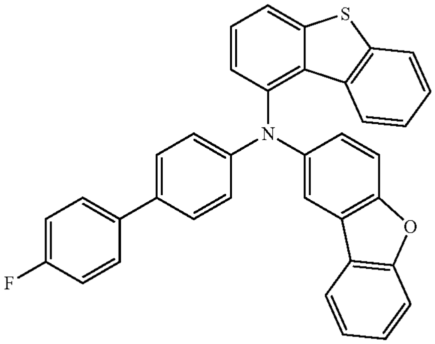
B82
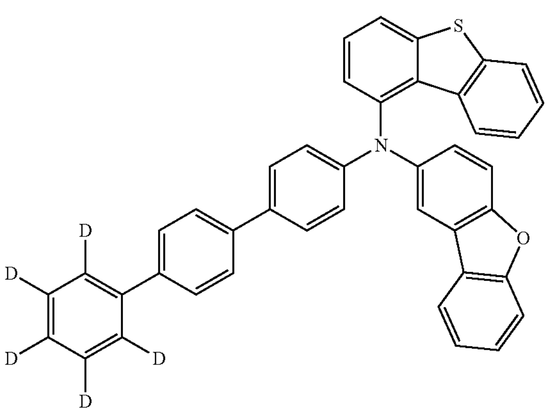
B83
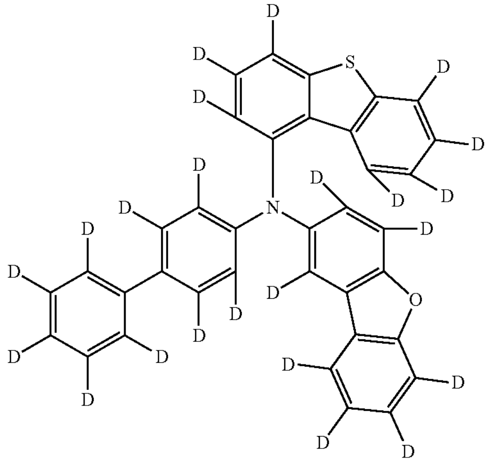
B84
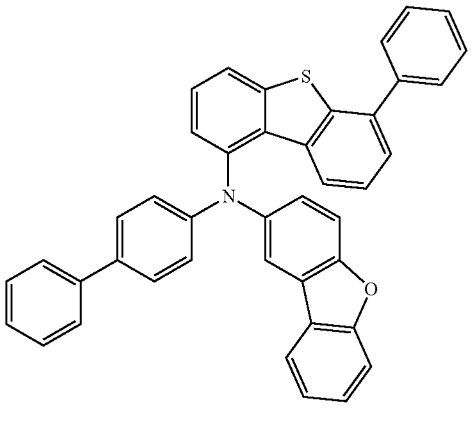

-continued

B85

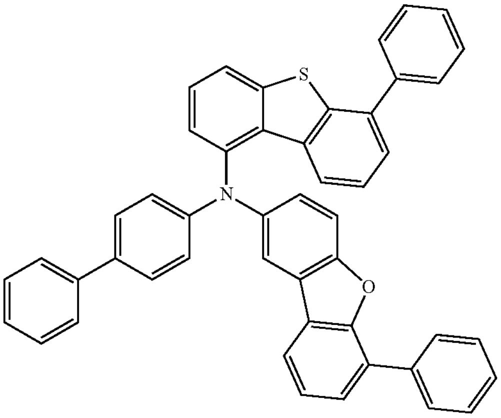

B86

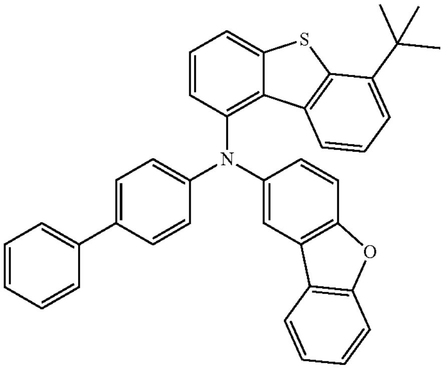

B87

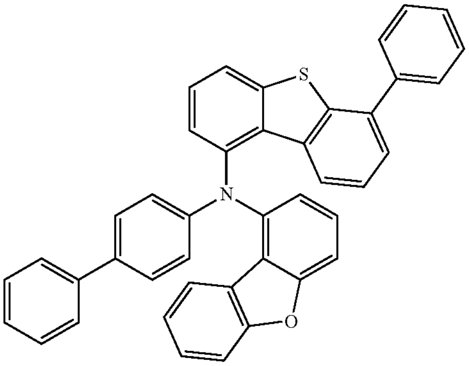

B88

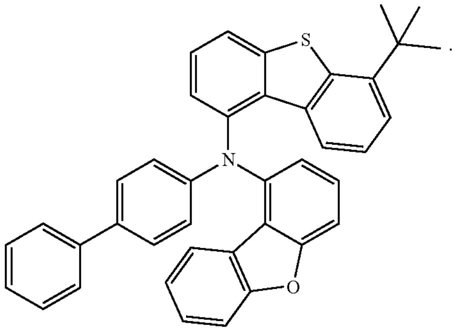

2. The organic electroluminescence device of claim 1, wherein the plurality of organic layers comprises a hole transport region, an emission layer, and an electron transport region, and the hole transport region comprises the amine compound selected from among compounds represented in Compound Group A and Compound Group B.

3. The organic electroluminescence device of claim 1, wherein the organic electroluminescence device further comprising a capping layer on the second electrode and having a refractive index of about 1.6 or more.

4. An amine compound selected from among Compound Group A and Compound Group B:

Compound Group A

A2

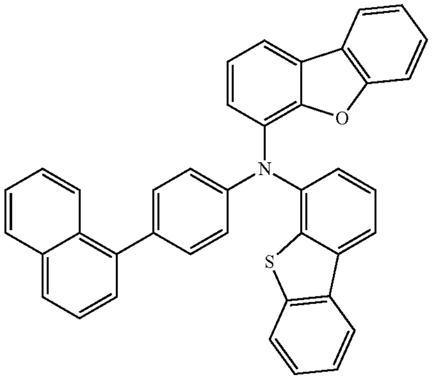

A3

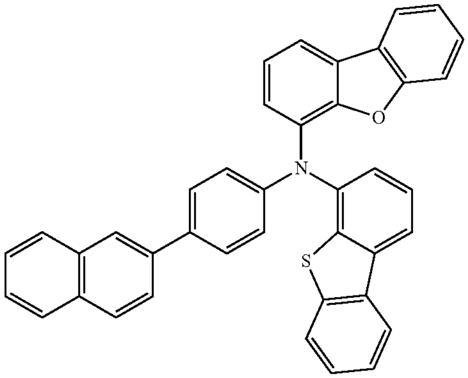

A4

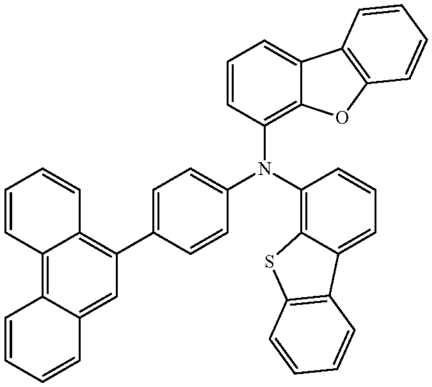

-continued
A5
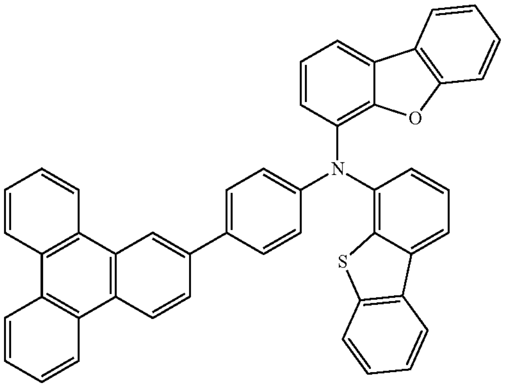
A6
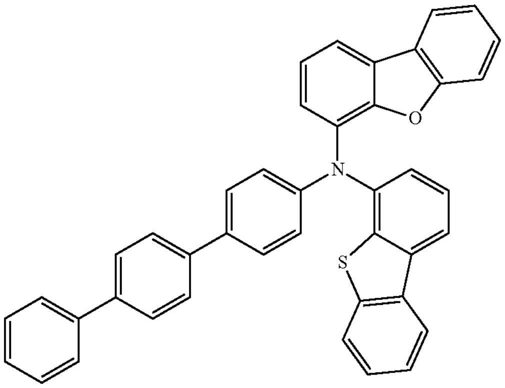
A7
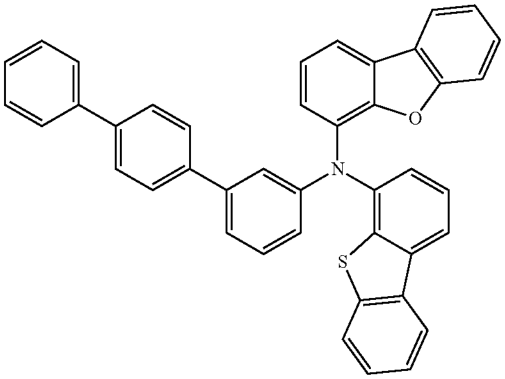
-continued
A8
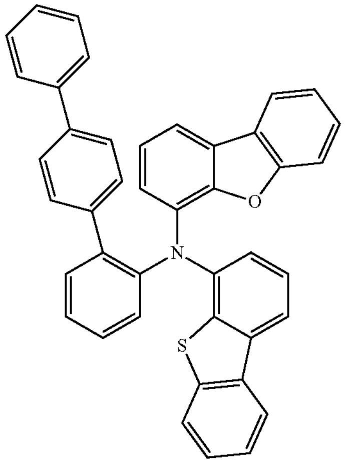
A9
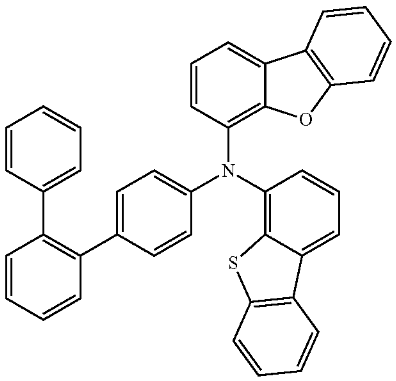
A10
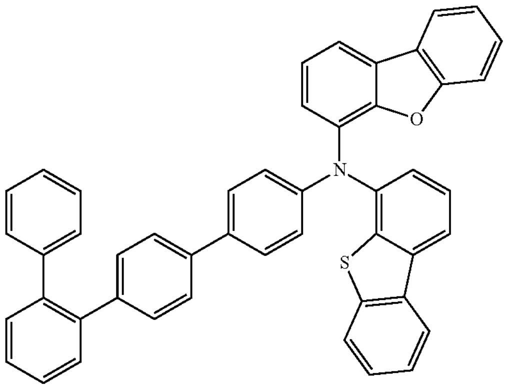
A11
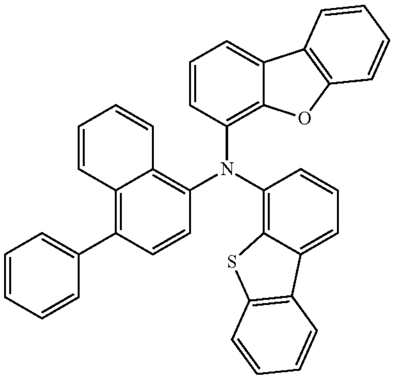

-continued
A12
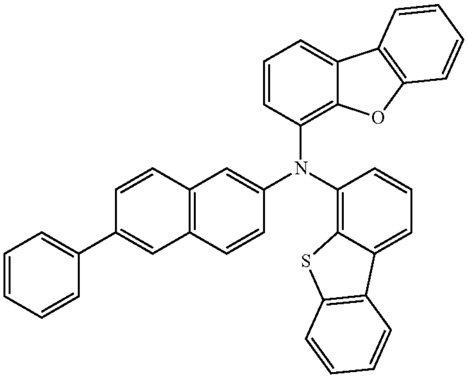
A13
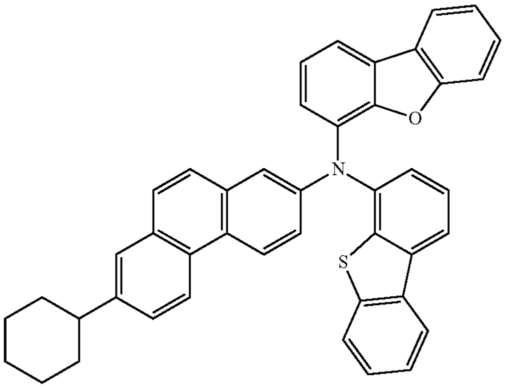
A14
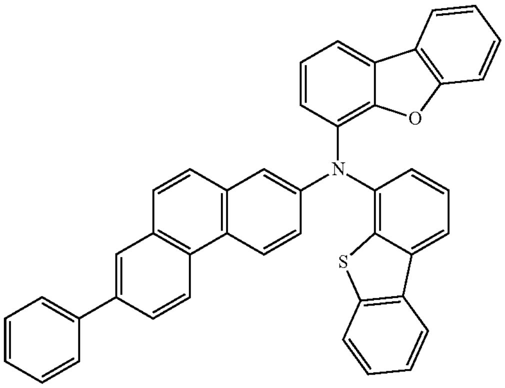
A15
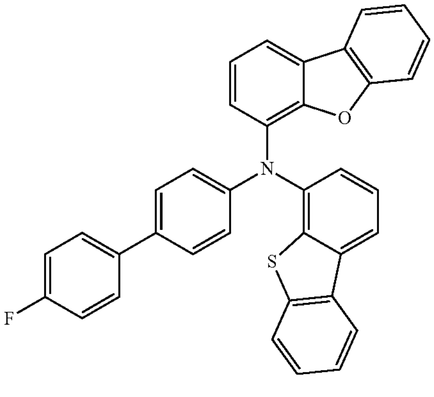
-continued
A16
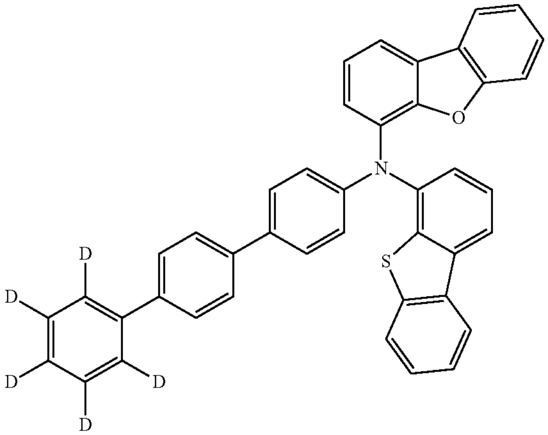
A17
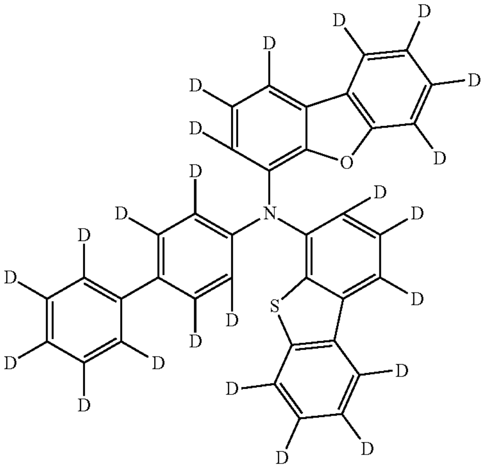
A18
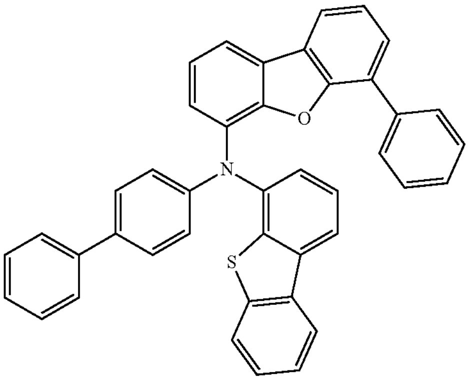

-continued
A19
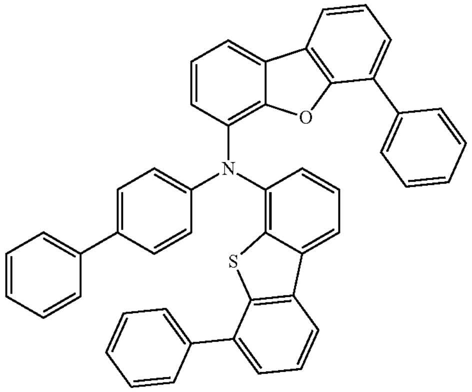
A20
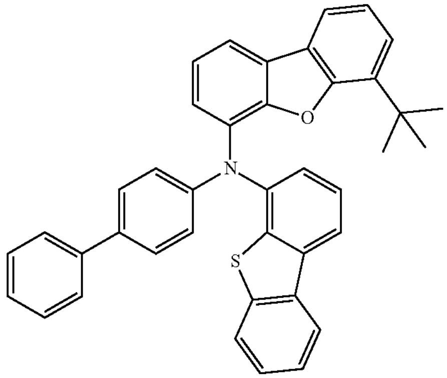
A22
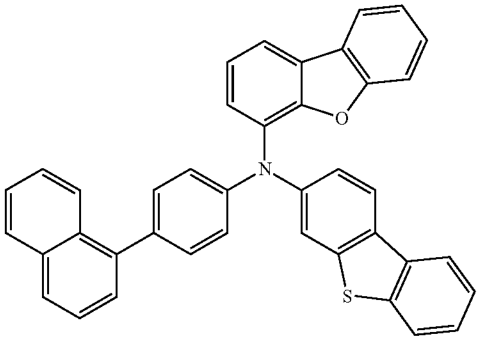
A23
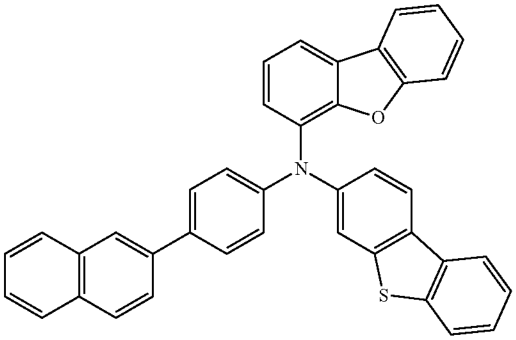
-continued
A24
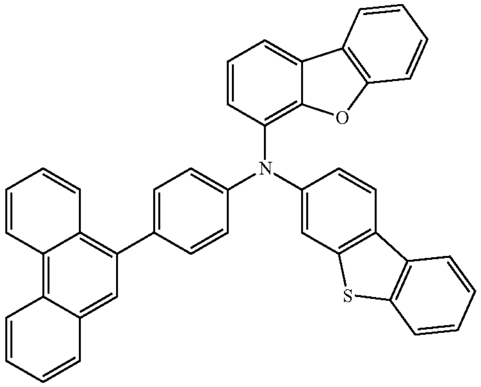
A25
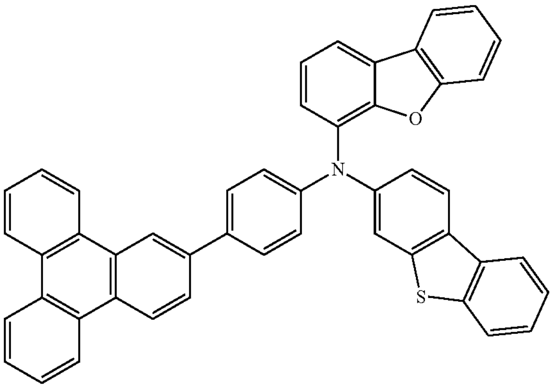
A26
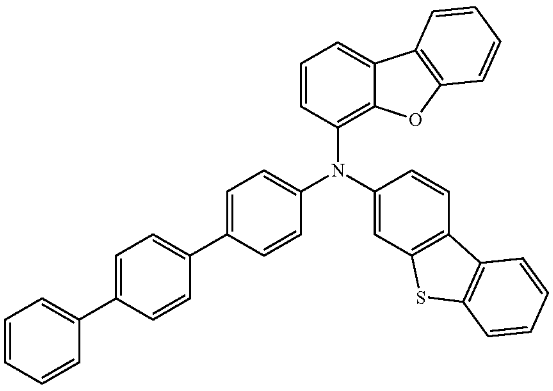
A27
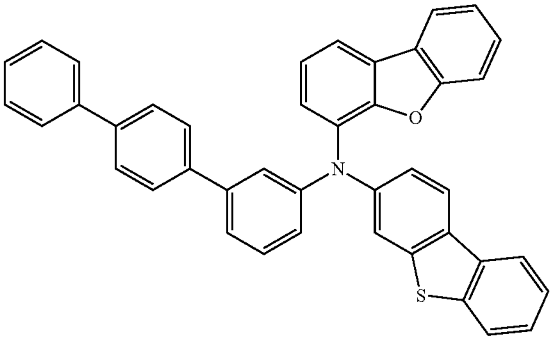

-continued
A28
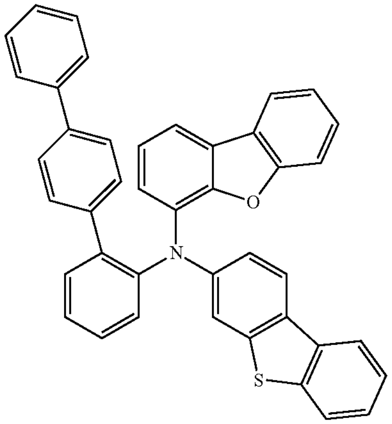
A29
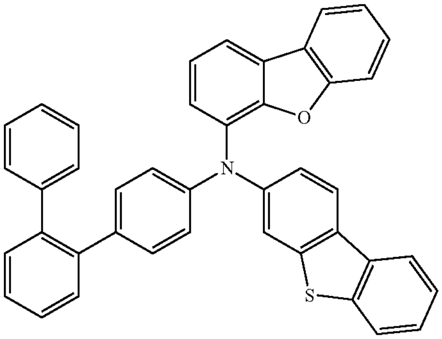
A30
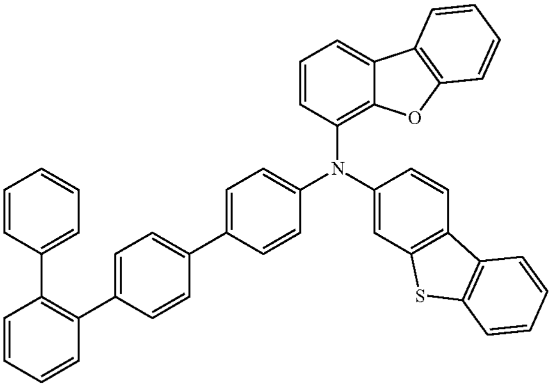
A31
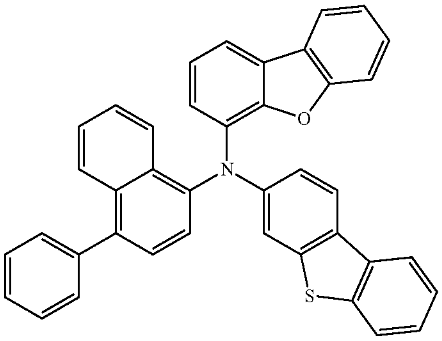
-continued
A32
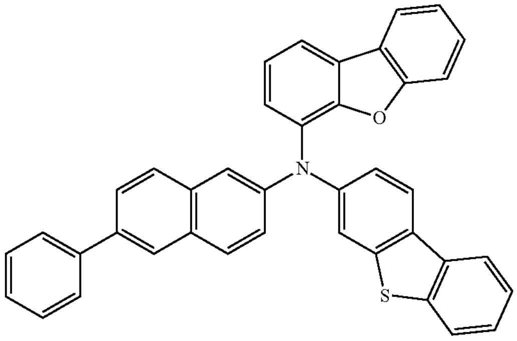
A33
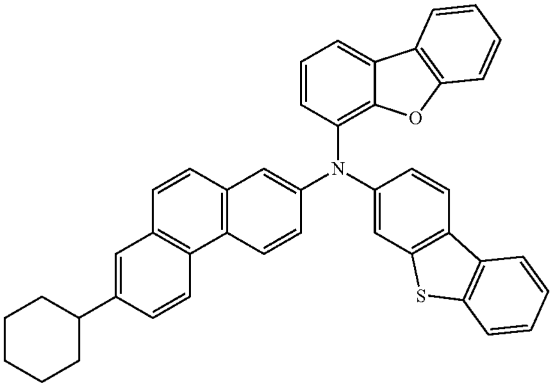
A34
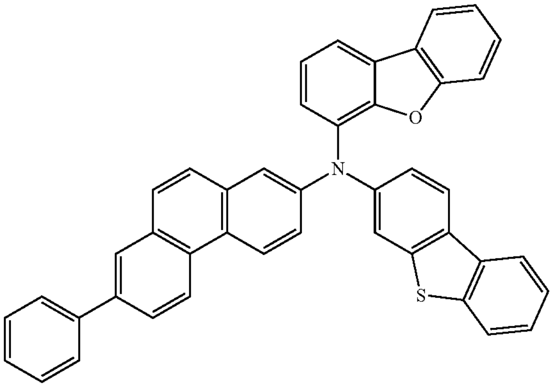
A35
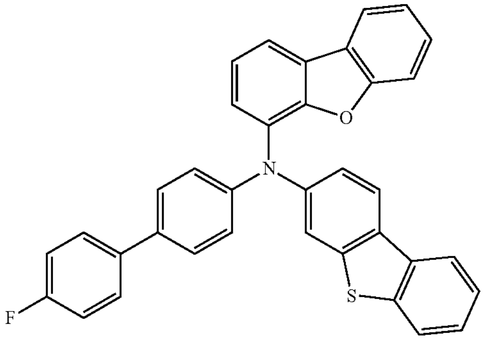

-continued
A36
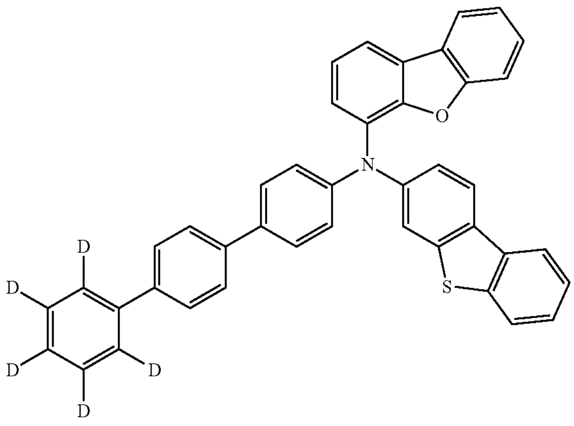
A37
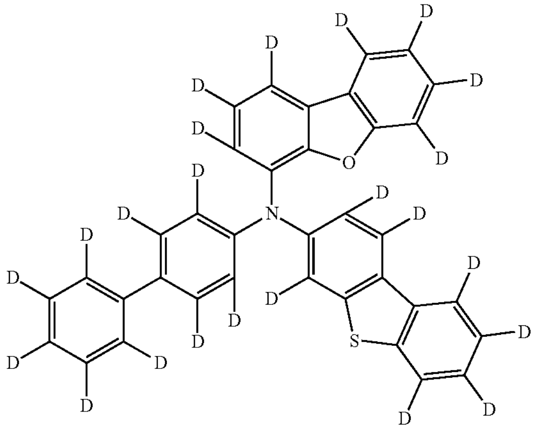
A38
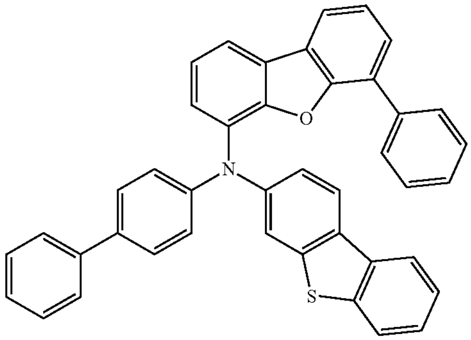
-continued
A39
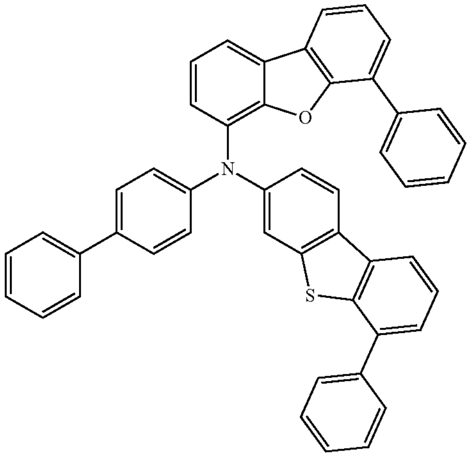
A40
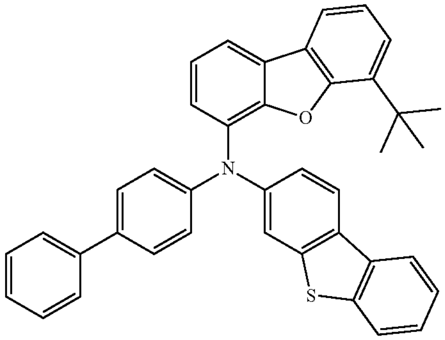
A42
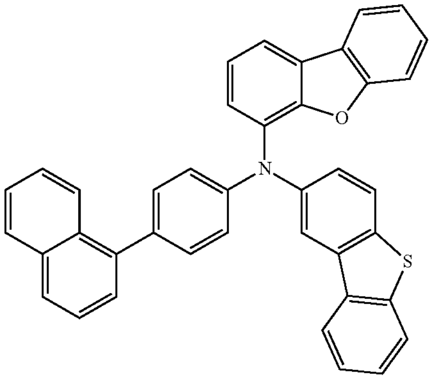
A43
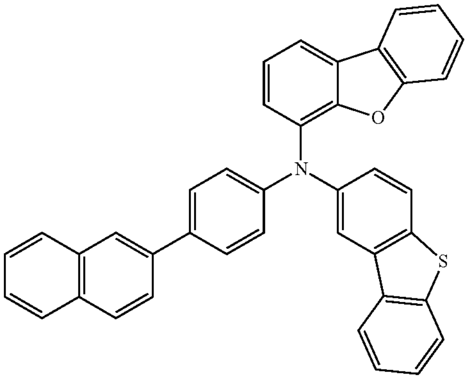

-continued
A44
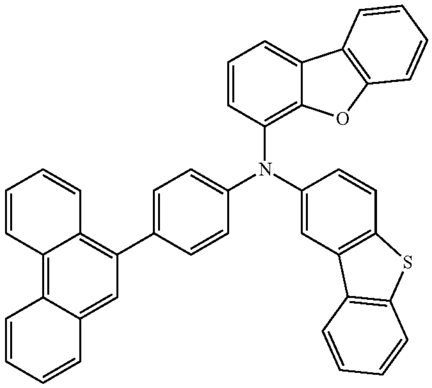
A45
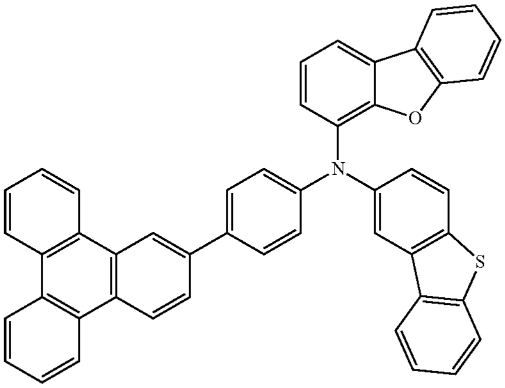
A46
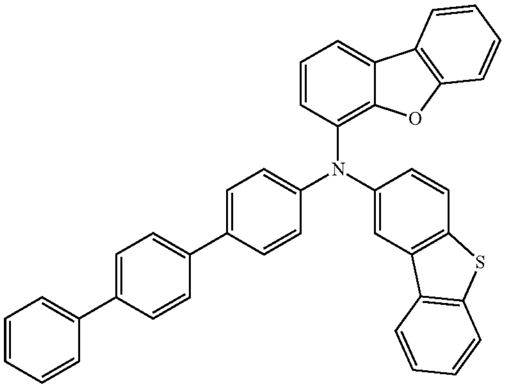
A47
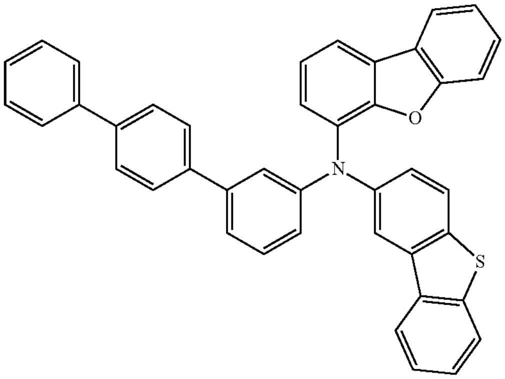
-continued
A48
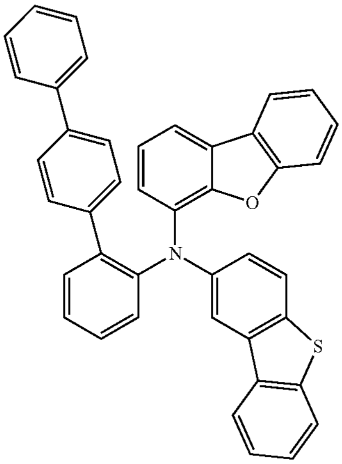
A49
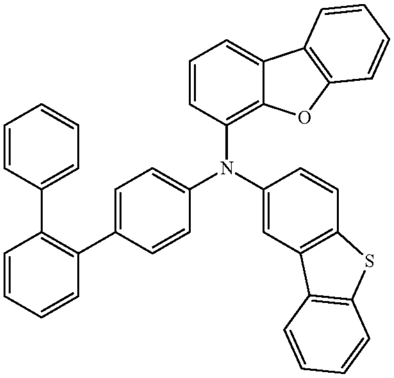
A50
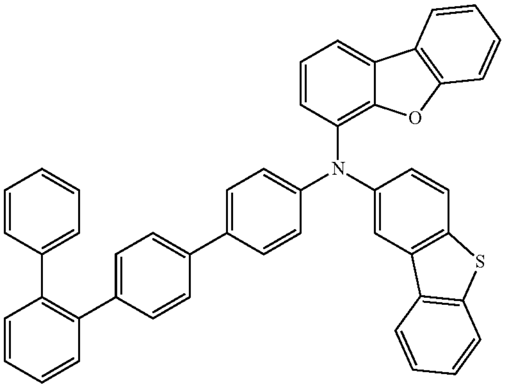
A51
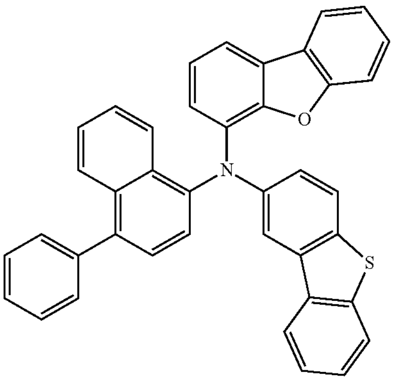

-continued
A52
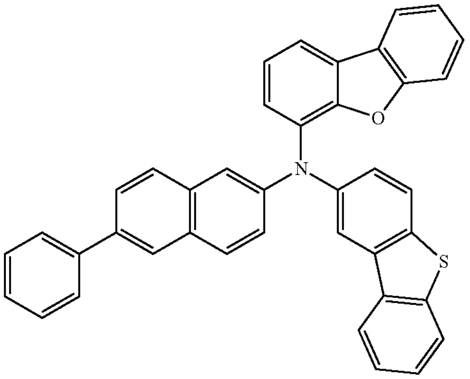
A53
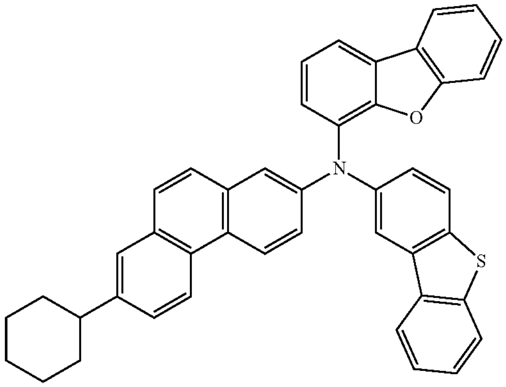
A54
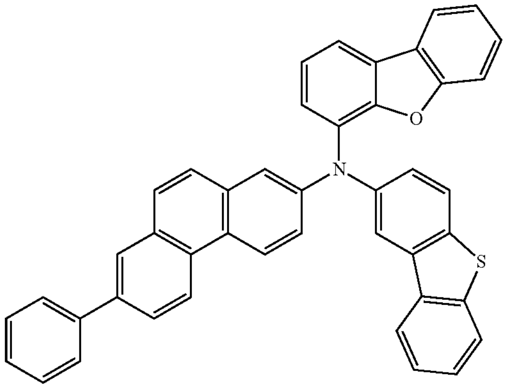
A55
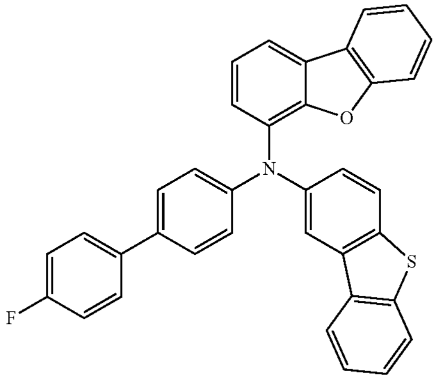
-continued
A56
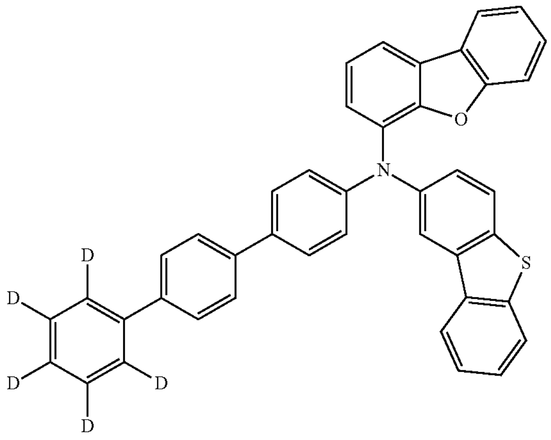
A57
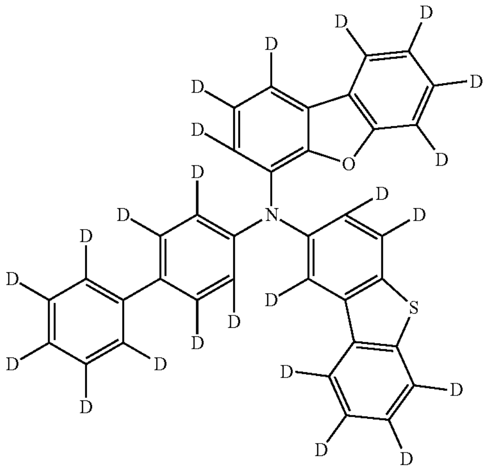
A58
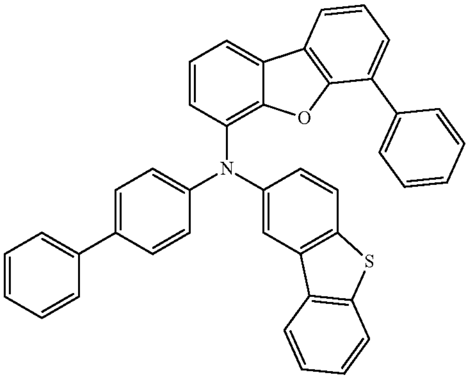

-continued
A59
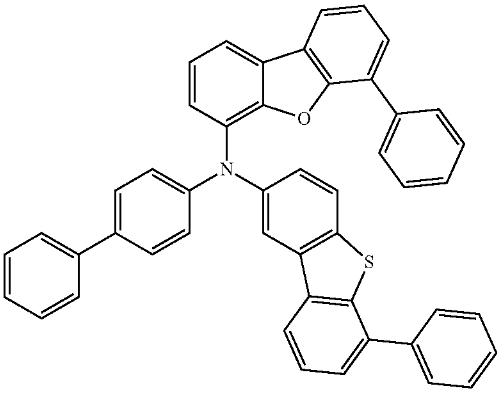
A60
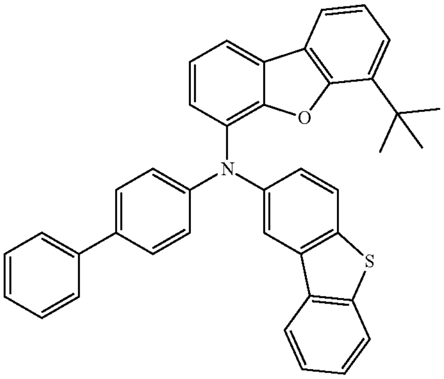
A62
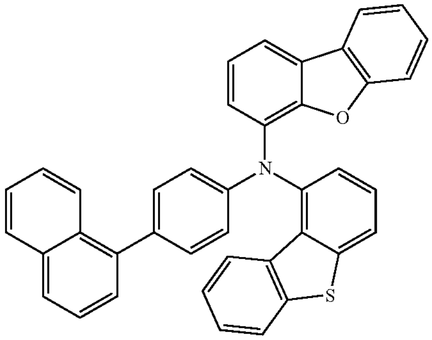
A63
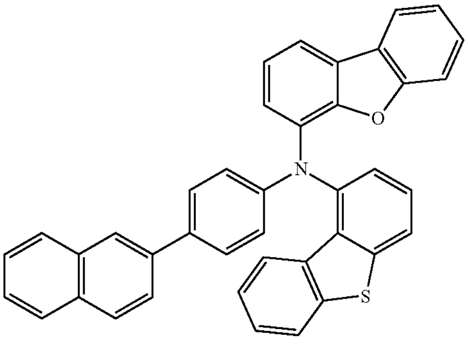
-continued
A64
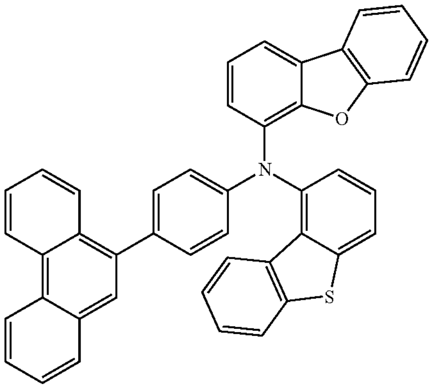
A65
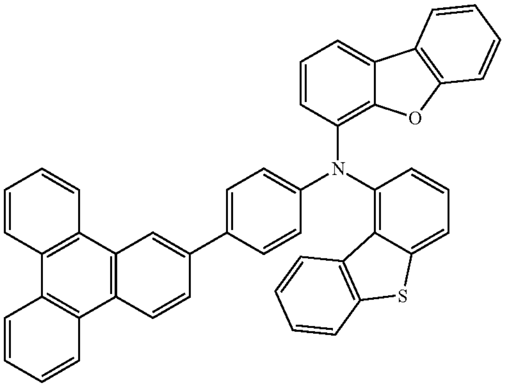
A66
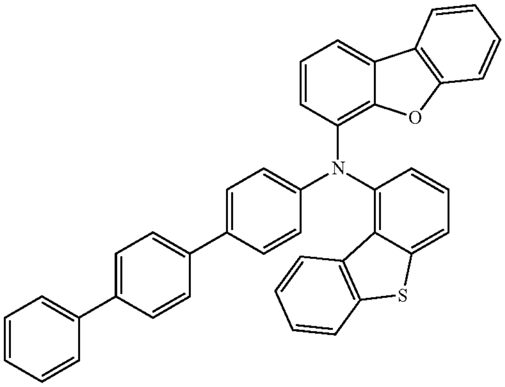
A67
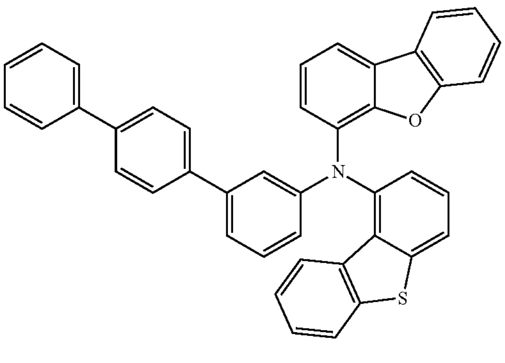

-continued
A68
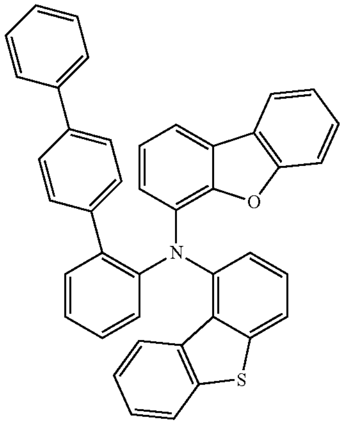
A69
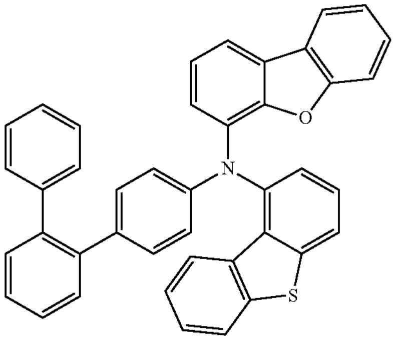
A70
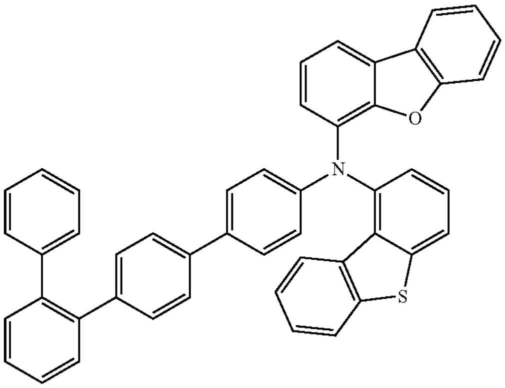
A71
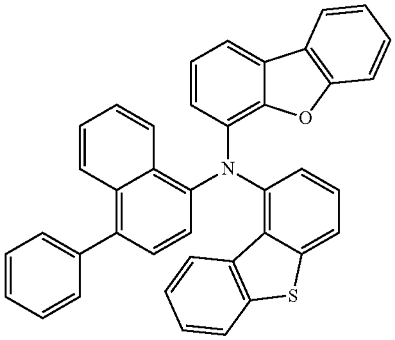
-continued
A72
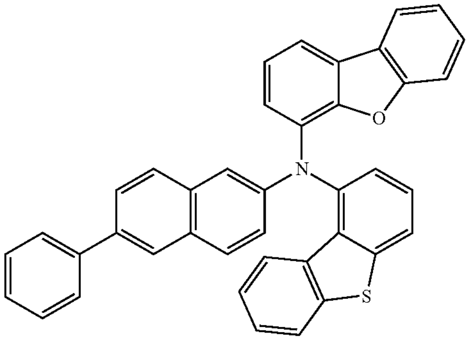
A73
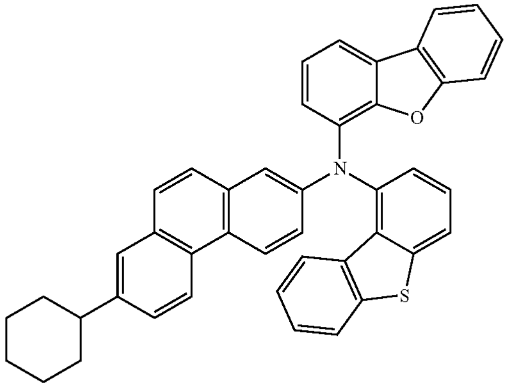
A74
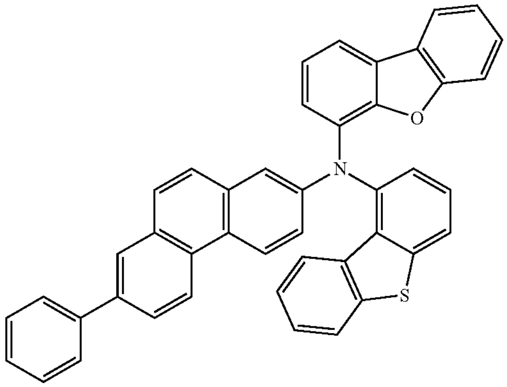
A75
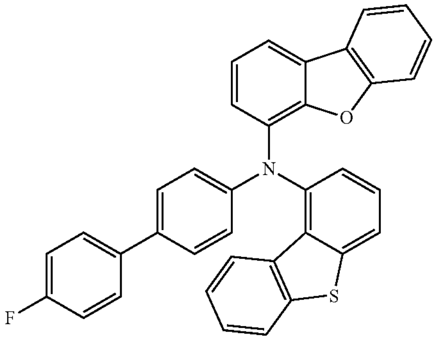

-continued
A76
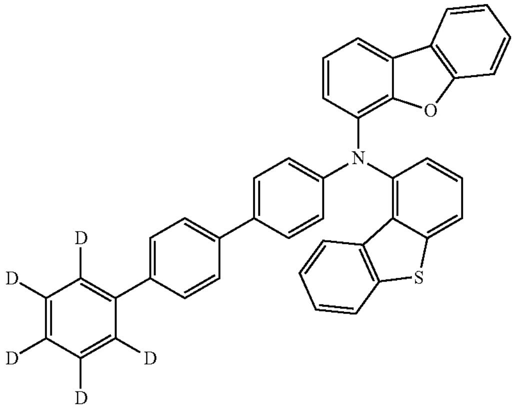
A77
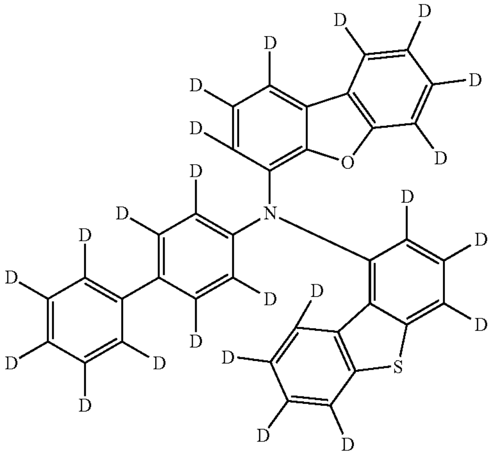
A78
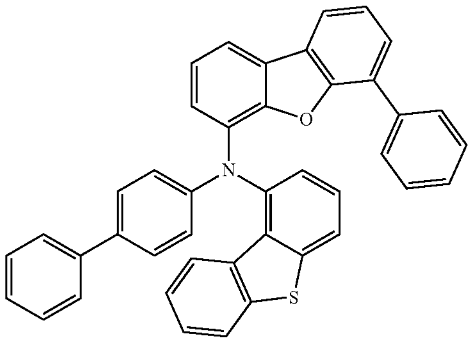
-continued
A79
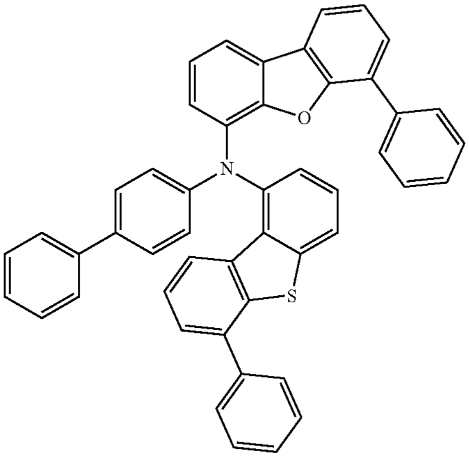
A80
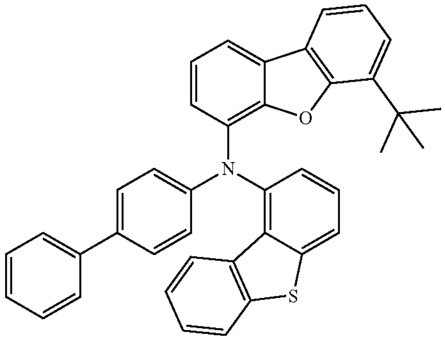
A82
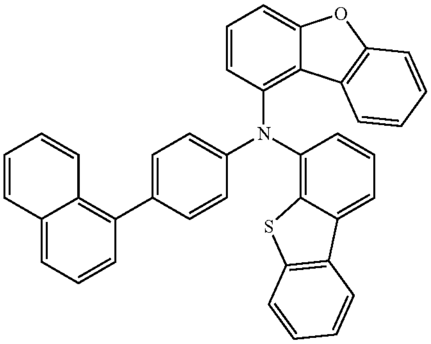
A83
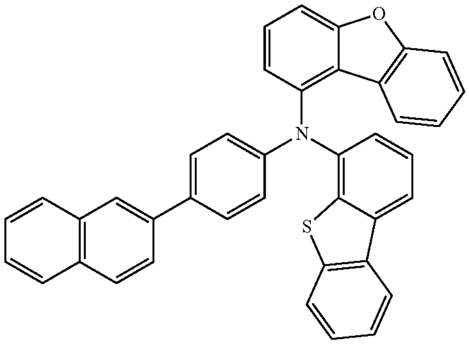

-continued
A84
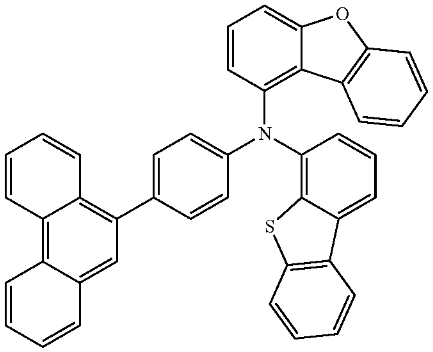
A85
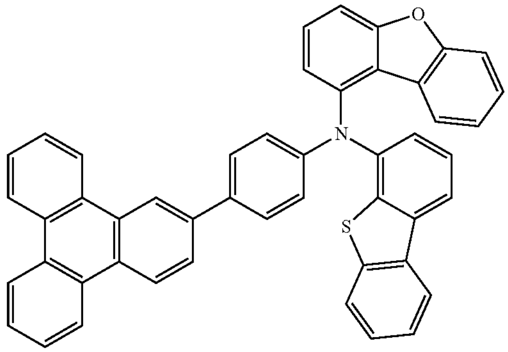
A86
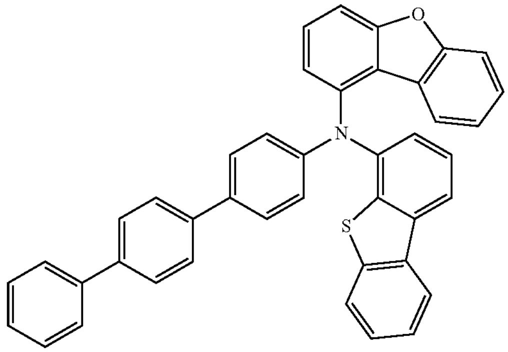
A87
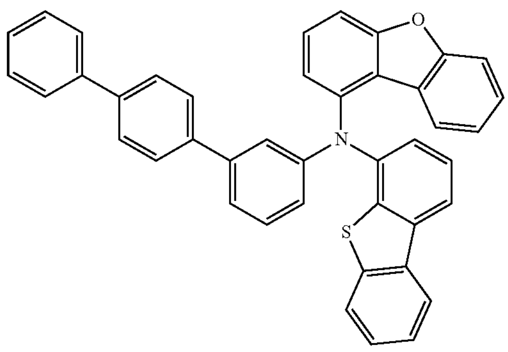
-continued
A88
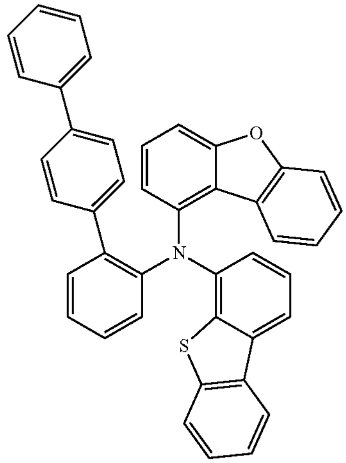
A89
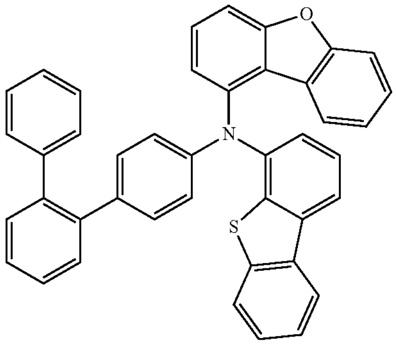
A90
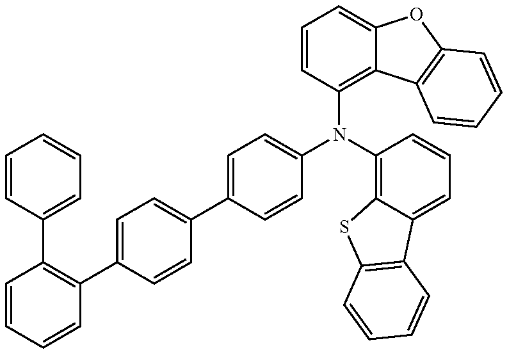
A91
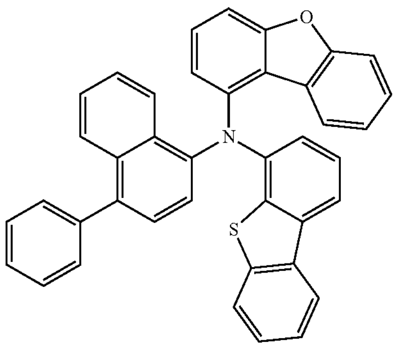

A92
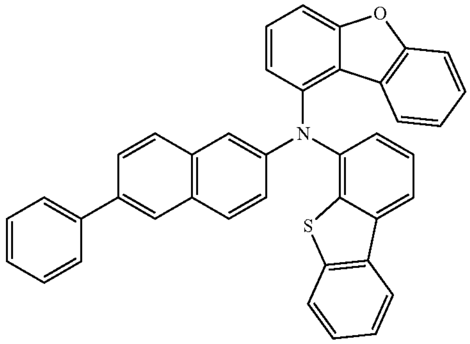
A93
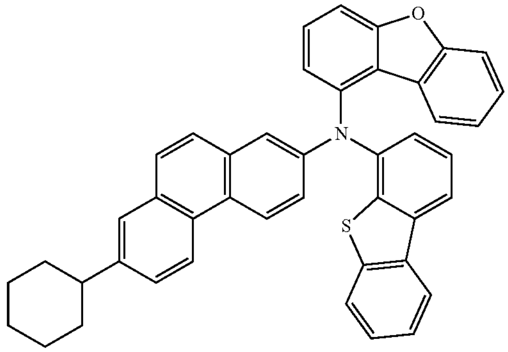
A94
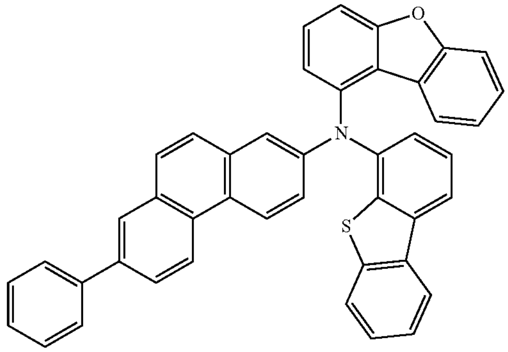
A95
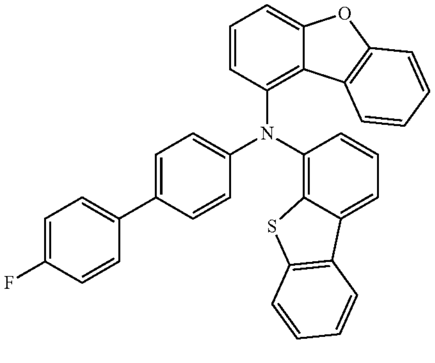
A96
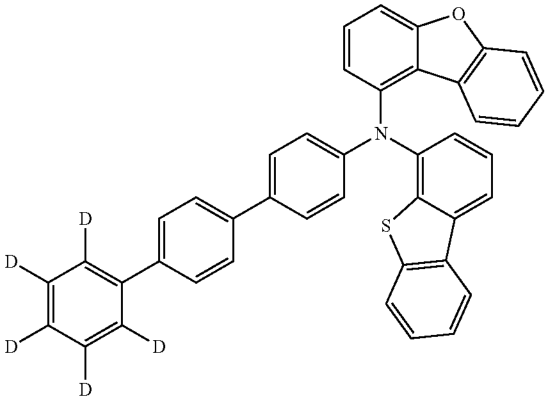
A97
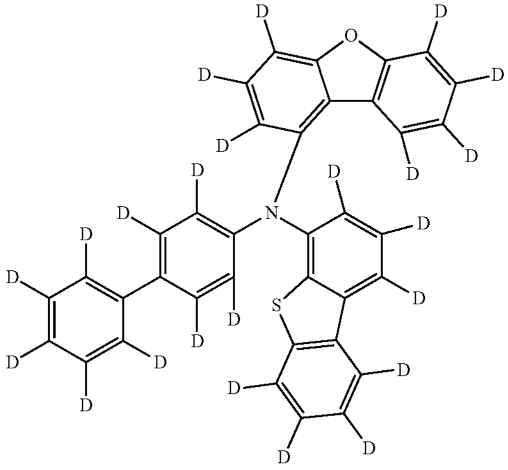
A98
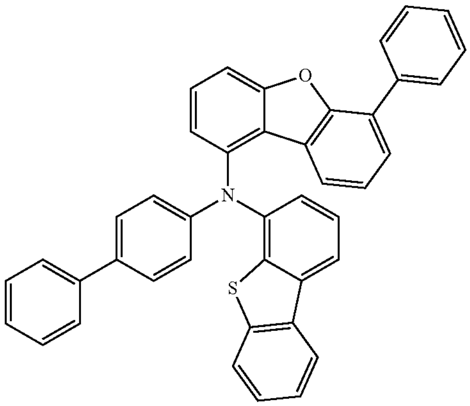

-continued
A99
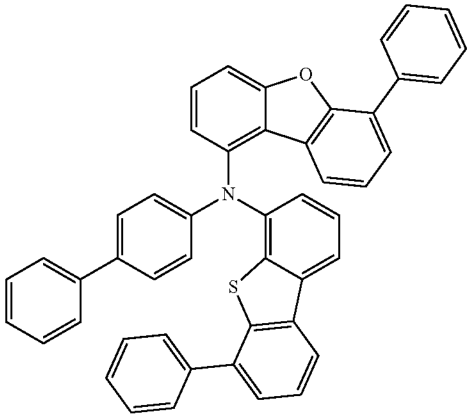
A100
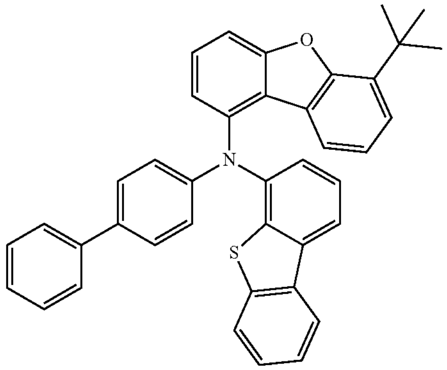
A102
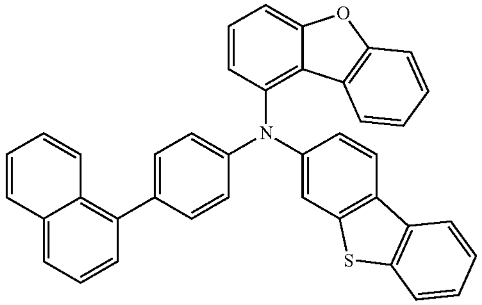
A103
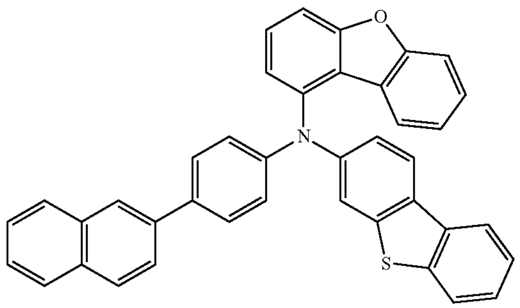
-continued
A104
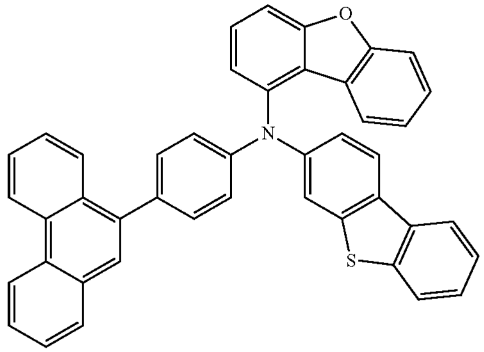
A105
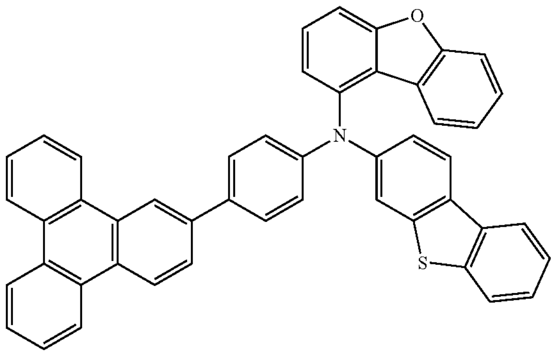
A106
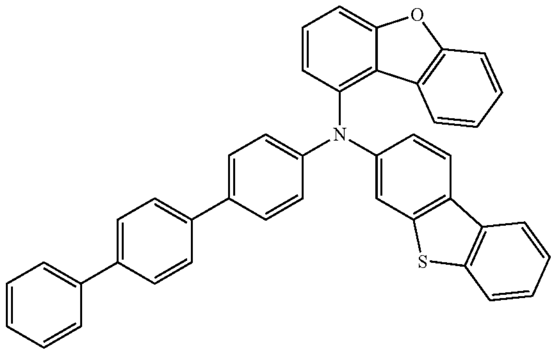
A107
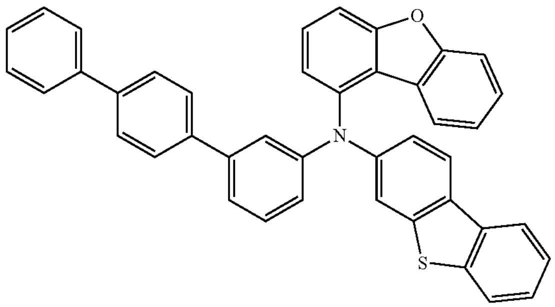

-continued
A108
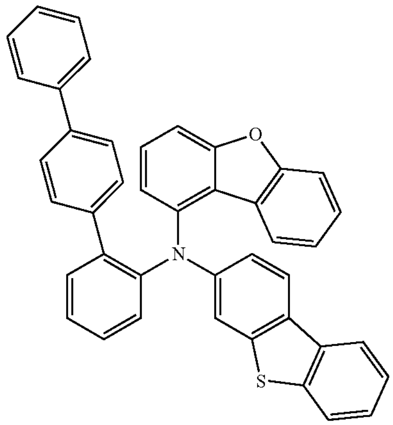
A109
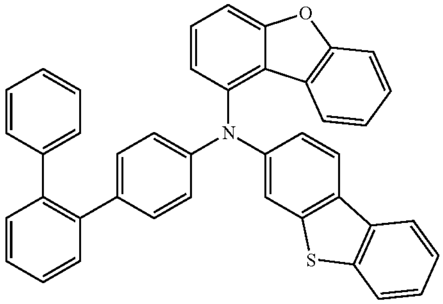
A110
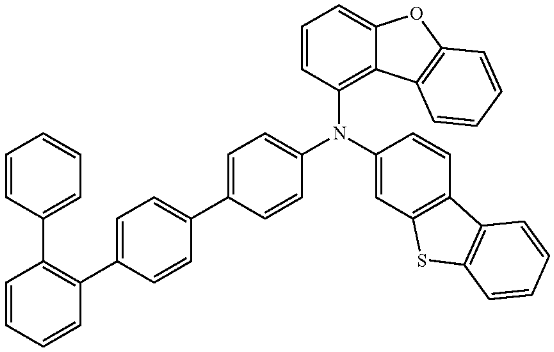
A111
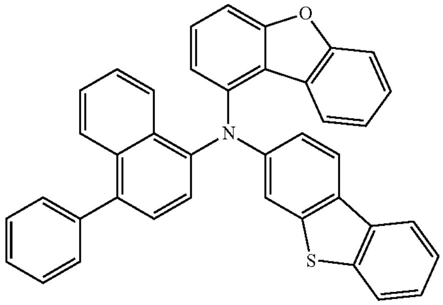
-continued
A112
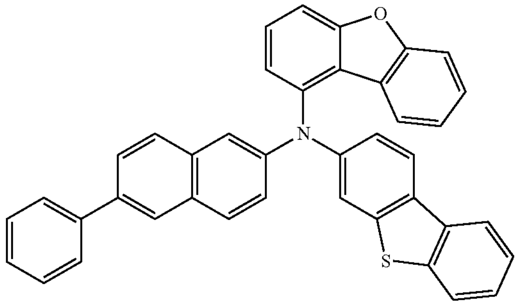
A113
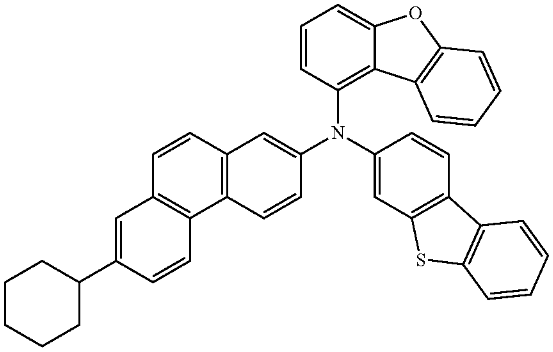
A114
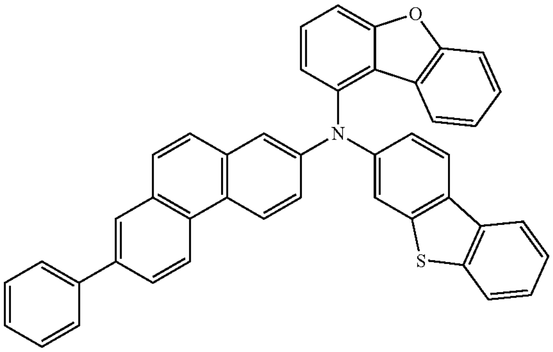
A115
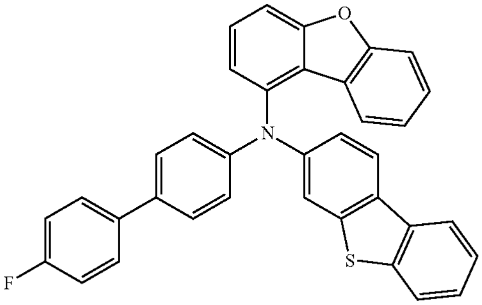

-continued
A116
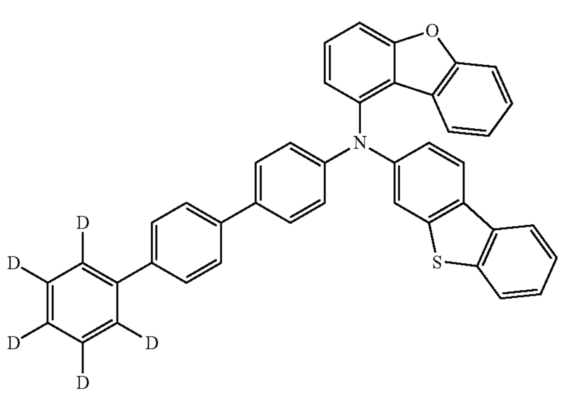
A117
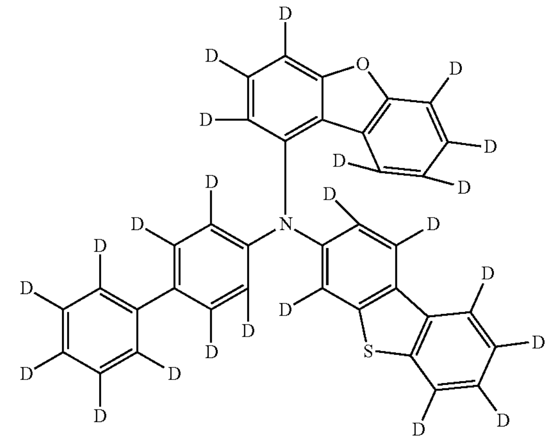
A118
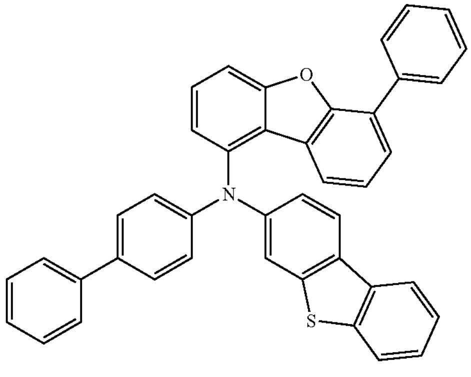
-continued
A119
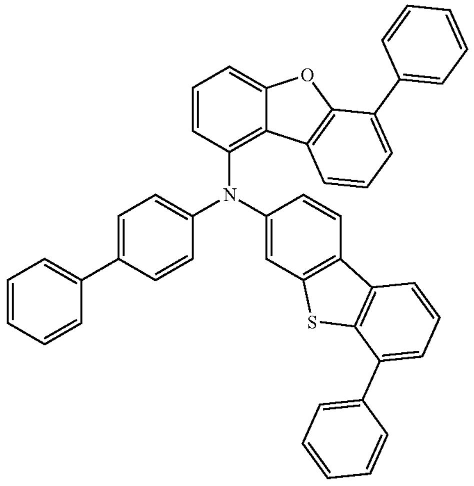
A120
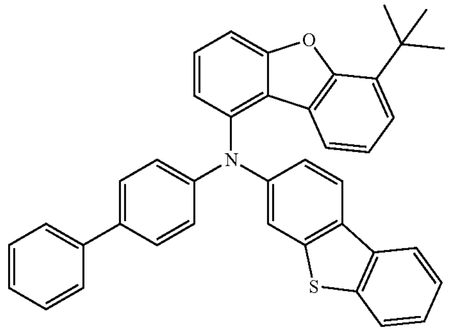
A122
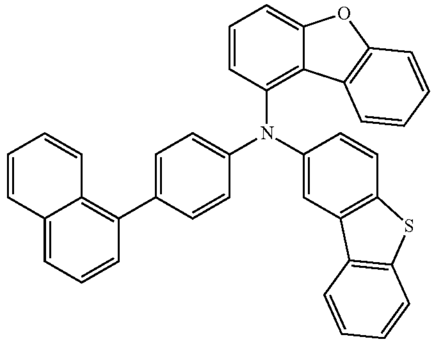
A123
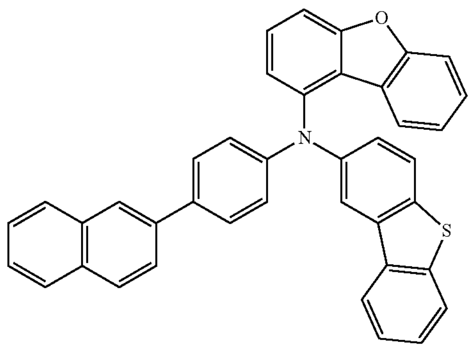

-continued
A124
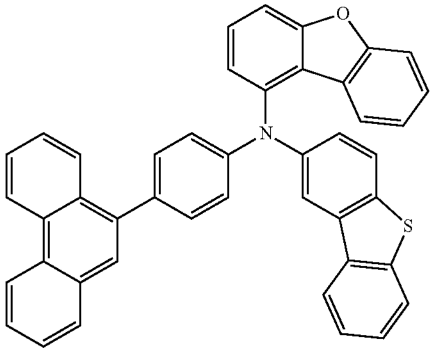
A125
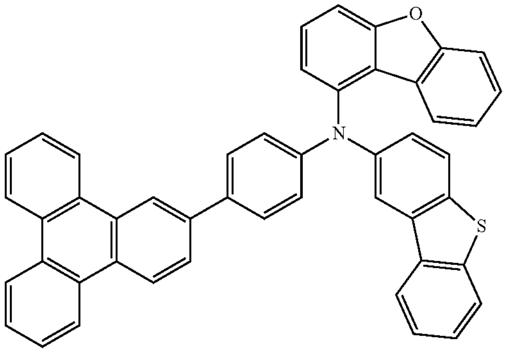
A126
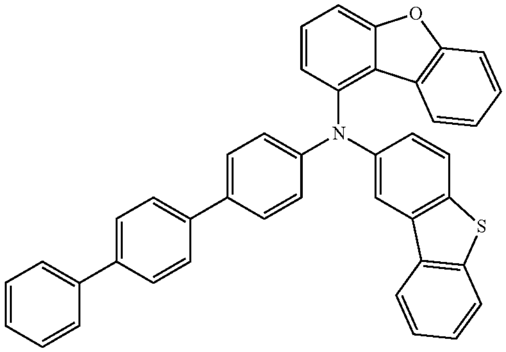
A127
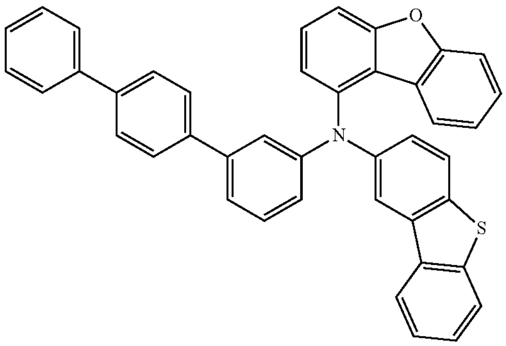
-continued
A128
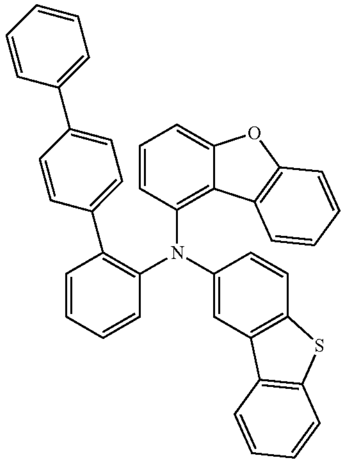
A129
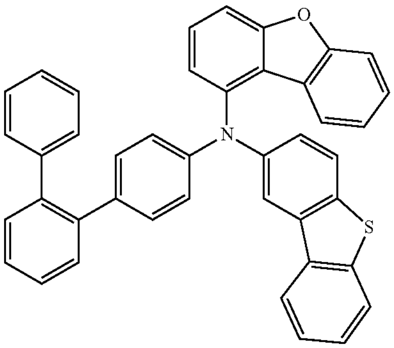
A130
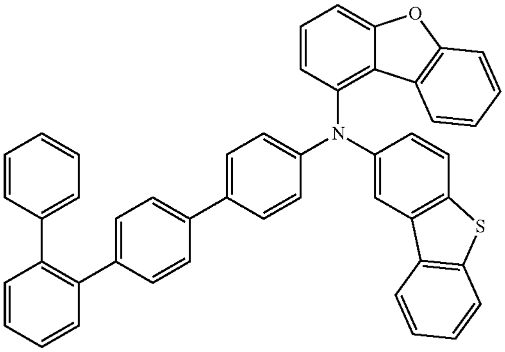
A131
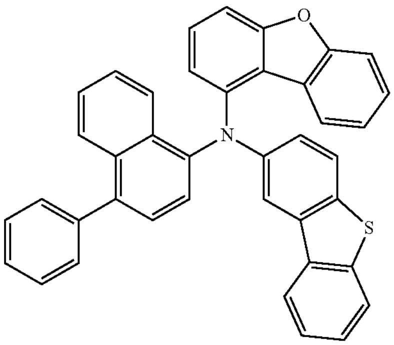

-continued
A132
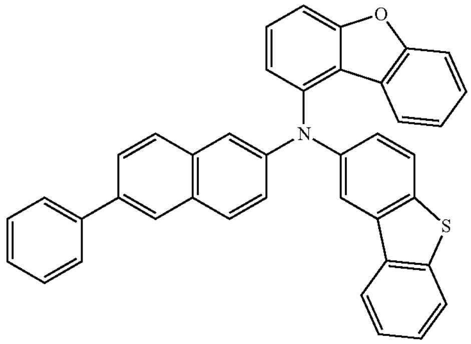
A133
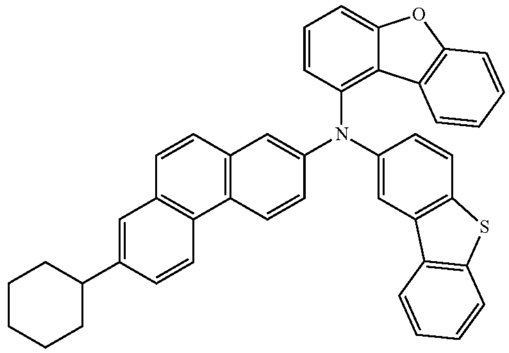
A134
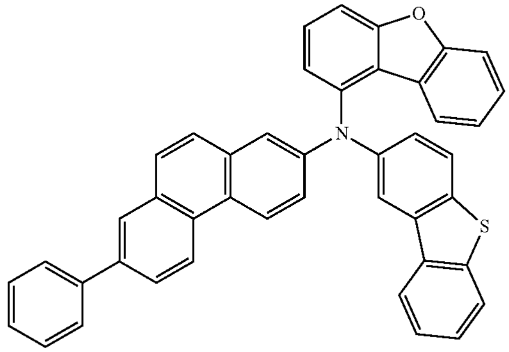
A135
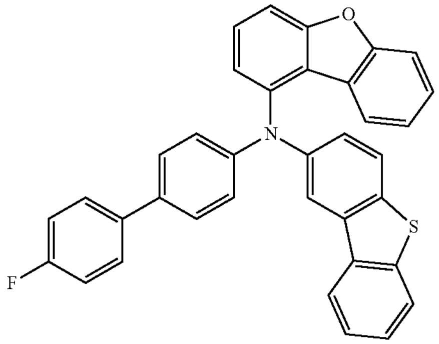
-continued
A136
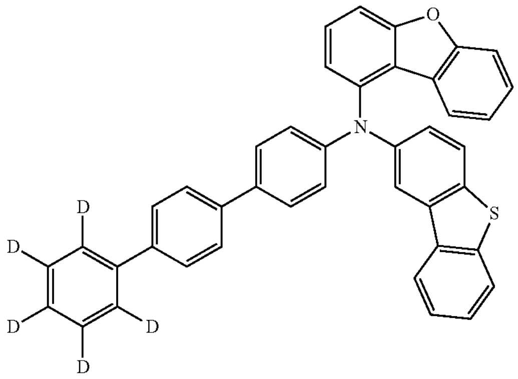
A137
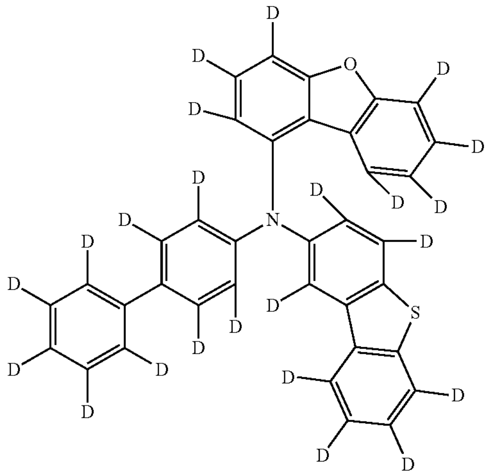
A138
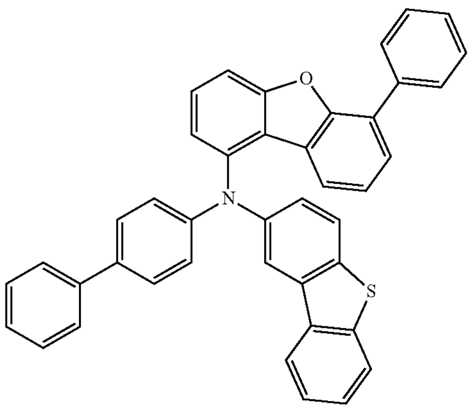

-continued
A139
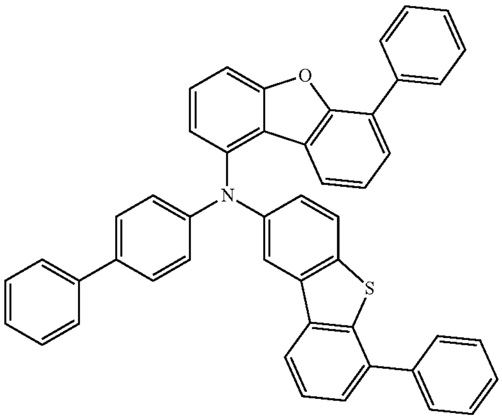
A140
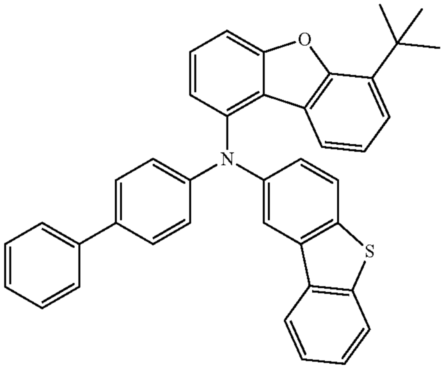
A142
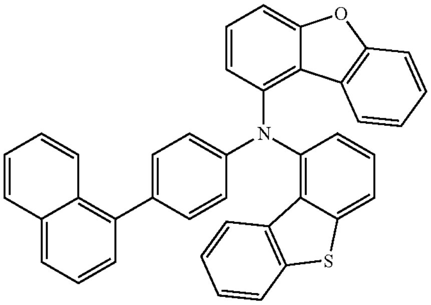
A143
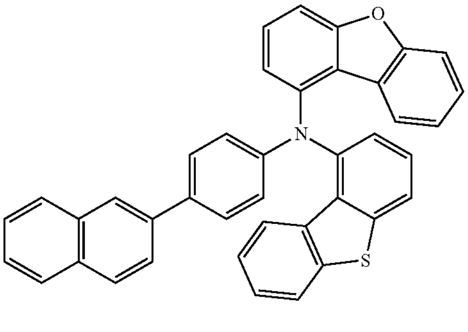
A144
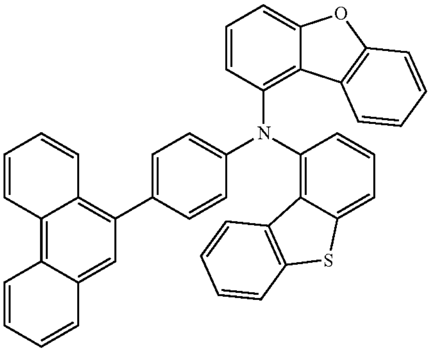
A145
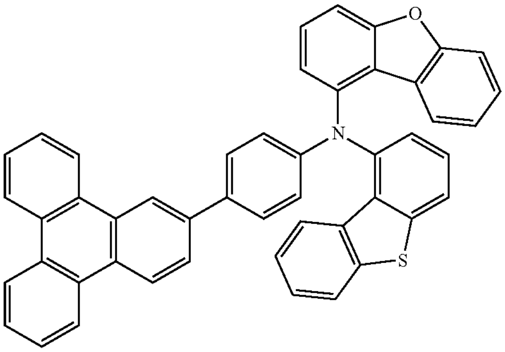
A146
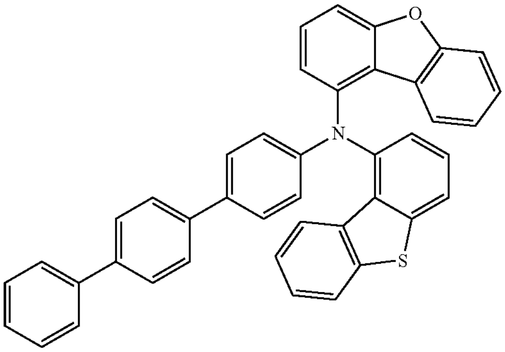
A147
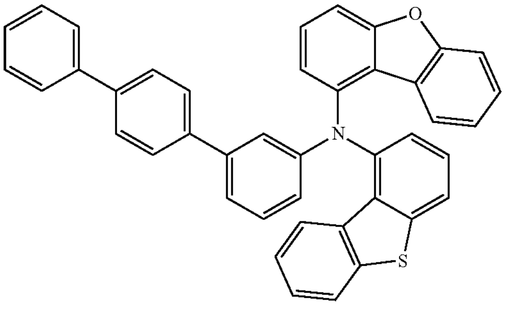

-continued
A148
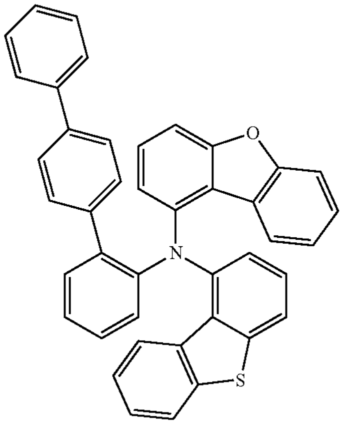
A149
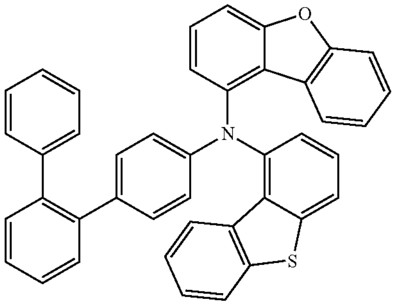
A150
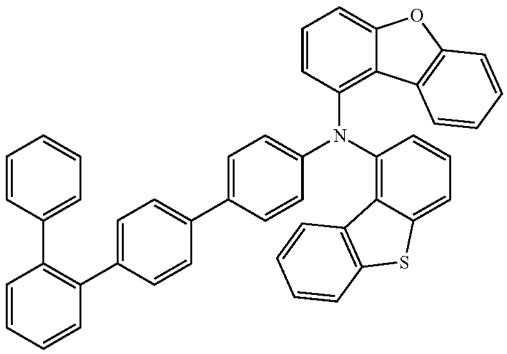
A151
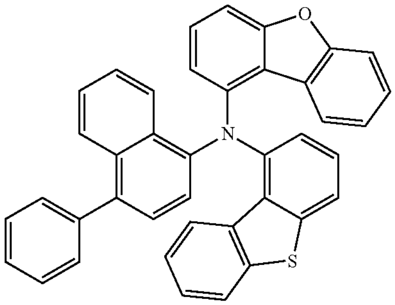
-continued
A152
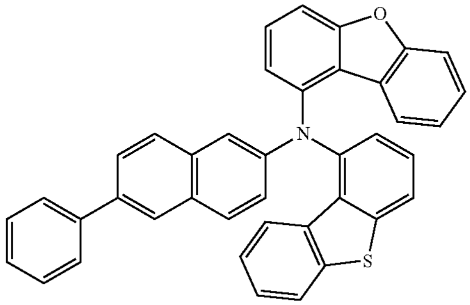
A153
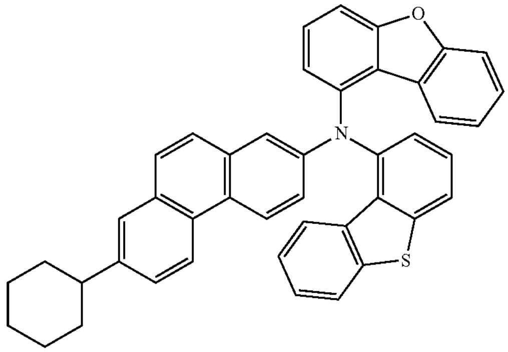
A154
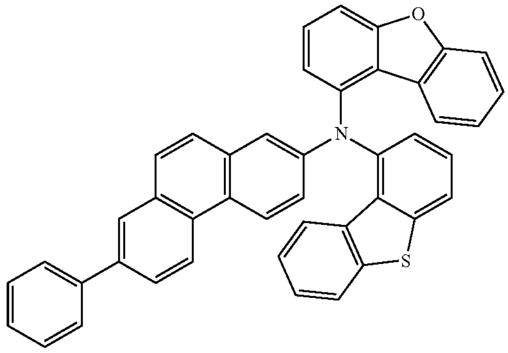
A155
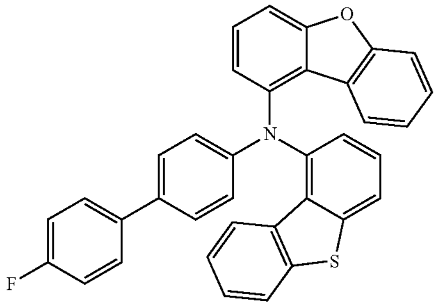

-continued
A156
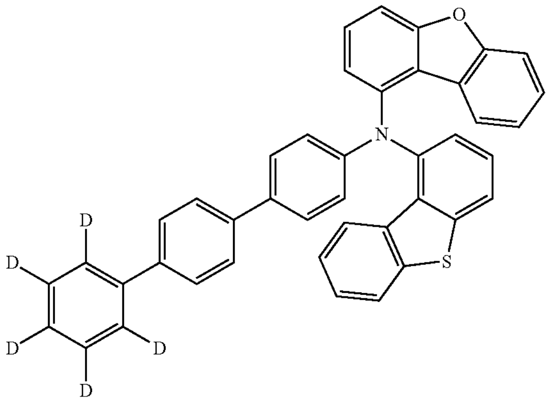
A157
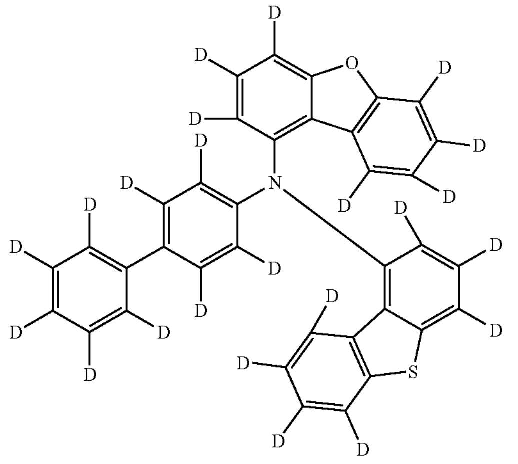
A158
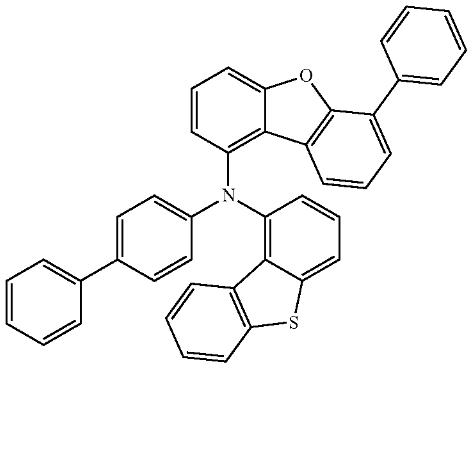
-continued
A159
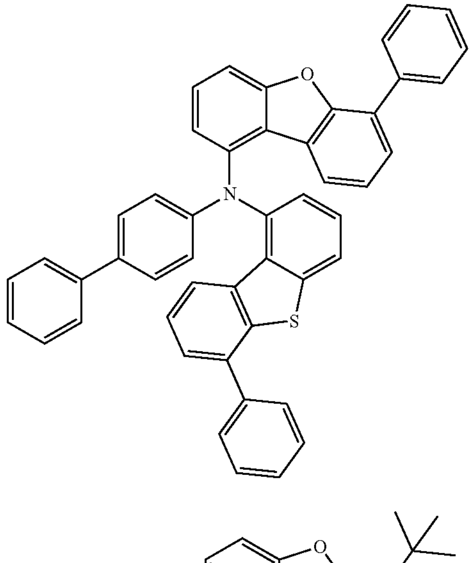
A160
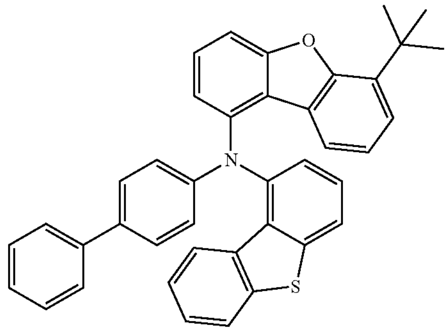
Compound Group B
B1
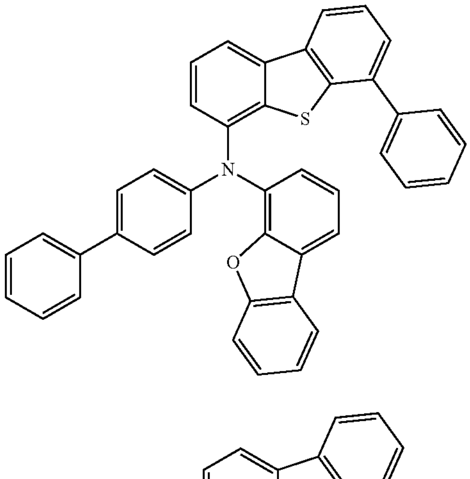
B2
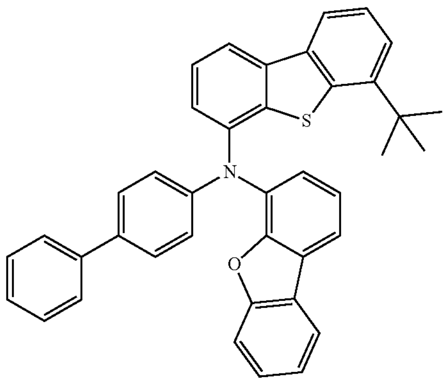

-continued
B4
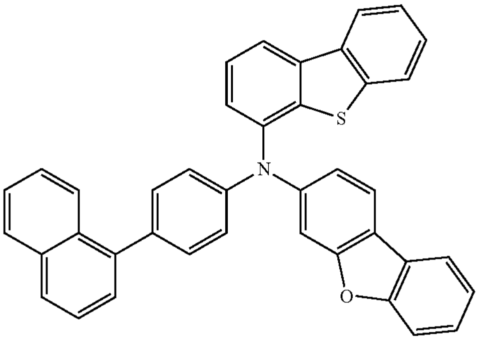
B5
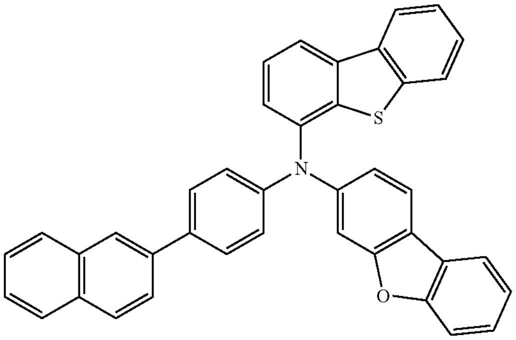
B6
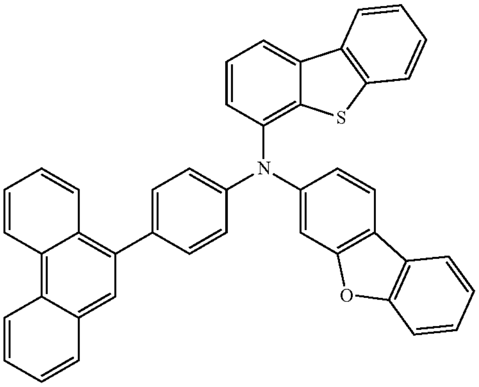
B7
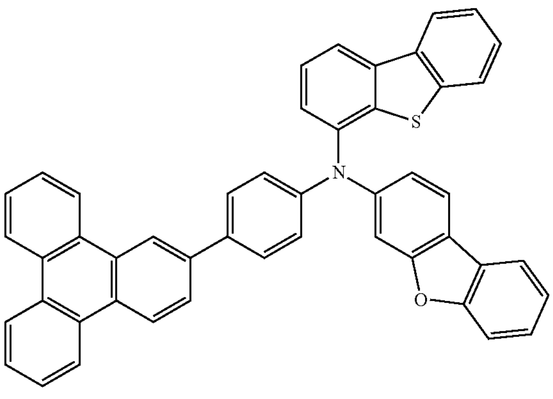
-continued
B8
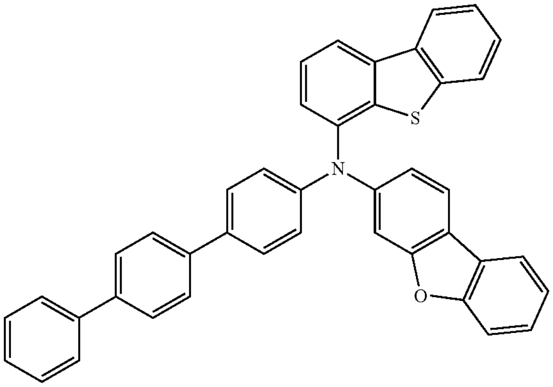
B9
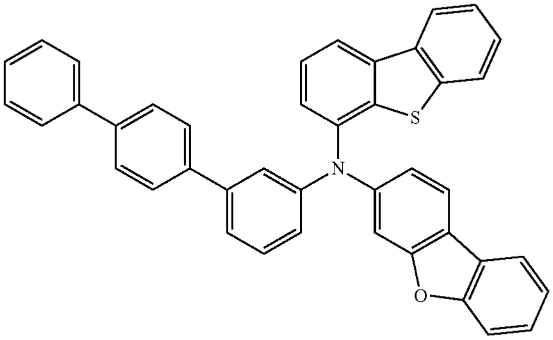
B10
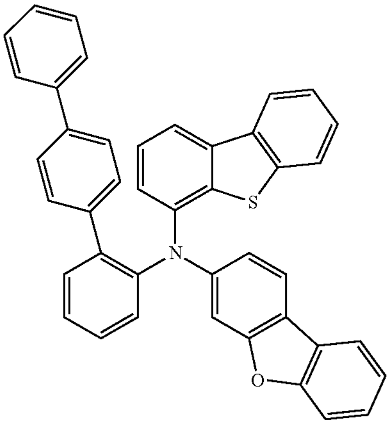
B11
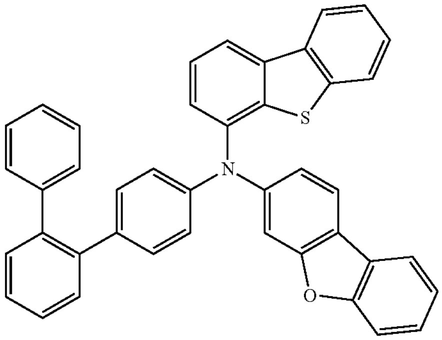

-continued
B12
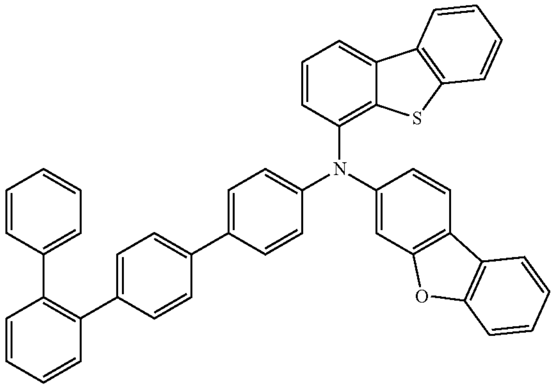
B13
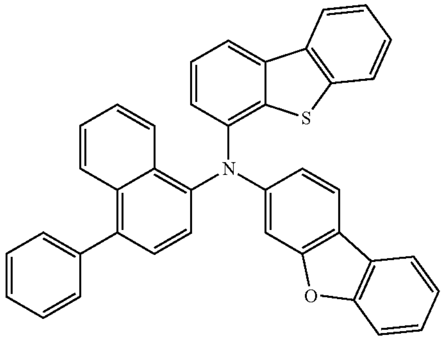
B14
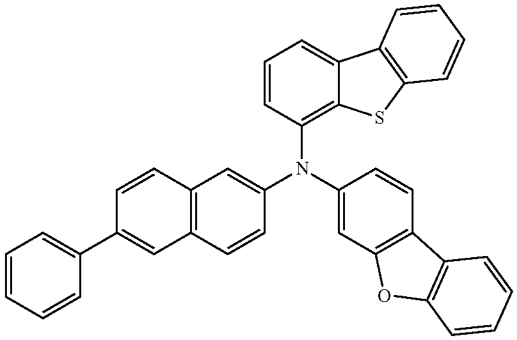
B15
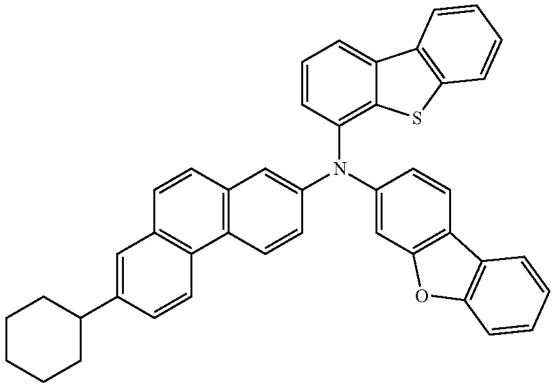
-continued
B16
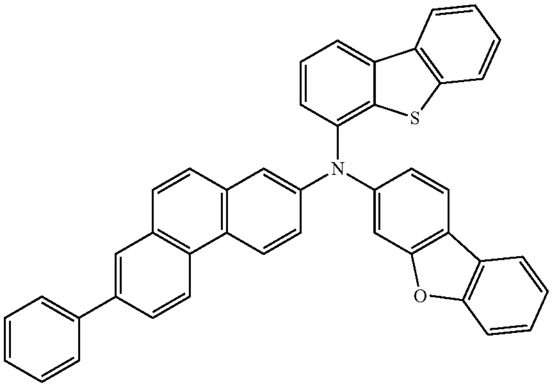
B17
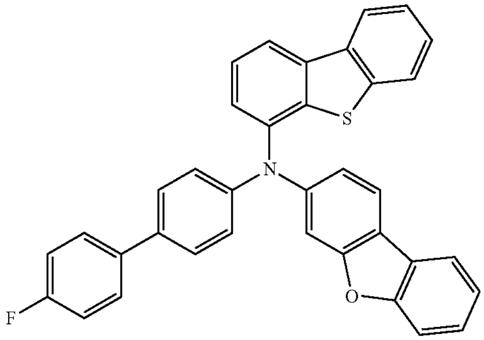
B18
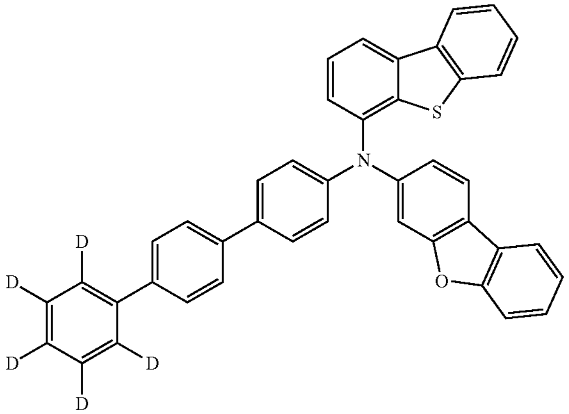

-continued
B19
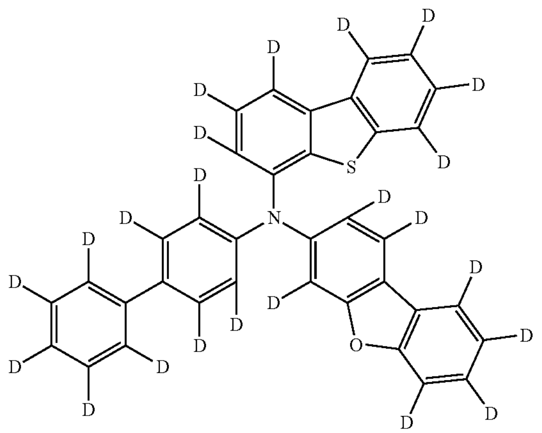
B20
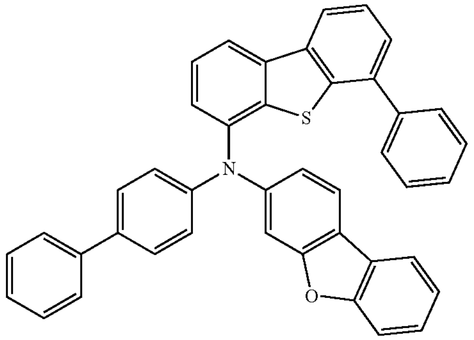
B21
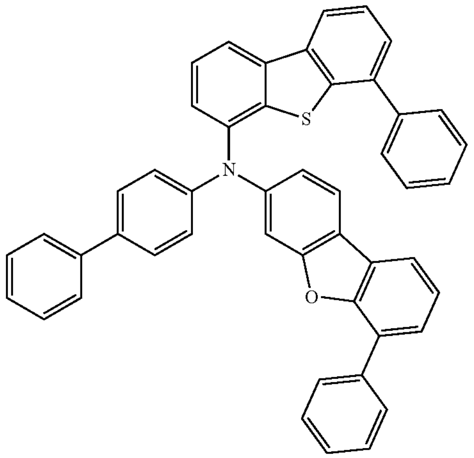
B22
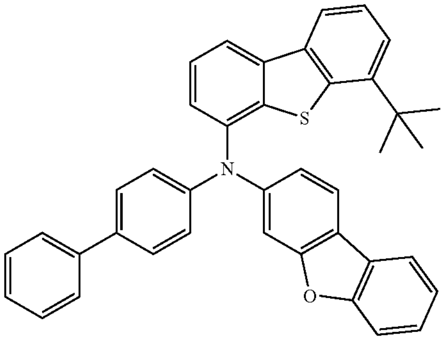
-continued
B24
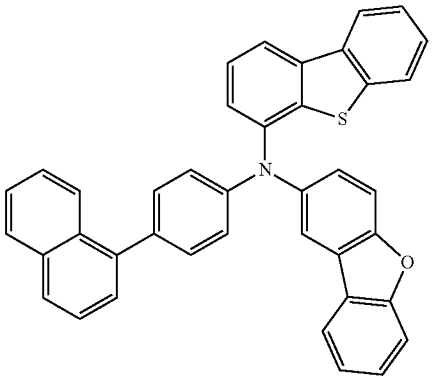
B25
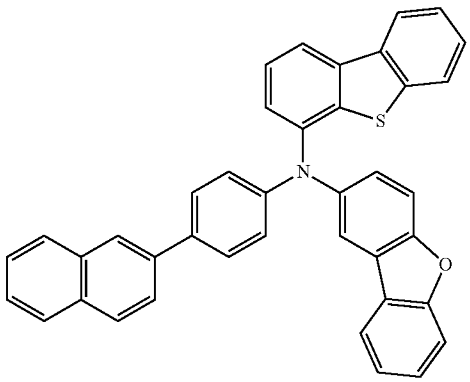
B26
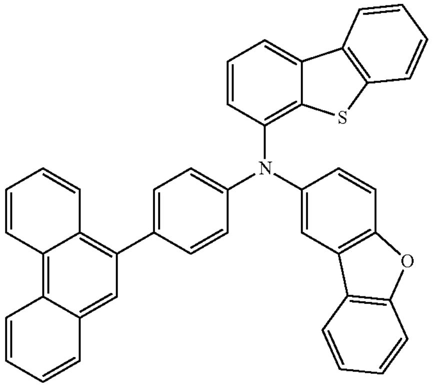
B27
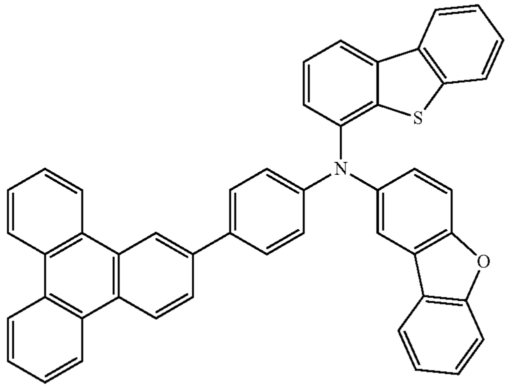

-continued
B28
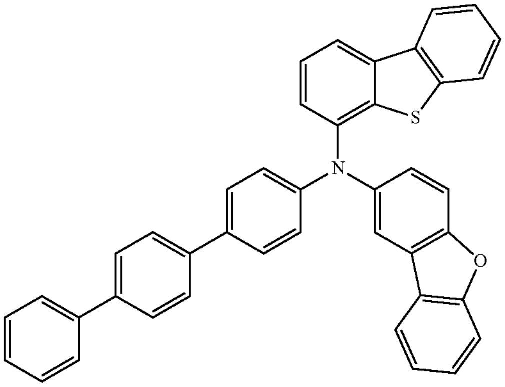
B29
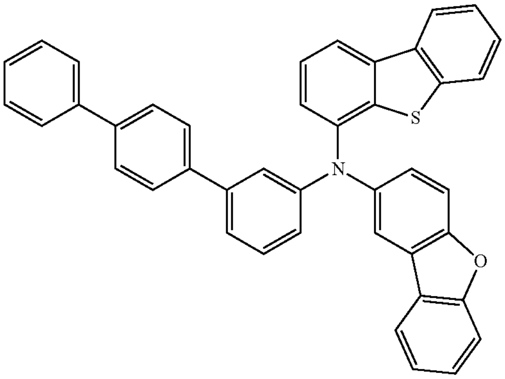
B30
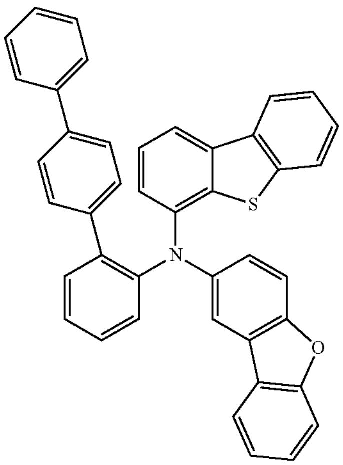
B31
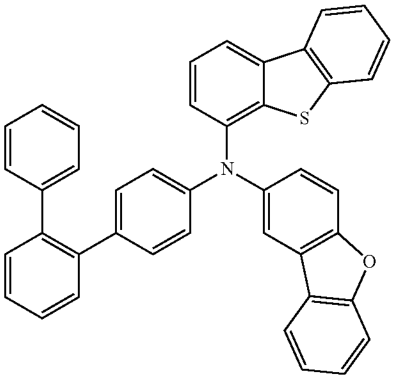
-continued
B32
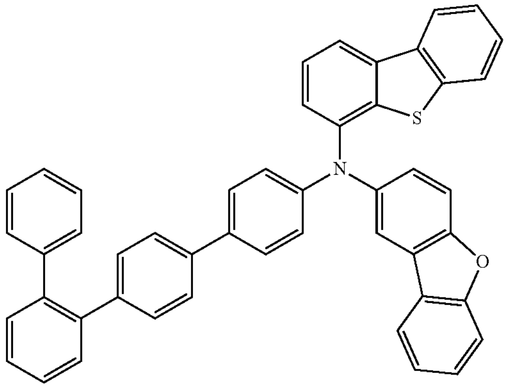
B33
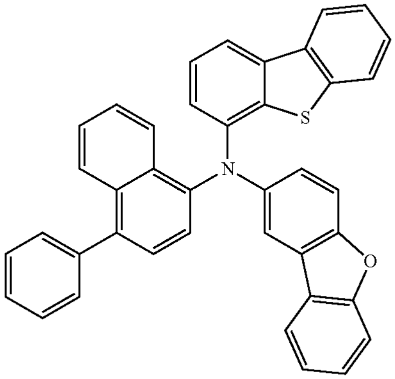
B34
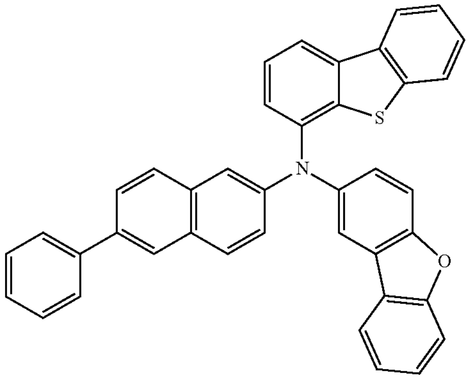
B35
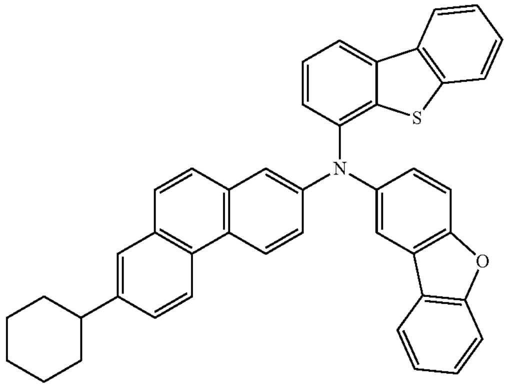

-continued
B36
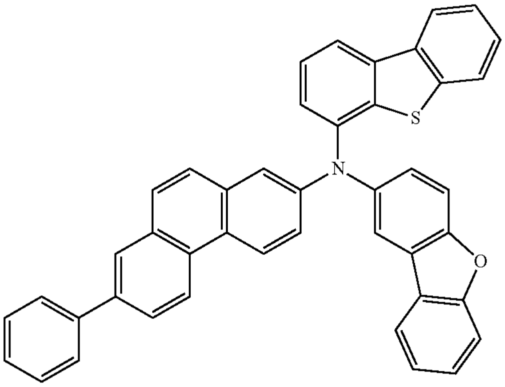
B37
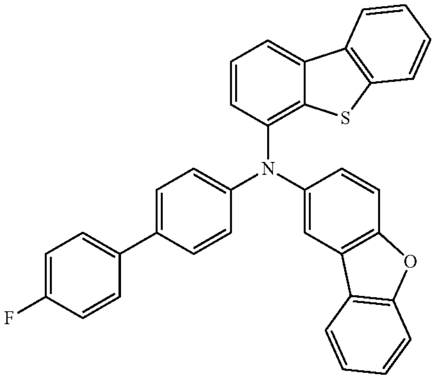
B38
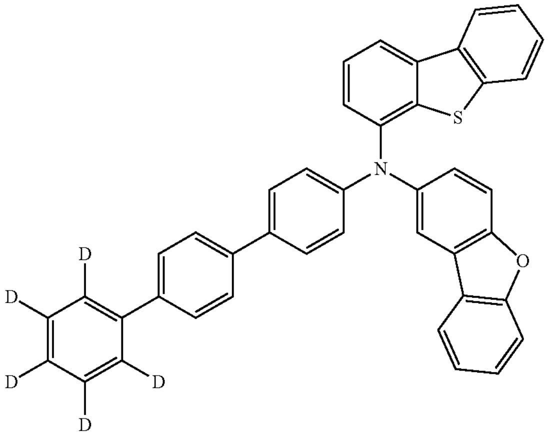
-continued
B39
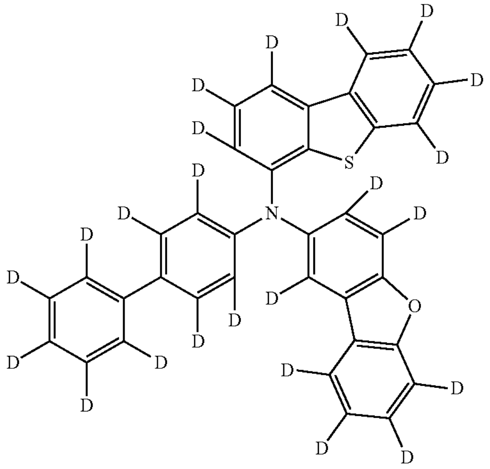
B40
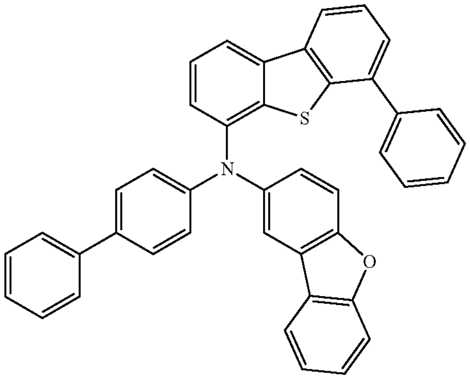
B41
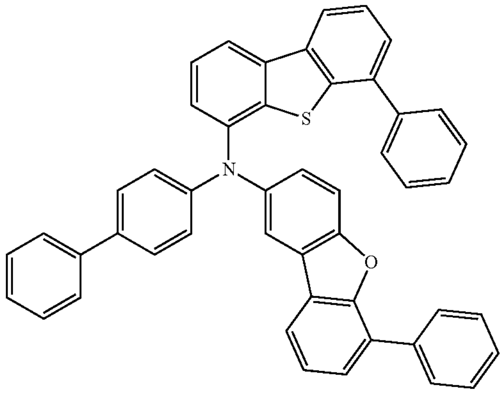
B42
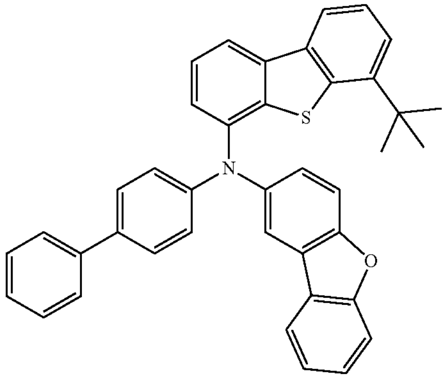

-continued
B43
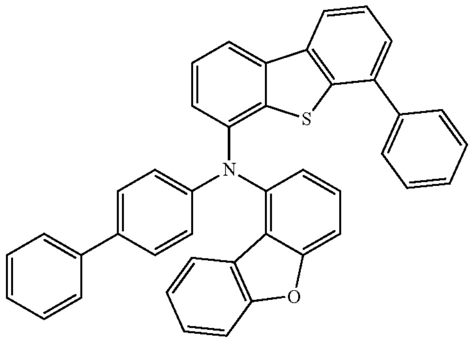
B44
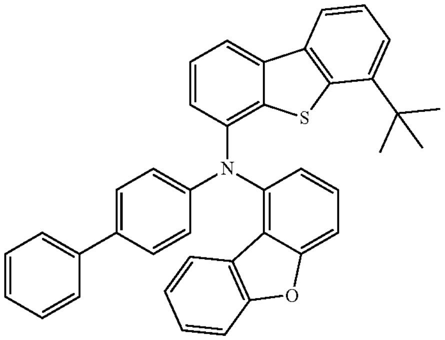
B45
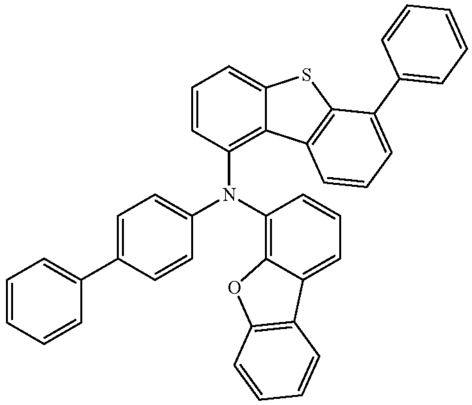
B46
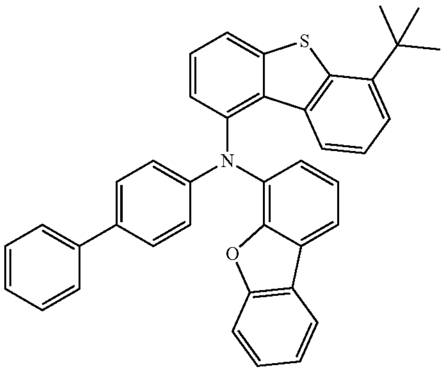
B48
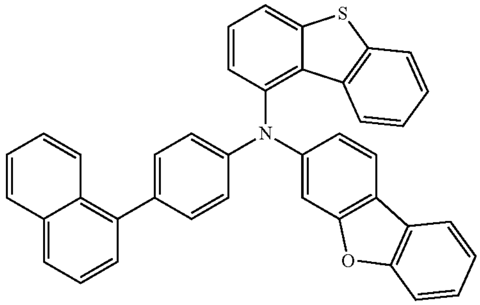
B49
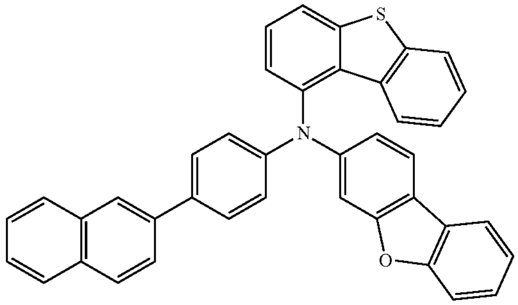
B50
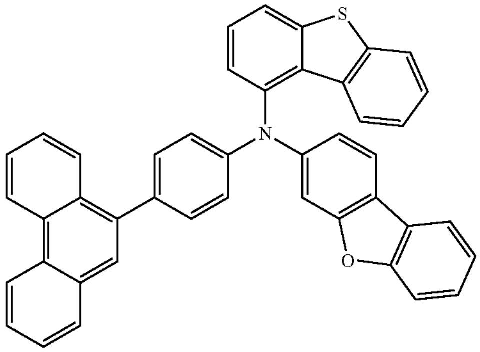
B51
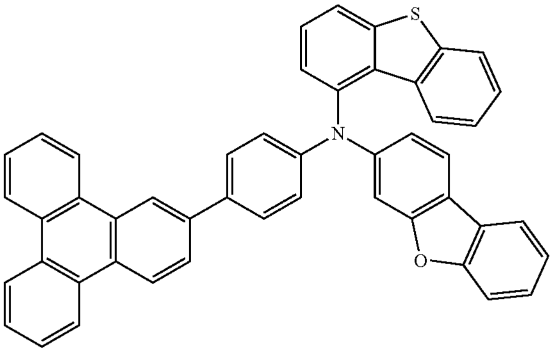

-continued
B52
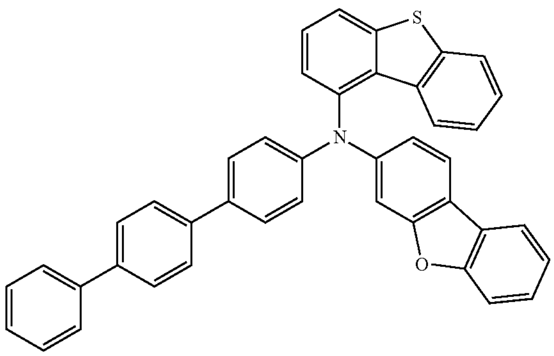
B53
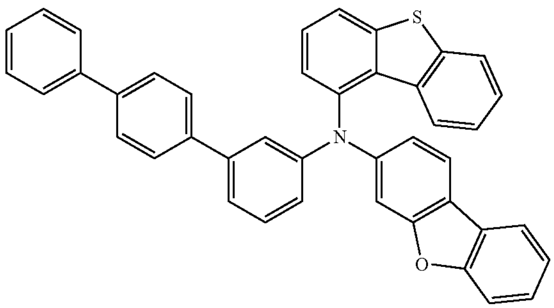
B54
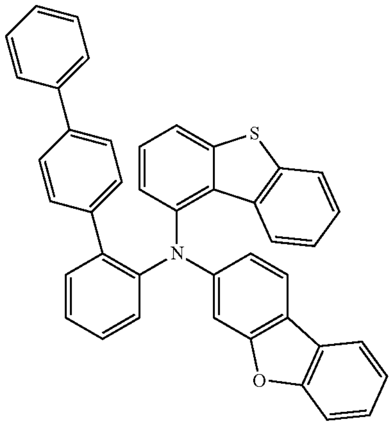
B55
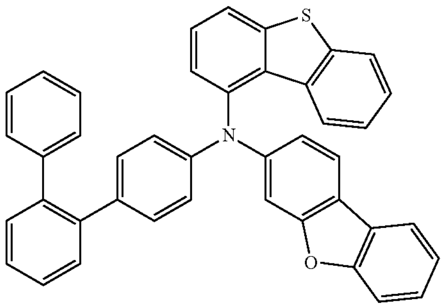
-continued
B56
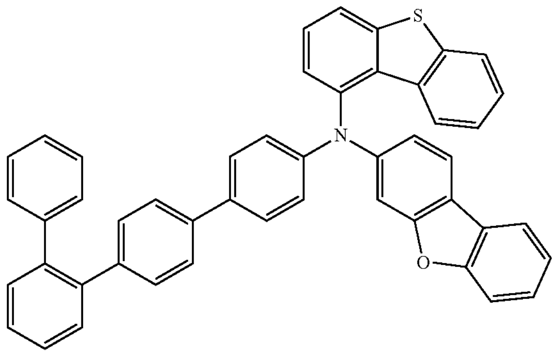
B57
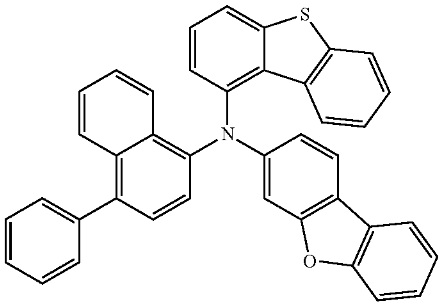
B58
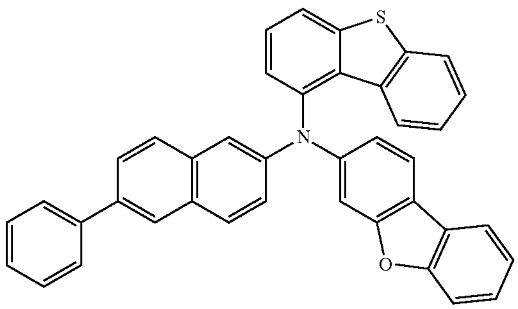
B59
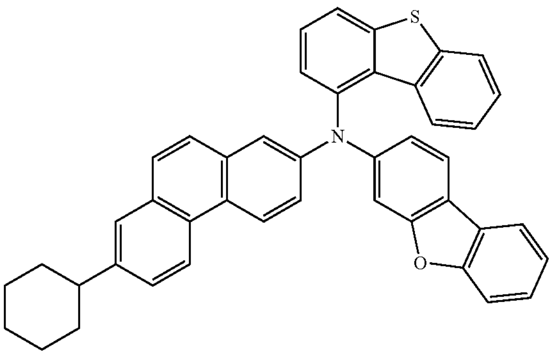

-continued
B60
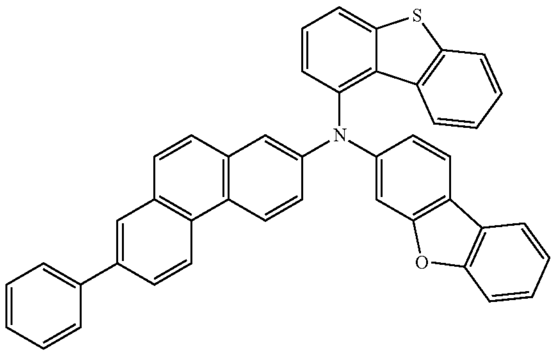
B61
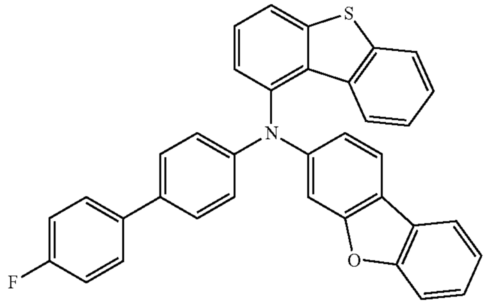
B62
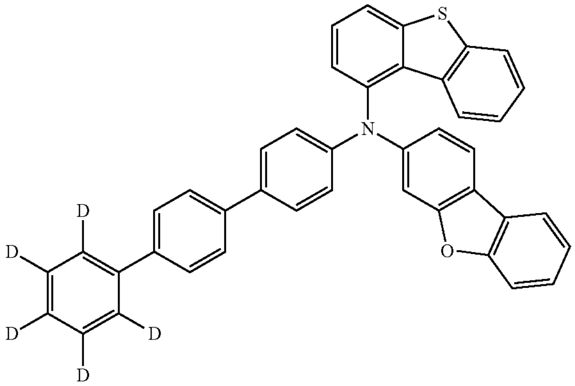
B63
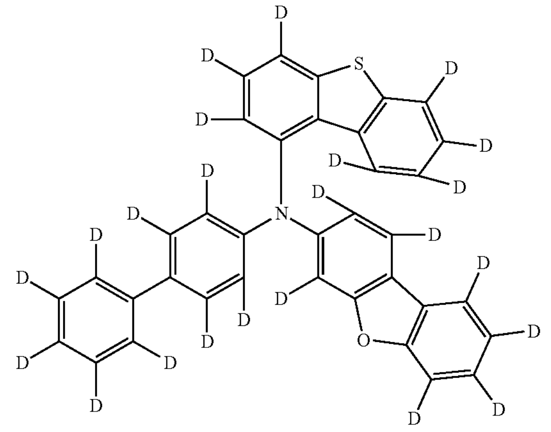
-continued
B64
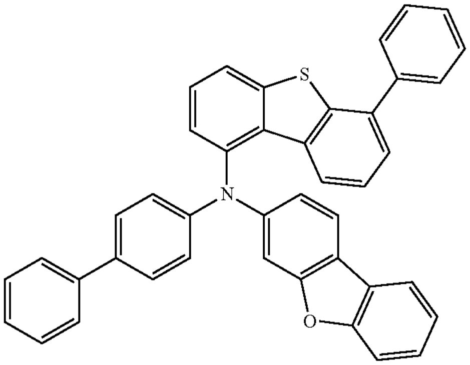
B65
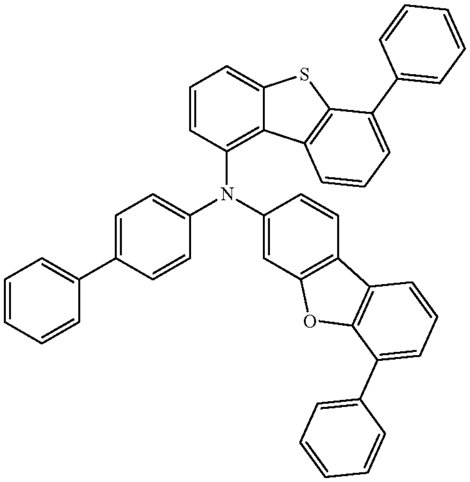
B66
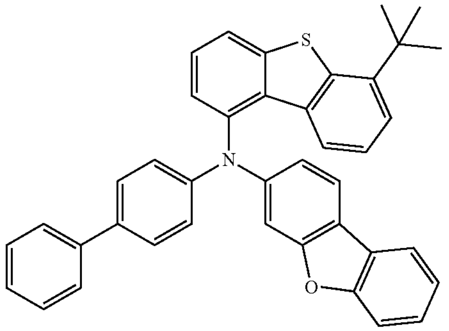
B68
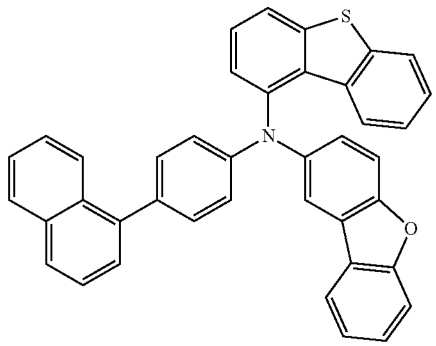

-continued
B69
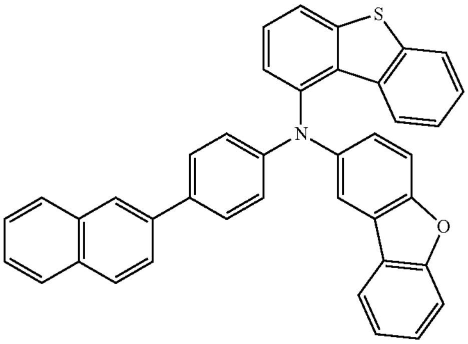
B70
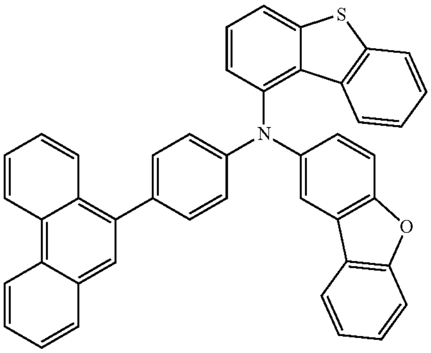
B71
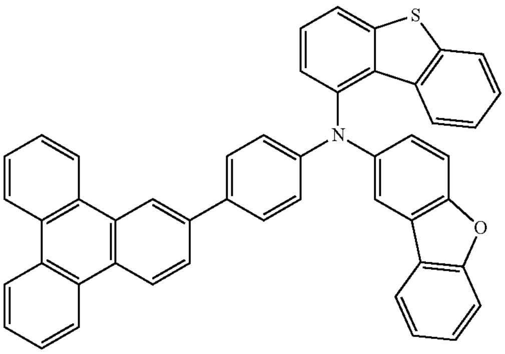
B72
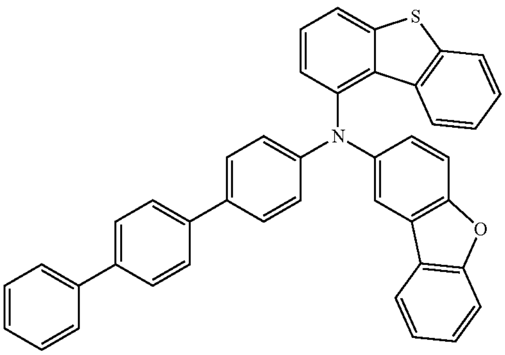
-continued
B73
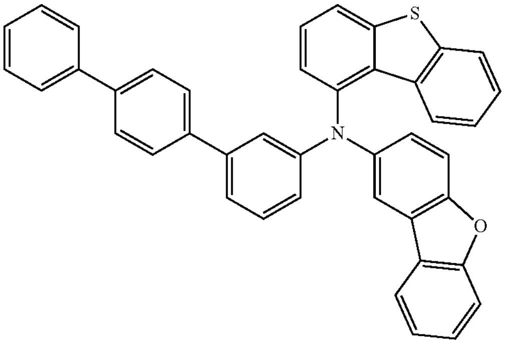
B74
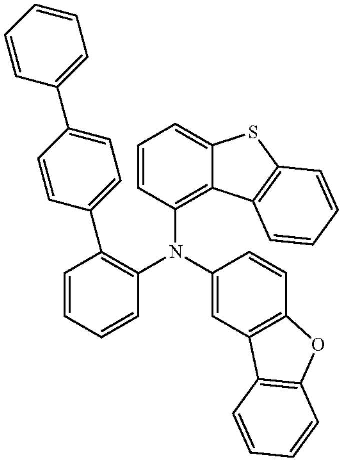
B75
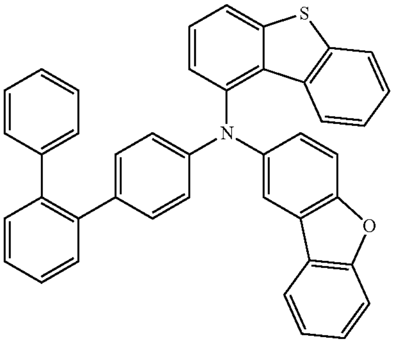
B76
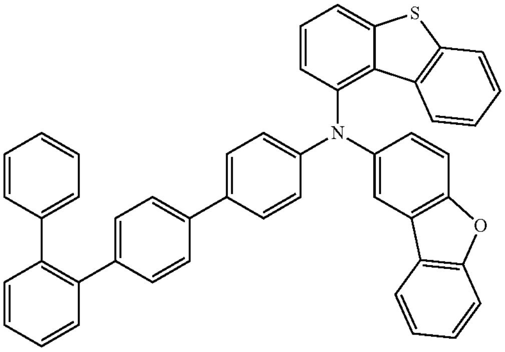

-continued
B77
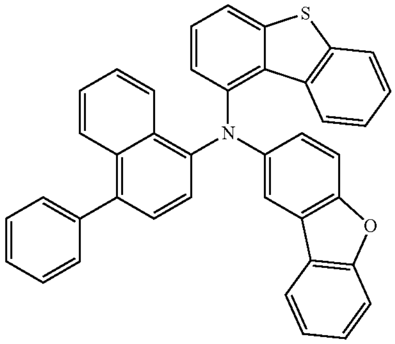
B78
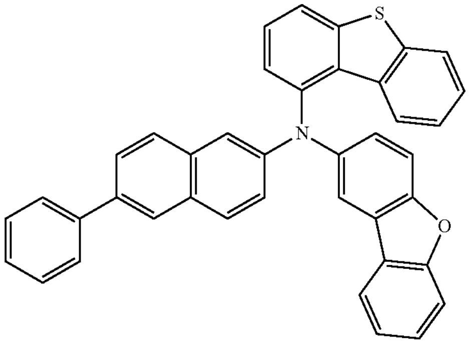
B79
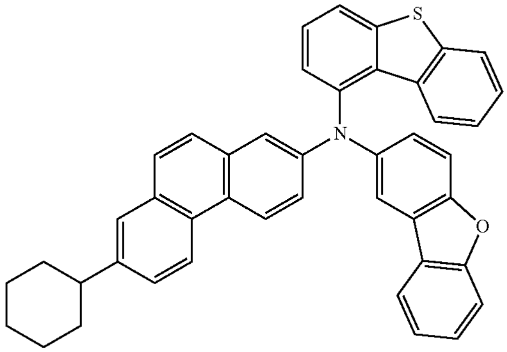
B80
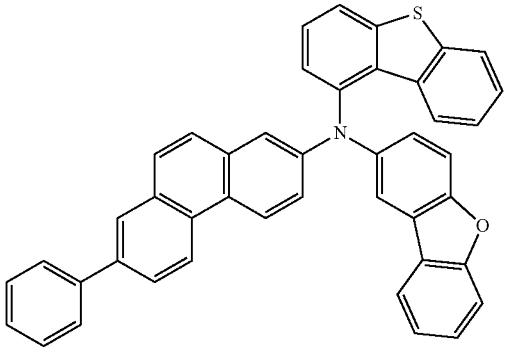
-continued
B81
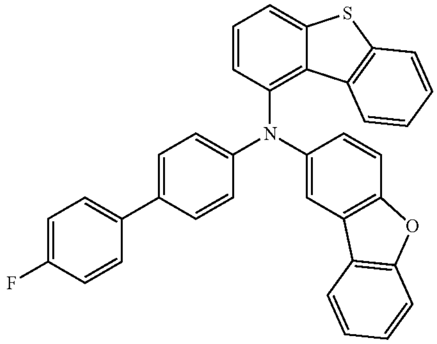
B82
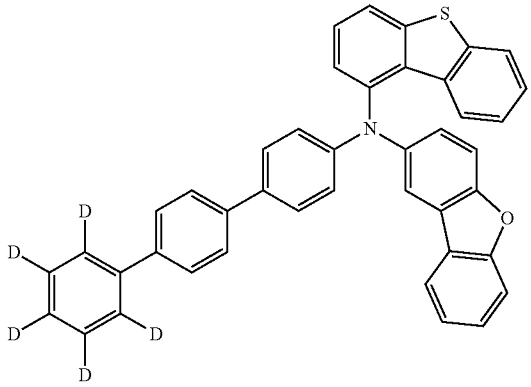
B83
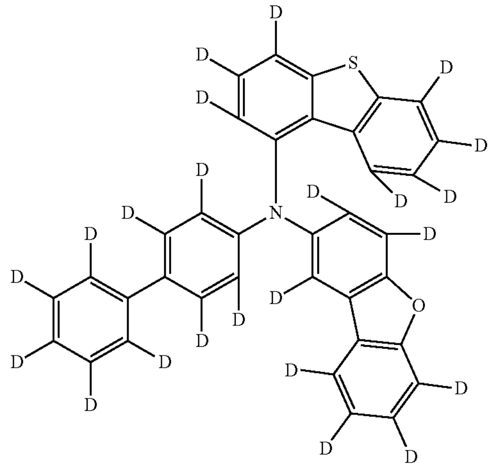
B84
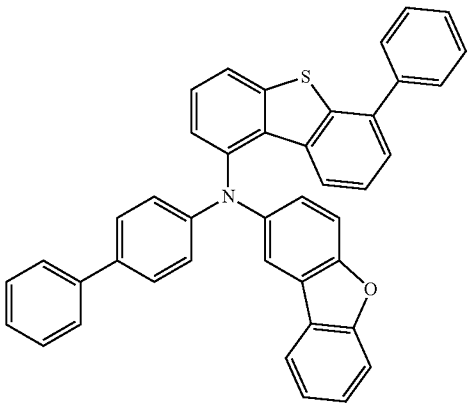

-continued
B85
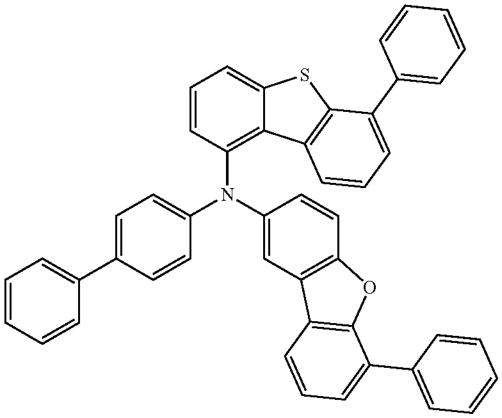
B86
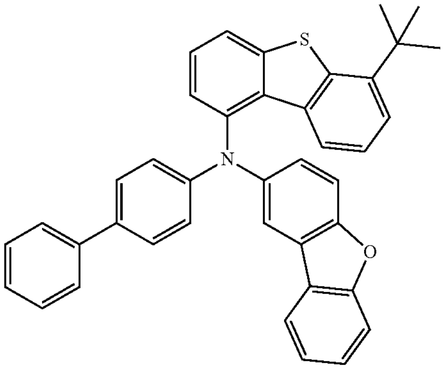
-continued
B87
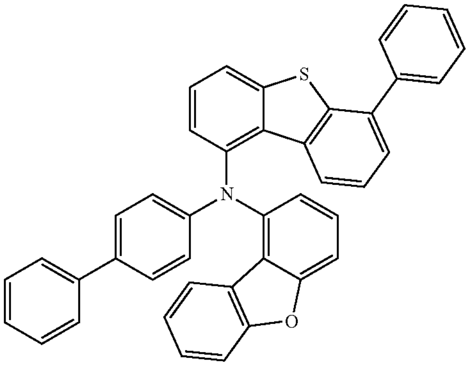
B88
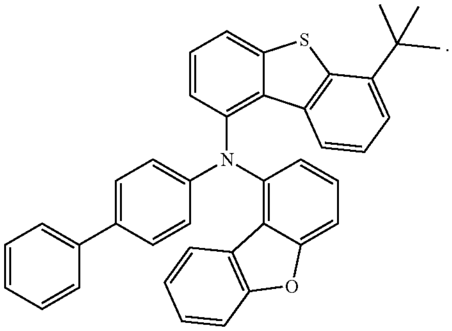
* * * * *